(12) United States Patent
Cheng et al.

(10) Patent No.: US 12,302,043 B2
(45) Date of Patent: May 13, 2025

(54) SYSTEM AND DEVICE WITH LASER ARRAY ILLUMINATION

(71) Applicant: Guangyi (Xiamen) Technology Co., Ltd., Xiamen (CN)

(72) Inventors: Siyang Cheng, Xiamen (CN); Jiansheng Wu, Xiamen (CN); Peijin Wang, Xiamen (CN); Zirong Zeng, Xiamen (CN)

(73) Assignee: GUANGYI (XIAMEN) TECHNOLOGY CO., LTD., Xiamen (CN)

( * ) Notice: Subject to any disclaimer, the term of this patent is extended or adjusted under 35 U.S.C. 154(b) by 961 days.

(21) Appl. No.: 17/357,844

(22) Filed: Jun. 24, 2021

(65) Prior Publication Data

US 2022/0021180 A1    Jan. 20, 2022

Related U.S. Application Data

(63) Continuation of application No. PCT/CN2019/128272, filed on Dec. 25, 2019.

(30) Foreign Application Priority Data

Dec. 26, 2018    (CN) .......................... 201822229316.4

(51) Int. Cl.
*H01S 5/024*    (2006.01)
*F21V 29/51*    (2015.01)
(Continued)

(52) U.S. Cl.
CPC ........... *H04N 9/3161* (2013.01); *F21V 29/51* (2015.01); *F21V 29/58* (2015.01);
(Continued)

(58) Field of Classification Search
CPC ............ H01S 5/02253; H01S 5/02423; H01S 5/02469; H01S 5/4025
See application file for complete search history.

(56) References Cited

U.S. PATENT DOCUMENTS 5,031,184 A    7/1991    Zeiss
6,517,221 B1    11/2003    Xie
(Continued)

FOREIGN PATENT DOCUMENTS

CN    1367555 A    9/2002
CN    1185767 C    2/2003
(Continued)

OTHER PUBLICATIONS

Cheng, Notice of Allowance, U.S. Appl. No. 16/299,047, Aug. 6, 2020, 8 pgs.
(Continued)

*Primary Examiner* — Yuanda Zhang
(74) *Attorney, Agent, or Firm* — Morgan, Lewis & Bockius LLP

(57) ABSTRACT

The present disclosure describes a diode laser array module that includes a plurality of diode lasers, a cooling module, and a pin connector module. The cooling module includes a heat sink that has structural features configured to allow pins of the diode lasers to be connected to a first conductive portion of the pin connector module within a recessed area in the bottom surface of the cooling module, where a second conductive portion of the pin connector module moves beyond the recessed area and is configured to be connected to a driving circuit module at a location outside of the recessed area in the bottom surface of the cooling module. Similarly principles are u to construct a diode laser array
(Continued)

module comprising bank packaged diode laser modules, pin connector modules for the bank packaged diode laser modules, and a cooling module.

19 Claims, 159 Drawing Sheets

(51) Int. Cl.
*F21V 29/58* (2015.01)
*H01S 5/02253* (2021.01)
*H01S 5/023* (2021.01)
*H01S 5/40* (2006.01)
*H04N 9/31* (2006.01)
*H05K 7/20* (2006.01)
*F21Y 105/10* (2016.01)
*F21Y 115/30* (2016.01)

(52) U.S. Cl.
CPC .......... *H01S 5/02253* (2021.01); *H01S 5/023* (2021.01); *H01S 5/02423* (2013.01); *H01S 5/02469* (2013.01); *H01S 5/4025* (2013.01); *H05K 7/20336* (2013.01); *F21Y 2105/10* (2016.08); *F21Y 2115/30* (2016.08)

(56) References Cited

U.S. PATENT DOCUMENTS

| 2007/0210400 | A1 | 9/2007 | Moribayashi et al. |
| 2008/0157112 | A1 | 7/2008 | He et al. |
| 2014/0029637 | A1 | 1/2014 | Schmidt |
| 2017/0160629 | A1 | 6/2017 | Hachair et al. |
| 2019/0207357 | A1* | 7/2019 | Cheng .............. H01S 3/0407 |

FOREIGN PATENT DOCUMENTS

| CN | 1417906 A | 5/2003 |
| CN | 101009418 A | 8/2007 |
| CN | 201174500 Y | 12/2008 |
| CN | 101841127 A | 9/2010 |
| CN | 103887687 B | 6/2014 |
| CN | 104112982 A | 10/2014 |
| CN | 206806725 U | 12/2017 |
| CN | 208157849 U | 11/2018 |
| CN | 109690884 A | 4/2019 |
| DE | 8908049 U1 | 8/1989 |
| JP | 2004349565 A | 12/2004 |
| JP | 2007250899 A | 9/2007 |
| JP | 2008300596 A | 12/2008 |
| TW | 201824670 A | 7/2018 |
| WO | WO 2016/012724 A1 | 1/2016 |
| WO | WO 2018/045597 A1 | 3/2018 |

OTHER PUBLICATIONS

Xiamen Chaoxuan Photoelectric Technology Co., Ltd., International Search Report and Written Opinion, PCT/CN2016/098763, Jun. 20, 2017, 7 pgs.

Xiamen Chaoxuan Photoelectric Technology Co., Ltd., International Search Report and Written Opinion, PCT/CN2019/128272, Mar. 23, 2020, 9 pgs.

* cited by examiner

SYSTEM AND DEVICE WITH LASER ARRAY ILLUMINATION

RELATED APPLICATIONS

This application is a continuation of PCT International Application No. PCT/CN2019/128272, filed Dec. 25, 2019, which claims priority to China Patent Application No. 201822229316.4, filed Dec. 26, 2018, which are incorporated herein by reference in their entirety.

TECHNICAL FIELD

The present disclosure relates to illumination systems, in particular, illumination systems that include laser arrays as light sources, and cooling systems thereof.

BACKGROUND

Systems and devices with laser array illumination are widely applicable, e.g., in image projection, lighting, advertisement display, etc. in both large scale public viewing settings and in medium or small indoor settings.

When constructing systems and devices with laser array illumination, special attention is required to ensure optical alignment, sufficient illumination power, and proper device cooling during normal operation. In addition, electronic driving circuit control of the individual laser components is also needed. When a relatively low cost and compact system is desired, meeting such design requirements becomes particularly challenging.

In general, many systems and devices that use laser array illumination employ laser arrays of semiconductor diode lasers or diode-pumped solid state lasers (DPSSLs) as their light sources. The semiconductor diode lasers are typically in a TO-CAN packaged form and are arranged in a grid pattern within a support substrate structure that includes integrated driving and cooling layers. Some diode lasers are bank packaged in a diode laser bank module. Diode laser module arrays may share the same cooling device. The designs of the cooling device and its assembly with the diode laser module arrays and corresponding circuit connections greatly affect the manufacturing ease and costs, and the robustness and performance of the resulting diode array modules.

SUMMARY

A diode laser array module comprises: a first diode laser array including a first plurality of diode lasers, wherein each diode laser of the first plurality of diode lasers has a respective diode laser body and a respective set of pins connected to the respective diode laser body; and a cooling module, wherein the cooling module includes a heat conducting body defined by a top surface, a bottom surface, and at least a first side surface and a second side surface of the cooling module, and includes a cooling structure that is at least partially embedded in the heat conducting body of the cooling module, wherein: the heat conducting body of the cooling module includes an array of first holes with corresponding first openings in the top surface of the cooling module to accommodate the first plurality of diode lasers, and the heat conducting body of the cooling module includes a plurality of first grooves, wherein each first groove is open in the bottom surface of the cooling module and connects a respective row of first holes in the array of first holes. The diode laser array module further comprises a plurality of pin connector modules, wherein: each pin connector module includes a respective first conductive portion that is located within a respective first groove of the heat conducting body of the cooling module and electrically connects the respective row of diode lasers that are inserted into the respective row of the first holes connected by the respective first groove, and each pin connector module includes at least one respective second conductive portion that is disposed within a portion of the heat conducting body of the cooling module that is beyond the respective first groove, the respective second conductive portion of said each pin connector module forms an electrical contact with the respective first conductive portion of said each pin connector module within the heat conducting body of the cooling module, and is configured to form an electrical contact to a driving circuit module outside of the first side surface of the cooling module.

A diode laser array module comprises: a first plurality of diode laser modules, wherein: each diode laser module of the first plurality of diode laser modules has a respective module body having a top surface, a bottom surface, a first side surface, and a second side surface, the respective module body of said each diode laser module includes a respective plurality of first holes in the top surface of the respective module body, and said each diode laser module includes a respective plurality of diode lasers mounted at least partially within the respective plurality of first holes of the respective module body of said each diode laser module, with respective pins of the respective plurality of diode lasers extending downward out of the respective plurality of first holes. The diode laser array module further comprises a first plurality of pin connector modules, wherein each respective pin connector module is configured to connect the respective pins of the respective plurality of diode lasers of at least one of the first plurality of diode laser modules to a driving circuit module that is disposed at a location separate from the bottom surface of the module body of said at least one diode laser module; and a cooling module, wherein the cooling module includes a heat conducting body defined by a top surface, a bottom surface, and at least a first side surface and a second side surface of the cooling module, and includes a cooling structure that is at least partially embedded in the heat conducting body of the cooling module, wherein: the top surface of the heat conducting body of the cooling module is in thermal contact with the bottom surfaces of the plurality of diode laser modules, and at least one of the bottom surface of the module body of the respective diode laser module or the top surface of the body of the cooling module includes one or more recessed areas at locations corresponding to the respective plurality of first holes of the respective module body of the respective diode laser module, such that one or more channels are formed by the one or more recessed areas when the top surface of the body of the cooling module is in thermal contact with the bottom surfaces of the respective module bodies of the plurality of diode laser modules, each pin connector module includes a respective first conductive portion that is located within the one or more channels formed between the top surface of the body of the cooling module and the bottom surfaces of the respective plurality of diode laser modules and electrically connects the respective plurality of diode lasers that are inserted into the respective plurality of first holes of a respective diode laser module, and each pin connector module includes a respective second conductive portion that extends out of the channel formed between the top surface of the body of the cooling module and the bottom surfaces of the plurality of diode laser modules to a location where electrical connections to the driving circuit module are to be made.

Other embodiments and advantages are apparent to those skilled in the art in light of the descriptions and drawings in this specification.

BRIEF DESCRIPTION OF THE DRAWINGS

The above-mentioned and/or additional aspects and advantages of the present utility model will become apparent and easy to understand from the description of the embodiments with reference to the following drawings, where.

Like reference numerals refer to corresponding parts throughout the drawings.

DETAILED DESCRIPTION

Figure 1:
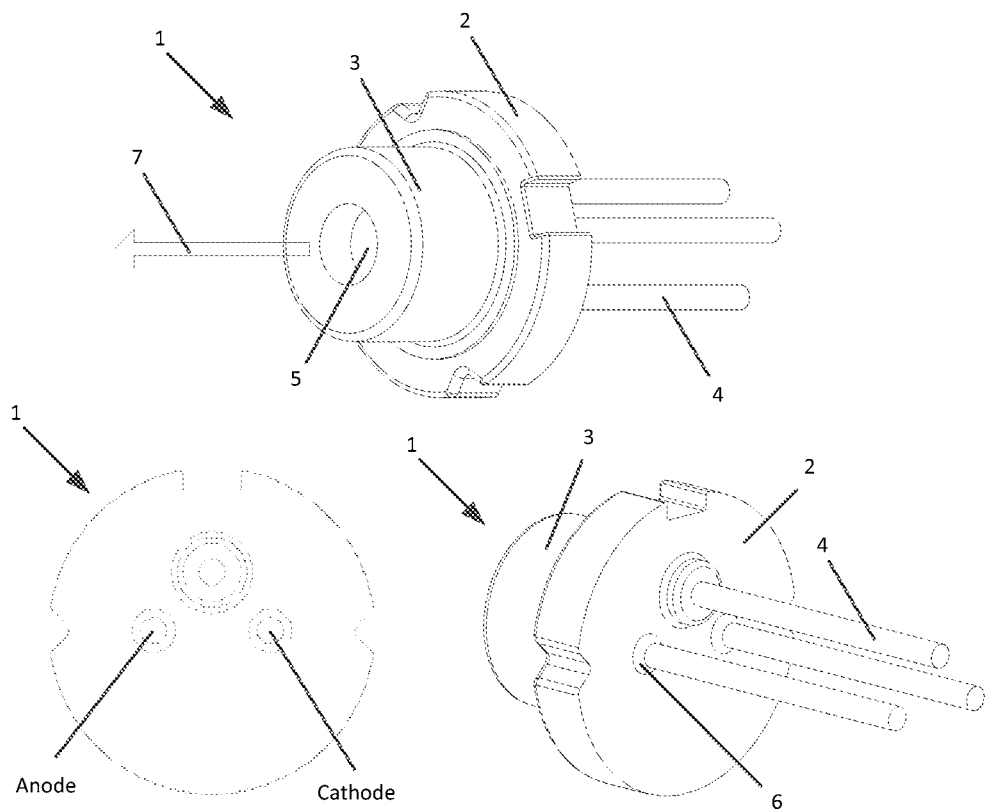
FIGS. 1-6 illustrate example laser diodes in various types of packing structures, in accordance with various embodiments.

As set forth in the Background section, many systems and devices that use laser array illumination use laser arrays of semiconductor diode lasers. When using diode laser array modules, issues such as optical collimation (e.g., adjustment of divergence angles of the diode lasers), heat dissipation, and electric driving efficiency, etc., need to be addressed. Typically, the heat dissipation/cooling require exposure and contact of heat conductors (or other efficient heat transfer media), while electric driving requires proper insulation between electric conductors. Since medium used for heat conduction/transfer are typically also good electric conductors and medium used for electric insulation are typically poor heat conductors, the requirements for cooling and electric driving in diode laser arrays present a unique challenge.

To address the above challenge, heat transfer requirements and electric driving functions of the laser diode module are physically separated into different surfaces of the laser array module using pin connector modules that have different portions residing in different parts of the diode laser modules and/or cooling module, such that each can be implemented without interfering with the other.

In some embodiments, in a single-sided diode laser array, by utilizing a heat sink module with embedded through-holes (stepped or straight through-holes) and grooves, the laser diodes can be placed at least partially within the through-holes and the thermal contact area between the laser diodes and the heat sink module can be increased (e.g., due to the increased contact area/exposure between the side walls of the through-holes and the laser diodes), and the pin connector modules can be placed in grooves and have portions that extend out of the grooves thereby improving the heat dissipation efficiency of the heat sink module and moving the driving circuit out of the heat exchange interface. This way, the physical separation of the driving circuit layer and the heat transfer interface is realized, and heat dissipation is no longer hindered by the existence of the driving circuit layer.

Generally speaking, many systems and devices using laser array illumination use semiconductor diode laser arrays as their light sources. Diode lasers usually are in the form of TO-CAN package. Multiple diode lasers in TO-CAN package may be further packaged into small diode laser modules, which may be further packaged into larger, more complex array modules with arrays of the smaller diode laser modules. An improved design of diode laser array module that utilizes these diode lasers and smaller diode laser modules that are compact, robust, efficiently cooled, and easy to manufacture and assemble are highly desired.

Usually, according to the application requirements, different packaging methods are used for diode laser chips. TO-CAN is a common packaging method. Its commonly used packaging specifications include TO-38, TO-56, and TO-9.

In addition, diode laser chips are often packaged in any other standard or non-standard type packages similar to TO-CAN package, such as SOT-01, SOT-02, and CMT-02.

The following demonstrative examples will be described by taking TO-9 packaging structure as an example. For other types of packaging structures, replacement may be made based on the same principle, which will be not repetitively described herein.

The following diode laser 1, diode laser 8, diode laser 11, diode laser 15, diode laser 16 and diode laser 17 may be replaced with one another in the same solution, which will be not repetitively described herein.

FIGS. 1-6 illustrate diode lasers in various packaging structures.

FIG. 1 is a schematic view of a TO-56 packaging structure. The diode laser 1 consists of a metal base 2, a metal housing 3, pins 4, a flat output window piece 5 and an insulating layer 6. For ease of description and clarity, as used in the present disclosure, the terms up, down, top, bottom, upward, downward, left, right, sideways, upper, lower, horizontal, vertical, etc., when used to describe the orientations and locations of various components in the diode laser array modules, are relative to a respective diode laser or array of diode lasers in the diode laser module or diode laser array module that is/are in the upright orientation with its/their flat output window piece(s) lying horizontally and pointing upward, and its/their pins pointing vertically downward. As a person skilled in the art would recognize, the diode laser array modules as a whole can be in any orientation in actual use.

One diode laser chip is mounted on the metal base 2. The metal housing 3, the flat output window piece 5 and the metal base 2 form a closed space for protecting the diode laser chip.

Usually, there are two or more pins 4 on the back of the metal base 2, the pins 4 are used to supply current to the diode laser chip or for laser detection; and the pins 4 and the metal base 2 are separated by using the insulating layer 6.

One diode laser chip emits one laser beam 7 which passes through the flat output window piece 5 and leaves the diode laser 1. Usually, the propagation direction of the laser beam 7 is perpendicular to the metal base 2.

The heat produced during working of the diode laser chip is transferred to the metal base 2 for radiation.

Each of diode lasers of TO-CAN package types such as TO-56 and TO-9 at least has two pins 4, wherein one pin is an anode and the other pin is a cathode, which supply power to the diode laser.

Figure 2:
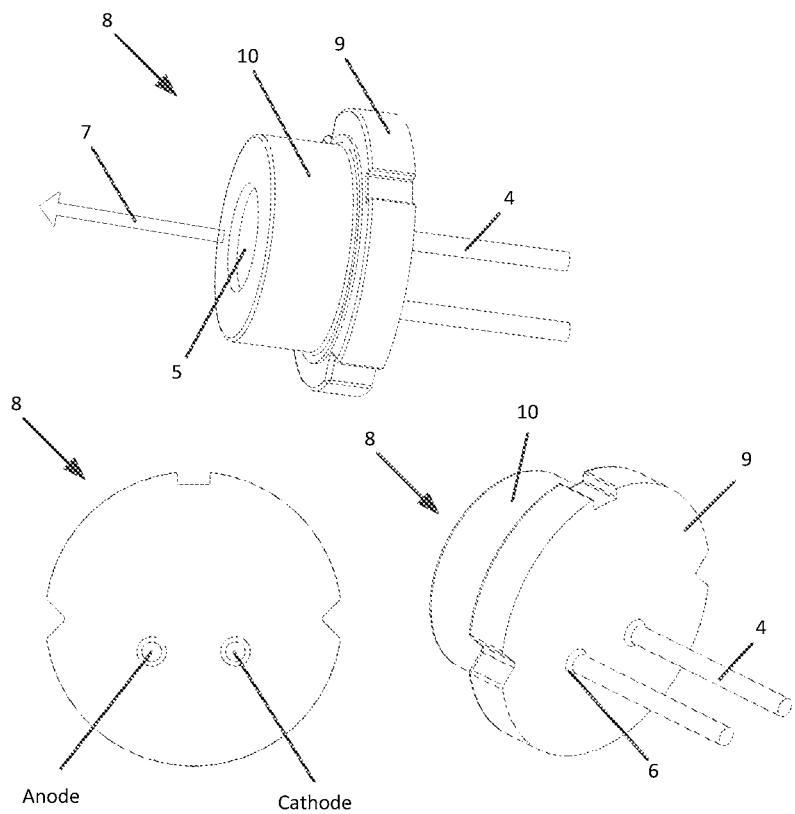

FIG. 2 is a schematic view of a TO-9 packaging structure. The diode laser 8 consists of a metal base 9, a metal housing 10, pins 4, a flat output window piece 5 and an insulating layer 6.

One diode laser chip is mounted on the metal base 9. The metal housing 10, the flat output window piece 5 and the metal base 9 form a closed space for protecting the diode laser chip.

Usually, there are two or more pins 4 on the back of the metal base 9, the pins 4 are used to supply current to the diode laser chip or for laser detection; and the pins 4 and the metal base 9 are separated by using the insulating layer 6.

One diode laser chip emits one laser beam 7 which passes through the flat output window piece 5 and leaves the diode laser 8. Usually, the propagation direction of the laser beam 7 is perpendicular to the metal base 9.

The heat produced during working of the diode laser chip is transferred to the metal base 9 for radiation.

Each of diode lasers of TO-CAN package types such as TO-56 and TO-9 at least has two pins 4, wherein one pin is an anode and the other pin is a cathode, which supply power to the diode laser.

The diode laser 1 and diode laser 8 both use the flat output window piece 5, but the divergence angle of laser beams emitted by the diode laser chip is large.

In order to reduce the divergence angle of laser beams, a collimating lens is used to replace the flat output window piece.

Figure 3:
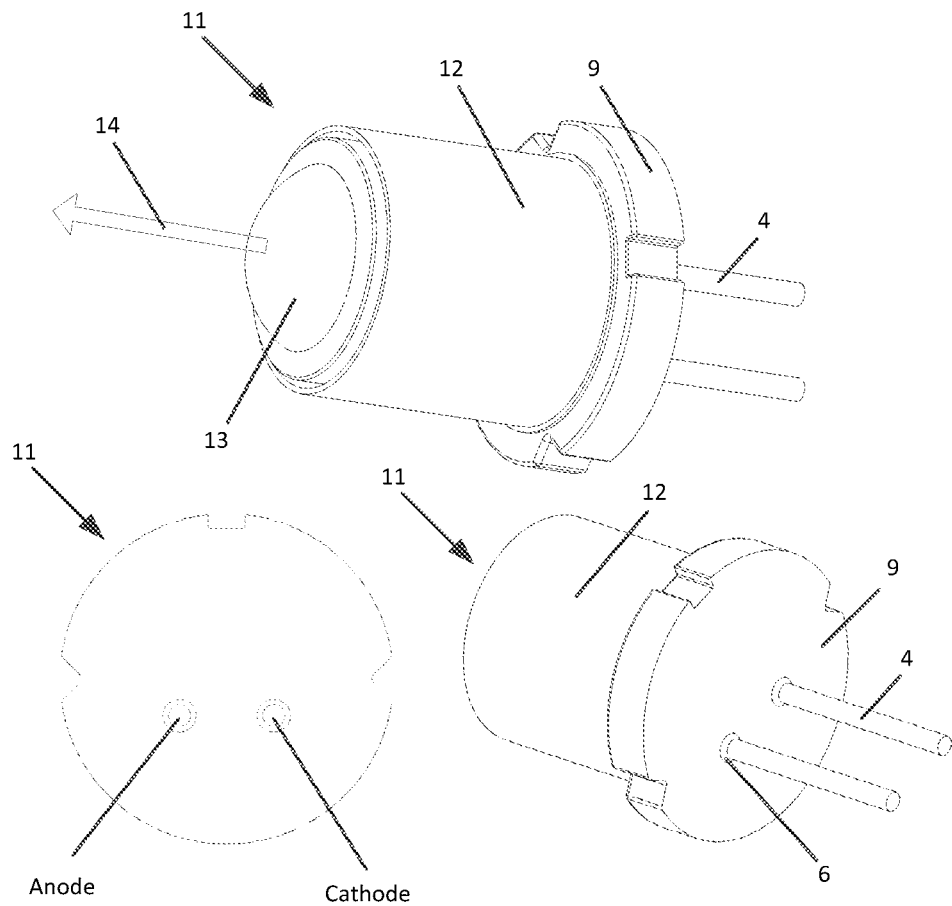

FIG. 3 is a schematic view of a collimating lens mounted on the basis of a TO-9 packaging structure. The diode laser 11 consists of a metal base 9, a metal housing 12, pins 4, collimating lens 13, and an insulating layer 6.

The metal housing 10 and the flat output window piece 5 of the diode laser 8 are respectively replaced with the metal housing 12 and the collimating lens 13 to form the diode laser 11. The other parts are totally the same, which will be not repetitively described herein.

One diode laser chip is mounted on the metal base 9. The metal housing 12, collimating lens 13 and the metal base 9 form a closed space for protecting the diode laser chip.

One diode laser chip emits one laser beam which passes through the collimating lens 13 to form a collimated laser beam 14 with a small divergence angle that leaves the diode laser 11; and normally, the propagation direction of the collimated laser beam 14 is perpendicular to the metal base 9.

The heat produced during working of the diode laser chip is transferred to the metal base 9 for radiation.

For other package types of TO-CAN (TO-38, TO-56, etc.), the purpose of reducing the divergence angle of the laser beam can be realized by using the same principle as adding the collimating lens to the diode laser 11, which will be not repetitively described herein.

Only one diode laser chip is packaged in each of the diode laser 1, diode laser 8 and diode laser 11. A plurality of diode laser chips can be simultaneously packaged in one TO-CAN packaging shell. The following demonstrative example will be described by taking the TO-9 packaging structure as an example.

Figure 4:
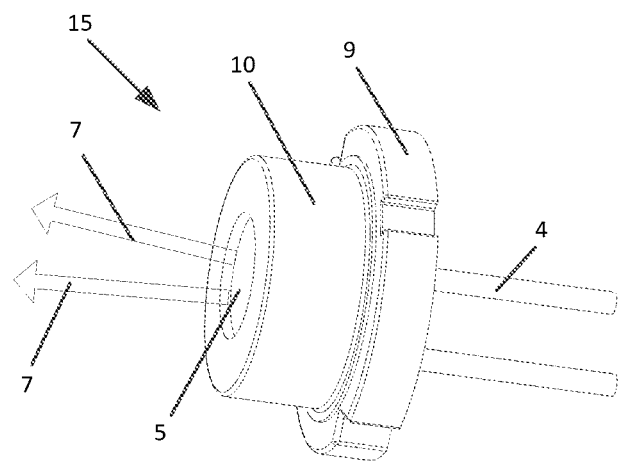

As shown in FIG. 4, the diode laser 15 consists of a metal base 9, a metal housing 10, pins 4, a flat output window piece 5 and an insulating layer 6 that are similar to those of the diode laser 8.

As shown in FIG. 4, two diode laser chips is mounted on the metal base 9. The metal housing 10, the flat output window piece 5 and the metal base 9 form a closed space for protecting the two diode laser chips.

The two diode laser chips each emit one laser beam 7, and the two laser beams 7 simultaneously pass through the flat output window piece 5 and leave the diode laser 15.

The heat produced during working of the diode laser chip is transferred to the metal base 9 for radiation.

Figure 5:
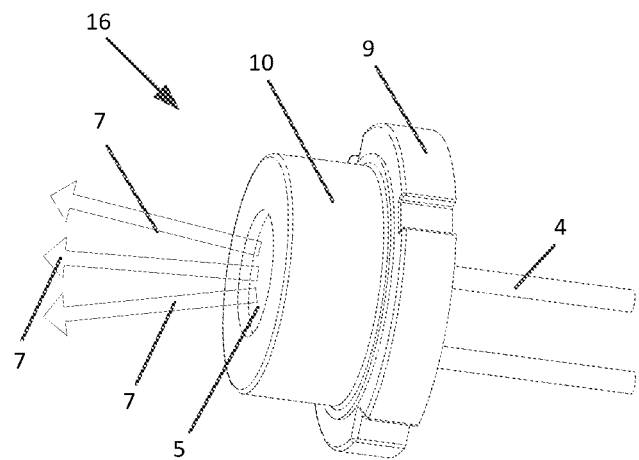

As shown in FIG. 5, the diode laser 16 consists of a metal base 9, a metal housing 10, pins 4, a flat output window piece 5 and an insulating layer 6, it is the same as the diode laser 8, which will be not repetitively described herein.

As shown in FIG. 5, three diode laser chips is mounted on the metal base 9. The metal housing 10, the flat output window piece 5 and the metal base 9 form a closed space for protecting the three diode laser chips.

The three diode laser chips each emit one laser beam 7, and the three laser beams 7 simultaneously pass through the flat output window piece 5 and leave the diode laser 16.

The heat produced during working of the diode laser chip is transferred to the metal base 9 for radiation.

For other package types of TO-CAN (TO-38, TO-56, etc.), a plurality of diode laser chips may be packaged in the shell by adopting the same or similar method as the diode laser 15 and diode laser 16.

The diode laser 15 and diode laser 16 both use the flat output window piece 5, since there is a certain included angle between the emitted laser beams 7, the divergence angle of the diode laser in which a plurality of diode laser chips is packaged is much larger than that of a single diode chip.

In order to reduce the divergence angle of laser beams, a collimating lens is used to replace the flat output window piece. The principle is the same as that of the diode laser 11.

Figure 6:
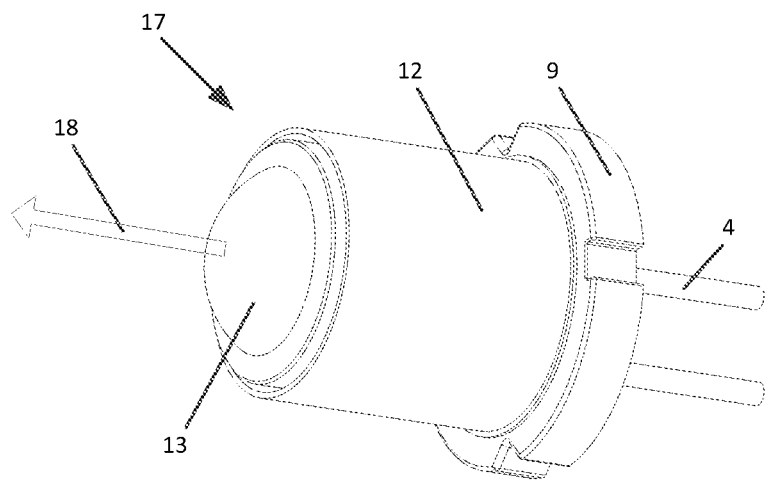

As shown in FIG. 6, a plurality of diode laser chips is packaged in the diode laser 17, the internal structure of the diode laser 17 is the same or similar to that of the diode laser 15 and diode laser 16, and the external structure of the diode laser 17 is the same or similar to that of the diode laser 11, which will be not repetitively described herein.

The diode laser 17 consists of a metal base 9, a metal housing 12, pins 4, collimating lens 13, and an insulating layer 6.

A plurality of diode laser chips are mounted on the metal base 9. The metal housing 12, collimating lens 13 and the metal base 9 form a closed space for protecting the diode laser chips.

Laser beams emitted by the plurality of diode laser chips converge through the collimating lens 13 to form a collimated laser beam 18 with a small divergence angle that leaves the diode laser 17; and normally, the propagation direction of the collimated laser beam 18 is perpendicular to the metal base 9.

The heat produced during working of a plurality of diode laser chips is transferred to the metal base 9 for radiation.

For other package types of TO-CAN (TO-38, TO-56, etc.), the purpose of enabling the laser beams emitted by the plurality of laser chips to converge to form a laser beam with a small divergence angle is realized by using the same principle as adding the collimating lens to the diode laser 17, which will be not repetitively described herein.

In order to use diode lasers more conveniently, a plurality of individual diode lasers are usually packaged to form a diode laser module, thereby achieving high efficiency of simultaneous mounting of a plurality of diode lasers.

The following solutions of the diode laser module will be described by taking the diode laser 11 as an example. The diode laser 11 may be replaced with diode lasers with any TO-CAN package structure, such as the diode laser 1, the diode laser 8, the diode laser 15, the diode laser 16, the diode laser 17, the diode laser 43, the diode laser 46, the diode laser 48, the diode laser 50, and the diode laser 51, in accordance with various embodiments. The principle is the same, which will be not repetitively described herein.

FIGS. 7-13 and FIGS. 14 to 28 are example structures of heat sinks for various types of diode laser modules, in accordance with various embodiments.

Figure 7:
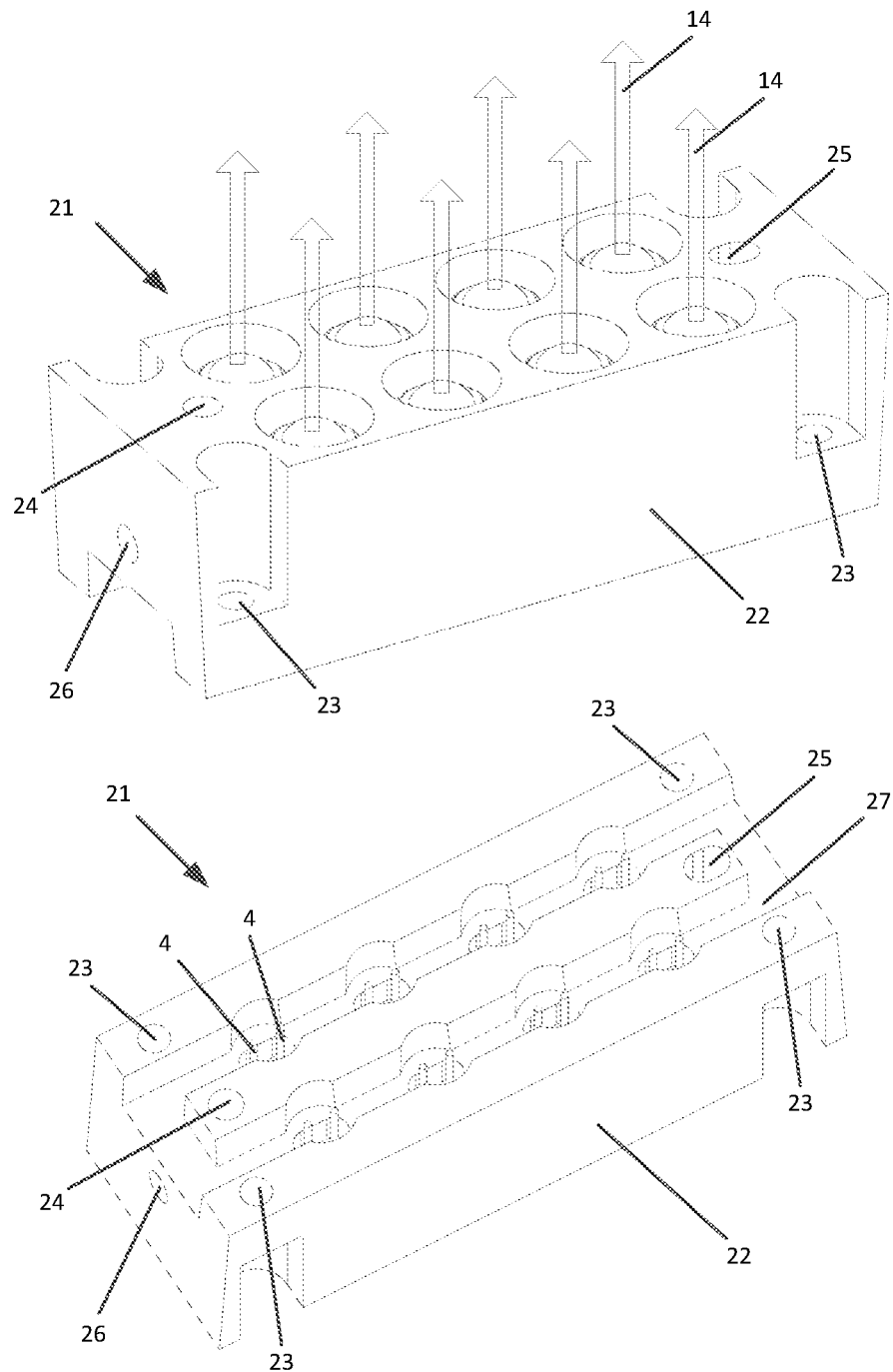
FIGS. 7-13 and 14 through 28 illustrate example heat sinks and example diode laser modules comprising a respective heat sink and a respective plurality of diode lasers, in accordance with various embodiments.

FIG. 7 is a schematic view of fitting between a heat sink 22 and diode lasers of a diode laser module 21. As shown in FIG. 7, eight diode lasers 11 are mounted on the heat sink 22 to form a diode laser module 21. The output side of the diode lasers 11 correspond to an upper side (also referred to as a top side) of the diode laser module 21 and the pin side of the diode lasers 11 correspond to a lower side (also referred to as a bottom side) of the diode laser module 21.

Figure 8:
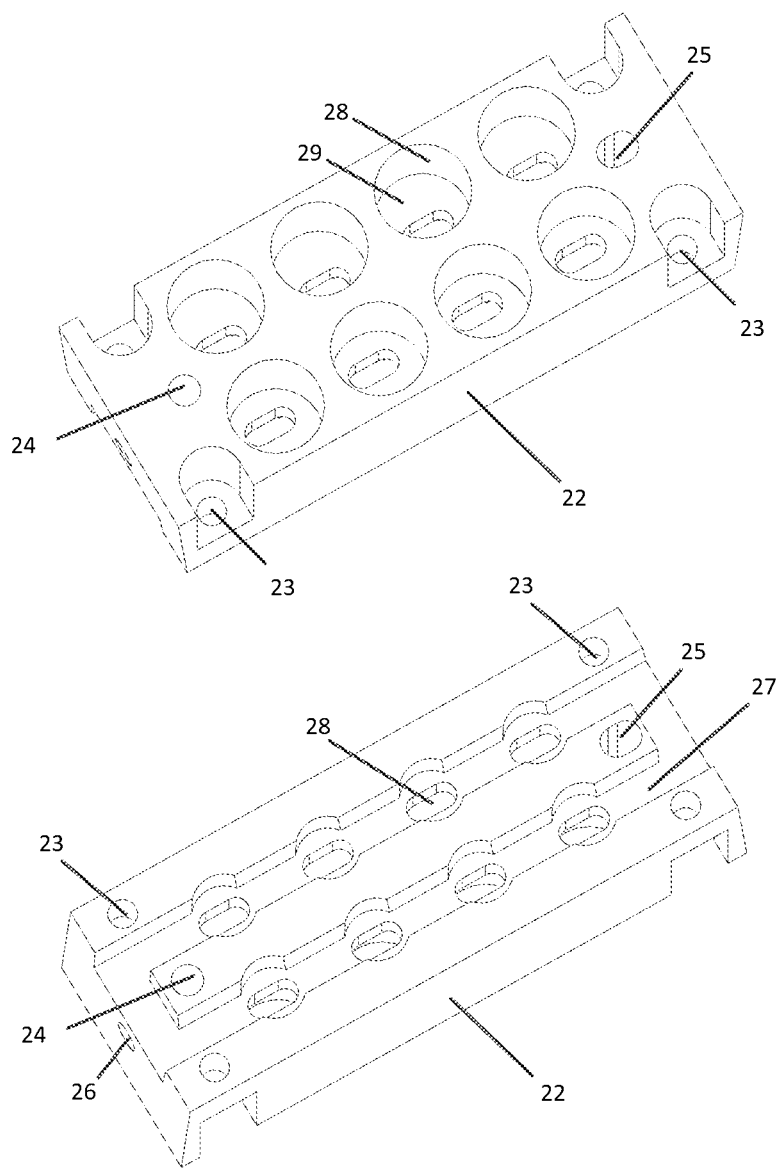

FIG. 8 is a structural schematic view of the heat sink 22, in accordance with some embodiments. As shown in FIG. 8, the upper surface of the heat sink 22 consists of a plurality of stepped through holes 28 (e.g., arranged in two parallel rows) for accommodating the diode lasers 11, a plurality of stepped through hole 23 (e.g., arranged near the four corners of the heat sink 22), a through hole 24 and a through hole 25 (e.g., respectively disposed near the two short sides of the top surface of the sink module 22, and passing through the two ends of the middle island portion of a rectangular groove 27). A respective stepped through hole 28 includes an upper portion with a diameter that corresponds to the diameter of the metal base 9 of the diode laser 11, such that the diode laser 11 can be entirely inserted into the respective stepped through hole 28. The respective stepped through hole 28 includes a middle portion below the upper portion that has a smaller lateral than the upper portion, and the size difference between the upper portion and the middle portion of the stepped through hole 28 forms the step surface 35 of the stepped through hole 28. In some embodiments, the middle portion of the through hole 28 has an elongated shape with lateral dimensions that allow the pins of a respective diode laser to pass through, but does not allow the metal base of the diode laser to pass through. The height of the middle portion of the through hole 28 is shorter or equal to the length of the pins of the diode lasers. In some embodiments, the through hole 28 optionally includes a lower portion that has lateral dimensions greater than those of the middle portion, e.g., with the depth of the lower portion is the same as the depth of the groove 27. The enlarged dimensions of the bottom portion relative to the middle portion allow more room to adjust the connections of the pins.

One side surface of the heat sink 22 consists of a hole 26 (e.g., not a through hole), as shown in FIG. 8.

The lower surface of the heat sink 22 consists of a rectangular groove 27 that runs through all stepped through holes 28 and connects them together (e.g., two long sides of the rectangular groove 27 each passing through a respective row of the stepped through holes 28). In some embodiments, the width of a respective side of the groove 27 is greater than the shorter dimension of the elongated middle portion of the through hole 28. In some embodiments, the bottom portions of the through holes 28 have a diameter that is greater than the width of a respective side of the groove 27 (e.g., the middle portions of the through holes 28 are smaller than the width of a respective side of the groove 27 and fits within the respective side of the groove, and the bottom portions of the through holes 28 are optionally larger than the width of the respective side of the groove 27 and do not entirely fit within the respective side of the groove).

The pins 4 of the diode laser 11 pass through the stepped through holes 28 to reach the lower surface of the heat sink 22; the metal base 9 of the diode laser 11 is in close contact with the step surfaces 29 of the stepped through holes 28 (e.g., directly on top of the middle portion of the through holes 28). The through holes 28 are filled with a heat conducting filling material to achieve good heat conductivity, such that the heat produced during working of the diode lasers 11 is transferred to the heat sink 22 through the heat conducting filling material. The heat conducting filling material may be a metal or non-metal material, such as heat conducting silicone grease and soldering tin.

Figure 9:
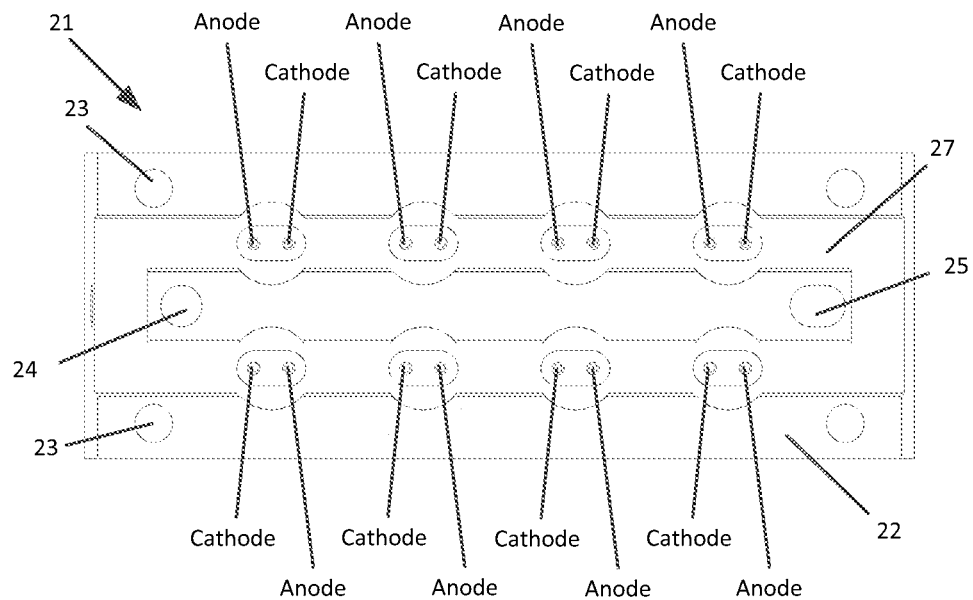

FIG. 9 is a schematic view of relative positions of the heat sink 22 and the diode lasers 11 after fitting, in accordance with some embodiments. The eight diode lasers 11 are mounted in the through holes 28 of the heat sink 22 in the diode laser module 21, with the anodes and cathodes of the diode lasers arranged sequentially as shown in FIG. 9.

Figure 10:
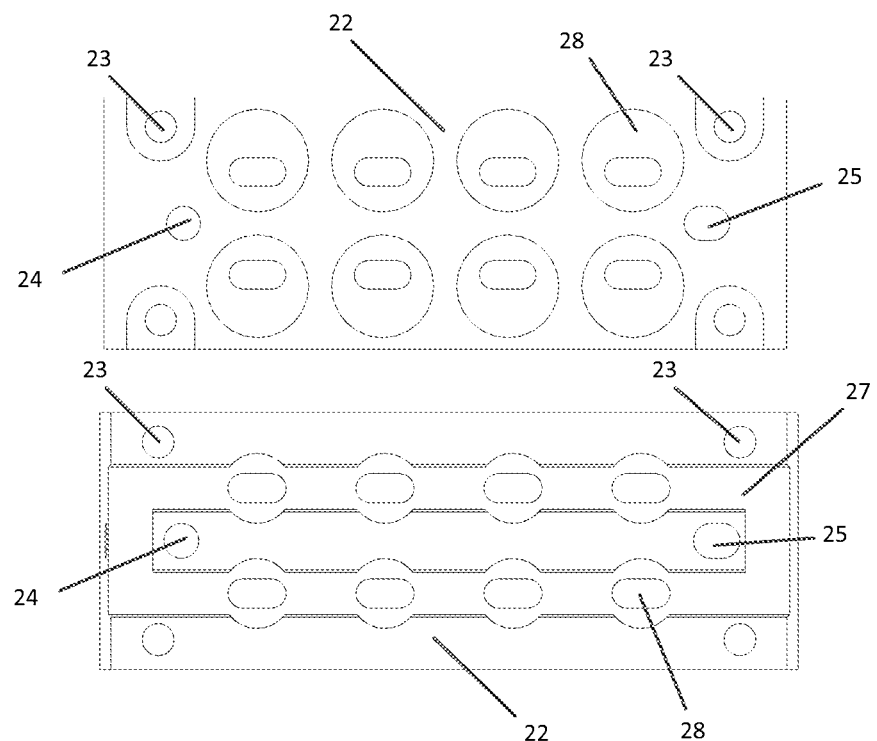

FIG. 10 is a schematic view of the upper surface and the lower surface of the heat sink 22, showing the relative positions of the holes and grooves on the surfaces, in accordance with some embodiments.

Figure 11:
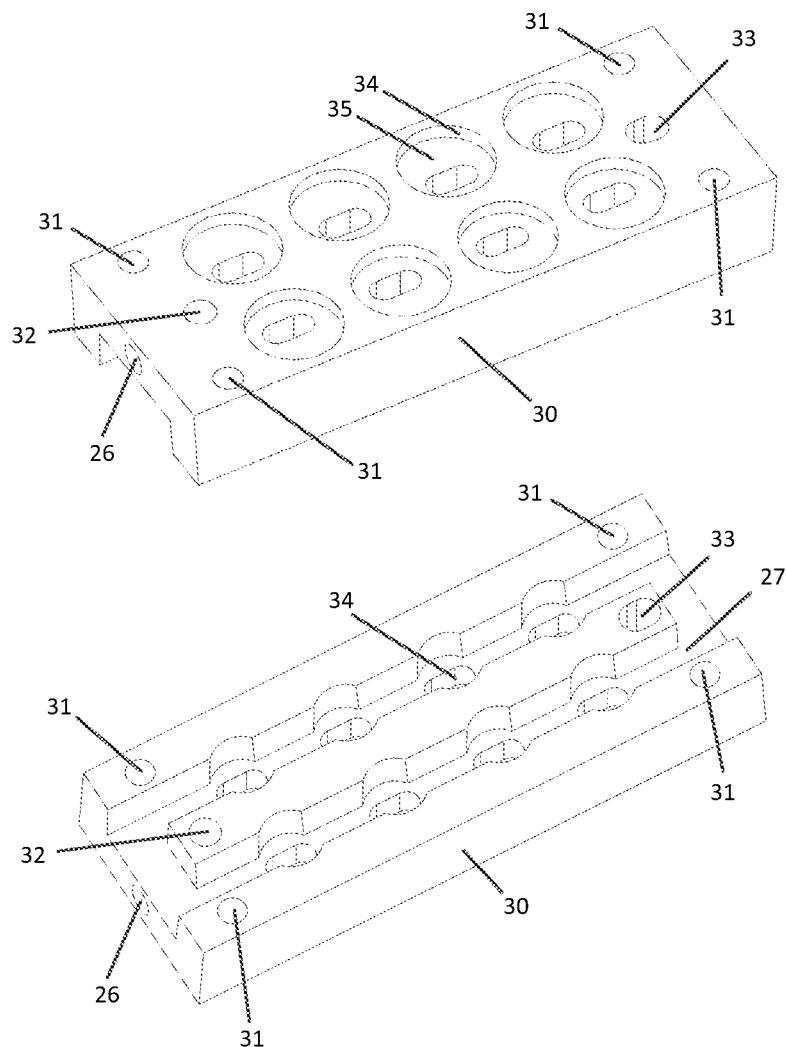
Figure 12:
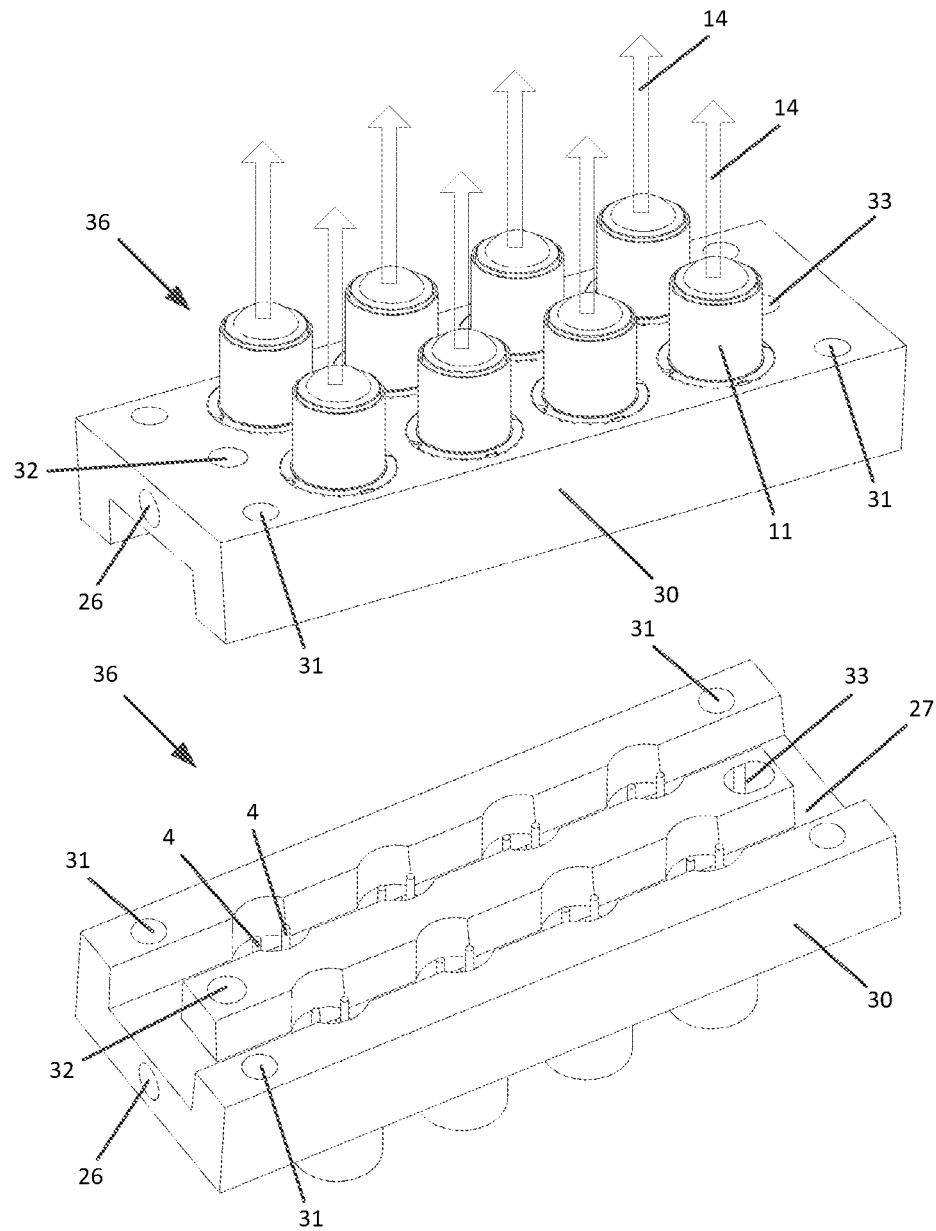

In some embodiments, the size of the diode laser module can be reduced by reducing the volume of the heat sink. For example, the heat sink 22 of the diode laser module 21 is optionally replaced with a heat sink 30, as shown in FIG. 11. FIG. 11 is a structural schematic view of a heat sink 30. FIG. 12 is a structural schematic view of fitting between the heat sink 30 and diode lasers 11. Eight diode lasers 11 are mounted on the heat sink 30 to form a diode laser module 36, as shown in FIG. 12.

As shown in FIGS. 11 and 12, the upper surface of the heat sink 30 consists of a plurality of stepped through hole 34 for accommodating the diode lasers 11 (e.g., similar to stepped through holes 28 in FIGS. 7-10, arranged in two rows), a plurality of through hole 31 (e.g., similar to through holes 23 in FIGS. 7-10, located near the four corners of the upper surface of the heat sink 30), a through hole 32 and a through hole 33 (e.g., similar to through holes 24 and 25 in FIGS. 7-10).

One side surface of the heat sink 30 consists of a hole 26 (e.g., not a through hole).

The lower surface of the heat sink 30 consists of a rectangular groove 27 (e.g., similar to the rectangular groove 27 in FIGS. 7-10) that runs through all stepped through holes 34 and connects them together.

The pins 4 of the diode lasers 11 pass through the stepped through holes 34 to reach the lower surface of the heat sink 30; the metal base 9 of each diode laser 11 is in close contact with the step surface 35 of a respective one of the stepped through holes 34. The stepped through holes 24 are filled with a heat conducting filling material to achieve good heat conductivity, such that the heat produced during working of the diode lasers 11 is transferred to the heat sink 30 through the heat conducting filling material, and the heat conducting filling material may be a metal or non-metal material, such as heat conducting silicone grease and soldering tin.

The hear sink 30 has a similar structure as the heat sink 22, except that the height of the heat sink 30 is smaller than the height of the heat sink 30, and the upper portions of the through holes 34 is much shorter than the upper portions of the through holes 28. Similarly, the though holes 31, 32, and 33 are shallower than the through holes 23, 24, and 25, respectively. The pin arrangement and structural dimensions as shown in FIGS. 9 and 10 apply equally to the heat sink 22 and the heat sink 30, in accordance with some embodiments. As shown in FIG. 12, the upper portions of the diode lasers (e.g., the metal housing 12) protrudes partially or entirely above the top surface of the heat sink 30, and the metal base 9 of the diode lasers sits within the upper portions of the through holes 34. The diode laser module 36 functions the same way as the diode laser module 21, which will be not repetitively described herein.

Figure 13:
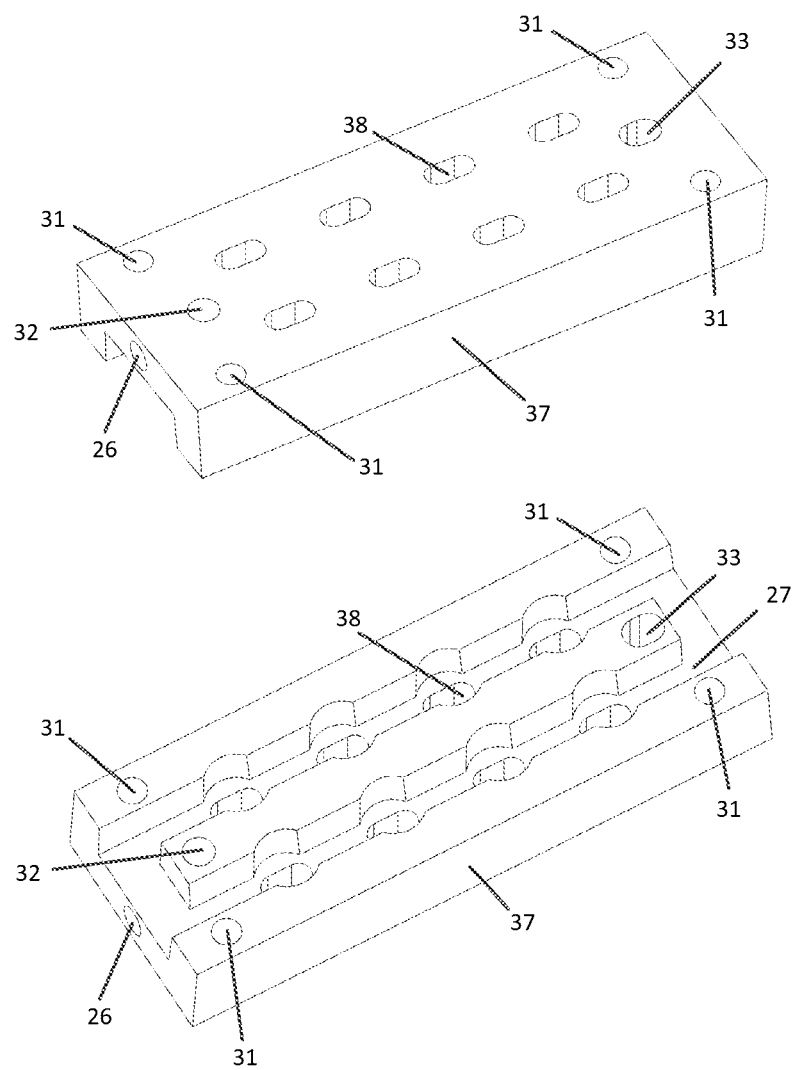

In some embodiments, the manufacturing process for making the diode lasers modules can be simplified by replacing the heat sink (e.g., heat sink 22 or 30) of the diode laser module (e.g., diode laser module 21 or 36) with the heat sink 37. FIG. 13 is a structural schematic view of a heat sink 37. The bottom surface of the heat sink 37 is identical to that of the heat sink 22 and 30. The top surface of the heat sink 37 is flat with through holes 38 replacing stepped through holes 28 or 34. The top portions of the through holes 38 are the same as the middle portions of the through holes 28 and 34. The lower portions of the through holes 38 are the same as the lower portions of the through holes 28 and 34.

Figure 14:
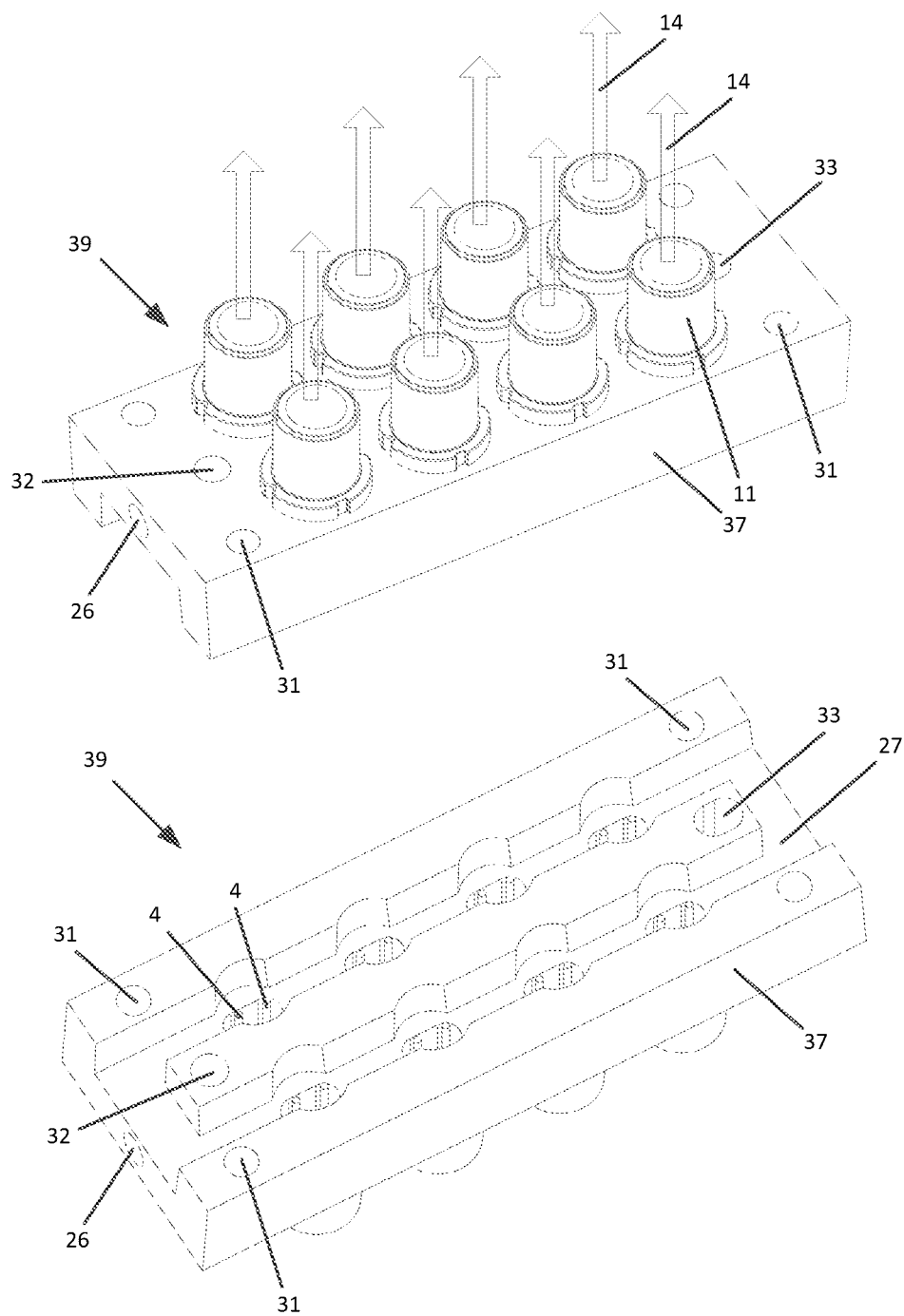

FIG. 14 is a structural schematic view of fitting between the heat sink 37 and the diode lasers 11. Eight diode lasers 11 are mounted on the heat sink 37 to form a diode laser module 39, as shown in FIG. 14.

The upper surface of the heat sink 37 consists of a plurality of through holes 38 for storing the diode lasers 11, a plurality of through hole 31, a through hole 32 and a through hole 33. One side surface of the heat sink 37 consists of a hole 26. The lower surface of the heat sink 37 consists of a rectangular groove 27 that runs through all stepped through holes 38 and connects them together.

The pins 4 of the diode laser 11 pass through the stepped through holes 38 to reach the lower surface of the heat sink 37. The metal base 9 of the diode laser 11 is in close contact with the upper surface of the heat sink 37. In FIG. 14, the metal housing 12 and the entire metal base 9 are above the top surface of the heat sink 37. The bottom surface of the metal base 9 is in close thermal contact with the top surface of the heat sink 37. The through holes 38 (including its rims) are filled with a heat conducting filling material to achieve good heat conductivity, such that the heat produced during working of the diode lasers 11 is transferred to the heat sink 37 through the heat conducting filling material, and the heat conducting filling material may be a metal or non-metal material, such as heat conducting silicone grease and soldering tin.

The principle of the diode laser module 39 is the same as that of the diode laser module 21, which will be not repetitively described herein.

Figure 15:
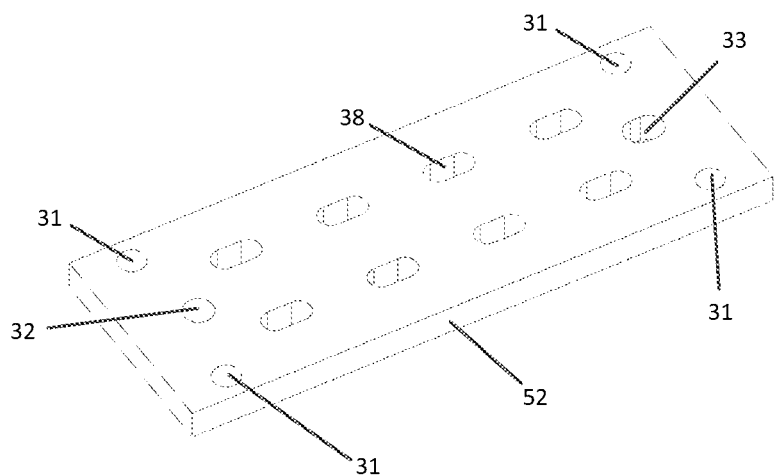
Figure 16:
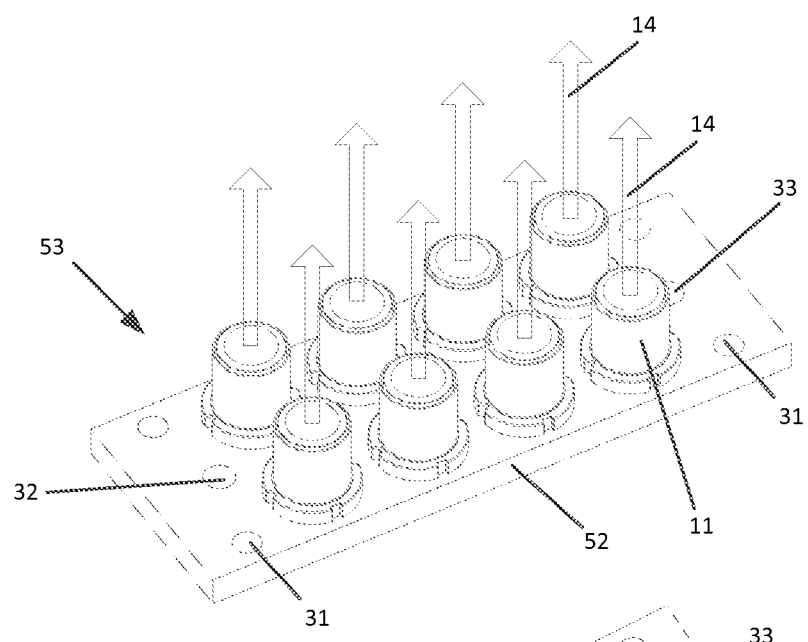
Figure 16:
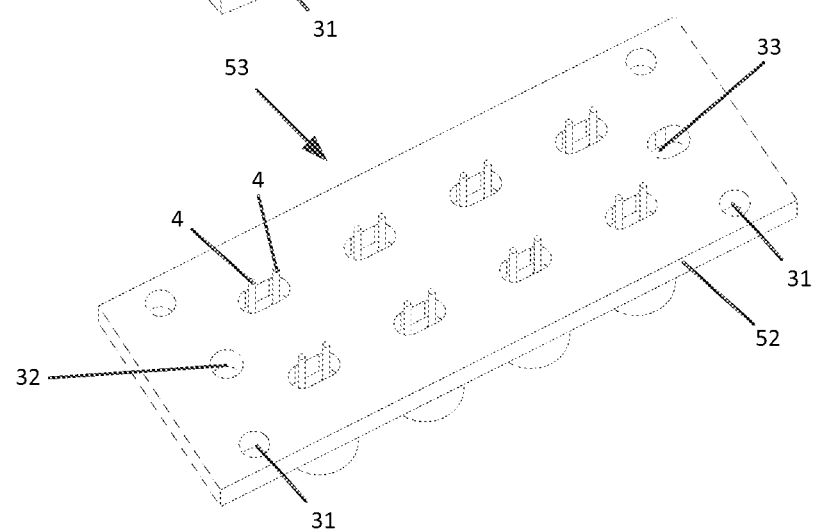

In some embodiments, further reduction in the size of the diode laser module can be achieved by further reducing the volume of the heat sink. For example, the heat sink (e.g., heat sink 22, 30, or 37) of the diode laser module (e.g., diode laser module 21, 36, or 39) is optionally replaced with the heat sink 52. FIG. 15 is a structural schematic view of the heat sink 52, in accordance with some embodiments. FIG. 16 is a structural schematic view of fitting between the heat sink 37 and diode lasers 11, in accordance with some embodiments. Eight diode lasers 11 are mounted on the heat sink 52 to form a diode laser module 53, as shown in FIG. 16.

The heat sink 52 includes a flat upper surface (e.g., without the upper portions of the through holes 28 or 34) and a flat lower surface (e.g., without the rectangular groove 27 and the lower portions of the through holes 28, 34, or 38). The upper surface of the heat sink 52 consists of a plurality of through hole 38 (e.g., without the bottom portions of the through holes 38 shown in FIG. 13), a plurality of through hole 31, a through hole 32 and a through hole 33.

The pins 4 of the diode lasers 11 pass through the through holes 38 (e.g., straight holes without any stepped surfaces) to reach the lower surface of the heat sink 52. In some embodiments, due to the small thickness of the heat sink 52, a portion of the pins 4 protrude beyond the bottom surface of the heat sink 52. The metal base 9 of each diode laser 11 is in close contact with the upper surface of the heat sink 52. The through holes 38 (including their rims) are filled with a heat conducting filling material to achieve good heat conductivity, such that the heat produced during working of the diode lasers 11 is transferred to the heat sink 52 through the heat conducting filling material, and the heat conducting filling material may be a metal or non-metal material, such as heat conducting silicone grease and soldering tin.

The principle of the diode laser module 53 is the same as that of the diode laser module 21, which will be not repetitively described herein.

Figure 17:
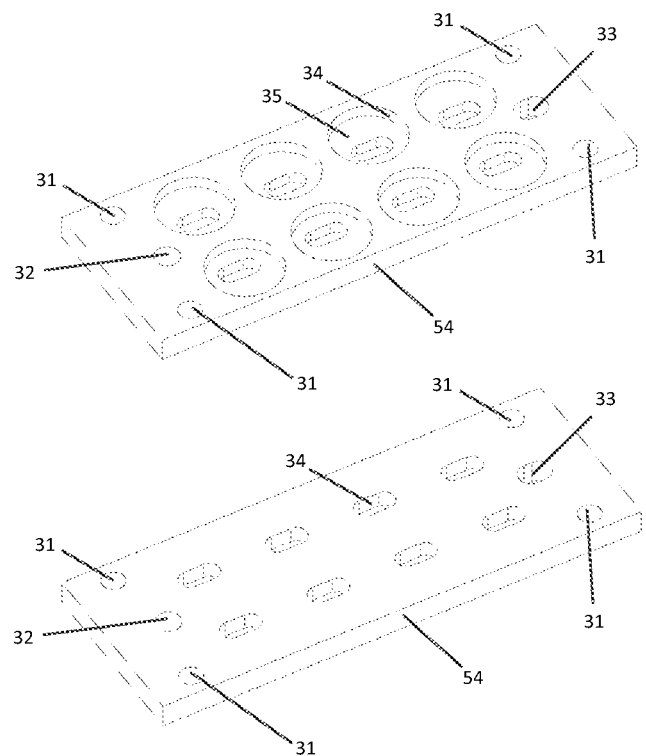
Figure 18:
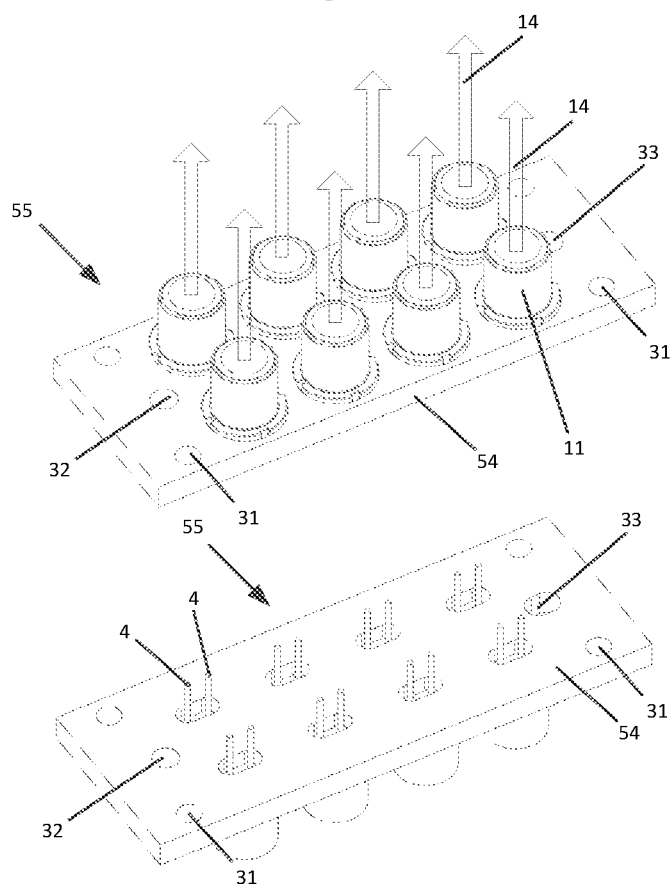
Figure 28:
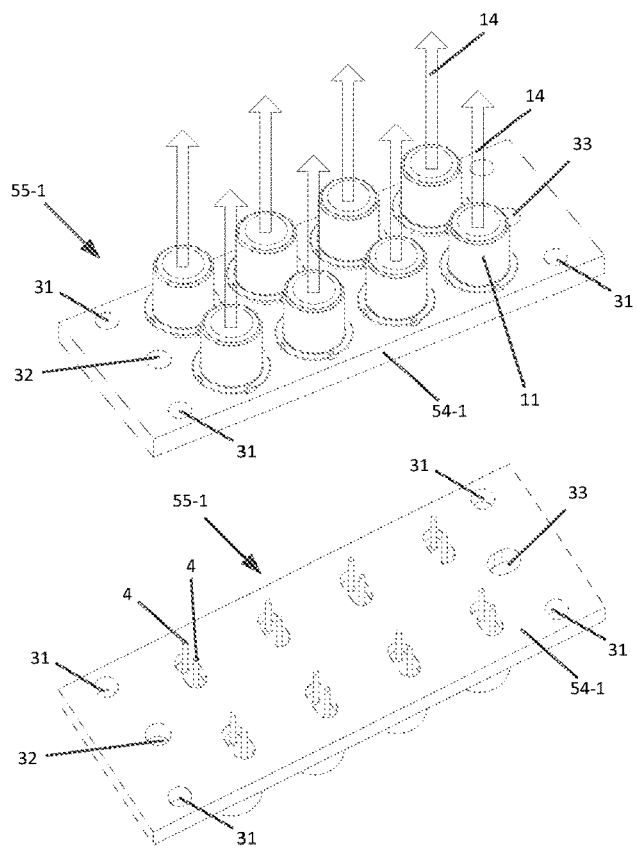

In some embodiments, it is more convenient to mount the diode lasers 11 in the diode laser module when a step in included in the through hole for accommodating the diode lasers. For example, the heat sink 52 of the diode laser module 53 can be replaced with the heat sink 54. FIG. 17 is a structural schematic view of the heat sink 54. FIG. 18 is a structural schematic view of fitting between the heat sink 54 and the diode lasers 11. Eight diode lasers 11 are mounted on the heat sink 54 to form a diode laser module 55, as shown in FIG. 28.

As shown in FIGS. 17 and 18, the upper surface of the heat sink 54 consists of a plurality of stepped through hole 34 (e.g., replacing through hole 38 in FIGS. 15 and 16), a through hole 31, a through hole 32 and a through hole 33 for storing the diode lasers 11.

The pins 4 of the diode laser 11 pass through the stepped through holes 34 to reach the lower surface of the heat sink 54; the metal base 9 of the diode laser 11 is in close contact with the step surfaces 35 of the stepped through holes 34, and is filled with a heat conducting filling material to achieve good heat conductivity, such that the heat produced during working of the diode laser 11 is transferred to the heat sink 54 through the heat conducting filling material, and the heat conducting filling material may be a metal or non-metal material, such as heat conducting silicone grease and soldering tin.

The principle of the diode laser module 55 is the same as that of the diode laser module 53, which will be not repetitively described herein.

Because the mounting position of the diode laser 11 relative to the heat sink can be rotated for 90°, the heat sink also needs to be modified to meet the mounting requirement and form a new diode laser module. FIGS. 19 through 27 illustrate heat sink modules with the through holes for accommodating the diode lasers rotated in accordance with the rotation needed for the laser diodes. In some embodiments, in the same laser diode module, some diode lasers are oriented differently from other diode lasers, and the corresponding through-holes for accommodating these diode lasers are also oriented differently.

Figure 19:
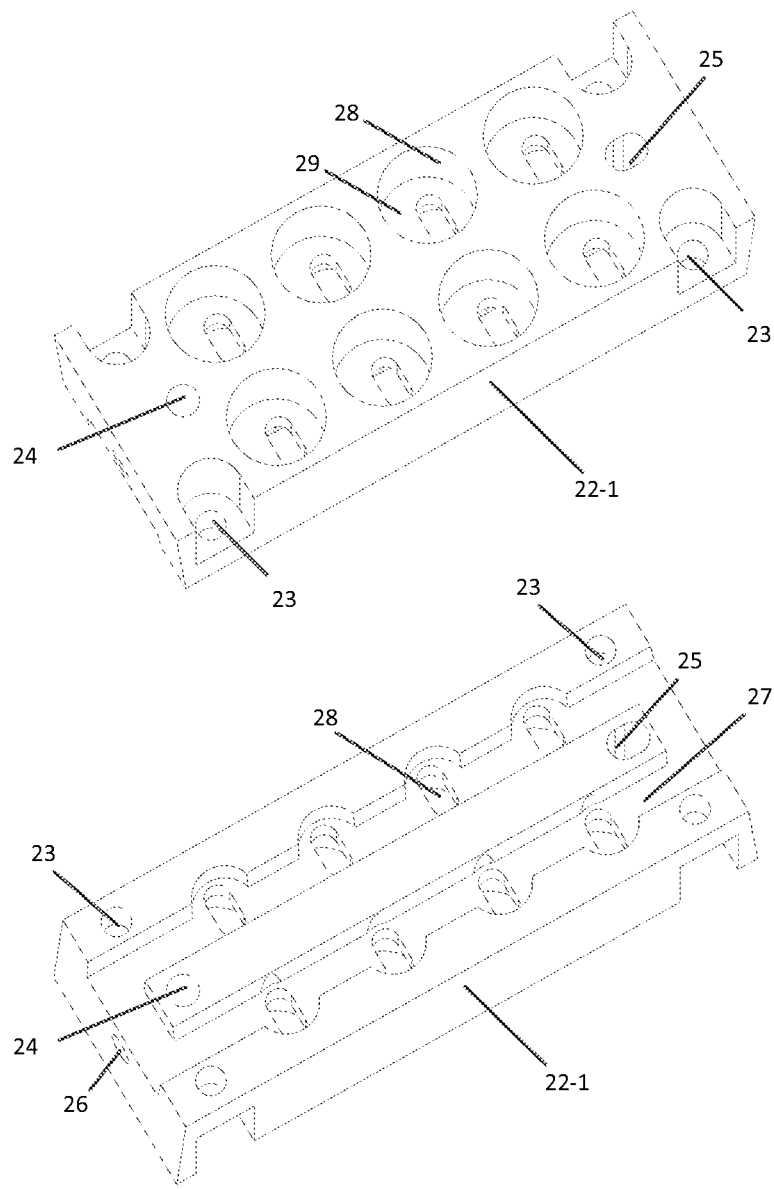

FIG. 19 is a structural schematic view of a heat sink 22-1. As shown in FIG. 14-5, the heat sink 22-1 is identical to the heat sink 22, except that the direction of the elongated middle portions of the stepped through holes 28 is rotated by 90 degrees such that the mounting requirement of the diode lasers after a 90 degree rotation can be met.

Figure 20:
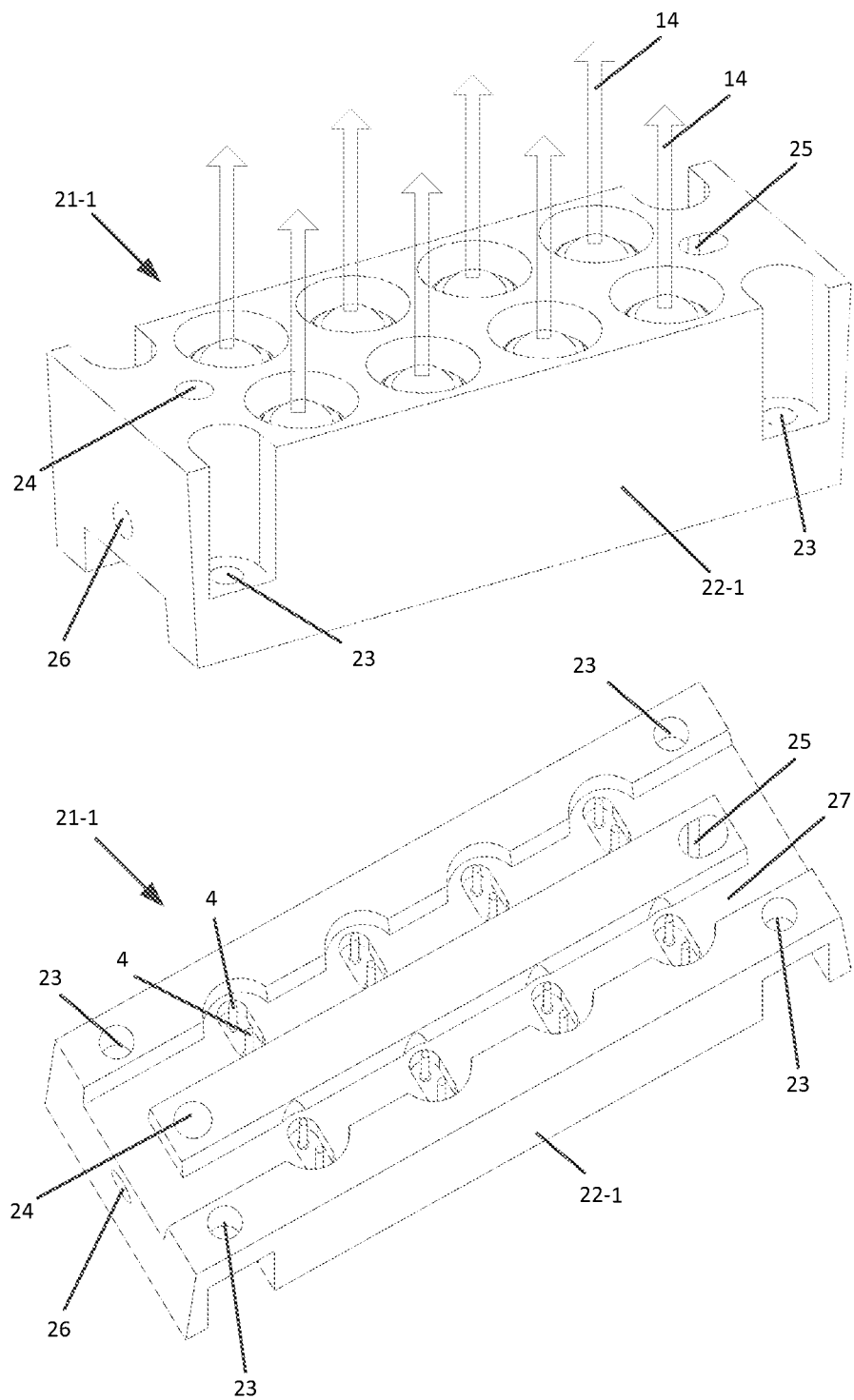

FIG. 20 is a structural schematic view of fitting between a heat sink 22-1 and a plurality of diode lasers 11. Eight diode lasers 11 are mounted on the heat sink 22-1 to form a diode laser module 21-1. The operating principle of the diode laser module 22-1 is the same as that of the diode laser module 22, which will be not repetitively described herein.

Figure 21:
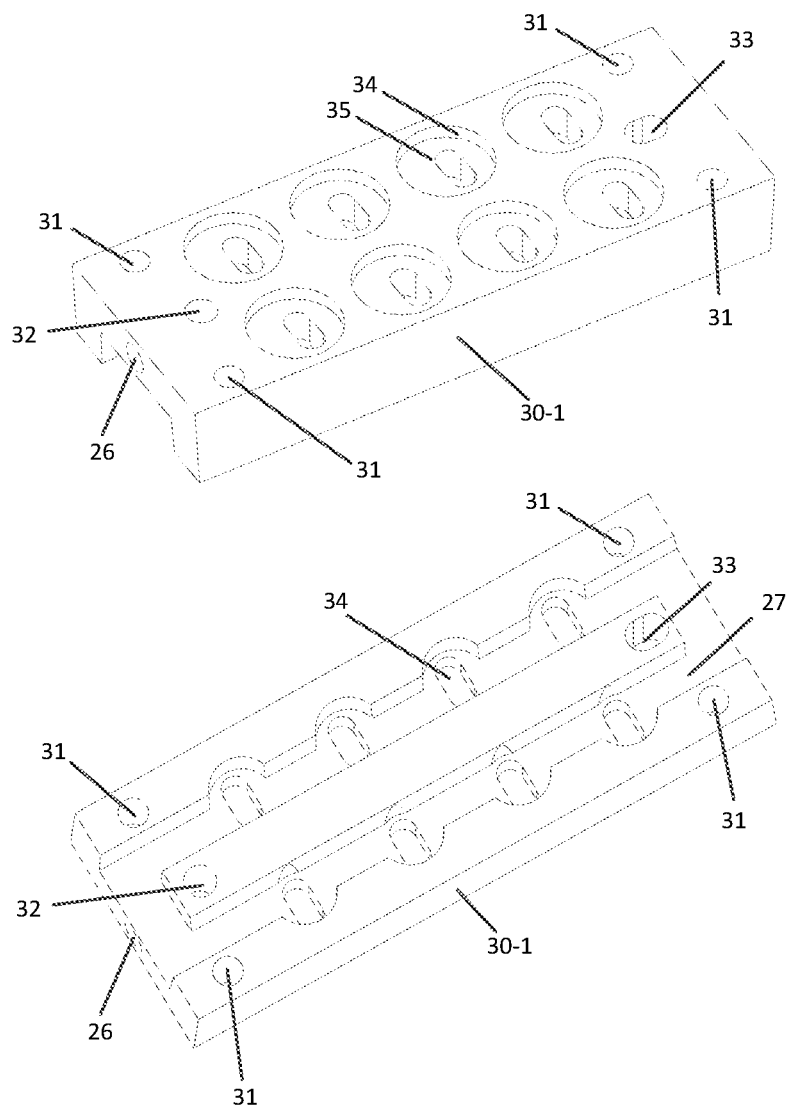

FIG. 21 is a structural schematic view of a heat sink 30-1. As shown in FIG. 14-7, the heat sink 30-1 is identical to the heat sink 30, except that the direction of the elongated middle portions of the stepped through holes 34 is rotated by 90 degrees such that the mounting requirement of the diode lasers after a 90 degree rotation can be met.

Figure 22:
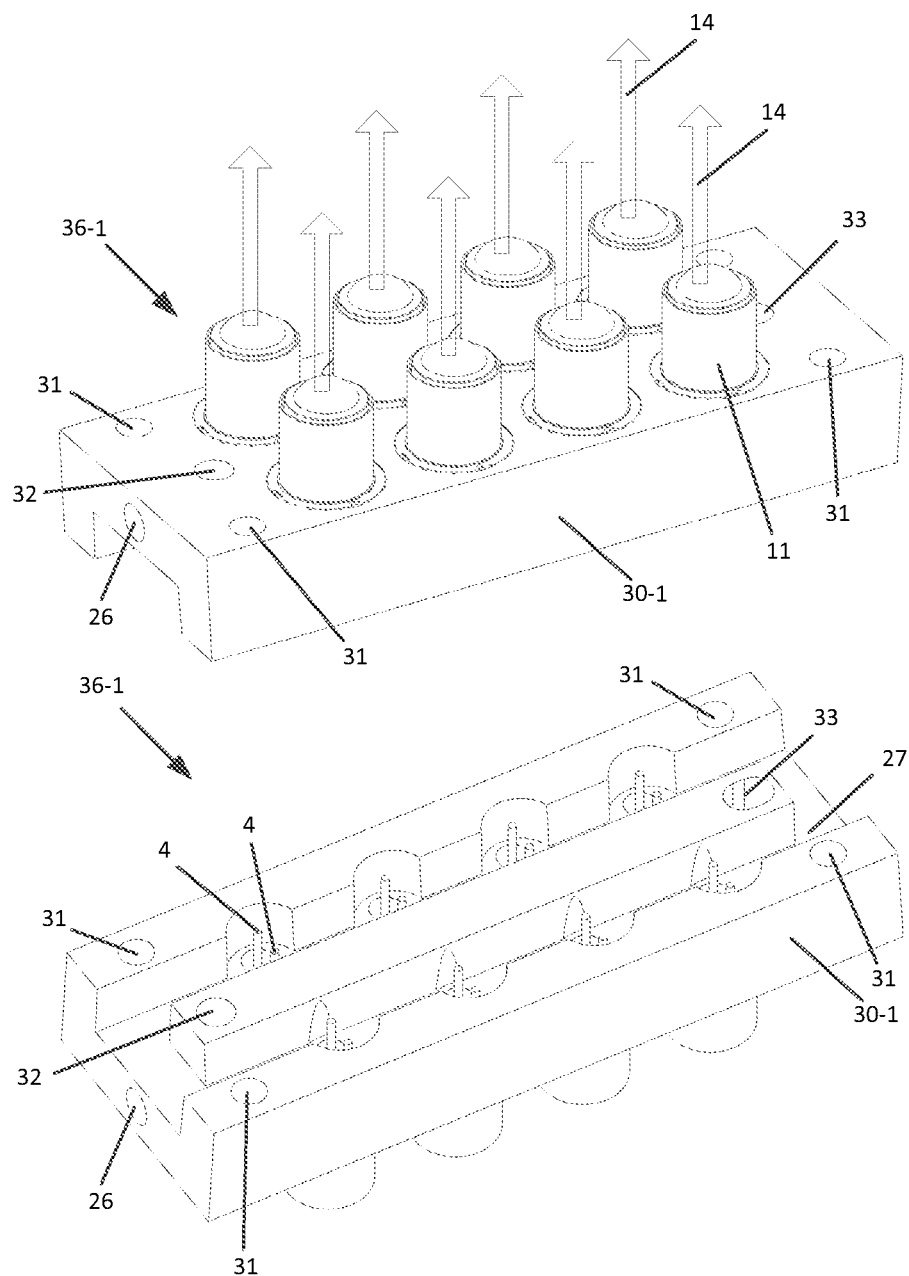

FIG. 22 is a structural schematic view of fitting between the heat sink 30-1 and the diode lasers 11. Eight diode lasers 11 are mounted on the heat sink 30-1 to form a diode laser module 36-1. The operating principle of the diode laser module 36-1 is the same as that of the diode laser module 36, which will be not repetitively described herein.

Figure 23:
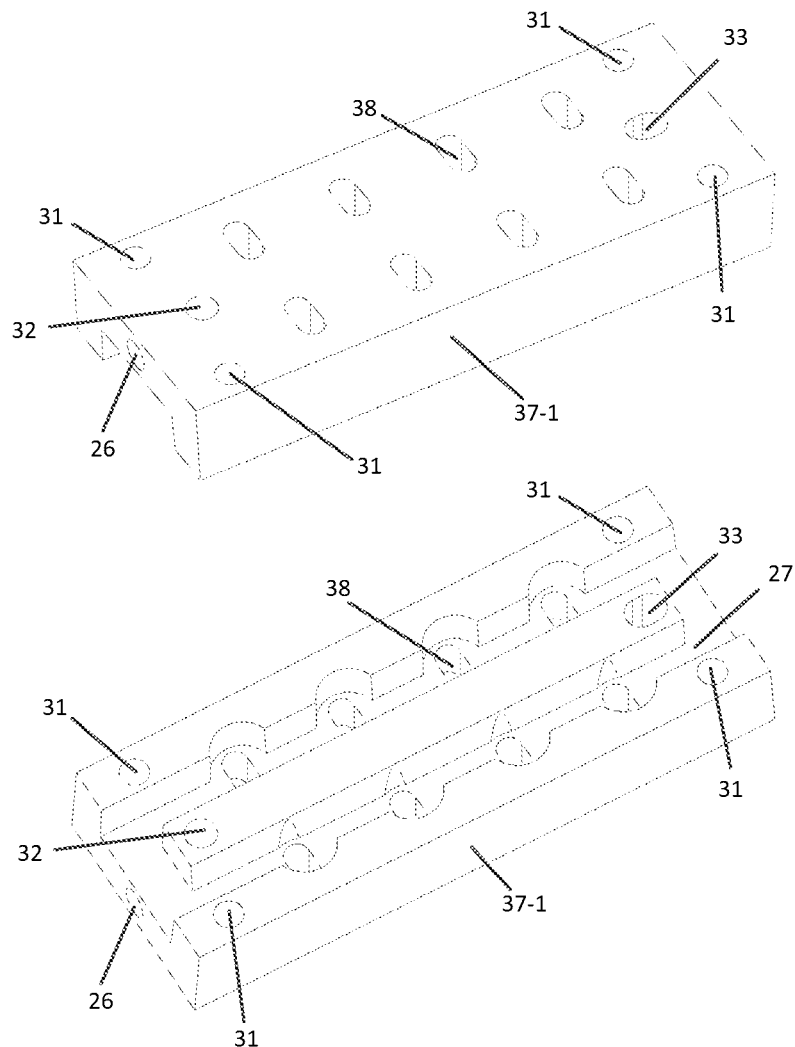

FIG. 23 is a structural schematic view of a heat sink 37-1. The heat sink 37-1 is identical to the heat sink 37, except that the direction of the through holes 38 is rotated by 90 degrees such that the mounting requirement of the diode lasers after a 90 degree rotation can be met.

Figure 24:
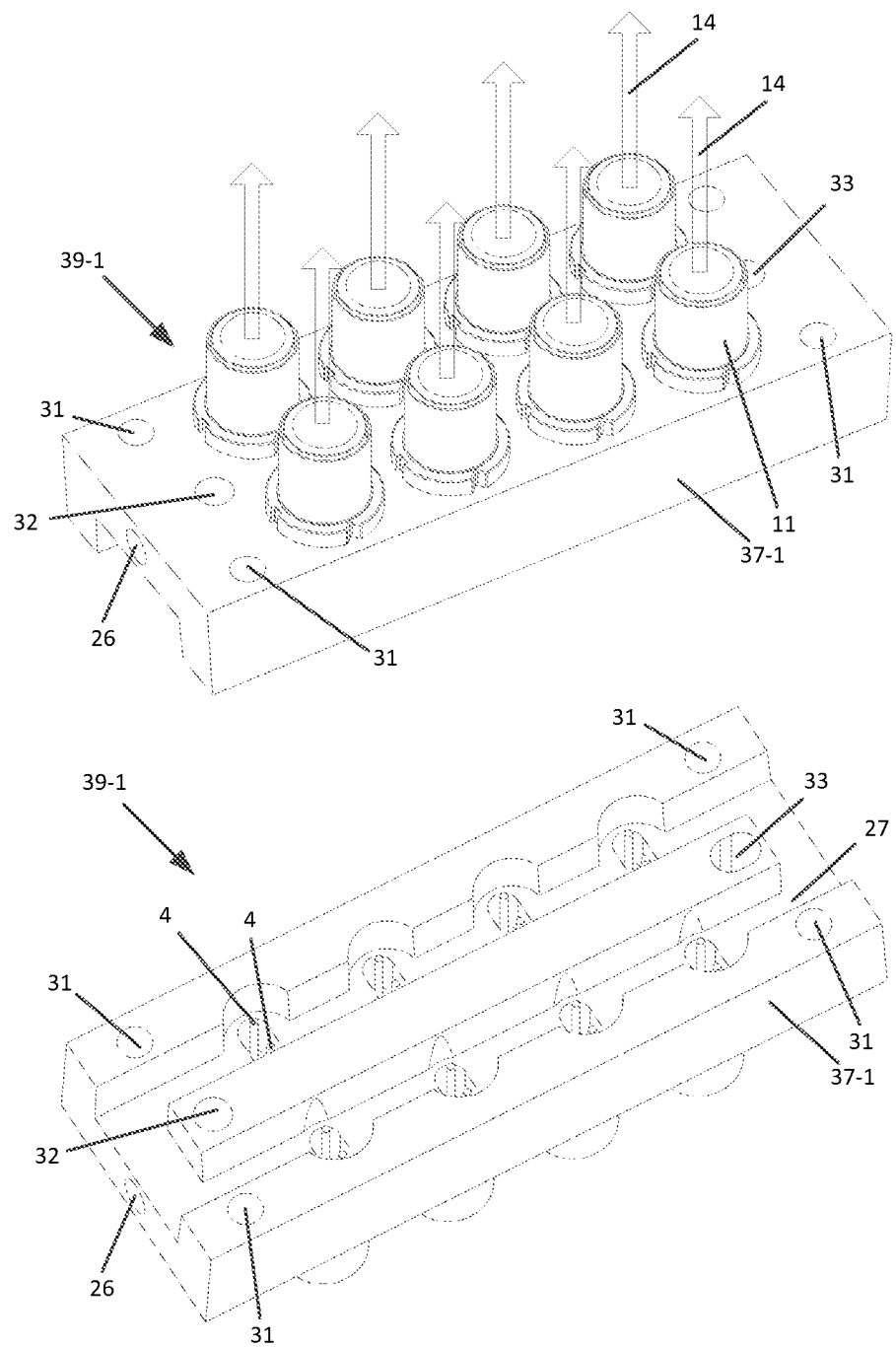

FIG. 24 is a structural schematic view of fitting between the heat sink 37-1 and the diode lasers. Eight diode lasers 11 are mounted on the heat sink 37-1 to form a diode laser module 39-1. The operating principle of the diode laser module 39-1 is the same as that of the diode laser module 39, which will be not repetitively described herein.

Figure 25:
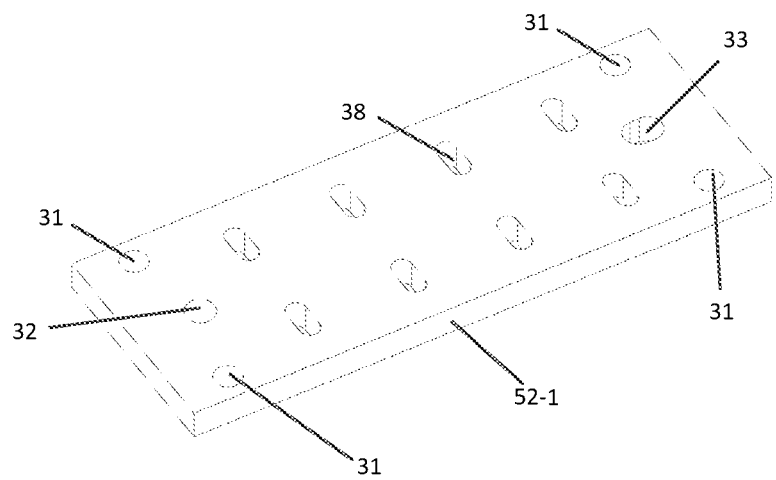

FIG. 25 is a structural schematic view of a heat sink 52-1. The heat sink 52-1 is identical to the heat sink 52, except that the direction of the through holes 38' is rotated by 90 degrees such that the mounting requirement of the diode lasers after a 90 degree rotation can be met.

Figure 26:
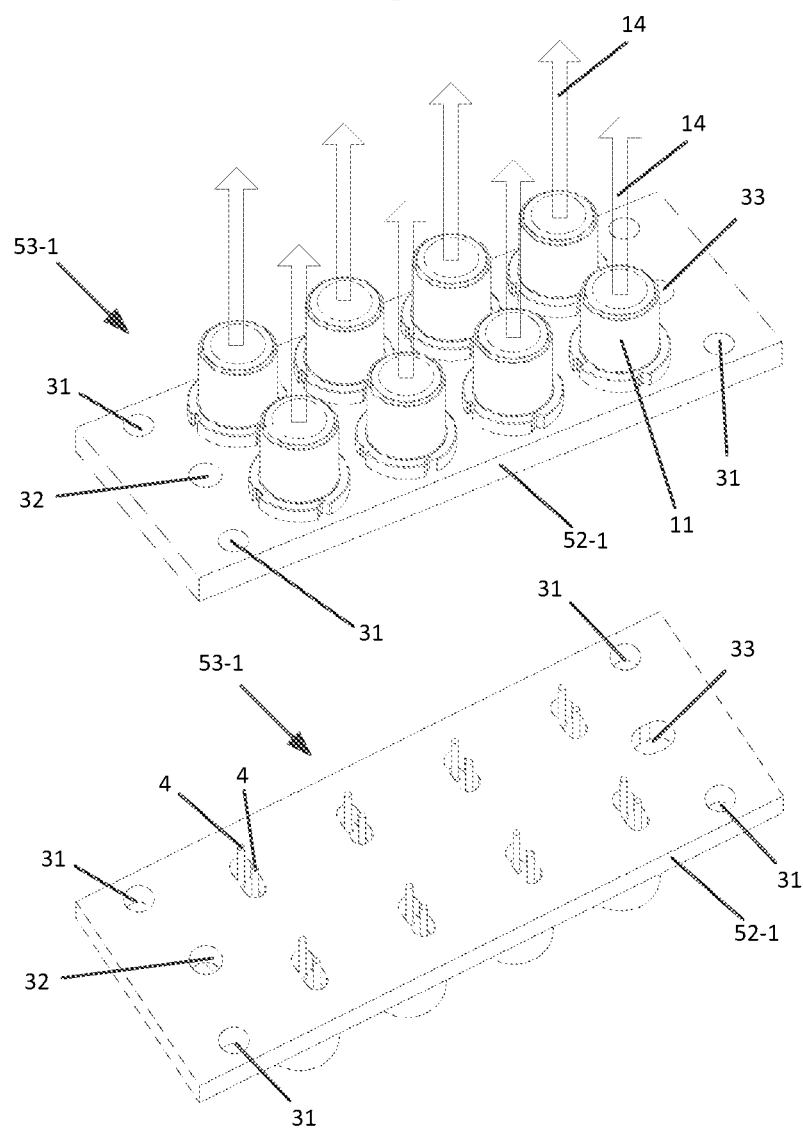

FIG. 26 is a structural schematic view of fitting between the heat sink 52-1 and the diode lasers 11. Eight diode lasers 11 are mounted on the heat sink 52-1 to form a diode laser module 53-1. The operating principle of the diode laser module 53-1 is the same as that of the diode laser module 53, which will be not repetitively described herein.

Figure 27:
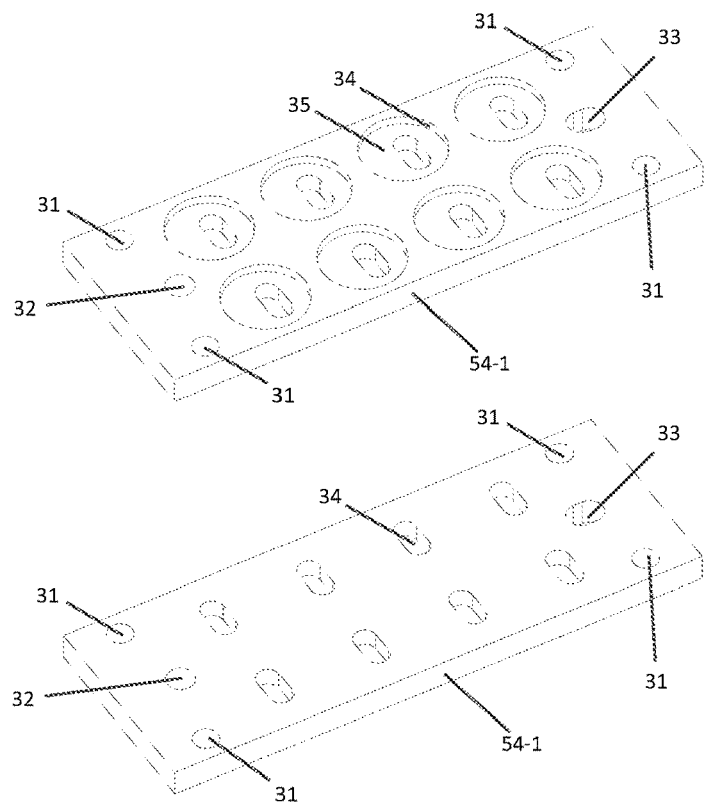

FIG. 27 is a structural schematic view of a heat sink 54-1. The heat sink 54-1 is identical to the heat sink 54, except that the direction of the stepped through holes 34' is rotated by 90 degrees such that the mounting requirement of the diode laser after a 90 degree rotation can be met.

FIG. 28 is a structural schematic view of fitting between the heat sink 54-1 and the diode lasers. Eight diode lasers 11 are mounted on the heat sink 54-1 to form a diode laser module 55-1. The operating principle of the diode laser module 55-1 is the same as that of the diode laser module 55, which will be not repetitively described herein.

In some embodiments, a diode laser includes multiple diode laser chips in the same packaging. The multichip direct packaging diode lasers are able to produce laser beams of asymmetric shapes, or multiple laser beams with predefined arrangements. FIGS. 29-37 illustrate example diode lasers that have multiple diode laser chips. In FIGS. 29-37, the diode laser 43, diode laser 46, diode laser 48, diode laser 50, and diode laser 51 may each be replaced with any one of the diode laser 1, diode laser 8, diode laser 11, diode laser 15, diode laser 16, and diode laser 17 in a respective diode laser module, in accordance with some embodiments.

Figure 29:
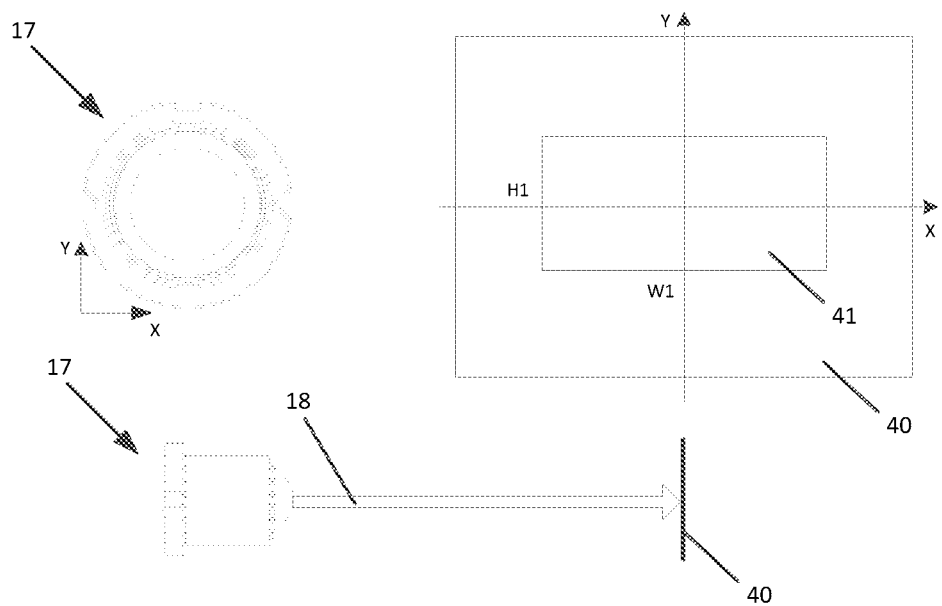
FIGS. 29-38 illustrate example diode lasers with collimating lenses, directly or indirectly packaged with the diode lasers, in accordance with various embodiments.

In some embodiments, a diode laser includes multiple diode laser chips and a collimating lens and does not include a flat output window piece. The diode laser produces a single beam. FIG. 29 respectively illustrates a front view and a side view of such a diode laser (e.g., a diode laser 17), and a view of a spot 41 illuminating a plane 40. As shown in FIG. 29, the collimated laser beam 18 output by the diode laser 17 reaches a plane 40, the light spot 41 (shadow area) is produced on its surface, with the width of W1, the height of H1. The width W1 and height H1 vary with the distance between the plane 40 and the diode laser 17.

In some embodiments, a diode laser includes a plurality of diode laser chips and a collimating lens and does not include a flat output window piece. The collimating lens is used to enable a plurality of laser beams emitted by a plurality of diode laser chips to converge to form a collimated laser beam. The divergence angle of the beam is large, which is not conducive to the use in an array formed by the plurality of diode lasers.

In order to make the diode lasers with the plurality of diode laser chips better used in the array, one collimating lens is used to collimate the plurality of laser beams emitted by the plurality diode laser chips, to obtain a plurality of laser beams with smaller divergence angle.

Figure 30:
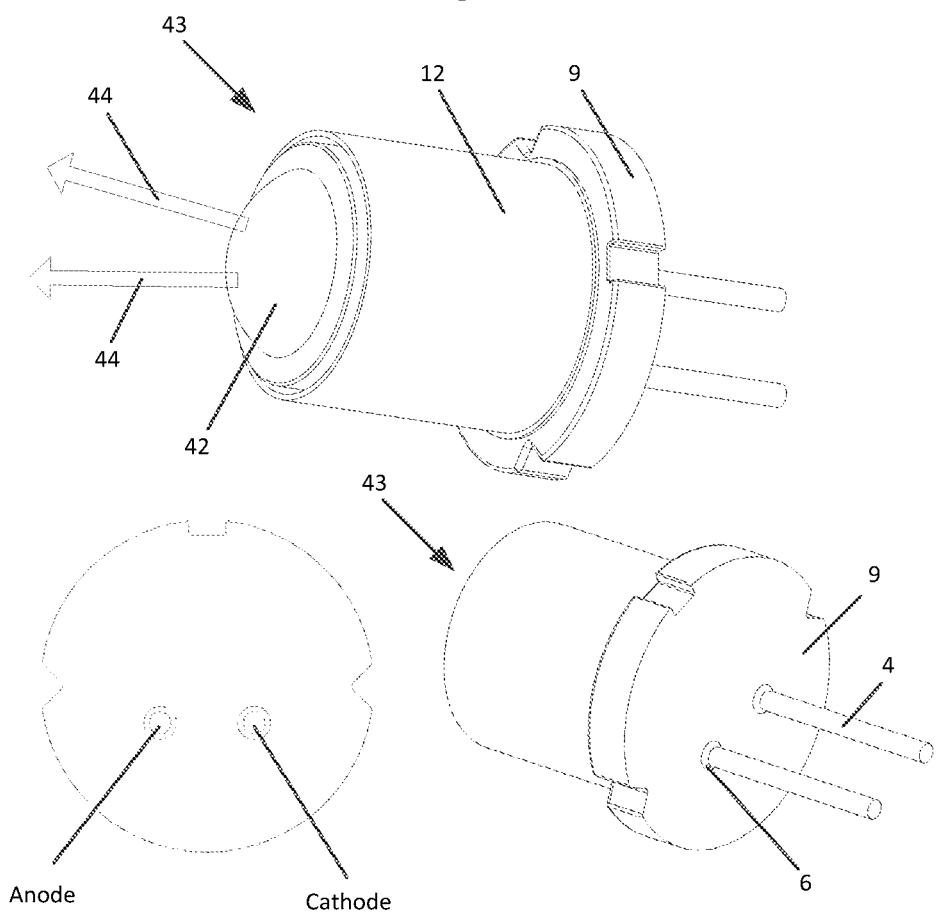
Figure 32:
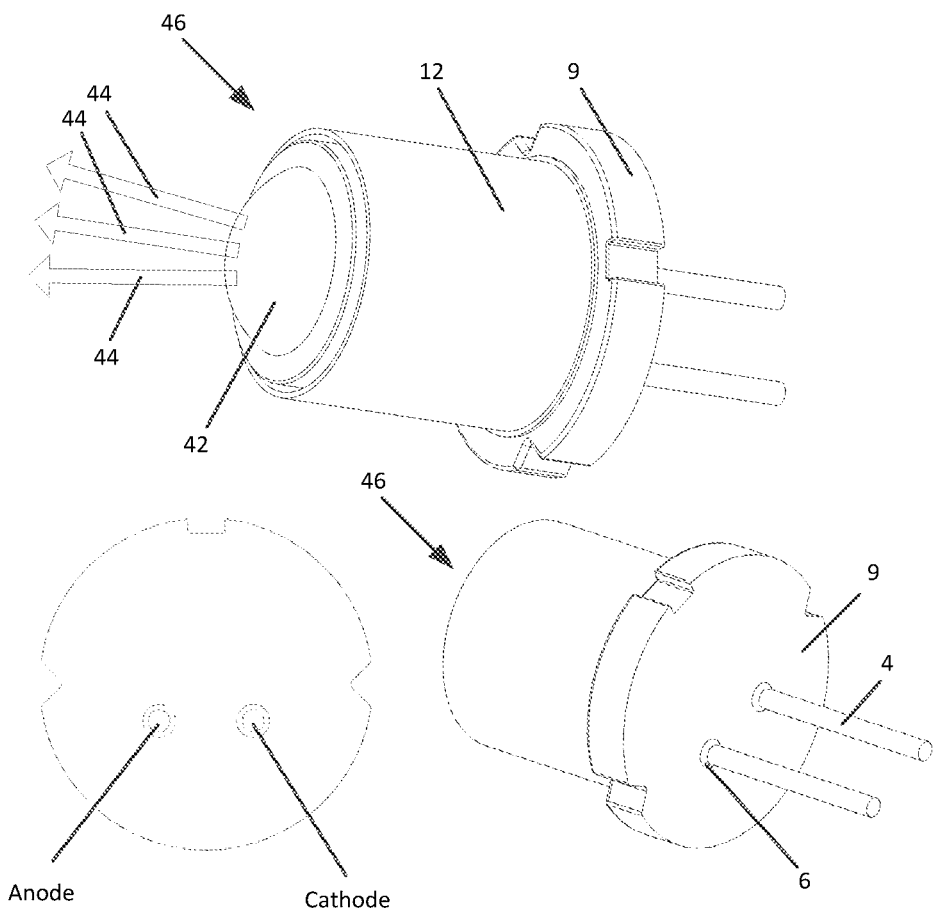

FIGS. 30 and 32 are respective schematic views of a collimating lens 42 packaged in a diode laser 43 or a diode laser 46, in accordance with some embodiments. The metal housings 10 of the diode laser 15 and the diode laser 16 are replaced with metal housings 12, and the flat output window pieces 5 are replaced with collimating lenses 42 to form the diode laser 43 and the diode laser 46, respectively.

The metal housing 12, the collimating lens 42 and the metal base 9 form a closed space for protecting the diode laser chips.

Two diode laser chips in the diode laser 43 each emit one laser beam which passes through the collimating lens 42 to form two collimated laser beams 44 with similar divergence angle, which leave the diode laser 43. There is a certain angle between the two collimated laser beams 44, as shown in FIG. 30.

Figure 31:
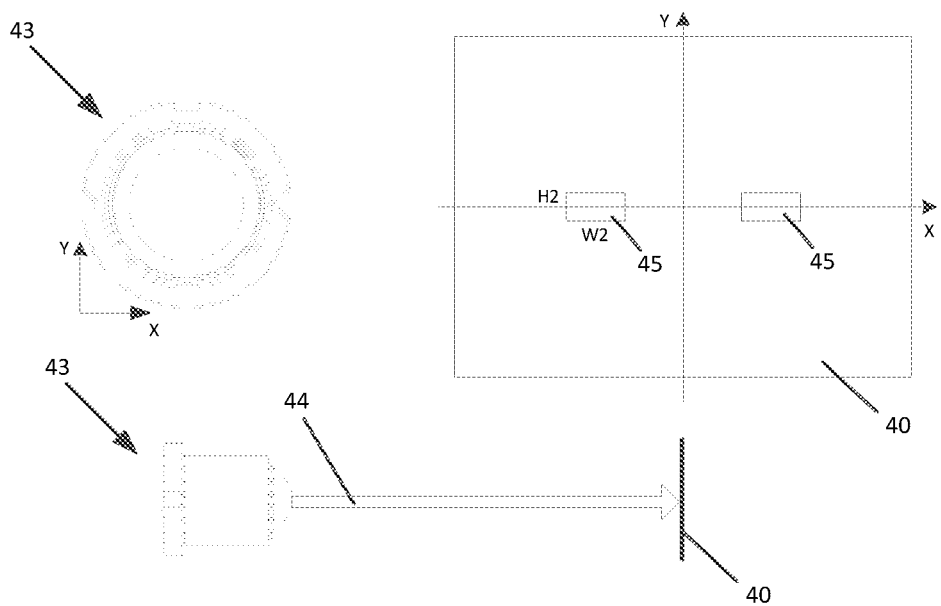

FIG. 31 respectively illustrates front view and a side view of the diode laser 43 and a view of spots 45 illuminating a plane 40. As shown in FIG. 31, two collimated laser beams 44 output by the diode laser 43 reaches the plane 40, and two light spots 45 (shadow area) are produced on its surface, with the width of W2, the height of H2. The width W2, height H2, and the distance between the two light spots 45 vary with the distance between the plane 40 and the diode laser 43.

FIG. 32 is a schematic view of the diode laser 46. Three diode laser chips are included in the diode laser 46, and each emits one laser beam which passes through the collimating lens 42 to form three collimated laser beams 44 with similar divergence angle when leaving the diode laser 46. There is a certain angle between the three collimated laser beams 44, as shown in FIG. 32.

Figure 33:
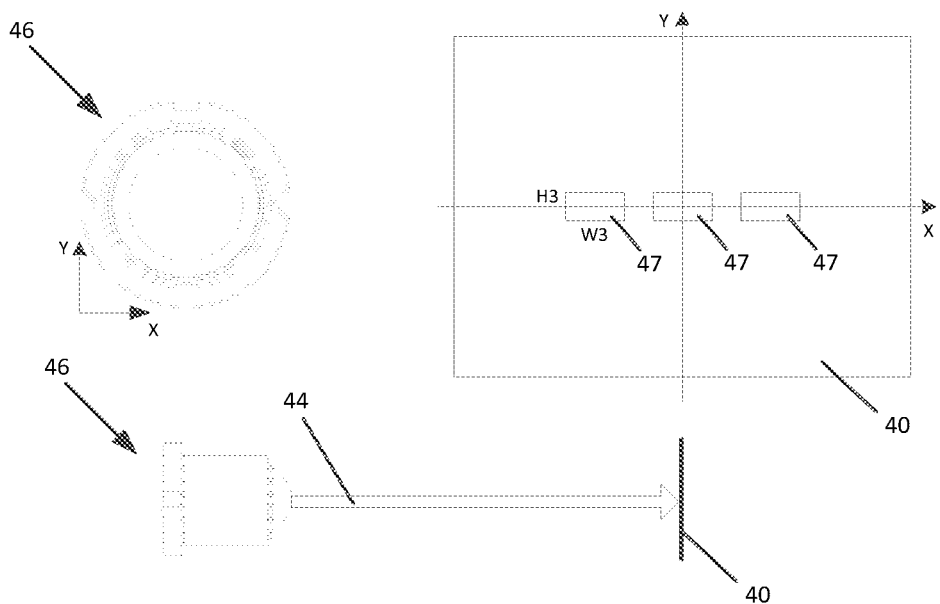

FIG. 33 respectively illustrates a front view and a side view of the diode laser 46 and a view of three spots 47 illuminating the plane 40. As shown in FIG. 33, three collimated laser beams 44 output by the diode laser 46 reaches the plane 40, and three light spots 47 (shadow area) are produced on its surface, with the width of W3 and the height of H3. The width W3, the height H3, and the distances between the three light spots 47 vary with the distance between the plane 40 and the diode laser 46.

For the diode laser 43 and the diode laser 46, the diode laser chips and the collimating lens 42 are packaged as a whole in the same metal housing. In some embodiments, the collimating lens is not included in the same packing as the diode laser chips, and instead is placed in front of the flat output window of the diode laser (e.g., with an air gap between the flat output window of the diode laser and the collimating lens). For example, sometimes, in order to ensure that the diode lasers can be used in an array and achieve the same optical performance, the collimating lens 42 may be used in combination with the diode laser 15 and the diode laser 16 to replace the diode laser 43 and the diode laser 46, respectively.

Figure 34:
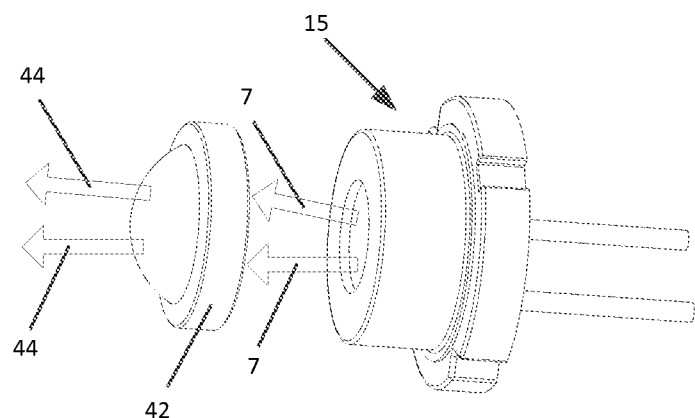

FIG. 34 is a schematic view of a combination of a diode laser 15 with a flat output window piece and a separate collimating lens 42, in accordance with some embodiments. As shown in FIG. 34, in the propagation direction of the laser beams 7 emitted by the diode laser 15, the collimating lens 42 is placed, and the two laser beams 7 are collimated through the collimating lens 42 respectively to form two collimated laser beams 44 with a smaller divergence angle (e.g., as compared to the divergence angle between the laser beams 7). When the beams 44 illuminate the plane 40, two light spots 45 with the same optical performance as the diode laser 43 (e.g., as shown in FIG. 31) can be obtained, which will be not repetitively described herein.

Figure 35:
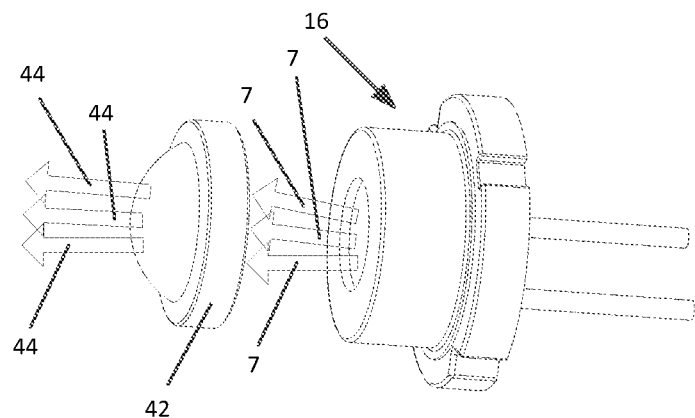

FIG. 35 is a schematic view of a combination of a diode laser 16 with a flat output window piece and a separate collimating lens 42, in accordance with some embodiments. As shown in FIG. 35, in the propagation direction of the laser beams 7 emitted by the diode laser 16, the collimating lens 42 is placed, and the three laser beams 7 are collimated through the collimating lens 42 respectively to form three collimated laser beams 44 with smaller divergence angles (e.g., as compared to the divergence angles of the laser beams 7). When the beams 44 illuminate the plane 40, three light spots 47 with the same optical performance as the diode laser 43 (as shown in FIG. 33) can be obtained, which will be not repetitively described herein.

In some embodiments, in order to protect the transmission optical path between the collimating lens 42 and the diode laser 15 or the diode laser 16, a metal housing may be added between them to achieve sealing of the optical path.

Figure 36:
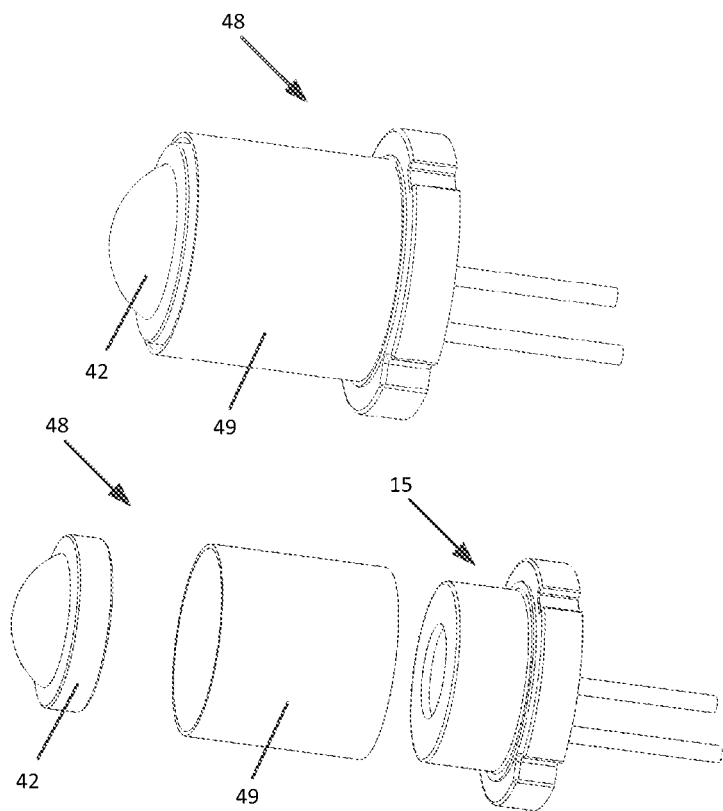

FIG. 36 is a schematic view of a combination of a diode laser 15, a metal housing 49 and a separate collimating lens 42. As shown in FIG. 36, the diode laser 48 consists of a diode laser 15, a metal housing 49 and a collimating lens 42. The inner diameter of the metal housing 49 is slightly greater than the outer diameter of the metal housing 10 of the diode laser, and the metal housing 49 is sleeved over the metal housing 10. The metal housing 49, the collimating lens 42 and the diode laser 15 form a closed space for protecting the transmission optical path (e.g., an air gap) between the collimating lens 42 and the flat output window piece of the diode laser 15.

Figure 37:
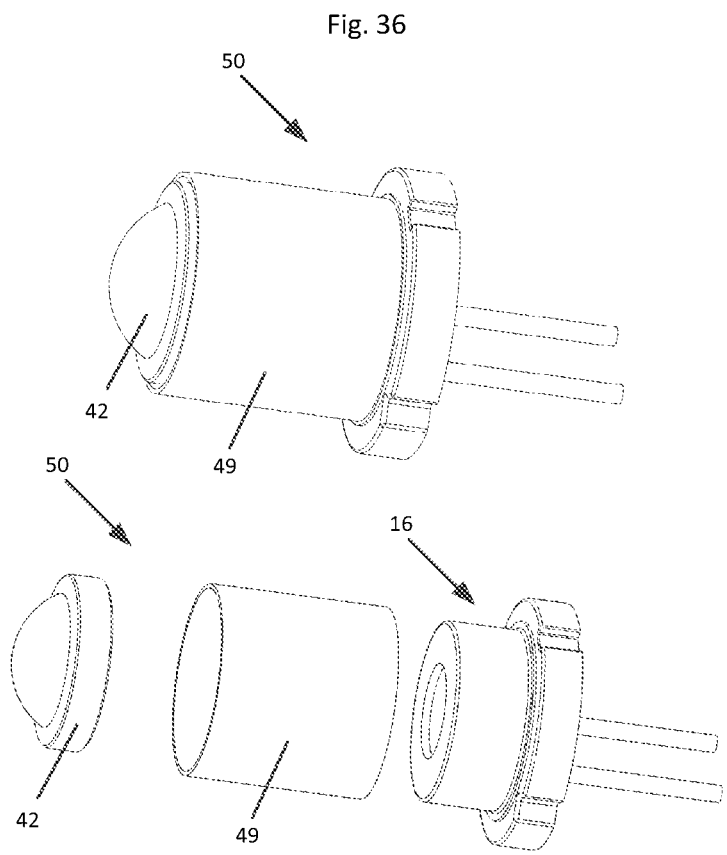

FIG. 37 is a schematic view of a combination of a diode laser 16, a metal housing 49 and a collimating lens 42. The metal housing 49 and the collimating lens 42 may also be used for the diode laser 16 to form the diode laser 50, which has the same structure as the diode laser 48, which will be not repetitively described herein.

In some embodiments, the indirect packaging method for adding a collimating lens 42 to form the diode laser 48 and the diode laser 50 are also suitable for a diode laser with a single diode laser chip.

Figure 38:
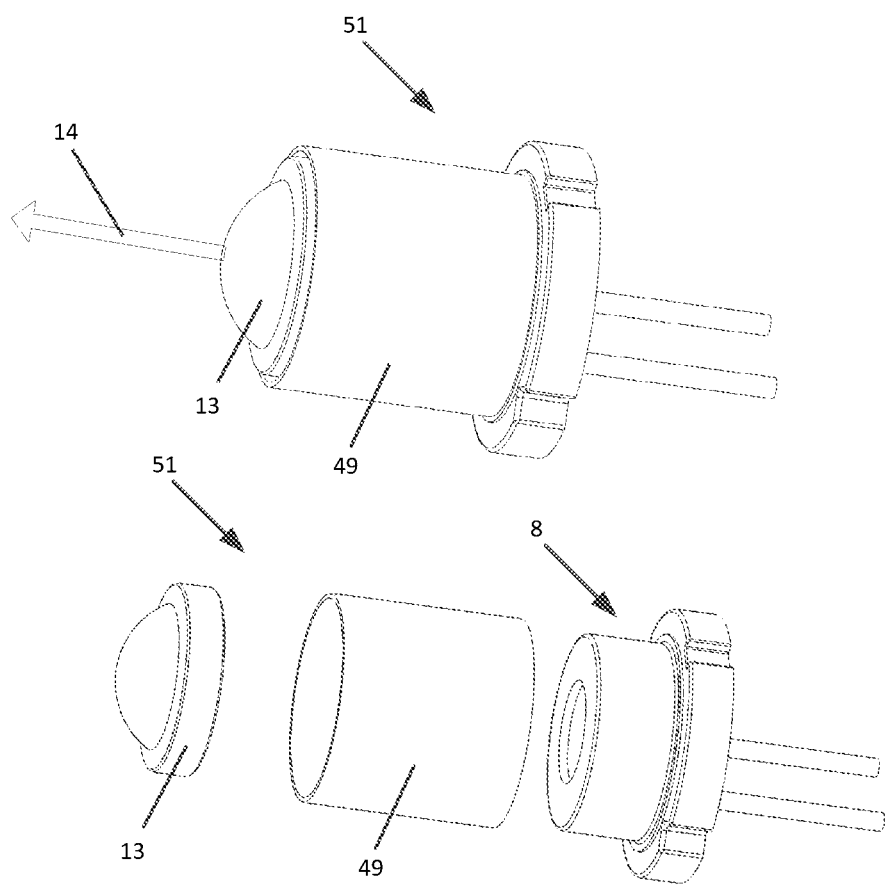

As shown in FIG. 38, the diode laser 51 consists of a diode laser 8, a metal housing 49 and a collimating lens 13, which has the same structure as the diode laser 48 and the diode laser 50, which will be not repetitively described herein.

The laser beam 14 emitted by the diode laser 51 has the same optical performance as the laser beam 14 emitted by the diode laser 11.

In some embodiments, a diode laser array module includes diode lasers (e.g., diode lasers 11 and other equivalents described above) residing in through holes (e.g., through-holes 38 and other equivalents described above) in a heat sink (e.g., heat sink 22 and other equivalents described above), and optionally other components such as a lens array module disposed on top of the heat sink, a cooling module disposed underneath the heat sink, and pin connectors, driving circuits, and insulating sleeves distributed in various peripheral or internal surfaces, recesses, channels, and/or through holes of the heat sink, lens array module, and/or cooling module. The following descriptions are a simplified description of part of the content of PCT Application No. PCT-CN 2016-098763, titled "System and Device with Laser Array Illumination", the content of which is incorporated herein in its entirety. The descriptions in the PCT Application "System and Device with Laser Array Illumination" refers to "diode laser 1" as an example, but the diode laser 8, diode laser 11, diode laser 15, diode laser 16, diode laser 17, diode laser 43, diode laser 46, diode laser 48, diode laser 50 and diode laser 51 described herein can replace the diode laser 1 in various embodiments described herein.

Figure 39:
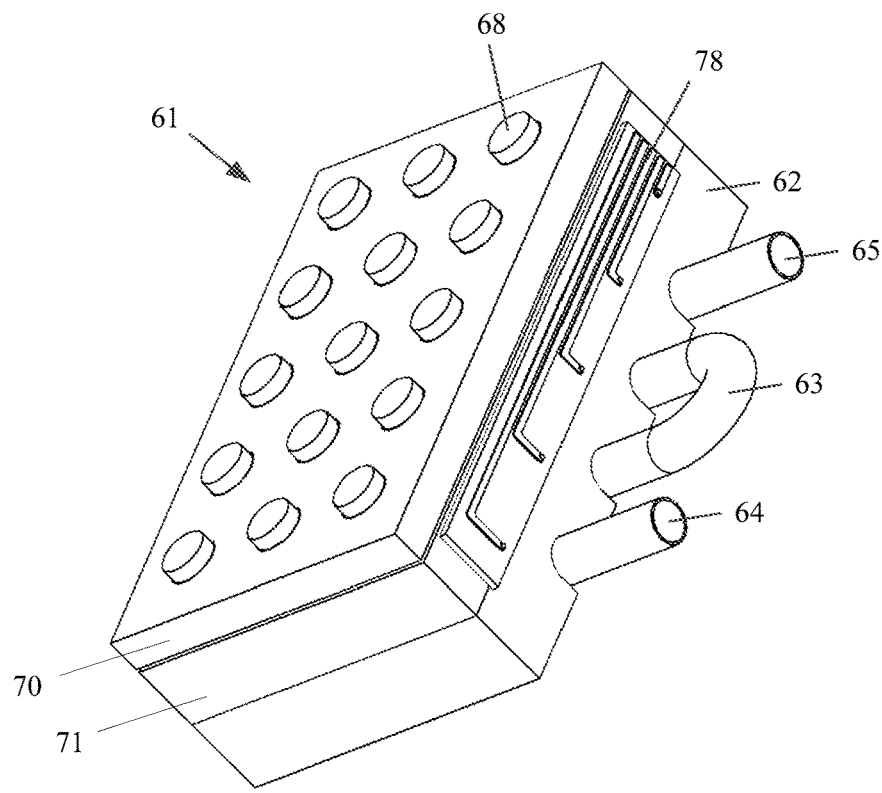
FIGS. 39-48 illustrate an example diode laser array module and components thereof, in accordance with some embodiments.
Figure 39:
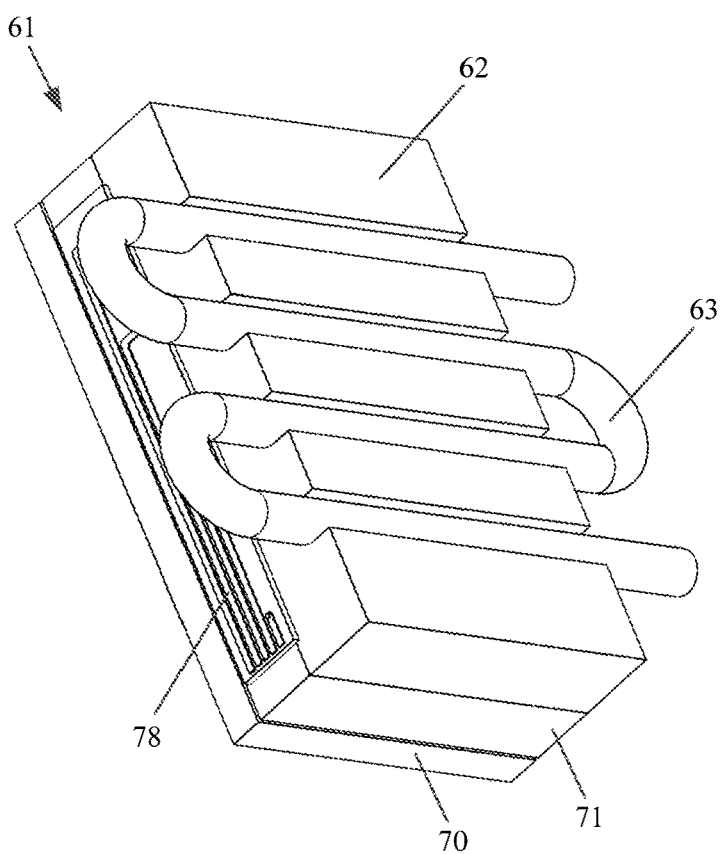
Figure 40:
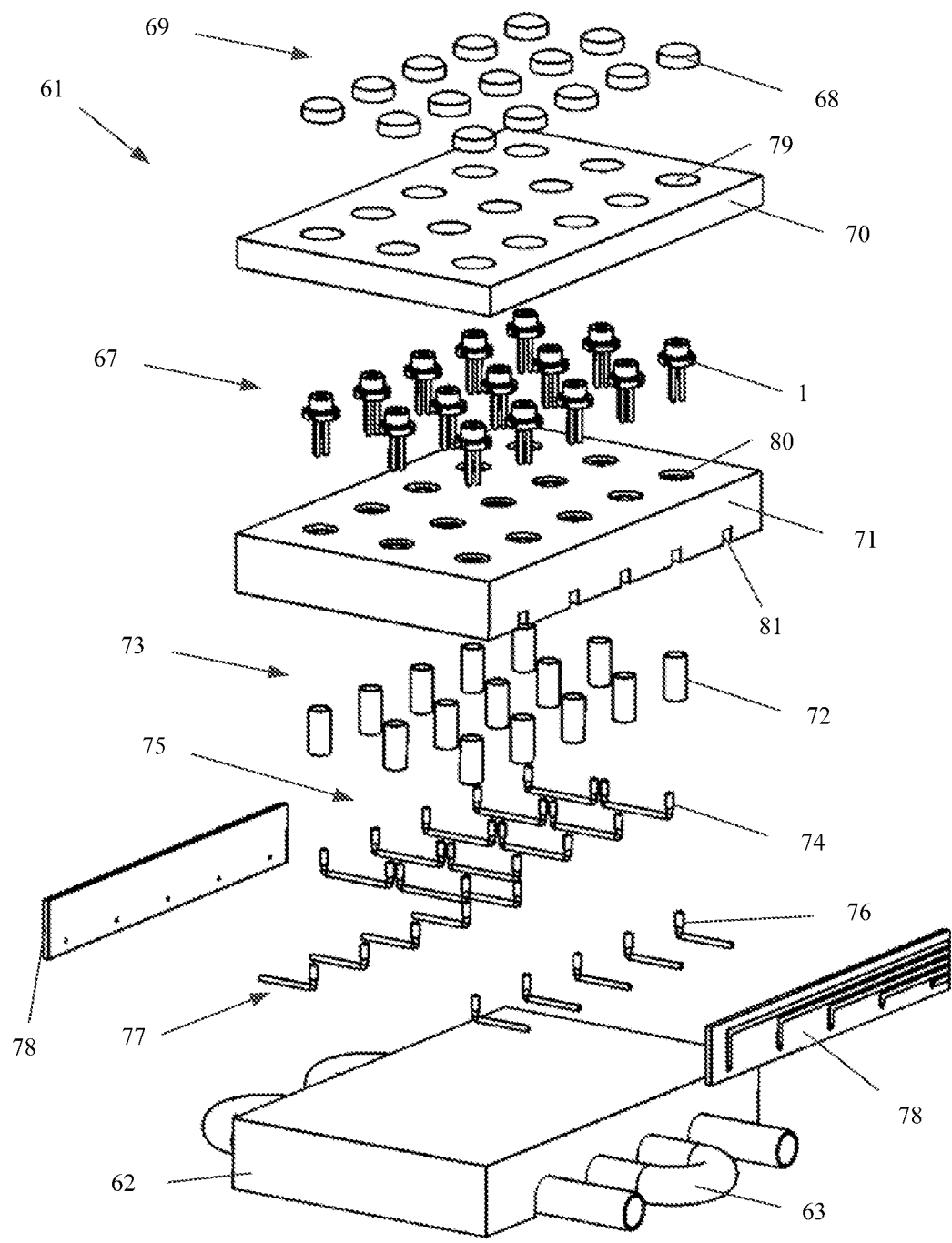

FIG. 39 is a schematic view of an exemplary diode laser array module 61, in accordance with some embodiments. FIG. 40 is a structural exploded schematic view of the diode laser array module 61 in accordance with some embodiments. As shown in FIGS. 39 and 40, the diode laser array module 61 includes a diode laser array 67 comprising a plurality of diode lasers 1, a lens array 69 including a plurality of lenses 68, a pressing plate module 70, a heat sink module 71, an insulating sleeve array 73 comprising a plurality insulating sleeves 72, a U-shaped pin connector array 75 comprising a plurality U-shaped pin connectors 74, an L-shaped pin connector array 77 comprising a plurality of L-shaped pin connectors 76, a driving circuit module 78 (e.g., one or more PCBs), and a cooling module (e.g., a liquid-cooled radiator module 62). The different components of the diode laser array module 61 fit together in accordance with the configuration shown in FIGS. 39 and 40, in accordance with some embodiments.

The heat produced during working of the diode lasers 1 is transferred to the cooling module (e.g., the liquid-cooled radiator 62) for cooling, and a cooling pipe 63 is embedded into the cooling module (e.g., the liquid-cooled radiator 62). Coolant flows in from one end 64 of the cooling pipe 63 and flows out from the other end 65. The coolant may be water, ethylene glycol, etc., in accordance with various embodiments.

FIGS. 41-48 illustrate individual components of the diode laser array module 61, in accordance with various embodiments.

Figure 41:
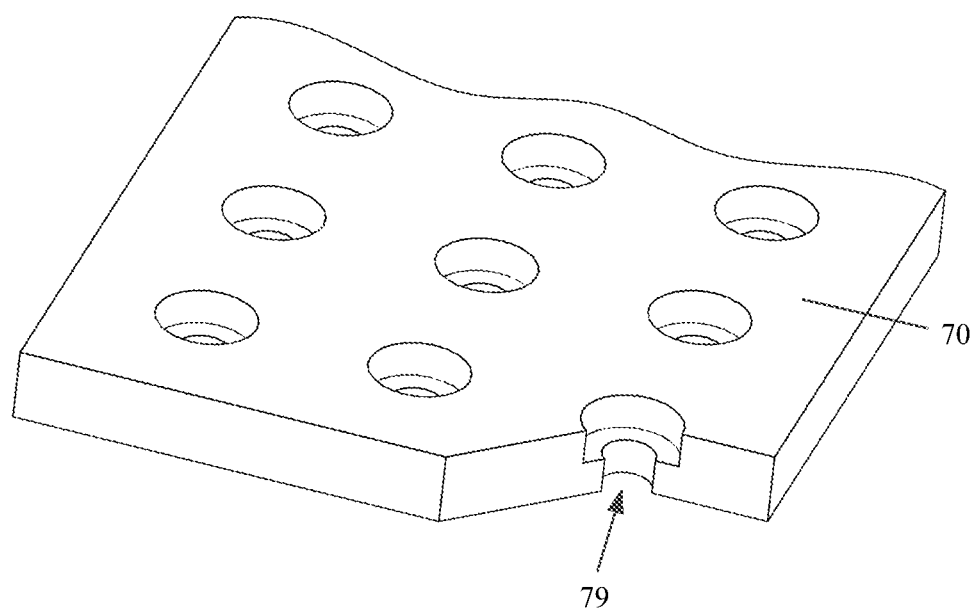

Specifically, FIG. 41 is a partial sectional view of the pressing plate module 70 shown in FIGS. 39 and 40. The pressing plate module 70 is a planar substrate comprising a plurality of stepped through holes 79 running through the upper surface and the lower surface of the planar substrate, and the plurality of stepped through holes 79 are arranged in an array that map to the array of through holes in the heat sink module 71 used to accommodate the diode lasers. In some embodiments, the stepped through holes 79 in the pressing plate module are straight through holes without the stepped surface within the holes.

As shown in FIG. 40, each stepped through hole 79 is used to fix one diode laser in the array of diode lasers 1 and one lens in the lens array 68. For example, in some embodiments, the radius of the lower portion of the stepped through hole 79 is smaller than the radius of the upper portion of the stepped through hole 79. In some embodiments, the radius of the upper portion of the stepped through hole 79 is slightly larger than the radius of the lens 68, such that the lens 68 sits within the upper portion of the stepped through hole 79 in the assembled diode laser array module 61 on top of the stepped surface in the stepped through hole 79. In some embodiments, the lens is affixed to the side wall and stepped surface of the stepped through hole 79 after alignment of the laser beams from multiple diode lasers is completely (e.g., glue is applied to the side wall and stepped surface first, and alignment adjustment is made before glue dies to affix the lens permanently). In some embodiments, the radius of the lower portion of the stepped through hole 79 is slightly greater than the radius of the metal housing (e.g., metal housing 10) of the diode laser (e.g., diode laser 1 or other equivalents), but smaller than the radius of the metal base of the diode laser (e.g., metal base 9), such that the pressing plate module 70 can be pressed against the upper surface of the heat sink when the stepped through holes are aligned with the stepped through holes in the heat sink module with the diode lasers already inserted. In some embodiments, the height of the lower portion of the stepped through holes 79 is the same or greater than the height of the metal housing 9 of the diode laser, such that an air gap is created between the lens 68 and the output window 5 of the diode laser. The laser beam 7 emitted by the diode laser 1 passes through the stepped through holes 79 to reach the lens 68. The lens 68 adjusts the divergence angle of the laser beam 7.

In some embodiments, when diode lasers with built-in lenses (e.g., diode laser 11, 17, diode laser 43, diode laser 46, diode laser 48, diode laser 50, and diode laser 51) are used, the lens array 69 may not be necessary for the diode laser array module 61. Instead, the pressing plate module optionally includes straight through holes to protect the extended metal housing (e.g., metal housing 12 or metal housing 49) of the diode lasers, and the diameter of the through holes are smaller than the diameter of the metal plate of the diode lasers, such that the lower surface of the pressing plate module presses against the metal base 9 of the diode lasers and the upper surface of the heat sink once the diode laser module is assembled.

Figure 42:
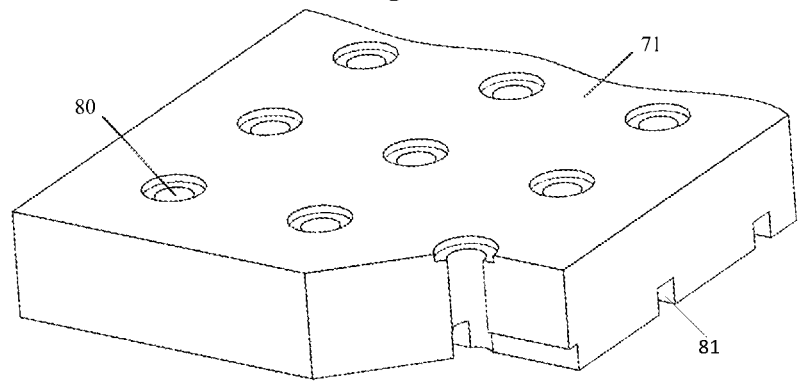
Figure 42:
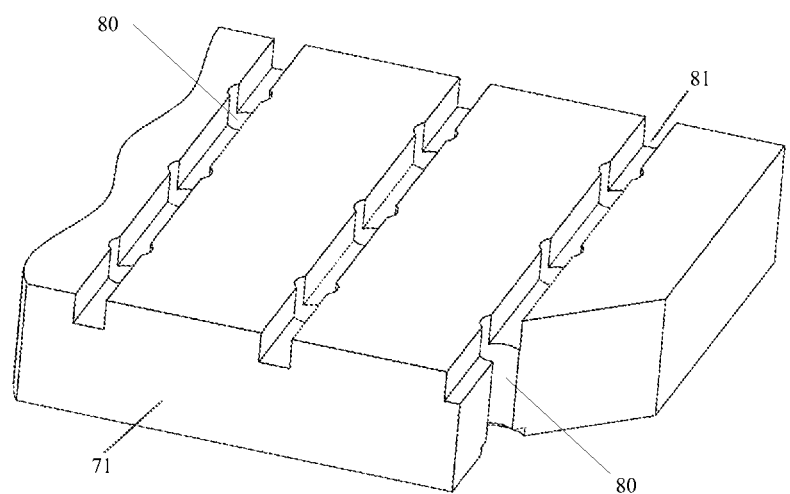

FIG. 42 is a partial sectional view of the heat sink module 71, in accordance with some embodiments. The top portion of FIG. 42 shows a view from the top of the heat sink module 71, and the bottom portion of FIG. 42 shows a view from the bottom of the heat sink module 71. The upper surface of the heat sink module 71 includes a plurality of stepped through holes 80 running from the upper surface to the lower surface of the heat sink module 71.

The plurality of through holes 80 form an array with parallel rows of through holes 80 exposed on the lower surface of the heat sink module 71, a respective linear groove 81 runs through the lower portions of each row of the through holes 80 and the respective linear groove 81 runs through the side surfaces of the heat sink module, as shown in FIG. 42.

Each stepped through hole 80 is used to accommodate a diode laser 1, and each linear groove 81 is used to accommodate a plurality of U-shaped pin connectors 74 and a plurality of L-shaped pin connectors 76.

The heat sink module 71 is made of a heat conducting material.

In some embodiments, the heat sink module 71 is replaced with other heat sinks (e.g., heat sink 21 in FIG. 7, heat sink 30 in FIG. 11, heat sink 37 in FIG. 13, heat sink 52 in FIG. 15, heat sink 54 in FIG. 17, heat sink 22-1 in FIG. 19, heat sink 30-1 in FIG. 22, heat sink 37-1 in FIG. 23, heat sink 52-1 in FIG. 25, and heat sink 54-1 in FIG. 27) described herein in a respective diode laser array module (e.g., diode laser array module 61) in accordance with various embodiments.

FIGS. 43-48 illustrate example layouts of pin connector and leads of the diode lasers in the diode laser array module 61, in accordance with some embodiments.

Figure 43:
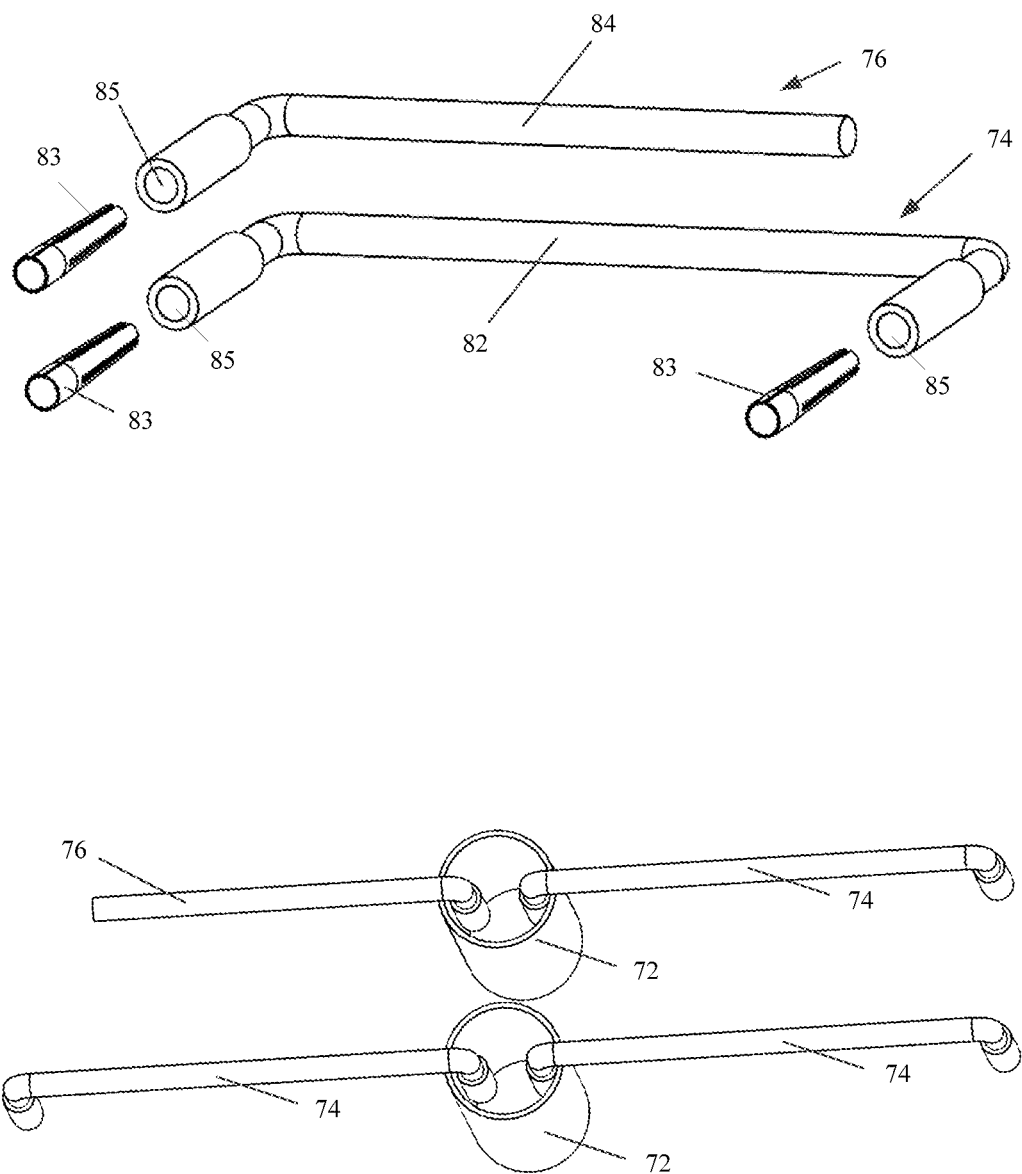

FIG. 43 illustrates the U-shaped pin connector 74 and the L-shaped pin connector 76 in accordance with some embodiments.

The U-shaped pin connector 74 consists of two paw springs 83 (pawl springs) and one U-shaped metal connecting rod 82. The two pawl springs 83 are placed into holes 85 in both ends of the U-shaped metal connecting rod 82, respectively.

The L-shaped pin connector 76 consists of one pawl spring 83 and one L-shaped metal connecting rod 84. The pawl spring 83 is placed into the hole 85 on one arm of the L-shaped metal connecting rod 84.

The U-shaped pin connectors 74, the L-shaped pin connectors 76 and the pawl springs 83 are all made of conductive materials (e.g., copper, silver, aluminum, or alloys etc.).

The pins 4 of a respective diode laser (e.g., diode laser 1 and other equivalents) are inserted into the pawl springs 83 of the U-shaped pin connector 74 (or L-shaped pin connector 76), which makes the pins 4, the pawl spring 83 and the hole 85 press against each other, realizing close contact and electric conduction between these components.

FIG. 43 is a schematic view of the arms of the U-shaped pin connectors 74 and the arm of an L-shaped pin connector 76 inserted in a insulating sleeve 72, in accordance with some embodiments. The insulating sleeve 72 insulates the U-shaped pin connectors 74 (or L-shaped pin connectors 76) from the stepped through holes 80 of the heat sink module 71, when the insulating sleeves are inserted into the stepped through holes 80 (or other equivalents thereof). Each insulating sleeve 72 is sleeved over one respective arm of two U-shaped pin connectors 74 (or the arm of one L-shaped pin connector 76 and one arm of one U-shaped pin connector 74), as shown in FIG. 29, in accordance with some embodiments. The height of the insulating sleeves are approximately equal to or greater than the depth of the lower portion of the stepped through holes 80, such that the connecting rode of the U-shaped connector and the L-shaped connectors are separated from the groove surface of grooves (e.g., grooves 71 or grooves 27) on the back of the heat sink.

Figure 44:
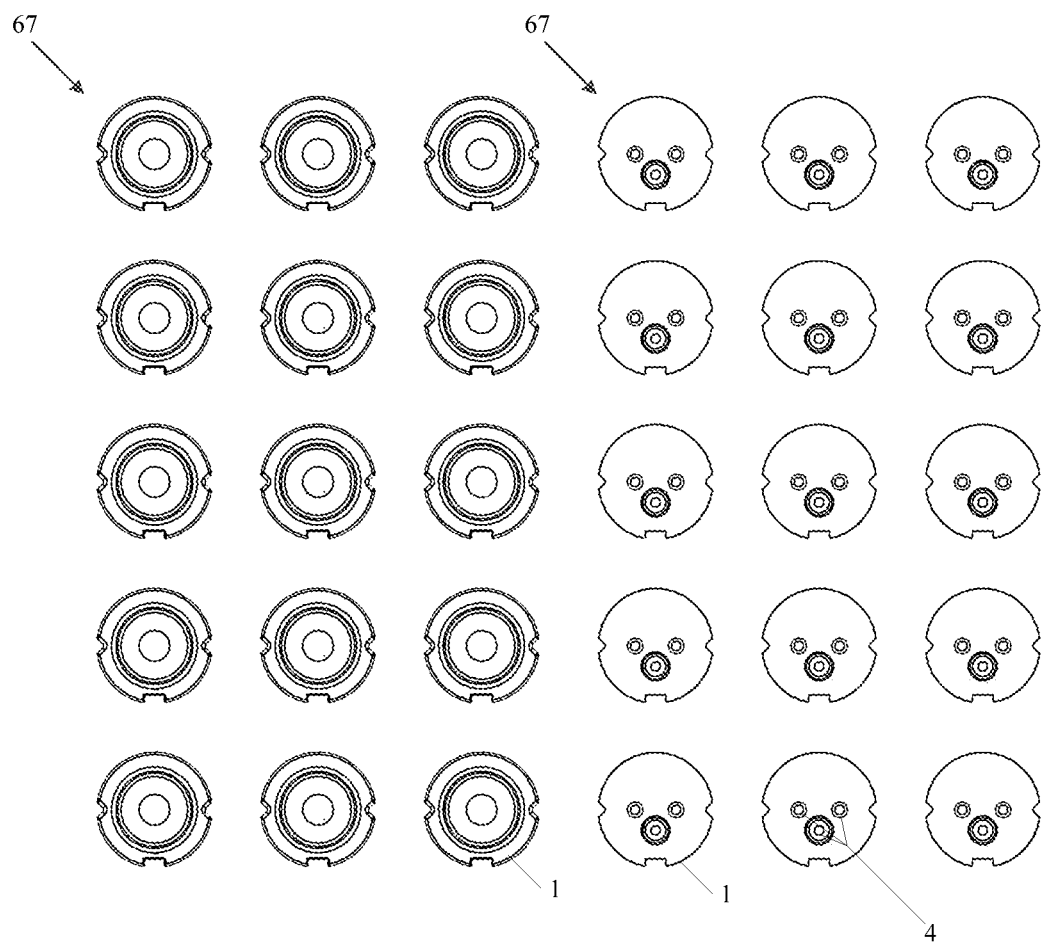

FIG. 44 is a top view (left) and a bottom view (right) of a diode laser array 67 comprising the plurality of diode lasers 1. The diode laser array 67 is arranged in accordance with predefine array layout (e.g., a grid of parallel rows and columns, or other regular arrangements), as shown in FIG. 30. In this example, there are a total of five rows in the array, and each row has three diode lasers. The three diode lasers in each row are arranged in the same manner (e.g., with the same general orientation, as shown in the rear view in FIG. 44).

Figure 45:
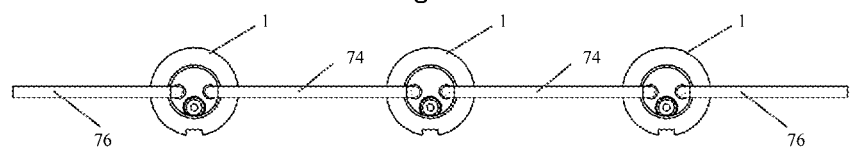
Figure 45:
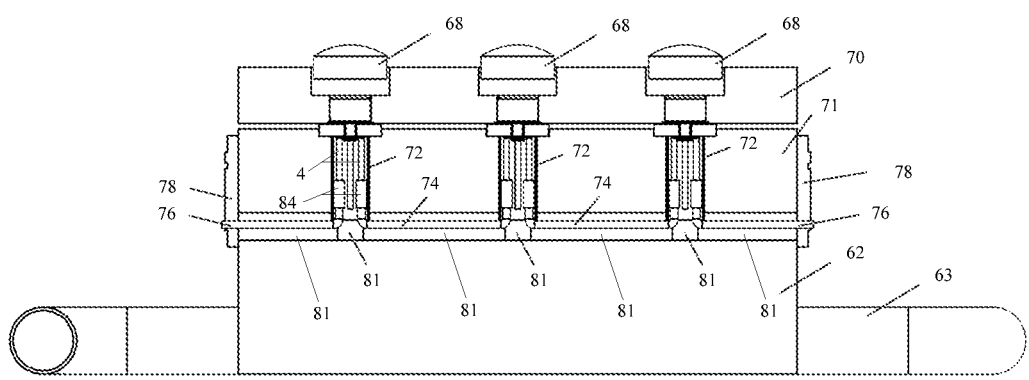

In some embodiments, the three diode lasers in each row of the diode laser array 67 form an independent circuit loop. As shown in FIG. 45, the U-shaped pin connector 74 connects the anode (or cathode) of a diode laser 1 with the cathode (or anode) of an adjacent diode laser 1. The L-shaped pin connector 76 connects the diode laser 1 with the driving circuit PCB 78 to form a circuit loop.

The U-shaped pin connector (or L-shaped pin connector) connected with the diode laser 1 is insulated from the heat sink module 71 by using the insulating sleeve 72.

FIG. 45 is a cross-sectional view of the diode laser array module 61. As shown in FIG. 45, each diode laser 1 is put into a respective stepped through hole 80. The metal base 2 is in contact with the heat sink module 71. The metal housing 3 passes through the stepped through hole 79 of the pressing plate module 70. The pressing plate module 70 and the heat sink module 71 squeeze each other to fix the location of the diode laser 1. The heat produced during working of the diode laser 1 is transferred to the heat sink module 71.

One lens 68 corresponds to each diode laser 1 and is fixed on the corresponding stepped through hole 80 by adhesive. The adhesive may be silica gel, or thermosetting adhesive, etc.

The L-shaped pin connector 76 connects the diode laser 1 and the driving circuit PCB 78 disposed on the side surface of the heat sink 71 to provide the working current for the diode laser 1; and the U-shaped pin connector 74 connects the two adjacent diode lasers 1. The U-shaped pin connectors 74 and the L-shaped pin connectors 76 are placed into the linear grooves 81. The L-shaped pin connectors 76 are entirely located within the linear groove 81 before it exits the side surface of the heat sink 71 and connects to the driving circuit PCB 78. As disclosed herein, in various embodiments, the linear groove 81 may be replaced by a linear groove that does not extend to the side surfaces of the heat sink, and the circuit of the diode lasers is connected to the driving circuit through lead connectors, FPCs and/or PCBs that are arranged differently (e.g., that go through a portion of the heat sink that is not in the linear groove, or reach a location that is outside of the linear groove, before it is connected to the driving circuit module).

In some embodiments, in order to insulate the U-shaped pin connectors 74, the L-shaped pin connectors 76 and the heat sink module 71, insulating adhesive such as insulating silica gel may be applied between them; or insulating sleeves such as plastic insulating sleeves may be sleeved over the U-shaped pin connectors 74 and the L-shaped pin connectors 76. The principle is similar to that of the insulating sleeves 72, which will not be repetitively described herein. Alternatively, an insulating layer such as PCB solder resist ink is used for coating the surface of the linear grooves 81.

The bottom surface of the heat sink module 71 is in close contact with the top surface of the liquid-cooled radiator 62, and transfers heat to the liquid-cooled radiator 62 to realize heat dissipation.

Figure 46:
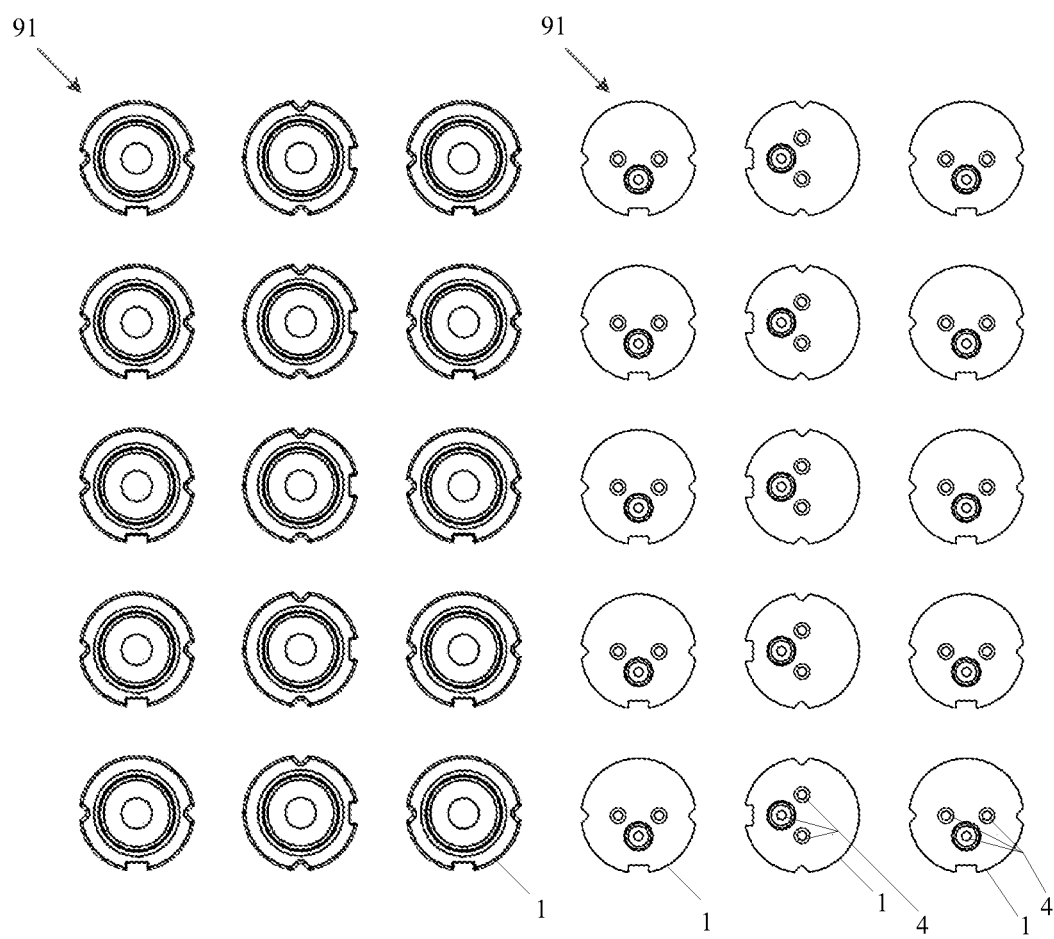

FIG. 46 is a top view and a bottom view of a diode laser array 91 in accordance with some embodiments. In order to meet different use requirements, the diode laser array 91, which is optionally arranged according to the top view and bottom view shown in FIG. 32, can replace the diode laser array 67 in the diode laser array module 61. The number of rows and number of columns of the diode laser arrays 91 are the same as that of the diode laser arrays 67. The difference lies in that the placement direction of the diode lasers in column 2 is different.

Figure 47:
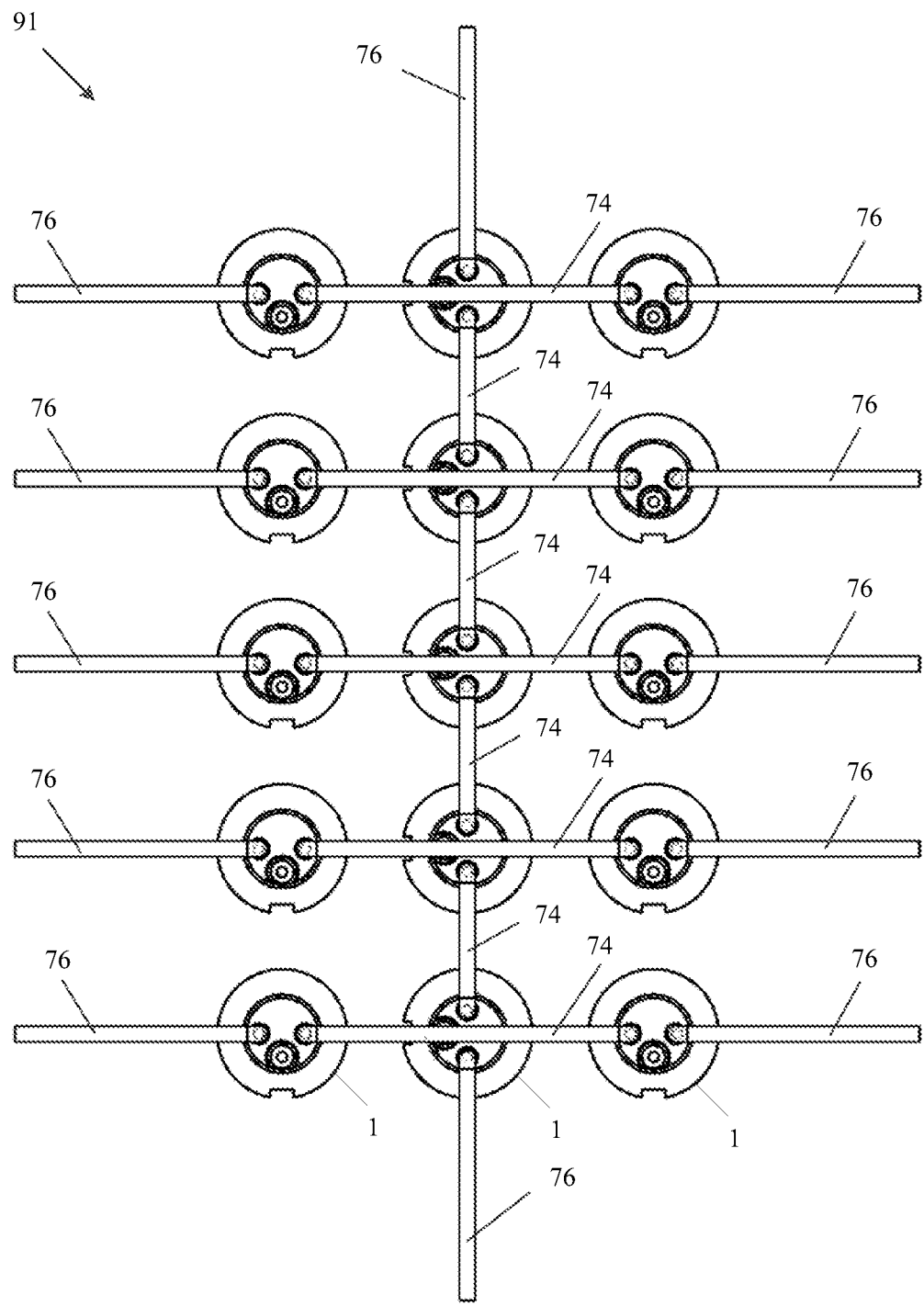

FIG. 47 is a schematic view of the diode laser array 91 adopting the same connecting and insulating modes as the diode laser array 67 in accordance with some embodiments. The diode laser arrays 91 are connected and insulated in the same way as the diode laser arrays 67, as shown in FIG. 47. The diode lasers may be connected and insulated in both row and column directions of arrays.

Figure 48:
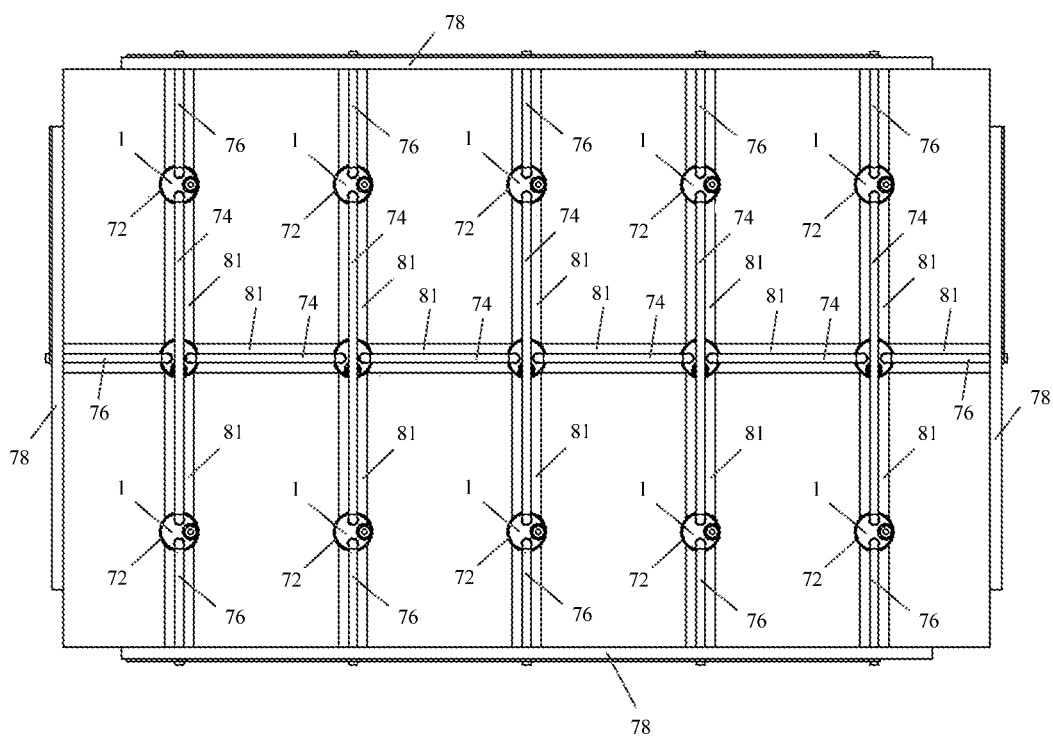

FIG. 48 is a schematic bottom view of the diode laser array 91 with a heat sink module. The fitting between the diode laser array 91 and the heat sink module is shown in FIG. 48. The U-shaped pin connectors 74 and the L-shaped pin connectors 76 connect the diode lasers 1 and driving circuit PCB 78 disposed on the side surface of the heat sink module. As disclosed herein, the fitting between the diode laser array and the cooling module can be varied from that shown in FIG. 48 depending on the circuitry requirement of the diode laser array module in various embodiments. The U-shaped pin connectors 74 and the L-shaped pin connectors 76 are placed into the linear grooves 81 in some embodiments.

In some embodiments, a diode laser array module includes a first diode laser array including a first plurality of diode lasers (e.g., diode lasers 1, 8, 11, 15, 16, 17, etc.), wherein each diode laser of the first plurality of diode lasers has a respective diode laser body and a respective set of pins (e.g., pins 4) connected to the respective diode laser body. The diode laser array module further includes a cooling module (e.g., a liquid-cooled radiator as described herein, a cooled radiator that conducts and dissipates heat with heat pipes, etc.), wherein the cooling module includes a heat conducting body (e.g., a heat sink) defined by a top surface, a bottom surface, and at least a first side surface and a second side surface of the cooling module, and includes a cooling structure (e.g., a liquid-filled passage, a liquid-filled tube, a plurality of heat pipes, etc. embedded in the heat sink and moves heat away from the heat sink) that is at least partially embedded in the heat conducting body of the cooling module, and wherein the heat conducting body of the cooling module includes an array of first holes (e.g., straight or stepped through holes) with corresponding first openings in the top surface of the cooling module to accommodate the first plurality of diode lasers, and the heat conducting body of the cooling module includes a plurality of first grooves (e.g., grooves 139 in FIG. 49, grooves 210 in FIG. 57 and FIG. 65, etc.), wherein each first groove is open in the bottom surface of the cooling module and connects a respective row of first holes (e.g., through holes 115) in the array of first holes. The diode laser array module further includes a plurality of pin connector modules (e.g., pin connector modules made of a series of pin connectors (e.g., L-shaped, U-shaped, and Z-shaped, etc.), pin connector modules made of PCBs and lead connectors, etc.), wherein each pin connector module includes a respective first conductive portion (e.g., a series of U-shaped pin connectors, or a portion of an elongated PCB, etc.) that is located within a respective first groove of the heat conducting body of the cooling module and electrically connects the respective row of diode lasers that are inserted into the respective row of the first holes connected by the respective first groove, and each pin connector module includes at least one respective second conductive portion (e.g., a pair of L-shaped pin connectors, a pair of Z-shaped pin connectors, an end portion of an elongated PCB, etc.) that is disposed within a portion of the heat conducting body of the cooling module that is beyond the respective first groove, the respective second conductive portion of said each pin connector module forms an electrical contact (e.g., connected by solder or already integrated in the same PCB) with the respective first conductive portion of said each pin connector module within the heat conducting body of the cooling module (e.g., within the respective first groove), and is configured to form an electrical contact to a driving circuit module outside of the first side surface of the cooling module (e.g., above the top surface, below the bottom surface, or on the outside of the first side surface, or separated from the body of the cooling module, etc.).

In some embodiments, the diode laser array module includes a first lens array module (e.g., lens array 69) that includes a first plurality of lenses (e.g., lenses 68, lenses 42), wherein each lens of the first plurality of lenses is disposed above a respective diode laser of the first plurality of diode lasers and separated from a respective output window of the respective diode laser (e.g., output window 5) by an air gap (e.g., the lens 42 is suspended above the output window by the top surface of pressing plate module 105 (e.g., as shown in FIGS. 34 and 35), or the lens 42 is packaged with a diode laser with a flat output window using a metal housing 49 (e.g., as shown in FIGS. 36-38)).

Figure 49:
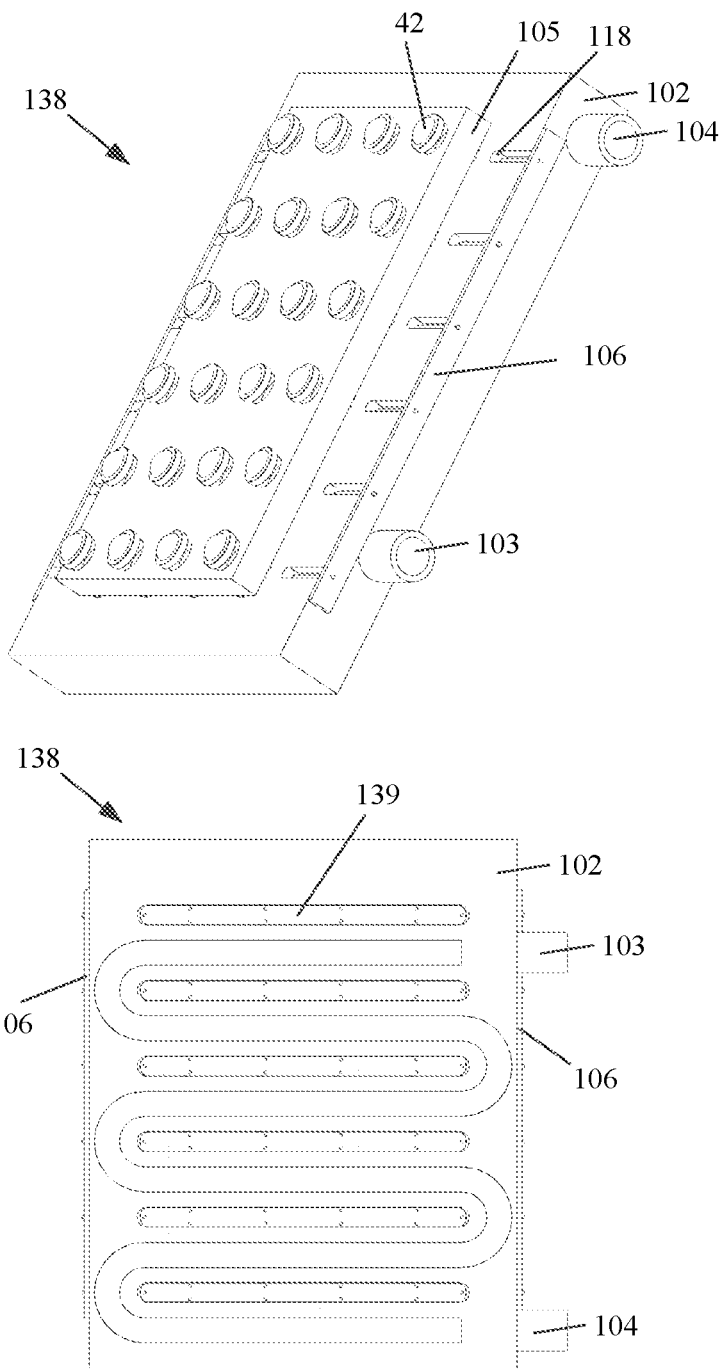
FIGS. 49-51 illustrate a diode laser array module 138 and components thereof in accordance with some embodiments.
Figure 130:
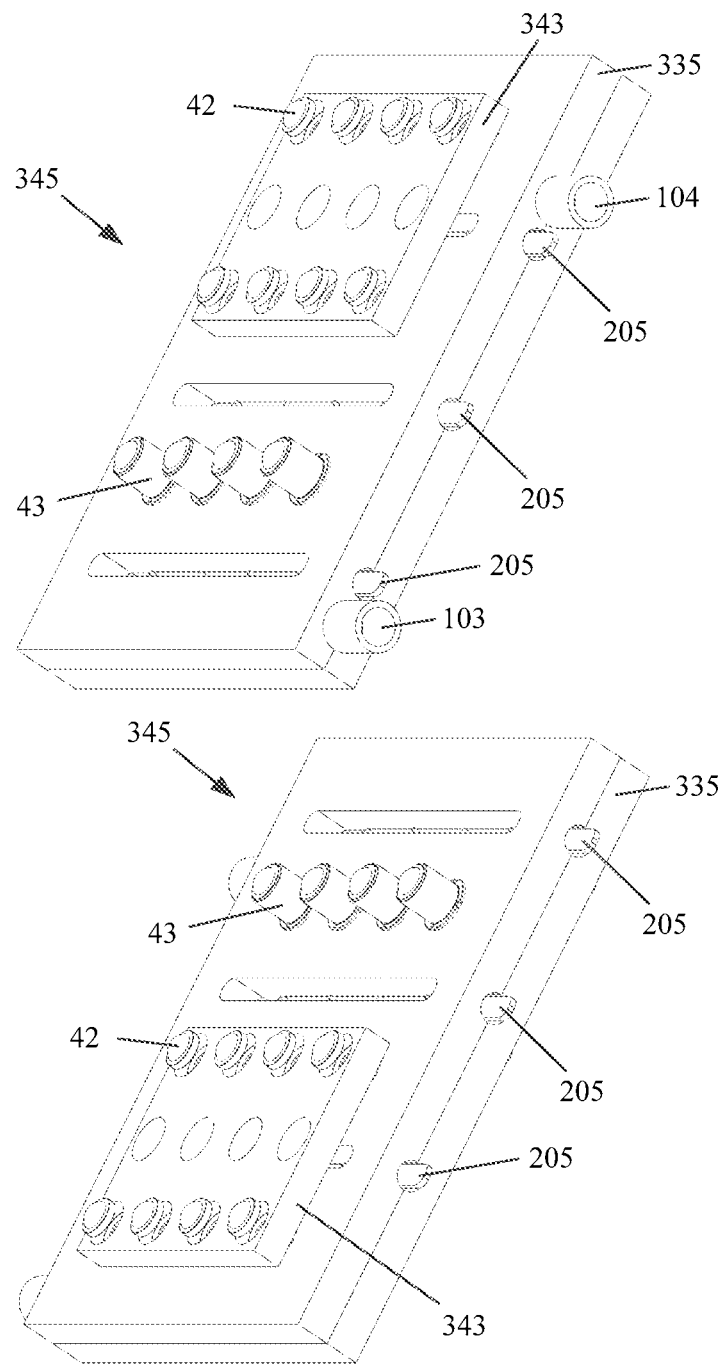

The diode laser array module is illustrated by embodiments described with respect to FIG. 49-FIG. 130 and various combinations thereof. For example, the first diode laser array is optionally implemented using any diode lasers described with respect to FIGS. 1-38, and optionally includes any diode laser modules described in FIGS. 49-130. The cooling module is optionally implemented using any cooling module described with respect to FIGS. 49-130, such as the liquid-cooled radiator 102, liquid-cooled radiator 188, liquid-cooled radiator 195, liquid-cooled radiator 204, the liquid-cooled radiator 211, the liquid-cooled radiator 239, liquid-cooled radiator 241, the liquid-cooled radiator 249, the liquid-cooled radiator 263, the liquid-cooled radiator 265, the liquid-cooled radiator 268, the cooled radiator 271, the cooled radiator 291, the cooled radiator 293, the liquid-cooled radiator 303, the liquid-cooled radiator 304. Each of these cooling modules includes a respective cooling structure (e.g., a liquid-filled passage, one or more heat pipes, a liquid-filled tube, etc.) as described with respect to the embodiments shown in FIGS. 49-106. The first holes in the heat conducting body of the cooling module are used to accommodate the individual diode lasers and allowing the conductive leads of the individual diode lasers be inserted to a position below the top surface of the cooling module (e.g., into the first grooves that are open in the bottom surface of the cooling module and connecting a respective row of the first holes). Each of the plurality of pin connector modules corresponds to a respective row of diode lasers, and includes two functional parts, which may be two structurally separate parts (e.g., a series of lead connectors) that are connected during assembly of the diode laser array module, or different portions an integral structure (e.g., a single PCB), as shown in the embodiments described with respect to the diode laser array module 138, diode laser array module 140, diode laser array module 187, diode laser array module 203, diode laser array module 268-1, diode laser array module 293-1, diode laser array module 304-1, diode laser array module 305, diode laser array module 326, diode laser array module 327, diode laser array module 328, diode laser array module 329, diode laser array module 330, diode laser array module 332, diode laser array module 333, diode laser array module 334, diode laser array module 335, diode laser array module 340, diode laser array module 341, diode laser array module 342, diode laser array module 344, diode laser array module 345, etc. described with respect to FIGS. 49-130.

In some embodiments, each pin connector module includes a respective series of U-shaped pin connectors that are disposed within a respective first groove of the heat body of the cooling module (e.g., a series of U-shaped pin connectors 114 that serve as the respective first conductive portion of the pin connector module) and electrically connecting a respective row of diode lasers of the first diode laser array that are inserted into the respective row of first holes connected by the respective first groove (e.g., the series of U-shaped pin connectors 114 residing in each groove 120 connect a respective row of the first plurality of diode lasers 1 by their pins that are inserted into the row of first holes and extending into the first groove connecting the row of first holes), and each pin connector module includes at least a respective L-shaped pin connector (e.g., L-shaped pin-connector 110 that serves as part of the respective second conductive portion of the pin connector module) that is disposed within a portion of the heat conducting body of the cooling module that is beyond of the respective first groove (e.g., the second portion includes a series of L-shaped pin connectors, each of which is connected to the last U-shaped connector or a pin of the last diode laser residing the first groove, and then pass through an internal path within the body of the cooling module to reach an exit point on the side surface or the top surface of the body of the cooling module), the respective L-shaped pin connector forming an electrical contact within the heat conducting body of the cooling module with one of the respective series of U-shaped pin connectors or a respective pin of a diode laser connected to the respective series of U-shaped connectors, and forming an electrical contact outside of the first side surface of the cooling module to a driving circuit module. In some embodiments, the same pin connector module and corresponding heat sink structure in the cooling module can also be used in an auxiliary heat sink that accommodate a diode laser array then attached to a cooling module with a cooling structure, e.g., a standalone cooling module, or a cooling module that is also used by another diode laser array module in a two-sided diode laser array module.

In some embodiments, each pin connector module includes a respective PCB (e.g., PCB 139 in FIG. 50) that is disposed within a respective first groove (e.g., groove 120) of the body of the cooling module (e.g., the entirety of the PCB 139 serves as the respective first conductive portion of the pin connector module) and electrically connecting a respective row diode lasers of the first diode laser array that are inserted into the respective row of first holes connected by the respective first groove (e.g., the PCB 139 residing in each groove 120 connect a respective row of the plurality of diode lasers by their pins that are inserted into the row of first holes and extending into the first groove connecting the row of first holes), and each pin connector module includes at least a respective L-shaped pin connector (e.g., L-shaped pin-connector 110 that serves as part of the respective second conductive portion of the pin connector module) that is disposed within a portion of the body of the cooling module that is beyond of the respective first groove (e.g., the second portion includes a series of L-shaped pin connectors, each of which is connected to the last U-shaped connector or a pin of the last diode laser residing the first groove, and then pass through an internal path within the body of the cooling module to reach an exit point on the side surface or the top surface of the body of the cooling module), and the respective L-shaped pin connector forming an electrical contact with the respective PCB of said each pin connector module within the heat conducting body of the cooling module, and forming an electrical contact to a driving circuit module outside of the first side surface of the cooling module. This is illustrated by the example diode laser array module 138 as described with respect to FIGS. 49-51, for example.

Figure 51:
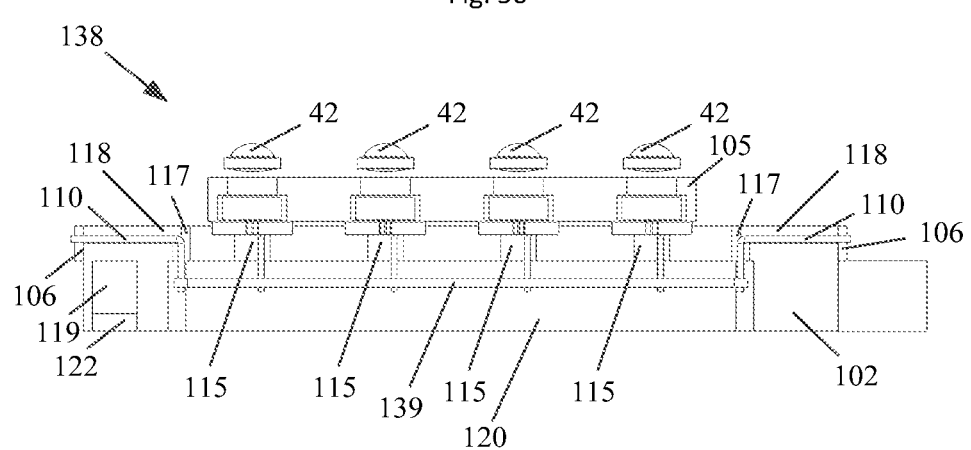

In some embodiments, the cooling module includes a plurality of third holes (e.g., holes 117 in FIG. 51 that runs from the bottom surface of the first groove 120 to the top surface of the cooling module (e.g., to the bottom surface of the side grooves 118, or the top surface of the cooling module)) that run in a vertical direction defined by the top surface and the bottom surface of the cooling module, and wherein at least part of the respective second conductive portion (e.g., the vertically disposed portion of the L-shaped pin connector 110) of the respective pin connector module is disposed within a respective one of the third holes in the cooling module (e.g., the second conductive portion includes an L-shaped pin connector 110 which is connected to the first or last U-shaped connector or a pin of the first or last diode laser residing in the first groove, and then passes through the vertical third holes within the body of the cooling module to reach a corresponding second groove 118 on the top surface of the cooling module, and runs toward the driving circuit PCB (e.g., PCB 106) disposed on the first side surface of the body of the cooling module along the second groove). This is also illustrated by the holes 117 in the cooling modules of diode laser array module 140 in FIGS. 52-54, etc.

In some embodiments, the cooling module includes a plurality of second grooves (e.g., linear grooves 118 in FIG. 51) on the top surface of the cooling module, and wherein at least part of the respective second conductive portion (e.g., the horizontally disposed portion of the L-shaped pin connector 110 in FIG. 51) of the respective pin connector module is disposed within a respective one of the second grooves on the top surface of the cooling module (e.g., the second portion includes an L-shaped pin connector 110 which is connected to the first or last U-shaped connector or a pin of the first or last diode laser residing in the first groove, and then passes through an internal path within the body of the cooling module to reach a corresponding second groove 118 on the top surface of the cooling module, and runs toward the driving circuit PCB (e.g., PCB 106) disposed on the first side surface of the body of the cooling module along the second groove) (e.g., the connection points between the L-shaped pin connectors 110 for each row of diode lasers and the driving circuit PCB are directly next to the side openings of the second grooves on the first side surface of the cooling module). This is illustrated in by the linear grooves 118 in the top surface of the cooling module 102 of the diode laser array module 138 as described with respect to FIGS. 58-60, and diode laser array module 140 in FIGS. 52-54, etc.

In some embodiments, a vertical position of the driving circuit module (e.g., a PCB) on the first side surface of the cooling module is above a vertical position of the cooling structure in the cooling module (e.g., the vertical position of the driving circuit PCB is above the vertical positions of the inlet and outlet of a liquid cooling tube or above the vertical positions of the cooling rods of the cooling module, and the electrical contact between the second portion of the respective pin connector module (e.g., the horizontal portion of the L-shaped pin connector 110) and the driving circuit module is above the vertical position of the cooling structure). This is illustrated in the diode laser array module 138, diode laser array module 140, and diode laser array module 187, etc., for example.

In some embodiments, the diode laser array module includes a module pressing plate (e.g., module pressing plate 105 in FIG. 54) disposed above the top surface of the cooling module, wherein the module pressing plate includes a plurality of second holes (e.g., holes 116) (e.g., straight through holes with uniform width from top to bottom of the through holes, or stepped through holes with one or more stepped surfaces between the top and the bottom surfaces of the module pressing plate) at positions corresponding to the first plurality of diode lasers, and wherein the module pressing plate pushes the first plurality of diode lasers against the cooling module when the module pressing plate is affixed to the cooling module. In some embodiments, the second holes in the module pressing plate are stepped through holes, and the stepped surface within the second holes press against the top of the diode lasers while the bottom edge of the second holes press against the metal plate portion of the diode laser body, such that the bottom of the metal plate portion of the diode laser body fits stably within the first holes of the cooling module. Other configurations of the fit between the module pressing plate and the diode lasers are possible. For example, in some embodiments, the module pressing plate (e.g., module pressing plate 128) includes straight through holes that are larger than the housing portion of the diode laser and smaller than the metal plate portion of the diode laser, and the bottom edge of the straight through holes presses the metal plate portion of the diode lasers against the cooling module, while the bottom portions of the metal plate portion of the diode lasers sit within the first holes in the top surface of the cooling module. In some embodiments, the module pressing plate includes stepped through holes that are wider on top and narrower on the bottom, and the wider top portion of the through hole can support a lens on top and the narrower bottom portion of the through hole is smaller than the metal plate portion of the diode laser, and pushes the metal plate portion against the cooling module. In some embodiments, the top portion of the through hole in the module pressing plate is wider to accommodate the lens 42, and the bottom portion of the through hole in the module pressing plate is smaller than the bottom plate portion of the diode laser and the bottom edge of the through hole pushes the metal plate portion of the diode laser against the cooling module. These configurations of the module pressing plate and corresponding positions of the lenses, diode lasers, and cooling module are optionally used in combinations with other configurations and structural variations of the cooling module and pin connector module described in this specification, without limitation.

Figure 52:
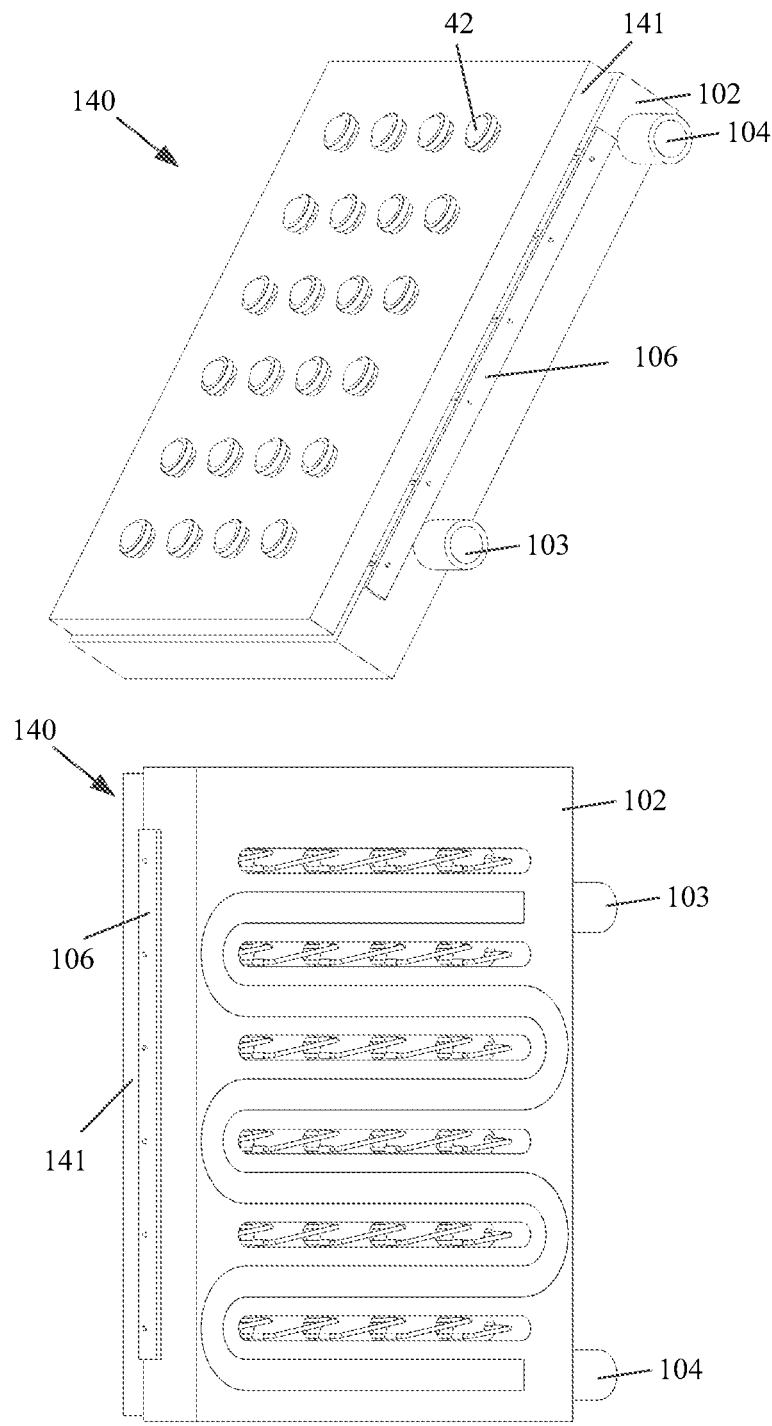
FIGS. 52-54 illustrate a diode laser array module 140 and components thereof in accordance with some embodiments.
Figure 53:
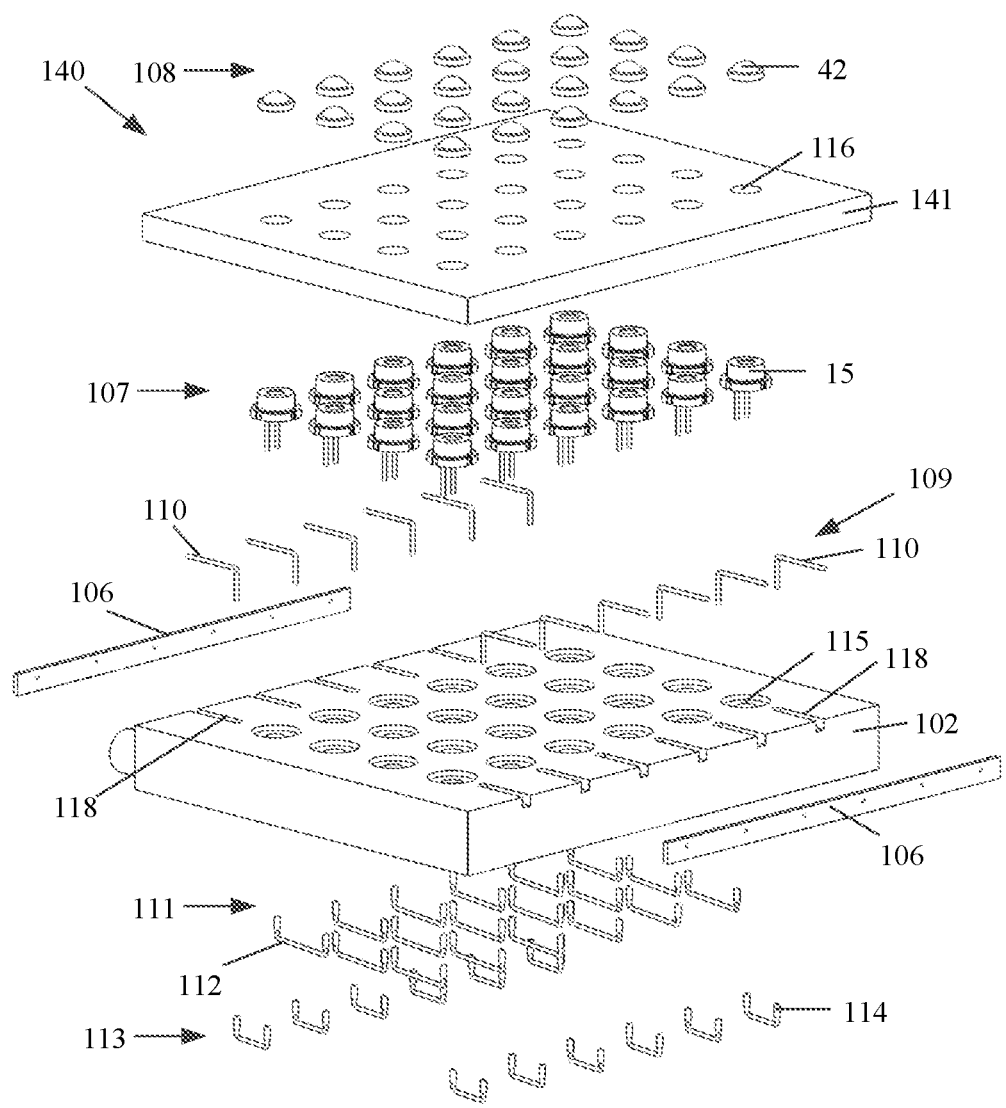
Figure 54:
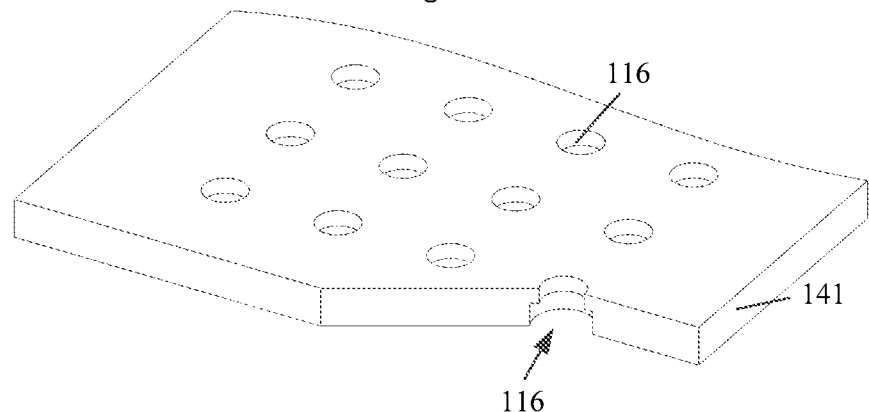

In some embodiments, the module pressing plate extends to the first side surface of the cooling module (e.g., the module pressing plate covers the plurality of side grooves 118 on the top surface of the cooling module and the portion of the L-shaped pin connectors 110 residing in the side grooves 118, as described with respect to FIGS. 52-54). This is illustrated in the diode laser array module 140 as described with respect to FIGS. 52-54. However, the larger module pressing plate that covers the side grooves on the top surface of the can be used in combination with other configurations and structural variations of the cooling module and pin connector module described in this specification, without limitation. In some embodiments, the side grooves are moved from the top surface of the cooling module to the top surface of the module pressing plate, for example.

Figure 50:
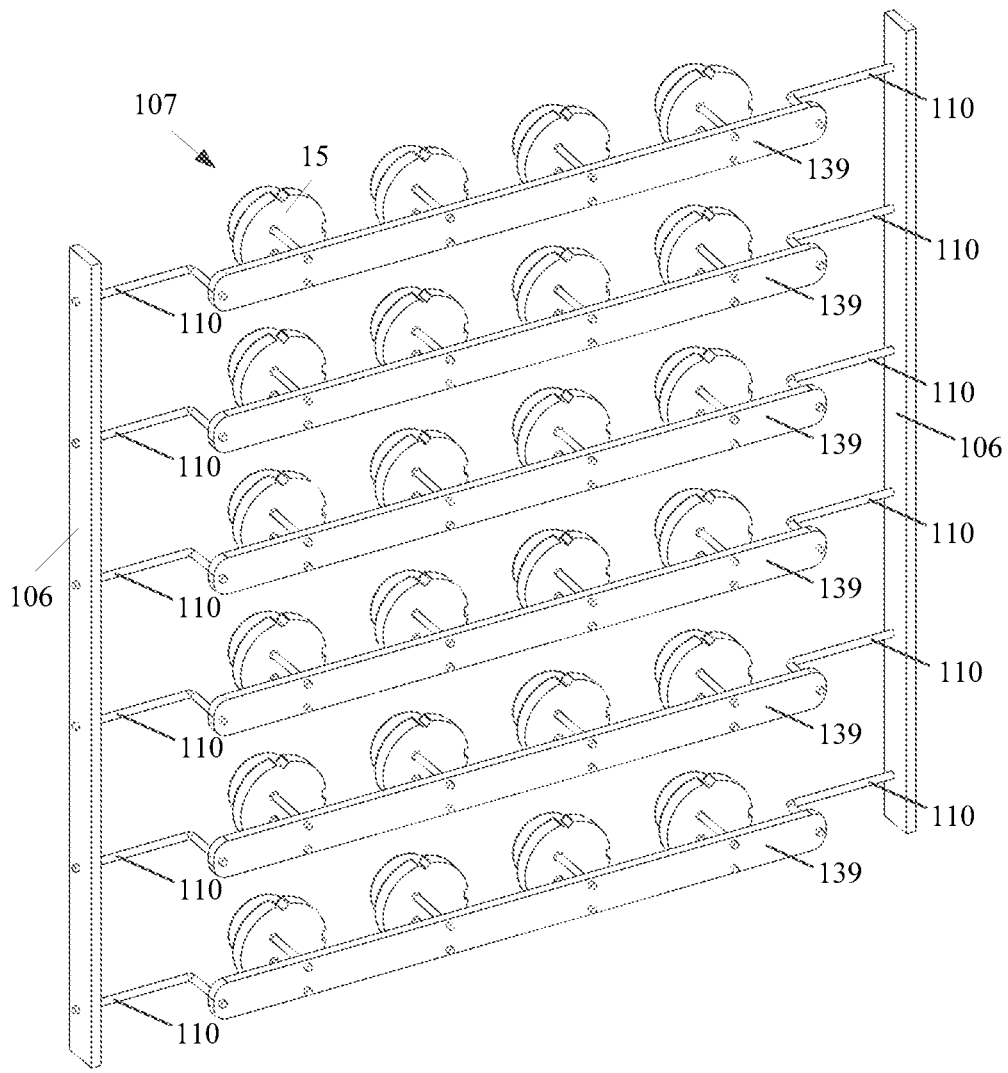

In some embodiments, the module pressing plate exposes at least a portion of the top surface of the cooling module next to the first side surface of the cooling module (e.g., the module pressing plate does not cover the side grooves 118, and the horizontal portions of the L-shaped pin connectors 110, as described with respect to FIGS. 49-51). This is illustrated in most of the example diode laser array modules disclosed herein.

In some embodiments, the module pressing plate includes a respective top surface, a respective bottom surface, and a respective first side surface that is parallel to the first side surface of the cooling module; and the driving circuit module (e.g., a driving circuit PCB 106) is disposed on the respective first side surface of the module pressing plate. For example, the module pressing plate includes a plurality of side grooves and vertical holes to allow the second portion of the pin connector module (e.g., vertical legs of the L-shaped pin connectors 110) to pass from the holes 117 in the top surface of the cooling module to the vertical holes and side grooves in the module pressing plate and then to the first side surface of the pressing plate module, where the horizontal portions of the L-shaped pin connectors 110 makes contact with the driving circuit PCB 106 disposed on the first side surface of the module pressing plate. In some embodiments, instead of fitting the driving circuit PCB on the side surface of the module pressing plate, the driving circuit PCB is disposed on a side surface of the cooling module. In some embodiments, the driving circuit PCB is disposed away from the cooling module and is connected to the second conductive portions of the pin connector modules via a PCB disposed on the side surface of the module pressing plate or a side surface of the cooling module.

Figure 61:
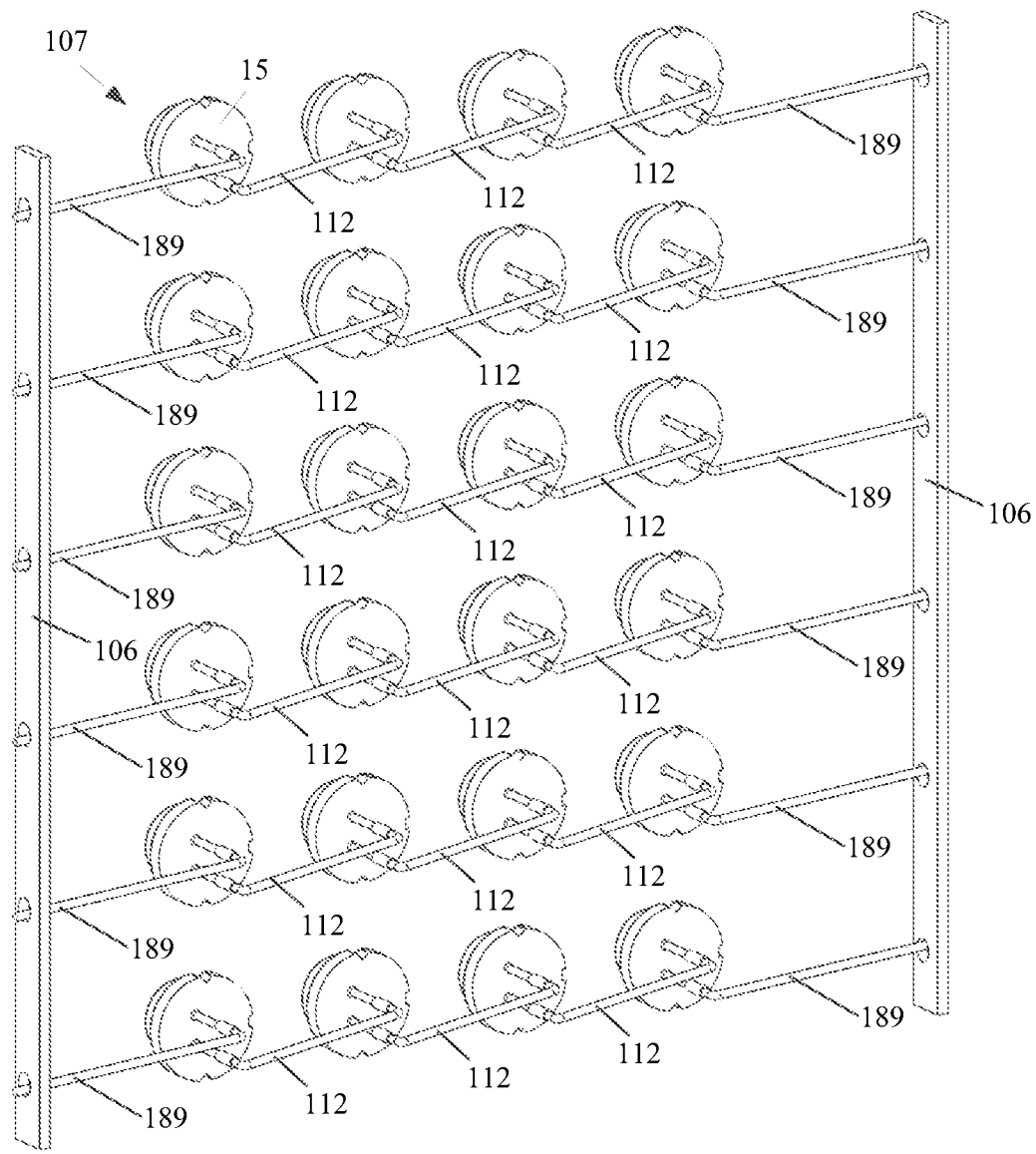
Figure 62:
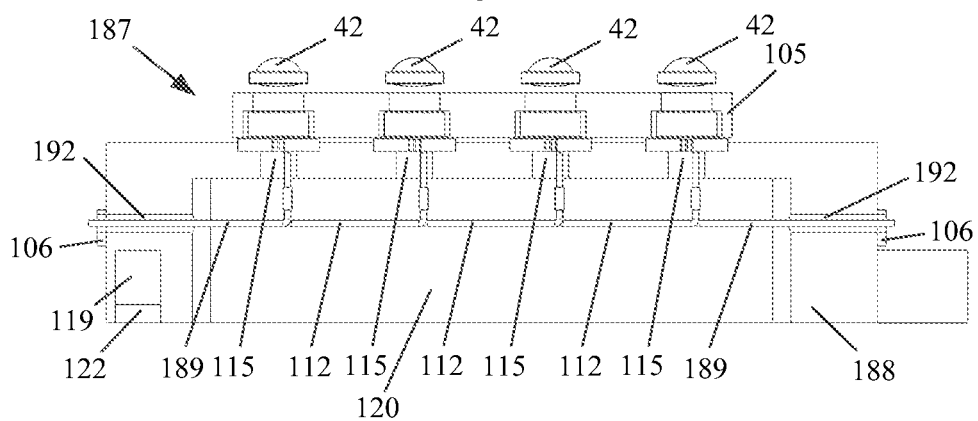

In some embodiments, the cooling module includes a plurality of fourth holes (e.g., horizontal through holes 192 in FIG. 62) that connects a first end surface of a respective first groove (e.g., groove 120) to the first side surface of the cooling module (e.g., the holes 192 passes through the side wall of the body of the cooling module), and the second conductive portion of the respective pin connector module (e.g., the horizontal portions of the L-shaped pin connectors 189 in FIG. 62) is disposed at least partially within the fourth holes of the cooling module. This is illustrated in the diode laser array module 187 as described with respect to FIGS. 55-62, wherein third through holes 192 are made in the end walls of the first grooves 120 in the bottom surface of the body of the cooling module 188. This is also illustrated by though holes 207 that are implemented in diode laser array module 203, diode laser array module 305, diode laser array module 330, diode laser array module, diode laser array module 333, diode laser array module 334, diode laser array module 340, diode laser array module 341, diode laser array module 342, diode laser array module 344, and diode laser array module 345, for example.

In some embodiments, a vertical extent of the driving circuit module on the first side surface of the cooling module overlaps a vertical extent of the cooling structure in the cooling module (e.g., the vertical position of the driving circuit PCB is the same as the vertical positions of the inlet and outlet of a liquid cooling tube or the same as the vertical positions of the cooling rods of the cooling module, and the electrical contact between the second portion of the respective pin connector module (e.g., the horizontal portion of the L-shaped pin connector 110) and the driving circuit module is within the vertical extent of the cooling structure. This is illustrated in the example diode laser array module 203, diode laser array module 268-1, diode laser array module 293-1, diode laser array module 305, diode laser array module 307, diode laser array module 330, diode laser array module, diode laser array module 333, diode laser array module 334, diode laser array module 340, diode laser array module 341, diode laser array module 342, diode laser array module 344, and diode laser array module 345, for example.

In some embodiments, a vertical position of the driving circuit module on the first side surface of the cooling module is below a vertical position of the cooling structure in the cooling module (e.g., the vertical position of the driving circuit PCB is the below the vertical positions of the inlet and outlet of a liquid cooling tube or below the vertical positions of the cooling rods of the cooling module, and the electrical contact between the second portion of the respective pin connector module (e.g., the horizontal portion of the L-shaped pin connector 110) and the driving circuit module is below the vertical position of the cooling structure. This is illustrated by diode laser array 304-1, for example.

In some embodiments, the plurality of pin connector modules include a first pin connector module that is a PCB that includes a first conductive portion residing in the respective first groove and a second conductive portion that passes through a wall of the cooling module (e.g., through the through holes 207) and connects to the driving circuit module at a location outside of the cooling module. This is illustrated by the PCBs 205 in the diode laser array module 203 as described with respect to FIGS. 63-69, where the PCB forms electrical contacts with the pins of each diode laser of a respective row of diode lasers (e.g., access to the electrical contacts can be made through the first grooves in the bottom side of the cooling module), and at least one end of the PCB extends through a hole 207 in the side wall of the first groove in the cooling module to the outside of the cooling module where the PCB can make electrical contacts with a driving circuit module. This is also illustrated in the diode laser array module 268-1 in FIG. 93, diode laser array module 293-1 in FIG. 100, diode laser array module 304-1 in FIG. 103, diode laser array module 305 in FIGS. 104-105, diode laser array module 307 in FIG. 106, for example. In some embodiments, the same pin connector module and corresponding heat sink structure in the cooling module can also be used in an auxiliary heat sink that accommodate a diode laser array then attached to a cooling module with a cooling structure, e.g., a standalone cooling module, or a cooling module that is also used by another diode laser array module in a two-sided diode laser array module (e.g., as described with respect to FIGS. 110-130).

In some embodiments, the cooling structure of the cooling module is a liquid-filled channel (e.g., water passage 119) that is sealed by a cover plate (e.g., water passage sealing plate 122 in FIG. 66) disposed on the bottom surface of the cooling module. This structure of the cooling module is illustrated by the cooling modules (e.g., liquid cooled radiators 102, 188, and 204, etc.) described with respect to various embodiments, for example. This method for forming the cooling module is optionally used for making other cooling modules disclosed in this specification.

In some embodiments, the cooling structure of the cooling module is a liquid-filled channel (e.g., water passage 119) that is sealed by a cover plate (e.g., water passage sealing plate 122 in FIG. 70) disposed on the top surface of the cooling module. This structure of the cooling module is illustrated by the cooling modules (e.g., liquid cooled radiators 239, and 241, etc.) described with respect to various figures, for example. This method for forming the cooling module is optionally used for making other cooling modules disclosed in this specification.

In some embodiments, the cooling module is comprised of a upper part and lower part that are aligned and affixed to each other (e.g., by vacuum welding the interfaces between the upper part and the lower part together), wherein a top surface of the upper part serves as the top surface of the cooling module, a bottom surface of the lower part serves as the bottom surface of the cooling module, a first side surface of the upper part and a first side surface of the lower part together form the first side surface of the cooling module, and a second side surface of the upper part and a second side surface of the lower part form the second side surface of the cooling module, the upper part includes the array of first holes of the cooling module (e.g., prior to and after being welded to the lower part), and the lower part includes the plurality of first grooves of the cooling module (e.g., prior to and after being welded to the lower part). This structure of the cooling module is illustrated by the cooling modules (e.g., liquid cooled radiators 263, 265, and 268, etc.) described with respect to various figures, for example. This method for forming the cooling module is optionally used for making other cooling modules disclosed in this specification.

In some embodiments, the cooling structure of the cooling module includes a liquid-filled channel, and is at least partially formed when the upper part and the lower part are aligned and affixed to each other, where a respective groove in a bottom surface of the upper part and a respective groove in a top surface of the lower part are sealed together form an inner surface of the liquid-filled channel. This structure of the cooling module is illustrated by the cooling modules (e.g., liquid cooled radiators 263, 265, and 268, etc.) described with respect to various figures, for example. This method for forming the cooling module is optionally used for making other cooling modules disclosed in this specification.

In some embodiments, the cooling structure of the cooling module includes a plurality of heat pipes (e.g., heat pipes 273) that pass through the body of the cooling module (e.g., in grooves 275 in the upper surface of the cooling module, as described with respect to FIGS. 94-100) between adjacent rows of the array of first holes, and includes an external radiator that is connected to the body of the cooling module via the plurality of heat pipes. This structure of the cooling module is illustrated by the cooling modules (e.g., cooled radiators 291, and 293, etc.) described with respect to various figures, for example. This type of cooling module is optionally used in place of other types of cooling modules disclosed in this specification, e.g., with identical features as those cooling modules except for the cooling structure of the cooling module.

In some embodiments, the cooling structure of the cooling module includes a preformed liquid passage pipe (e.g., water passage pipe 296) that is mounted into a plurality of preformed grooves (e.g., grooves 275) in the top surface of the cooling module (e.g., before the diode lasers and the module pressing plate are installed). This structure of the cooling module is illustrated by the cooling modules (e.g., liquid cooled radiators 303, and 304, etc.) described with respect to various figures, for example. This type of the cooling module is optionally used in place of other cooling modules disclosed in this specification, e.g., with identical features as those cooling modules except for the cooling structure of the cooling module.

Figure 113:
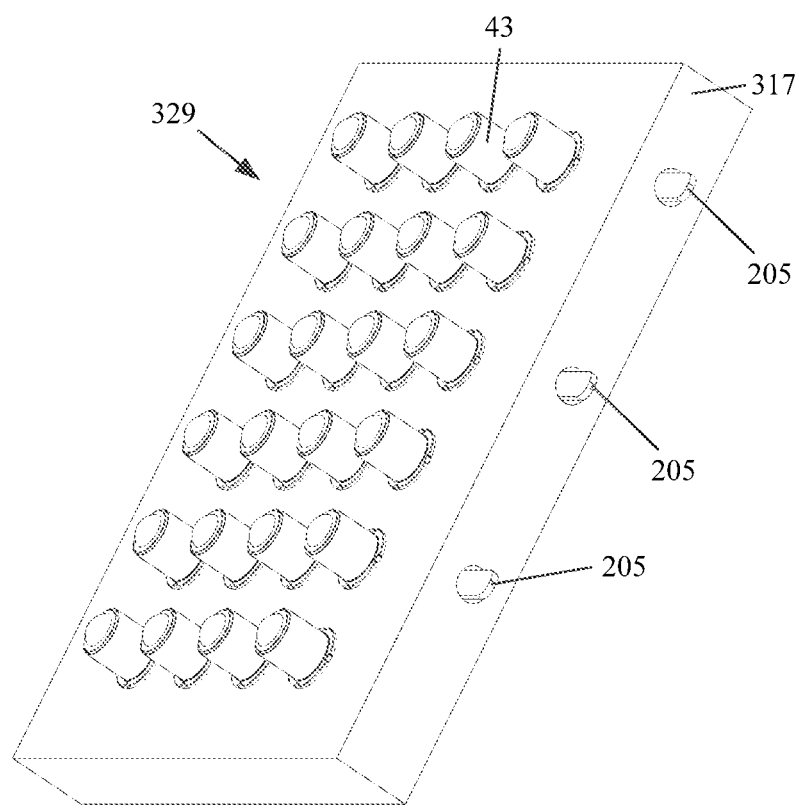

In some embodiments, the diode laser array module is a double-sided diode laser array module, the double-sided diode laser array module includes a second diode laser array including a second plurality of diode lasers, wherein the second diode laser array is facing a direction opposite to a direction faced by the first diode laser array in the diode laser array module, wherein each diode laser of the second plurality of diode lasers has a respective diode laser body (e.g., metal housing and support plate of the diode laser 1, 11, etc.) and a respective plurality of pins connected to the respective diode laser body (e.g., pins 4) of the second plurality of diode lasers, the double-sided diode laser array module includes an auxiliary heat sink module facing an opposite direction from a direction faced by the cooling module, wherein: the auxiliary heat sink module includes a heat conducting body defined by a top surface, a bottom surface, and at least a first side surface and a second side surface of the auxiliary heat sink module, and does not include a corresponding cooling structure (e.g., liquid cooling tubes or channels, or metal rods) within the body of the auxiliary heat sink module, wherein the body of the auxiliary heat sink module is structured in accordance with any of the cooling module of the diode laser array module disclosed herein, except for the inclusion of the cooling structure in the cooling module, to accommodate the second plurality of diode lasers and a corresponding second plurality of pin connector modules that connect the second plurality of diode lasers to a driving circuit module that is disposed away from the first side surface of the auxiliary heat sink module. The example manners by which the second plurality of diode lasers are installed in the auxiliary heat sink are illustrated in FIG. 113, for example. The auxiliary heat sink module used to accommodate the diode lasers on the second side of the double-sided diode laser array may have the same type or structure as the cooling module used to accommodate the diode lasers on the first side of the double-sided diode laser array module in some embodiments, and do not have to in some other embodiments. This is illustrated in the examples described with respect to FIG. 118, for example.

In some embodiments, the auxiliary heat sink module and the cooling module are attached together by the bottom surface of the cooling module and the bottom surface of the auxiliary heat sink module (e.g., with the first grooves of the cooling module and the first grooves of the auxiliary heat sink module aligned with each other).

In some embodiments, the first plurality of diode lasers are affixed to the cooling module in a first manner, the second plurality of diode lasers are affixed to the auxiliary heat sink module in a second manner that is distinct from the first manner (e.g., the first manner and the second manner are respectively welding or using a press plate module, or vice versa).

In some embodiments, the diode laser array module is a double-sided diode laser array module, the double-sided diode laser array module includes a second diode laser array including a second plurality of diode lasers, wherein the second diode laser array is facing a direction opposite to a direction faced by the first diode laser array in the diode laser array module, wherein each diode laser of the second plurality of diode lasers has a respective diode laser body (e.g., metal housing and support plate of the diode laser 1, 11, etc.) and a respective plurality of pins connected to the respective diode laser body (e.g., pins 4) of the second plurality of diode lasers, and the body of the cooling module includes a second set of structural features (e.g., the grooves, holes, and pin connector modules) corresponding to a first set of structural features of the cooling module recited in various embodiments, wherein the second set of structural features are configured to accommodate the second plurality of diode lasers and a corresponding second plurality of pin connector modules, and wherein the second set of structural features and their corresponding structural features are disposed on two opposite sides of the body of the cooling module and are offset from each other in a direction parallel to the top surface of the cooling module. This is illustrated by the example embodiment described with respect to FIGS. 117-130, for example.

The following descriptions provide details of the various aspects of the various example embodiments.

The technical solutions described herein are related to and further improve upon the solutions described in System and Device with Laser Array Illumination (Application No. PCT-CN 2016-098763) which aims to minimize the number of interfaces between the diode lasers and the coolant, and maximize the heat conducting performance of the cooling module as much as possible. The current solutions require different structures and manufacturing methods of liquid-cooled radiators and present a brand-new solution to improve and optimize the design of the circuit, cooling and various structures of the diode lasers and diode laser array modules.

The following embodiments are described by taking the diode laser 15 as an example, one or more of which may be replaced with any one or more of the diode laser 1, the diode laser 8, the diode laser 11, the diode laser 15, the diode laser 16, the diode laser 17, the diode laser 43, the diode laser 46, the diode laser 48, the diode laser 50, the diode laser 51. The principle is the same, which will be not repetitively described herein.

The same or similar changes in the diode laser array module 140 relative to the diode laser array module 138 may be used in any of embodiments in the same or similar manners as in the solution described herein. The principle is the same, and the unchanged aspects of the diode laser array modules or parts thereof will be not repetitively described herein. Unless otherwise specified or illustrated, the same reference numbers refer to the same components, and illustrated parts that are not specifically described in one figure but are described with respect to another figure have the same structures, positions, and/or functions across multiple figures or embodiments in which the parts are present.

The diode laser array 107, as shown in FIG. 50, used in all the solutions herein may be replaced with other diode laser arrays. The principle is the same as that of the diode laser array module 138, which will be not repetitively described herein.

The pin connectors connecting the diode lasers 15 in all the solutions may be replaced with pin connecting PCBs. The principle is the same as that of the diode laser array module 138, which will be not repetitively described herein.

The pressing plate module used in all the solutions herein may be correspondingly adjusted according to the difference between the pressing plate module 141 and the pressing plate module 105 to form a new pressing plate module and make replacement. The principle is the same as that of the diode laser array module 140, which will be not repetitively described herein.

The same or similar changes of the diode laser array module 187 relative to the diode laser array module 138 may be used in any of solutions the same as or similar to the solution herein. The principle is the same, which will be not repetitively described herein.

The same or similar changes of the diode laser array module 203 relative to the diode laser array module 138 may be used in any of solutions the same as or similar to the solution herein. The principle is the same, which will be not repetitively described herein.

In some embodiments, in order to mount the circuit more easily, instead of using the U-shaped pin connectors to link the individual diode lasers in a respective row of diode lasers, the diode lasers in a row are electrically connected by a PCB (e.g., an elongated PCB 139) to make the mounting more convenient.

FIG. 49 shows a schematic perspective view and a bottom view of a diode laser array module 138 in accordance with some embodiments. In FIG. 49, instead of using a series of the U-shaped pin connector to connect the pins 4 of a row of diode lasers and using a U-shaped pin connector to connect the leads of two U-shaped pin connectors at the end of two adjacent rows of diode lasers in a respective diode laser array module, a pin connecting circuit PCB 139 is used to connect each row of diode lasers 15 in a diode laser array 107 to form the diode laser array module 138.

As shown in FIG. 49, the diode laser array module includes a liquid cooled radiator 102 and a diode laser array comprising four rows of diode lasers 15. The four rows of diode lasers 15 are disposed into an array of through holes 115 with opening in the top surface of the liquid-cooled radiator 102. A module pressing plate 105 includes a plurality of stepped through holes 105 at locations corresponding to the diode lasers 15 in the diode laser array, and fixes the diode lasers 15 into the through holes 115 in the heat sink of the liquid-cooled radiator 102. There are a plurality of linear grooves 118 near the edge of the top surface of the liquid-cooled radiator. The inner end of the linear groove 118 on the top surface of the liquid-cooled radiator is connected to the top of the groove 120 in the bottom surface of the liquid-cooled radiator 102 by a vertical hole 117 in the body of the liquid-cooled radiator 102. The driving circuit PCB 106 is connected to the circuit of the different rows of diode lasers 14 in the diode laser array 107 by the horizontal portions of the L-shaped pin connectors 110 that is disposed in the linear grooves 118 on the top surface of the liquid-cooled radiator 102. The liquid-cooled radiator 102 includes a liquid-filled channel with an inlet 103 and an outlet 104 on the side surface of the liquid-cooled radiator 102. In some embodiments, as shown in FIG. 49, the PCB 106 is optionally disposed at a vertical location on the side surface of the liquid-cooled radiator 102 above the vertical position of the inlet and outlet. In some embodiments, the PCB 106 includes cutout portions that allow the PCB 106 to occupy a portion of the side surface of the liquid-cooled radiator 102 that is adjacent to the inlet 103 and the outlet 104. As shown in the bottom view of the diode laser module 138 in FIG. 49, the bottom surface of the liquid-cooled radiator 102 includes a plurality of linear grooves 139. Each linear groove 120 is located and oriented to link the bottom portions of a respective row of through holes 115, and through which the pins 4 of the diode lasers 15 can be soldered to a respective PCB 139 disposed within the groove 120. In some embodiments, a set of linear grooves 118 and corresponding vertical holes 117 are disposed on both sides of the liquid-cooled radiator 102, as shown in FIG. 51.

In some embodiments, the module pressing plate 105 includes a plurality of stepped through holes running though the upper surface and the lower surface of the module pressing plate 105. Each stepped through hole is used to fix one diode laser 15 and one lens 42 onto the top surface of the liquid-cooled radiator 102 when the module pressing plate 105 is affixed to the top surface of the liquid-cooled radiator 102. In some embodiments, two laser beams 7 emitted by each diode laser 15 pass through the stepped through holes in the module pressing plate 105 to reach the lens 42 and form two collimated laser beams.

The bottom surface of the diode laser module (e.g., including the module pressing plate 105 and the diode laser array including the multiple rows of diode lasers 15) is in close thermal contact with the top surface of the heat sink of the liquid-cooled radiator 102. The heat produced during working of the diode lasers 15 is transferred to the liquid-cooled radiator 102 for cooling. Coolant flows in from the inlet 103 and out from the outlet 104. The coolant may be water, ethylene glycol, etc. The water passage in the liquid-cooled radiator is inserted between the grooves 120 for the transmission of coolant. The body of the liquid-cooled radiator 102 is a heat sink made of heat conducting materials. In some embodiments, the liquid-cooled radiator 102 consists of a heat sink when a preformed water passage, and a water passage sealing plate, and the water passage sealing plate is embedded into the water passage and is bonded together through the adhesive or welded together.

FIG. 50 is a perspective view of the connecting modes of the diode laser array 107 in the diode laser array module 138, in accordance with some embodiments. As shown in FIG. 50, each of the L-shaped pin connectors 110 serves as a portion of a respective pin connector module that connects a respective PCB 139 to a driving circuit PCB 106. Each pin connecting PCB 139 connects a respective row of diode lasers 15, and serves as another portion of the pin connector module for the respective row of diode lasers 15. The driving circuit PCB 106 in the diode laser array module 138 is connected to the respective pin connector modules (e.g., comprising a PCB 139 and at least one L-shaped pin connector 110) for multiple rows of diode lasers 15, are shown in FIG. 50.

The sectional view of the diode laser array module 138 is shown in FIG. 51. As shown in FIG. 51, the diode lasers 15 are placed into the stepped through holes 115 in the liquid-cooled radiator 102. The metal base 9 is in contact with the liquid-cooled radiator 102. The metal housing 10 passes through the stepped through holes in the module pressing plate. The pressing plate module 105 and the liquid-cooled radiator 102 squeeze each other to fix the diode lasers 15. One lens 42 corresponds to one diode laser 15 and is fixed on the corresponding stepped through hole in the module pressing plate by adhesive. The adhesive may be silica gel, thermosetting adhesive, etc.

The L-shaped pin connector 110 connects the driving circuit PCB 106 and the pin connecting circuit PCB 139; and the pin connecting circuit PCB 139 connects a plurality of diode lasers 15 and the L-shaped pin connectors 110 in the same row, which makes adjacent diode lasers 15 be connected in series or parallel.

The pin connecting circuit PCB 139 is put into the groove 120 in the bottom surface of the liquid-cooled radiator. The horizontal portion of the L-shaped pin connector 110 is put into the groove 118 on the top surface of the liquid-cooled radiator 102. The vertical portion of the L-shaped pin connector 110 is disposed in the vertical hole 117 that links the groove 120 and the groove 118. The vertical hole 117 and the vertical portion of the L-shaped pin connector 110 are disposed in a portion of the liquid-cooled module 102 that is outside of the groove 120.

In some embodiments, the pressing plate module 105 in the diode laser array module 138 does not cover the through holes 117 and grooves 118 in the liquid-cooled radiator 102. In order to prevent air from entering the working area of the diode lasers along the through holes 117 and grooves 118, the through holes 117 and grooves 118 need to be filled by using adhesive and other sealing methods, resulting in increase of assembly complexity. In some embodiments, it is advantageous to cover the through holes 117 and grooves 118 with a large pressing plate module to reduce the sealing difficulty of the diode laser array module.

FIGS. 52-54 illustrated a diode laser array module 140 that is a variation on the basis of the diode laser array module 138. FIG. 52 shows a perspective view and a bottom view of the diode laser array module 140. In this example, the PCBs 139 are optionally replaced by respective series of U-shaped pin connectors that are disposed in the grooves 120 in the bottom surface of the liquid-cooled radiator 102 and used to link respective rows of diode lasers 15. In this example, the module pressing plate 105 is optionally replaced with a module pressing plate 141 that is larger and extends all the way to cover the linear grooves 118 and the vertical holes 117 in the top surface of the liquid-cooled radiator 102.

In FIG. 52 and FIG. 53, the pressing plate module 105 of the diode laser array module 138 is replaced with the pressing plate module 141 to form a diode laser array module 140. The other parts are totally the same, which will not be repetitively described herein.

An exploded view of the diode laser module 140 is show in FIG. 53. The relative positions and orientations of the components of the diode laser array module 140 are illustrated.

A partial sectional view of the pressing plate module 141 is shown in FIG. 54, the array distribution of the stepped through hole 116 in the pressing plate module 141 is totally the same as that in the pressing plate module 105. The size of the pressing plate module 141 is larger than that of the pressing plate module 105, and can cover the through holes 117 and grooves 118. The other parts are totally the same, which will not be repetitively described herein. The pressing plate module 141 consists of a plurality of stepped through holes 116 running through the upper surface and the lower surface. Each through hole 116 is used to fix one diode laser 15 and one lens 42, and the material of the pressing plate module 141 is not limited. Two laser beams 7 emitted by each diode laser 15 pass through the through holes 116 to reach the lens 42 and form two collimated laser beams 44.

In some application environments, in addition to the diode lasers being mounted on the upper surface of the liquid-cooled radiator, other parts need to be kept intact, and so the solution needs to be changed to meet the requirements.

FIGS. 55-62 illustrate a diode laser array module 187 and various components thereof in accordance with some embodiments.

Figure 55:
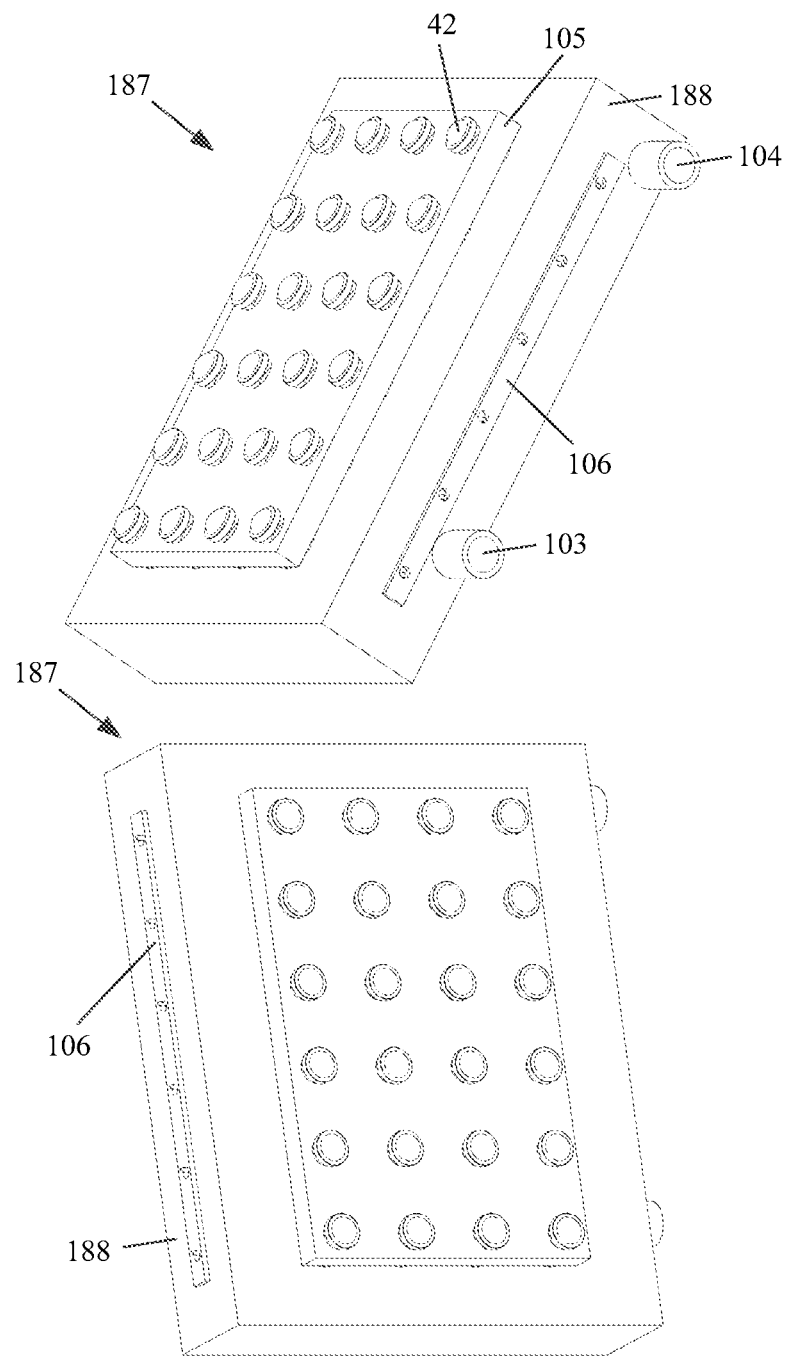
FIGS. 55-62 illustrate a diode laser array module 187 and components thereof in accordance with some embodiments.
Figure 56:
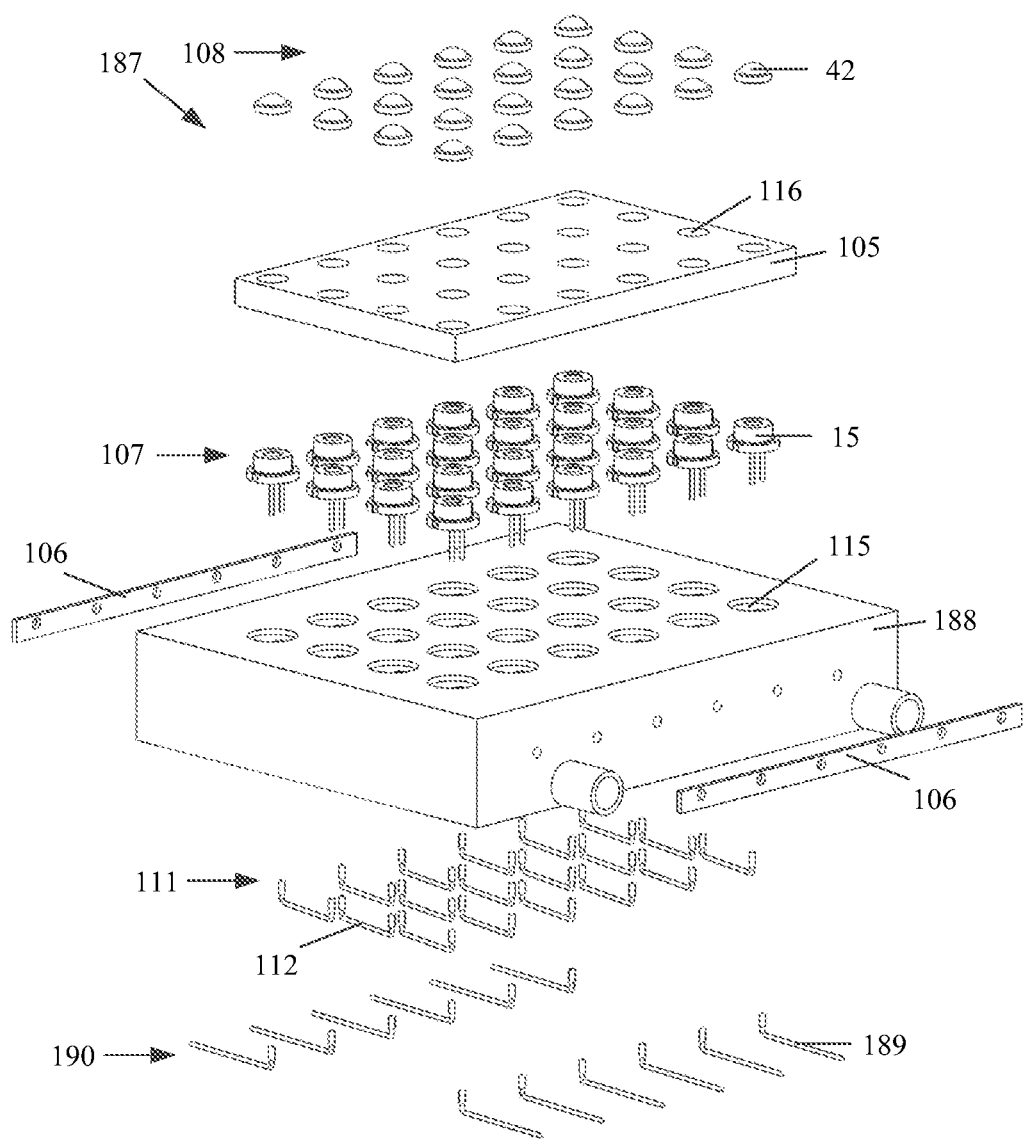

FIG. 55 shows the diode laser array module 187 from two different perspectives. FIG. 56 shows an exploded view of the diode laser array module 187. As shown in FIG. 55 and FIG. 56, the difference between the diode laser array module 187 and the diode laser array module 138 mainly lies in the liquid-cooled radiator and the pin connectors, and the other parts are totally the same, which will be not repetitively described herein.

The diode laser array module 187 includes a diode laser array 107, a lens array 108, a pressing plate module 105, a U-shaped pin connector array 111, an L-shaped pin connector array 190 consisting of a plurality of L-shaped pin connectors 189, a driving circuit PCB 106 and a liquid-cooled radiator 188.

The heat produced during working of the diode laser 15 is transferred to the liquid-cooled radiator 188 for cooling. Coolant flows in from the inlet 103 and out from the outlet 104. The coolant may be water, ethylene glycol, etc.

Figure 57:
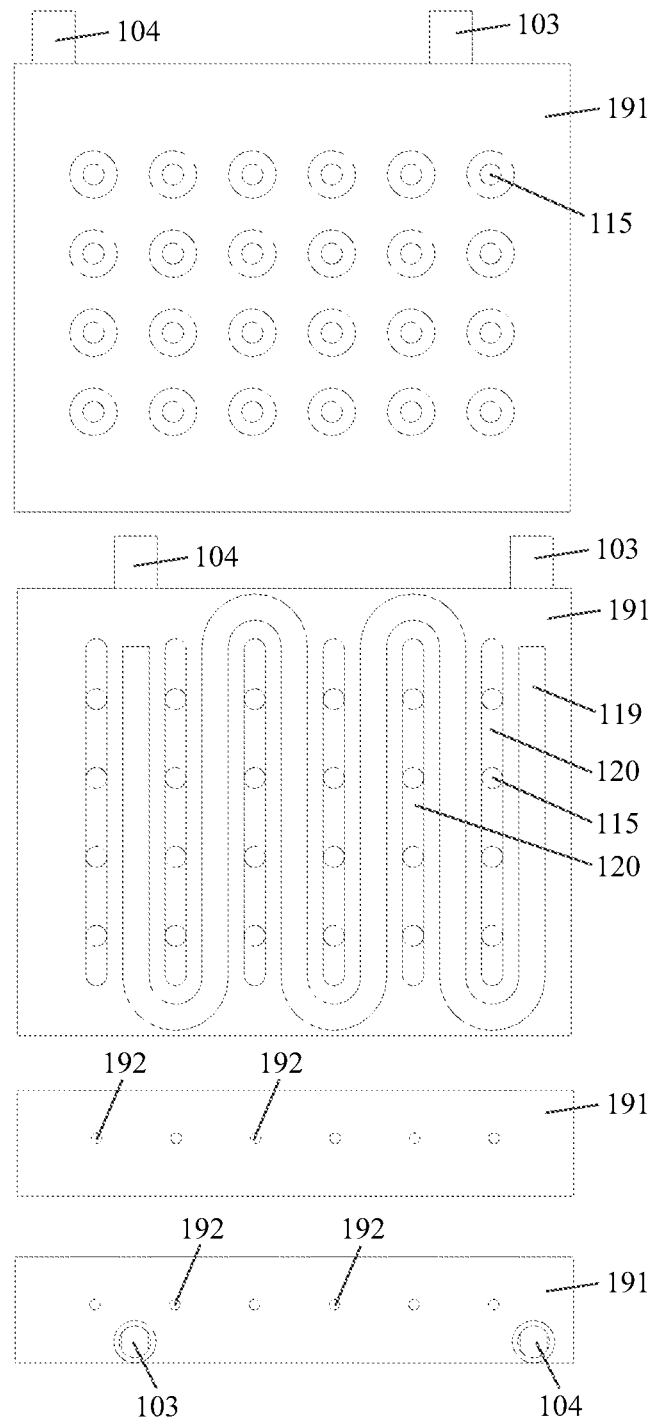

FIG. 57 shows various views (e.g., top, bottom, left, right) of the liquid-cooled radiator 188, in accordance with some embodiments. The heat sink 191 of the liquid-cooled radiator 188 is shown in FIG. 57. The upper surface of the heat sink 191 includes a plurality of stepped through holes 115 arranged in multiple rows, the stepped through holes 115 each runs from the upper surface to the lower surface of the liquid-cooled radiator 188.

The lower surface of the heat sink 191 includes a plurality of linear grooves 120 running through a plurality of stepped through holes 115 in the same row. A plurality of through holes 192 run through the side surfaces of the heat sink 191 and through the ends of the grooves 120 (e.g., a horizontal through hole 192 runs from each end of a respective groove 120 through the body of the heat sink 191 to exit on a side surface of the heat sink 191). In some embodiments, the vertical positions of the through holes 192 are above the vertical positions of the water passages in the liquid-cooled radiator 188. In some embodiments, the through holes 192 are adjacent the water passages in the liquid-cooled radiator 188.

Each stepped through hole 115 is used to fix one diode laser 15, the linear grooves 120 are used to accommodate a plurality of U-shaped pin connectors 112 and a plurality of L-shaped pin connectors 189. If PCBs 139 are to replace the U-shaped pin connectors 112 to serve as part of the pin connector modules for the different rows of diode lasers, the PCBs 139 will be placed in the linear grooves 120.

Figure 58:
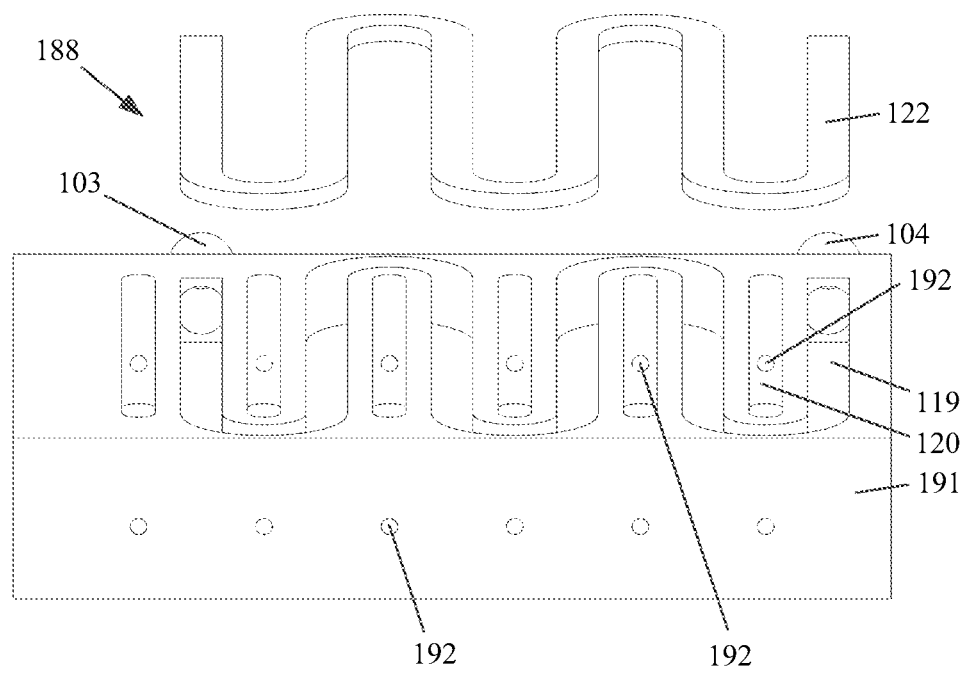

The water passage 119 above the lower surface of the heat sink 191 is communicated with the inlet 103 and the outlet 104, and is inserted between the grooves 120 for the transmission of coolant. The heat sink 191 is made of a heat conducting material. The exploded view of the liquid-cooled radiator 188 is shown in FIG. 58. The liquid-cooled radiator 188 consists of a heat sink 191 and a water passage sealing plate 122, and the water passage sealing plate 122 is embedded into the water passage 119 and is bonded together through adhesive or welded together. The exploded view of the liquid-cooled radiator 188 also shows the relative positions of the through holes 192, the linear grooves 120, the water passage 119 in the heat sink 191 of the liquid-cooled radiator 188.

Figure 59:
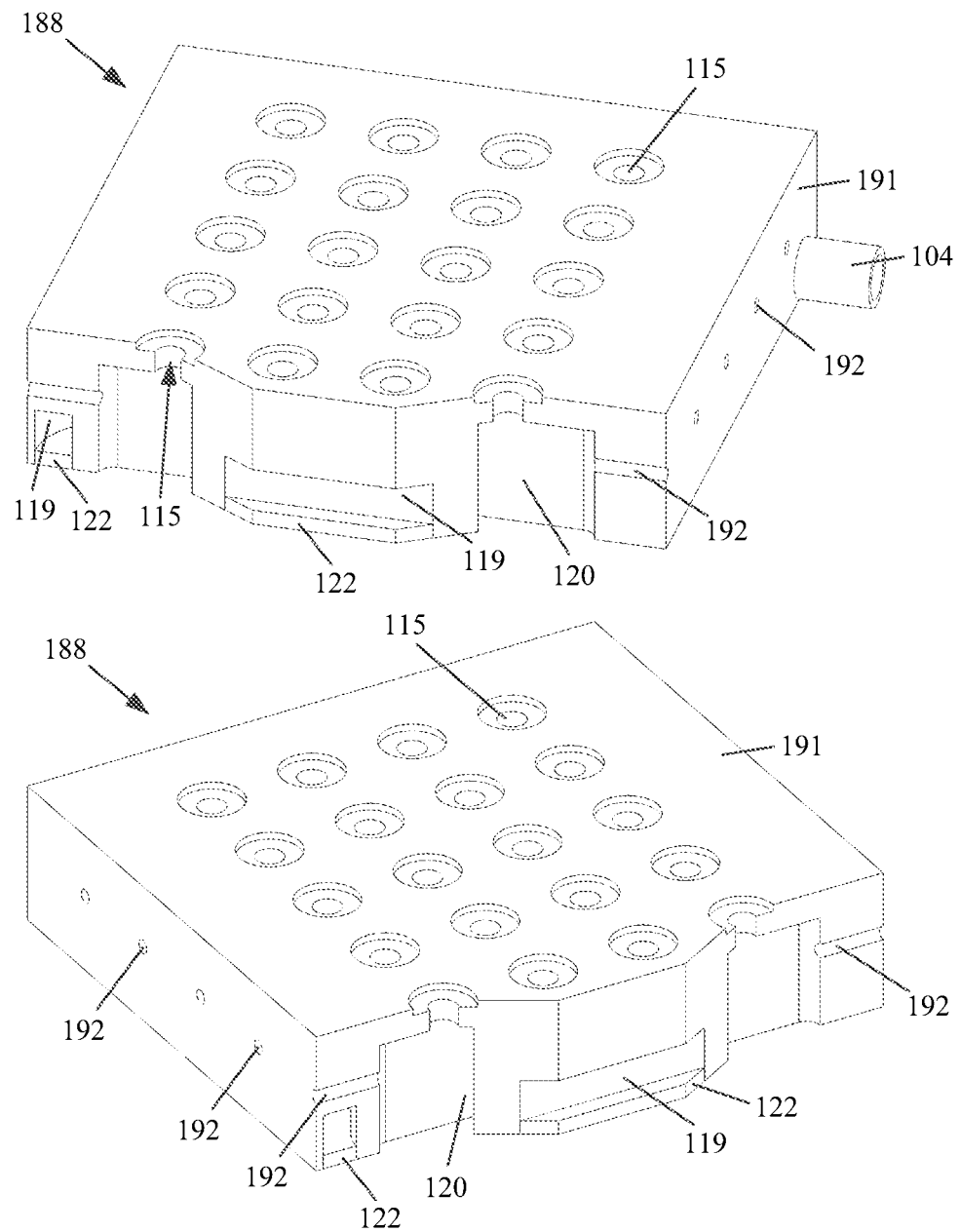

The partial sectional views of the liquid-cooled radiator 188 are shown in FIG. 59. In FIG. 59, the horizontal through holes 192 passes through the end walls of the groove 120 to the side surfaces of the heat sink 191.

Figure 60:
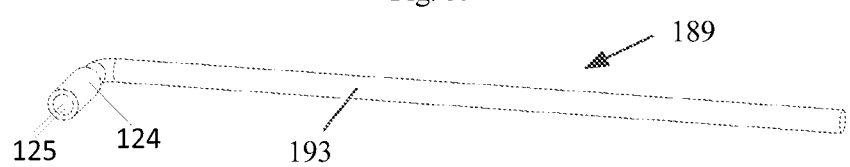

The L-shaped pin connector 189 is shown in FIG. 60. An L-shaped pin connector 189 consists of one pin connecting end 124 (e.g., a vertical portion of the L-shaped pin connector 189 a first or last diode laser 15 in a row of diode lasers, within the groove 120) and one L-shaped metal connecting rod 193 (e.g., a horizontal portion of the L-shaped pin connector 189 that is disposed in the horizontal hole 192 and connects to the driving circuit PCB 106 at a location outside of the side surface of the liquid-cooled radiator 188). The hole 125 in the pin connecting end 124 is used for pin connection of the diode lasers 15. The L-shaped pin connectors 189 are made of a conductive material.

The connecting modes of the diode laser array 107, the L-shaped pin connectors 189, the U-shaped pin connectors 112, and the driving circuit PCB 106 in the diode laser array module 187 are shown in FIG. 61, in accordance with some embodiments.

The sectional view of the diode laser array module 187 is shown in FIG. 62. The diode lasers 15 are placed into the stepped through holes 115. The metal base 9 is in contact with the liquid-cooled radiator 188. The metal housing 10 passes through the stepped through holes 116 in the module pressing plate 105. The pressing plate module 105 and the liquid-cooled radiator 188 squeeze each other to fix the diode lasers 15. One lens 42 corresponds to one diode laser 15 and is fixed on the corresponding stepped through hole 116 in the module pressing plate 105 by adhesive. The adhesive may be silica gel, thermosetting adhesive, etc. The L-shaped pin connector 189 connects the diode laser 15 and the driving circuit PCB 106. The horizontal portion of the L-shaped pin connector 189 passes through the horizontal hole 192 from the end of the groove 120 to the side surface of the liquid-cooled radiator 188. The vertical portion of the L-shaped pin connector 189 connects to the pin of the first or last diode laser 15 of a respective row of diode lasers 15. The U-shaped pin connector 112 connects two adjacent diode lasers 15 in a respective row of diode lasers 15. The U-shaped pin connectors 112 and the L-shaped pin connectors 189 are placed into the grooves 120. The U-shaped pin connectors 112 and the two L-shaped pin connectors 189 form a respective pin connector module for a respective row of diode lasers 15 in the diode laser array module 187.

In some embodiments, in order to reduce the processing difficulty of the liquid-cooled radiator to a greater extent, PCBs are used to replace the pin connectors within the grooves 120 and through the body of the liquid-cooled radiator.

Figure 63:
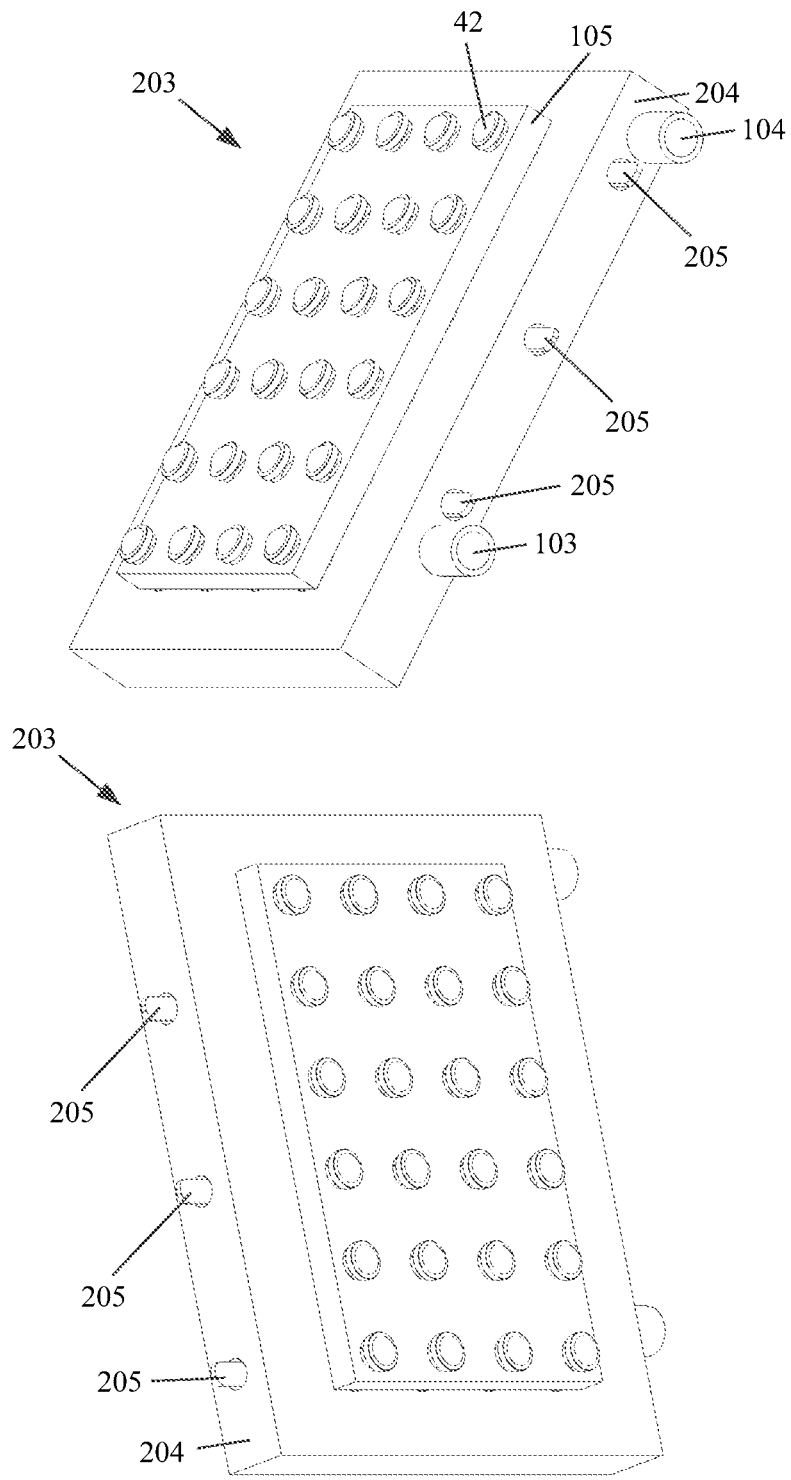
FIGS. 63-69 illustrate a diode laser array module 203 and components thereof in accordance with some embodiments.
Figure 64:
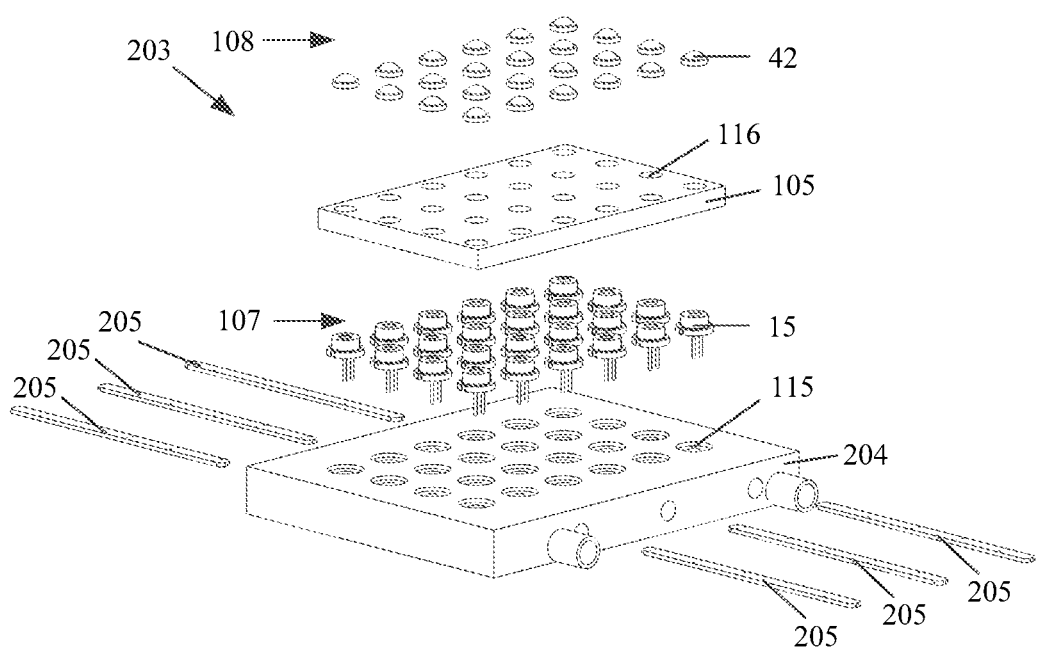

FIGS. 63-69 illustrate various views of a diode laser array module 203 and components thereof, in accordance with some embodiments. As shown in FIG. 63 and FIG. 64, the liquid-cooled radiator 102 of the diode laser array module 187 is replaced with the liquid-cooled radiator 204, and the U-shaped pin connectors 112, the L-shaped pin connectors 189 and the driving circuit PCB 106 are replaced with the pin connecting circuit PCBs 205 to form a diode laser array module 203. The other parts are totally the same, which will not be repetitively described herein.

The diode laser array module 203 includes a diode laser array 107, a lens array 108, a pressing plate module 105, a plurality of pin connecting circuit PCBs 205 and a liquid-cooled radiator 204. FIG. 64 is an exploded view of the diode laser array module 203, showing the relative locations and orientations of the different components in the diode laser array module.

The heat produced during working of the diode laser 15 is transferred to the liquid-cooled radiator 204 for cooling. Coolant flows in from the inlet 103 and out from the outlet 104. The coolant may be water, ethylene glycol, etc.

Figure 65:
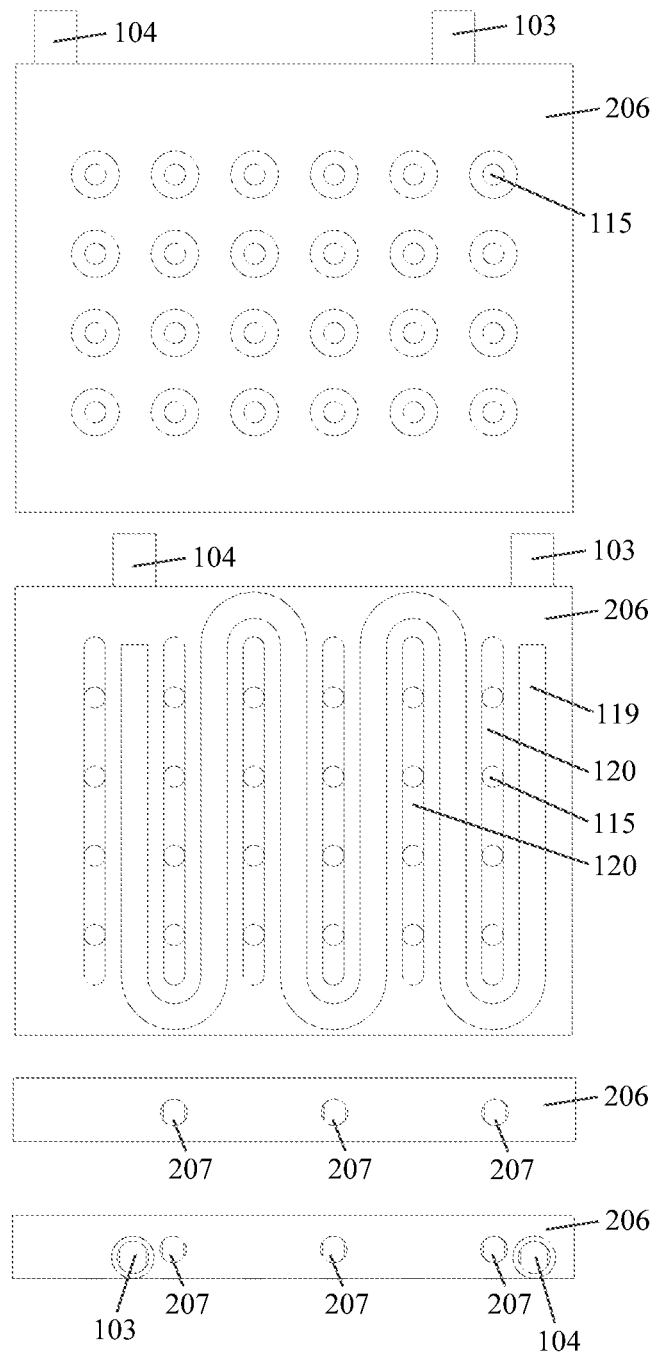
Figure 66:
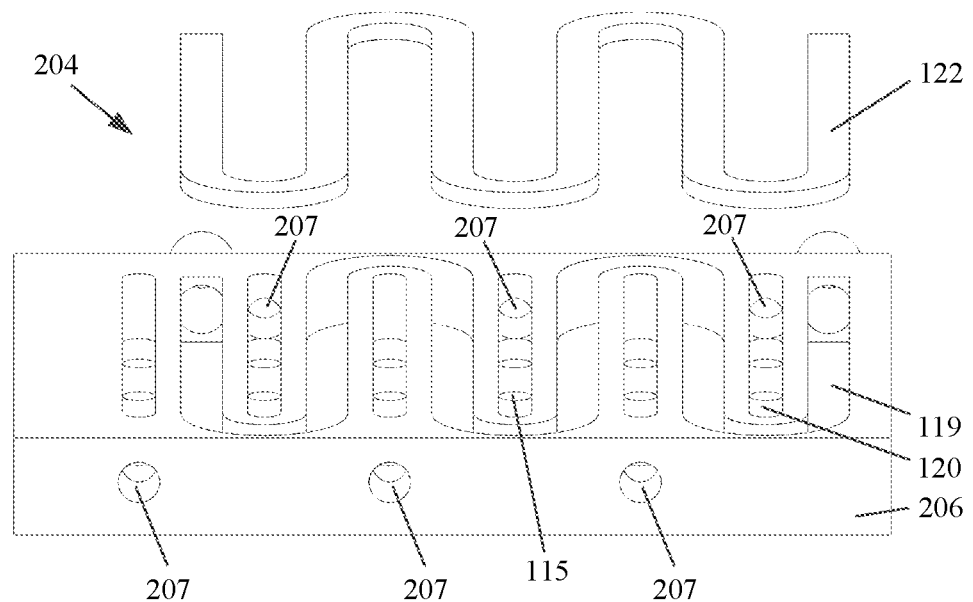

FIG. 65 shows a plurality of views (e.g., top, bottom, left, right) of the liquid-cooled radiator 204. The heat sink 206 of the liquid-cooled radiator 204 is shown in FIG. 65. The top surface of the heat sink 206 consists of a plurality of stepped through holes 115 running through the upper surface and the lower surface of the heat sink 206. The bottom surface of the heat sink 206 includes a plurality of linear grooves 120 each running through a plurality of stepped through holes 115 in the same row, and a plurality of through holes 207 running through the side surface and the grooves 120. Each through hole 207 links the end of a respective groove 120 to the side surface of the heat sink 206. Two opposing through holes 207 on the two opposing ends of a respective groove 120 are at the same vertical position that is within the vertical extent of the groove 120 in the body of the heat sink 206. The side surface of the heat sink 206 consists of a plurality of through holes 207 running through the side surface and grooves 120, and each through hole 207 is communicated with one corresponding groove 120. Each stepped through hole 115 is used to fix one diode laser 15 in the liquid-cooled radiator 204, and each linear groove 120 is used to accommodate a respective pin connecting circuit PCB 205 for a respective row of diode lasers 15.

Figure 157:
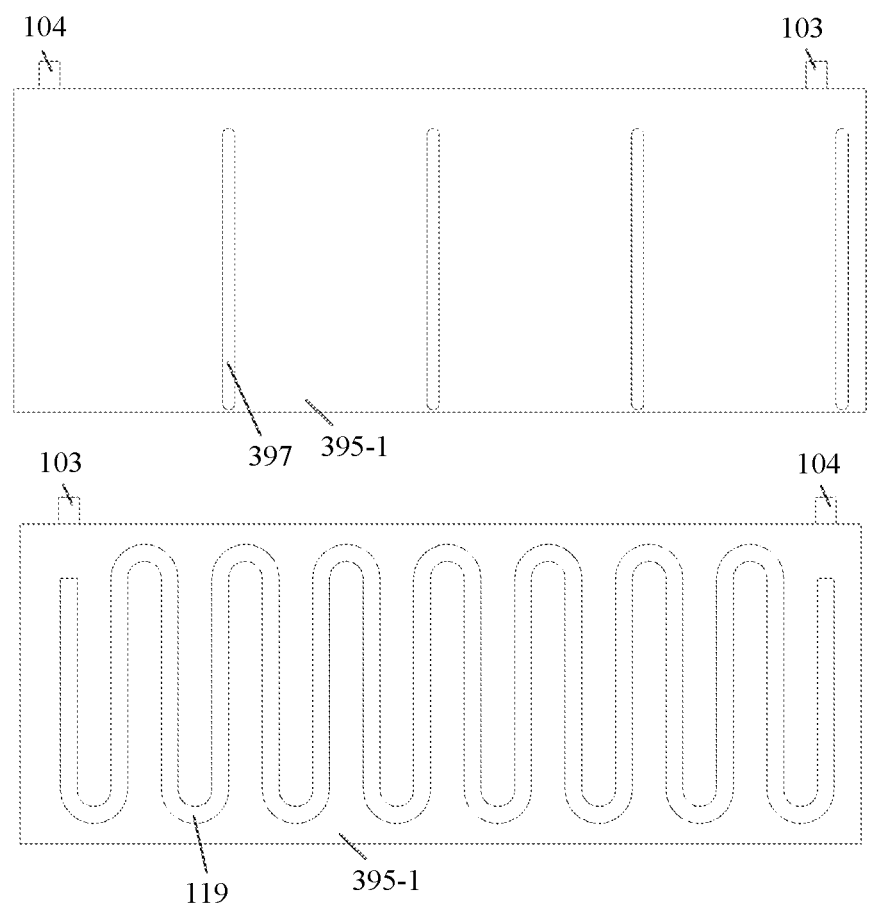

The water passage 119 above the lower surface of the heat sink 206 is communicated with the inlet 103 and the outlet 104, and is inserted between the grooves 120 for the transmission of coolant. The heat sink 206 is made of a heat conducting material. The exploded view of the liquid-cooled radiator 204 is shown in FIG. 157. The liquid-cooled radiator 204 consists of a heat sink 206 and a water passage sealing plate 122. The water passage sealing plate 122 is embedded into the preformed water passage 119 and the through holes 115 and 207 are exposed outside the water passage sealing plate. The water passage sealing plate 122 and the heat sink 206 are bonded together through adhesive or welded together.

Figure 67:
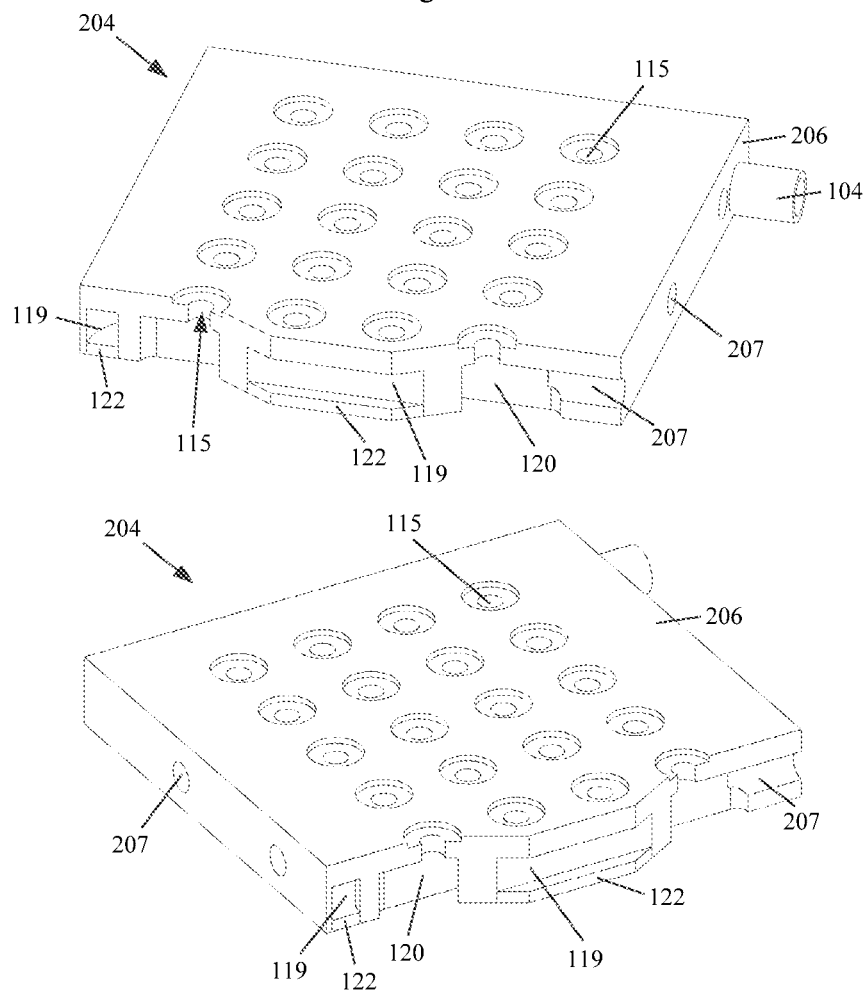

A pair of partial sectional views of the liquid-cooled radiator 204 is shown in FIG. 67. The sectional views show the positions and orientations of the through holes 207 in the body of the heat sink 206 from the end of the groove 120 to the side surface of the heat sink 206. The through holes 207 for adjacent rows of diode lasers 15 are optionally disposed on two opposite side surfaces of the heat sink 206, as they are separated by a water passage.

Figure 68:
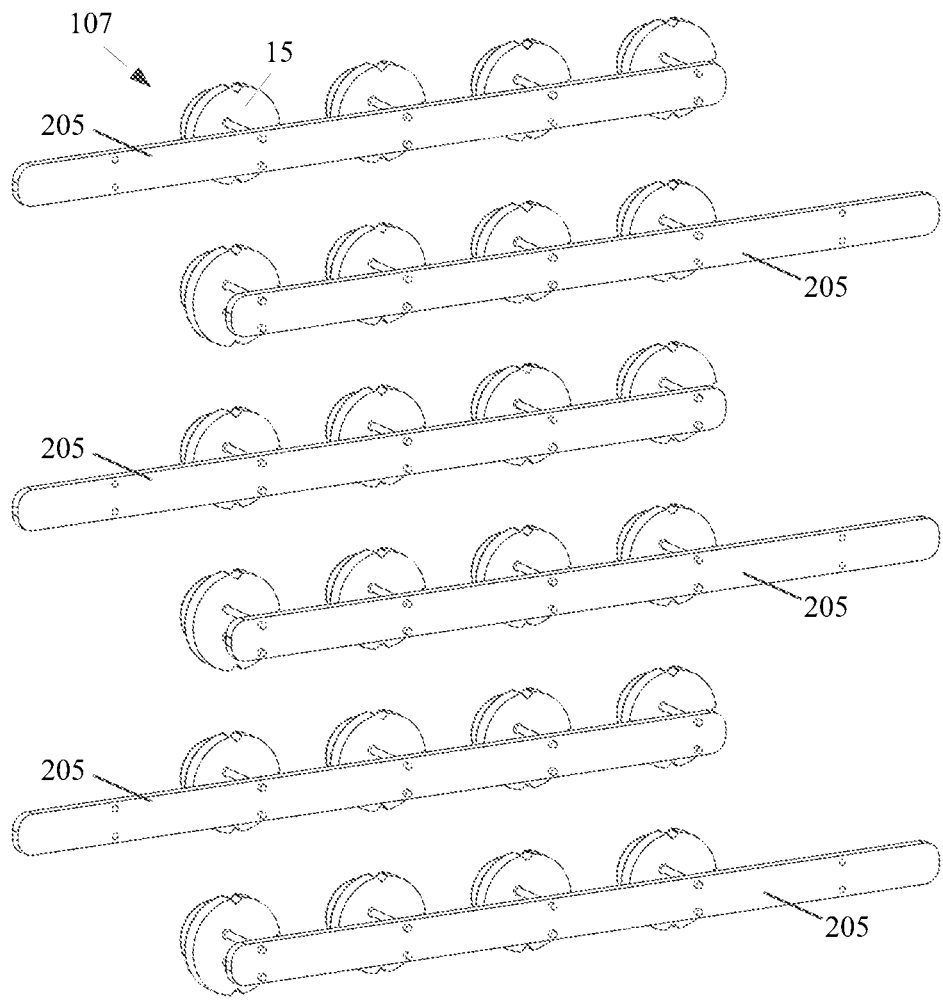

The connecting modes of the diode laser array 107 and the pin connecting circuit PCBs 205 in the diode laser array module 204 are shown in FIG. 68. As shown in FIG. 68, a first portion of the PCB 205 are connected with a respective row of diode lasers 15 and disposed within the groove 120, and a second portion (e.g., an end portion) of the PCB 205 is extended out of the side surface of the liquid-cooled radiator 204 through the hole 207, where the second portion of the PCB 205 is connected to (e.g., by its anode and cathode) a driving circuit PBC outside of the side surface of the liquid-cooled radiator 204.

Figure 69:
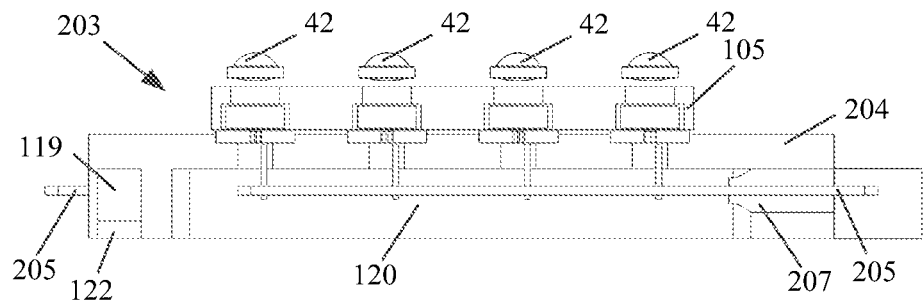

A sectional view of the diode laser array module 203 is shown in FIG. 69. The diode lasers 15 are placed into the stepped through holes 115. The metal base 9 is in contact with the liquid-cooled radiator 204. The metal housing 10 passes through the stepped through holes 116 in the module pressing plate 105. The module pressing plate 105 and the liquid-cooled radiator 204 squeeze each other to fix the diode lasers 15 on the liquid-cooled radiator 204. One lens 42 corresponds to one diode laser 15 and is fixed on the corresponding stepped through hole 116 by adhesive. The adhesive may be silica gel, thermosetting adhesive, etc. The pin connecting circuit PCBs 205 are placed into the grooves 120, extend out from the through holes 207 to a location outside of the side surface of the liquid-cooled radiator 204 and are to be connected with an external driving circuit.

The water passage sealing plate 122 of the liquid-cooled radiator 102, the liquid-cooled radiator 188, or the liquid-cooled radiator 204 and the diode lasers are respectively on the two opposing sides of the liquid-cooled radiator. In order to make more effective use of the surface of the liquid-cooled radiator, the water passage sealing plate 122 and the diode lasers are optionally placed on the same side of the liquid-cooled radiator, and the other surface can adapt to the application of more complex structure requirements, in some embodiments. The liquid-cooled radiator 239, the liquid-cooled radiator 241 in any solution herein will respectively replaces the liquid-cooled radiator 102 and the liquid-cooled radiator 204, with other aspects unchanged.

Figure 70:
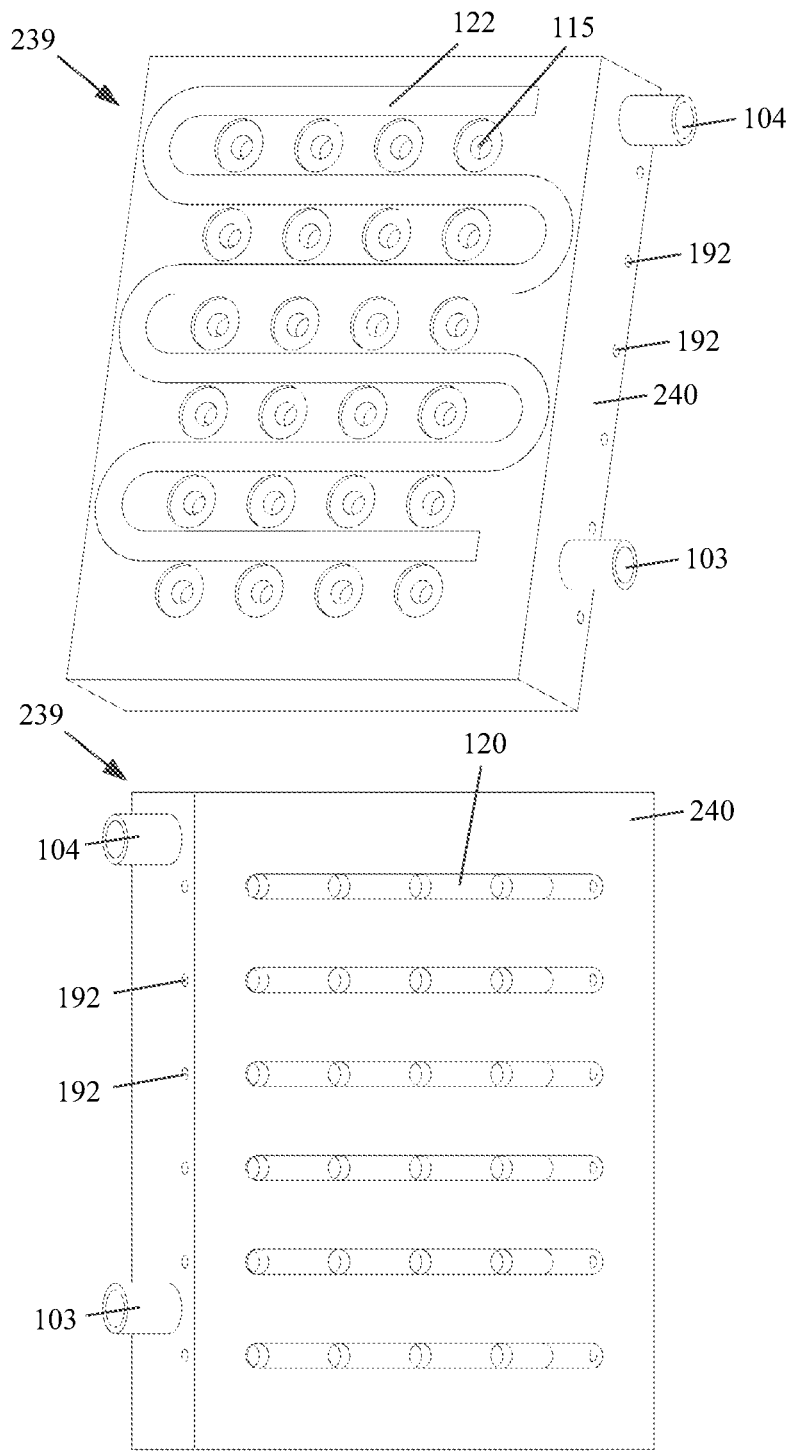
FIGS. 70-73 illustrate a liquid-cooled radiator 239 and components thereof in accordance with some embodiments.

FIG. 70 shows two perspective views (e.g., view from the top, and view from the bottom) of the liquid-cooled radiator 239. The liquid cooled radiator 239 can completely replace the liquid-cooled radiator 188, with the adjustment of the pin connector module to accommodate the change in position of the holes 192 on the side surface of the liquid-cooled radiator. The external shape characteristic of the liquid-cooled radiator 239 is totally the same as that of the liquid-cooled radiator 188 (only the vertical positions of the holes 192 and the vertical positions of the water passage 119 inside are changed), which will be not repetitively described herein.

Figure 71:
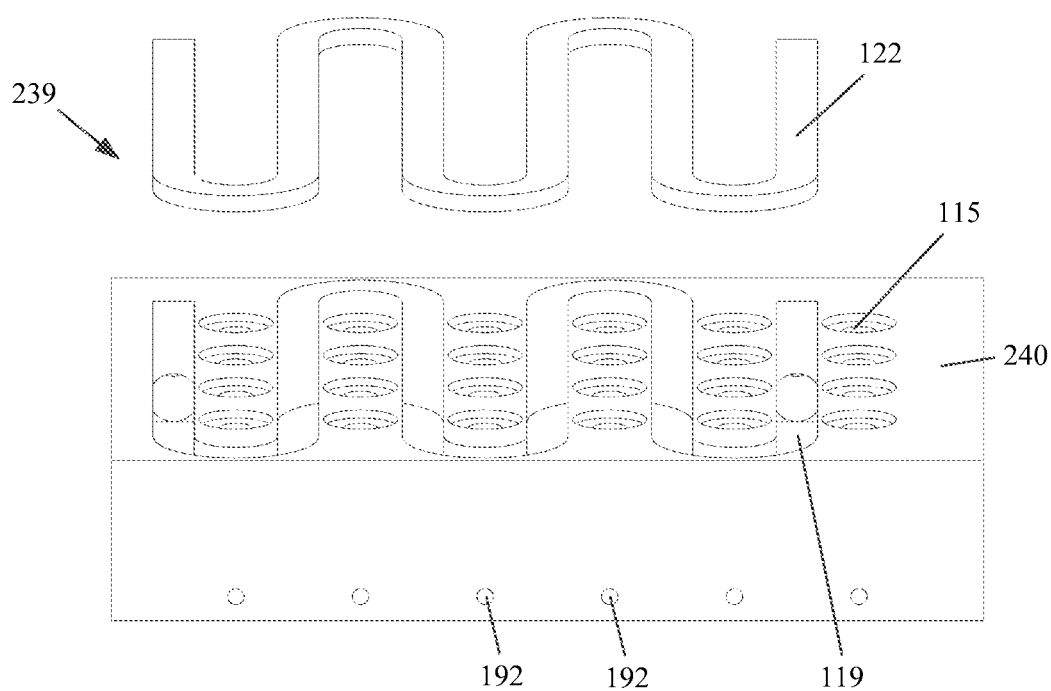

FIG. 71 is an exploded view of the liquid-cooled radiator 239. The liquid-cooled radiator 239 consists of a heat sink 240 and a water passage sealing plate 122, as shown in FIG. 71. The water passage 119 is preformed in the top surface of the heat sink 240 and goes around the through holes 115.

Figure 72:
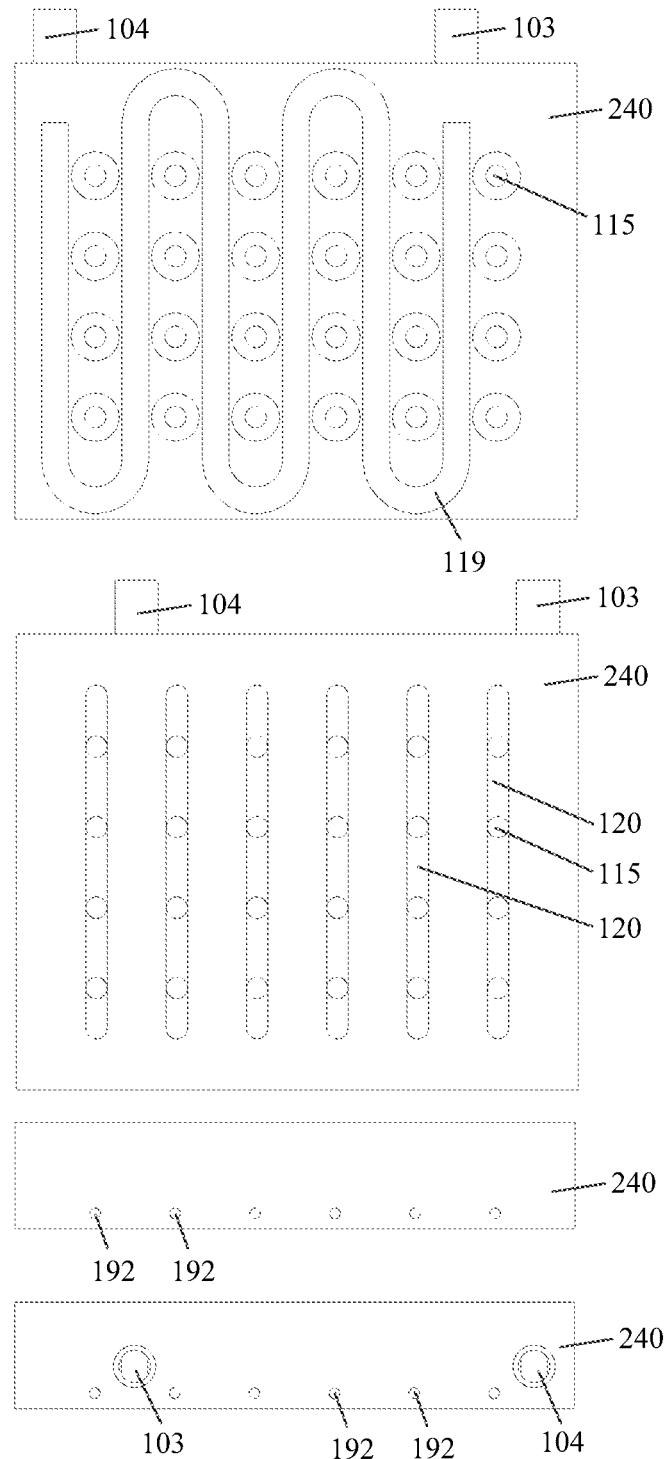
Figure 73:
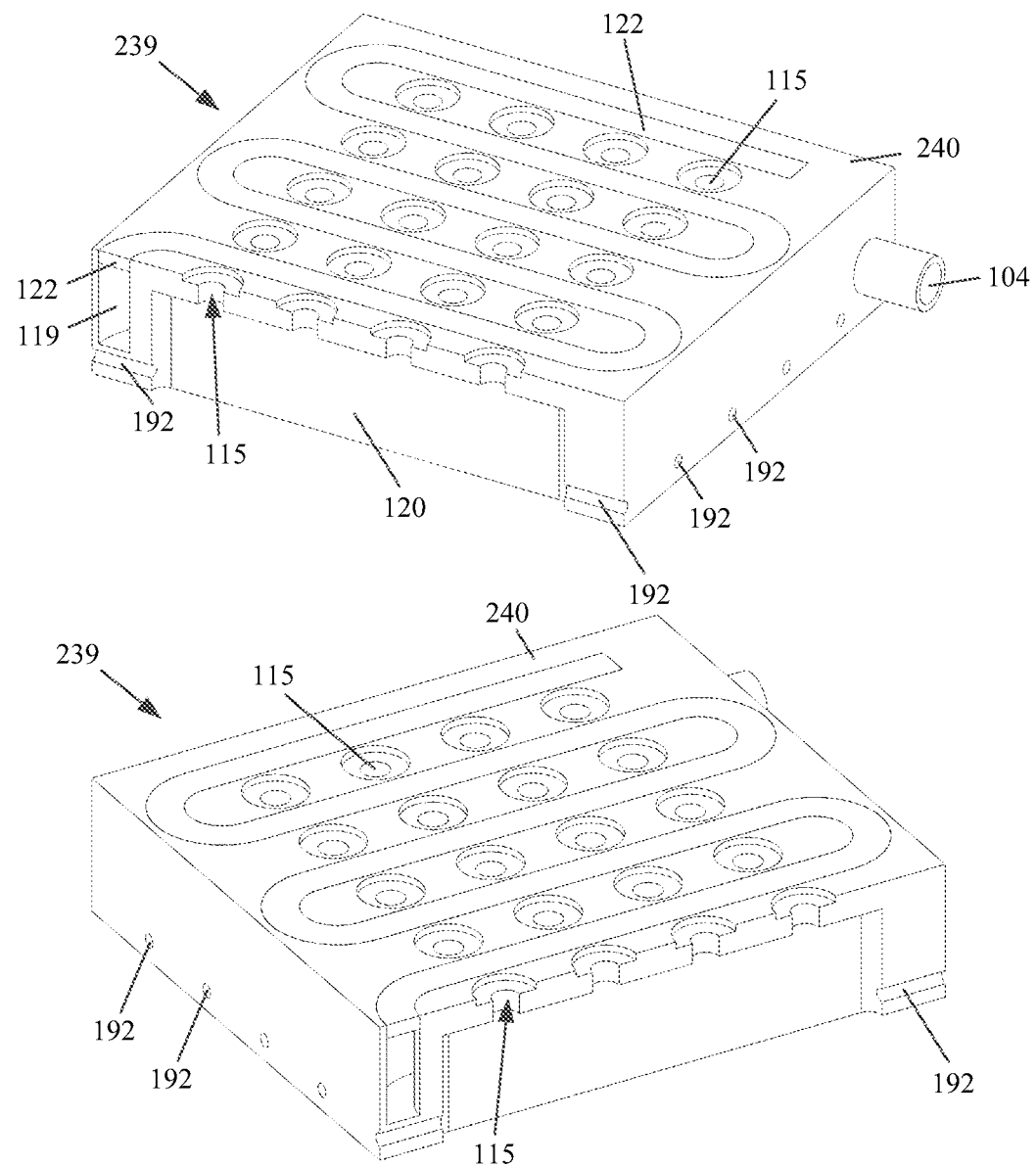

FIG. 72 shows a plurality of views (e.g., top, bottom, left, right) of the heat sink 240. The upper surface of the heat sink 240 includes a plurality of stepped through holes 115 running through the upper surface and the lower surface of the heat sink 240. The water passage 119 is preformed in the upper surface of the heat sink and sealed by a water passage sealing plate 122 bounded or welded to the top surface of the heat sink 240. The lower surface of the heat sink 240 include a plurality of linear grooves 120, each passing through the stepped through holes 115 in the same row. A plurality of through hole 192 run through the side surfaces of the heat sink 240, and the vertical positions of the through holes 192 are within the vertical extent of the grooves 120. The water passage 119 below the upper surface of the heat sink 240 is communicated with the inlet 103 and the outlet 104, and is inserted between the grooves 120 for the transmission of coolant. The heat sink 240 is made of a heat conducting material. The partial sectional views of the liquid-cooled radiator 239 are shown in FIG. 73. The partial sectional views in FIG. 73 illustrate the relative positions and orientations of the through holes 192, the groove 120 in the body of the liquid-cooled radiator 239.

Figure 74:
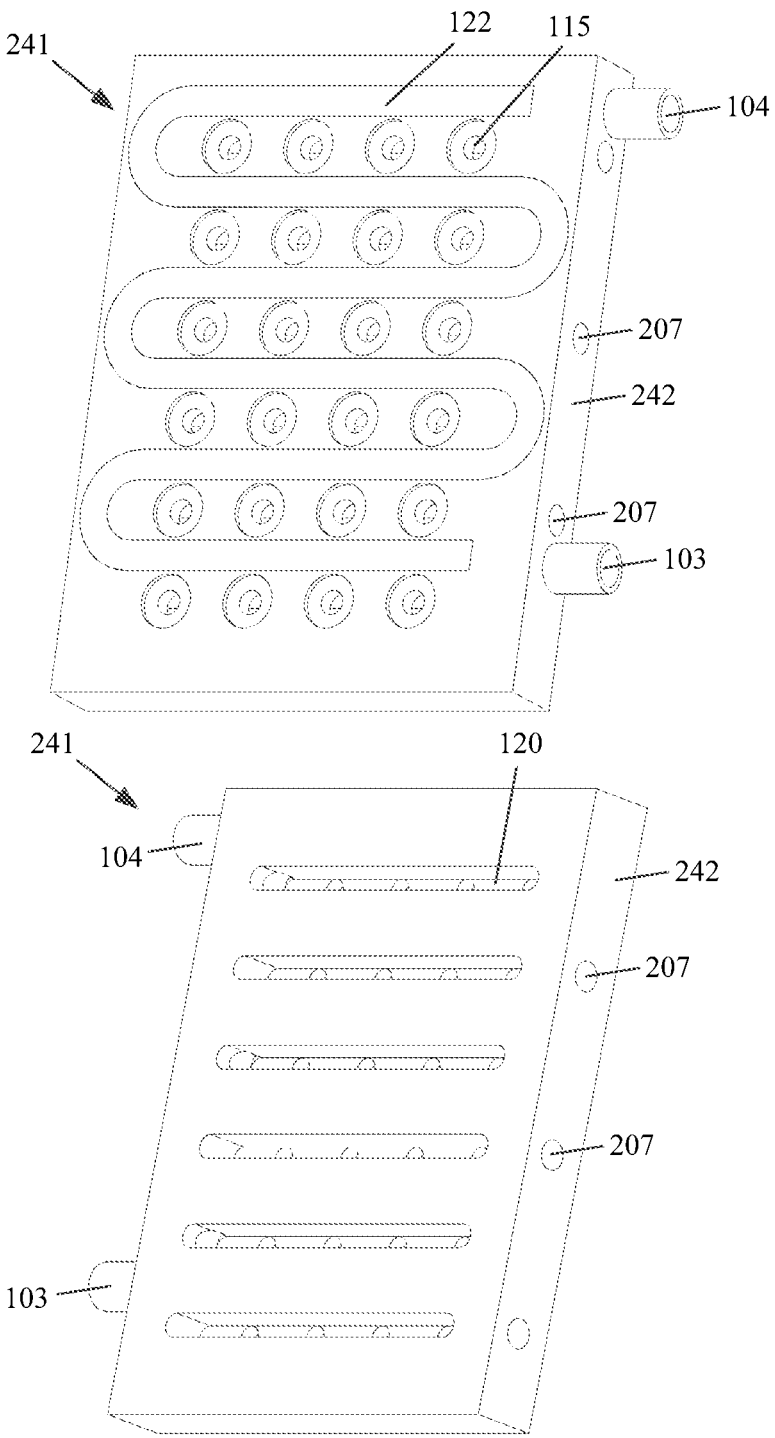
FIGS. 74-77 illustrate a liquid-cooled radiator 241 and components thereof in accordance with some embodiments.

FIG. 74 illustrates two perspective views (e.g., view from above, and view from below) of a liquid-cooled radiator 241, in accordance with some embodiments. In some embodiments, the liquid-cooled radiator 241 can completely replace the liquid-cooled radiator 204 in a diode laser array module. The external shape characteristic of the liquid-cooled radiator 241 is totally the same as that of the liquid-cooled radiator 204, which will be not repetitively described herein.

Figure 75:
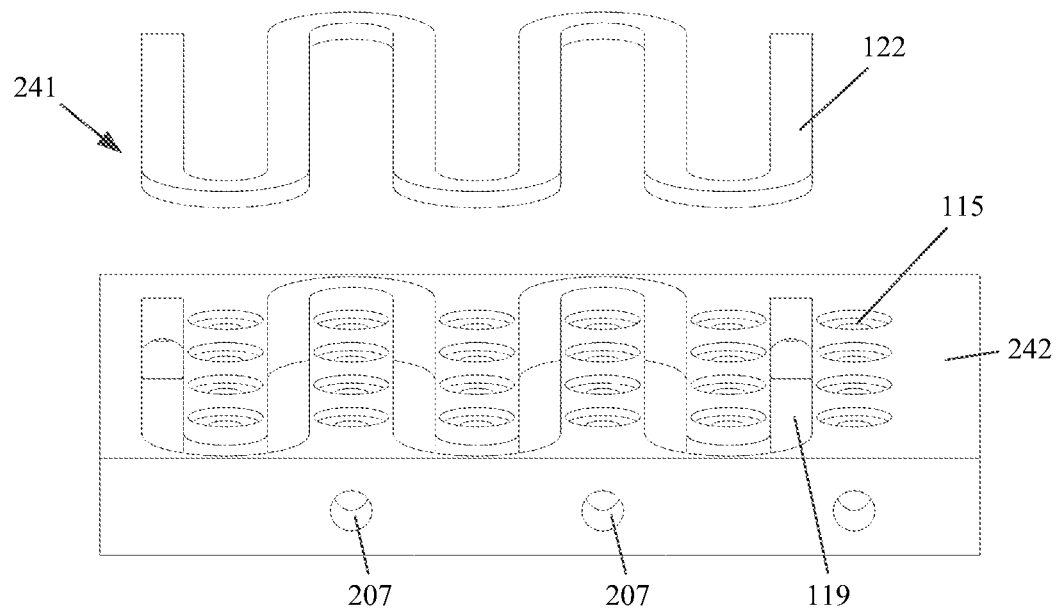
Figure 76:
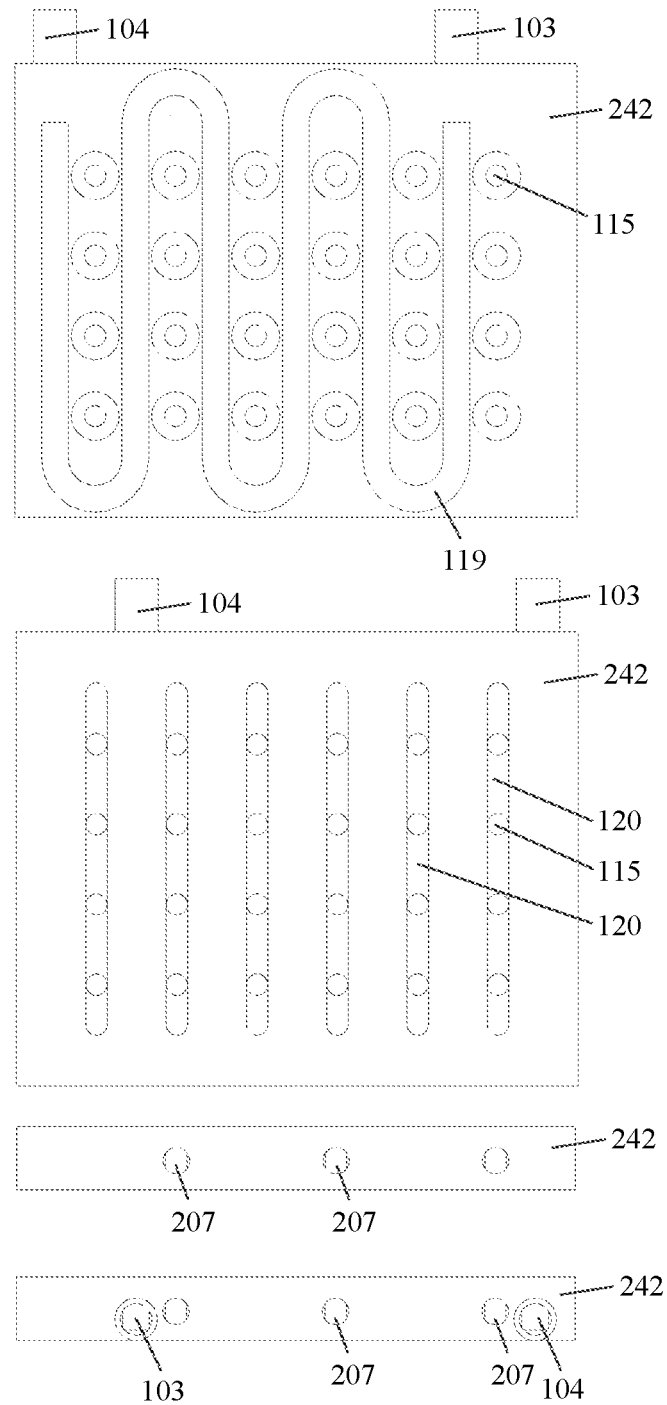

FIG. 75 shows an exploded view of the liquid-cooled radiator 241. The liquid-cooled radiator 241 includes a heat sink 242 and a water passage sealing plate 122, as shown in FIG. 75. FIG. 76 shows a plurality of views (e.g., top, bottom, left, right) of the liquid-cooled radiator 241. As shown in FIG. 76. The upper surface of the heat sink 242 includes a plurality of stepped through holes 115 running through the upper surface and the lower surface of the heat sink 242. The water passage 119 is preformed in the upper surface of the heat sink 242 and sealed by a water passage sealing plate from the top. The lower surface of the heat sink 242 includes a plurality of grooves 120 that link a plurality of stepped through holes 115 in the same row. The vertical positions of a plurality of through hole 207 running through one or both side surfaces are within the vertical extent of the grooves 120. The side surfaces of the heat sink 242 include a plurality of through holes 207 running through the side surfaces and the grooves 120, and each through hole 207 runs through one corresponding grooves 120.

The water passage 119 below the upper surface of the heat sink 242 is communicated with the inlet 103 and the outlet 104, and is inserted between the grooves 120 (and the rows of through holes 115) for the transmission of coolant. The heat sink 242 is made of a heat conducting material.

Figure 77:
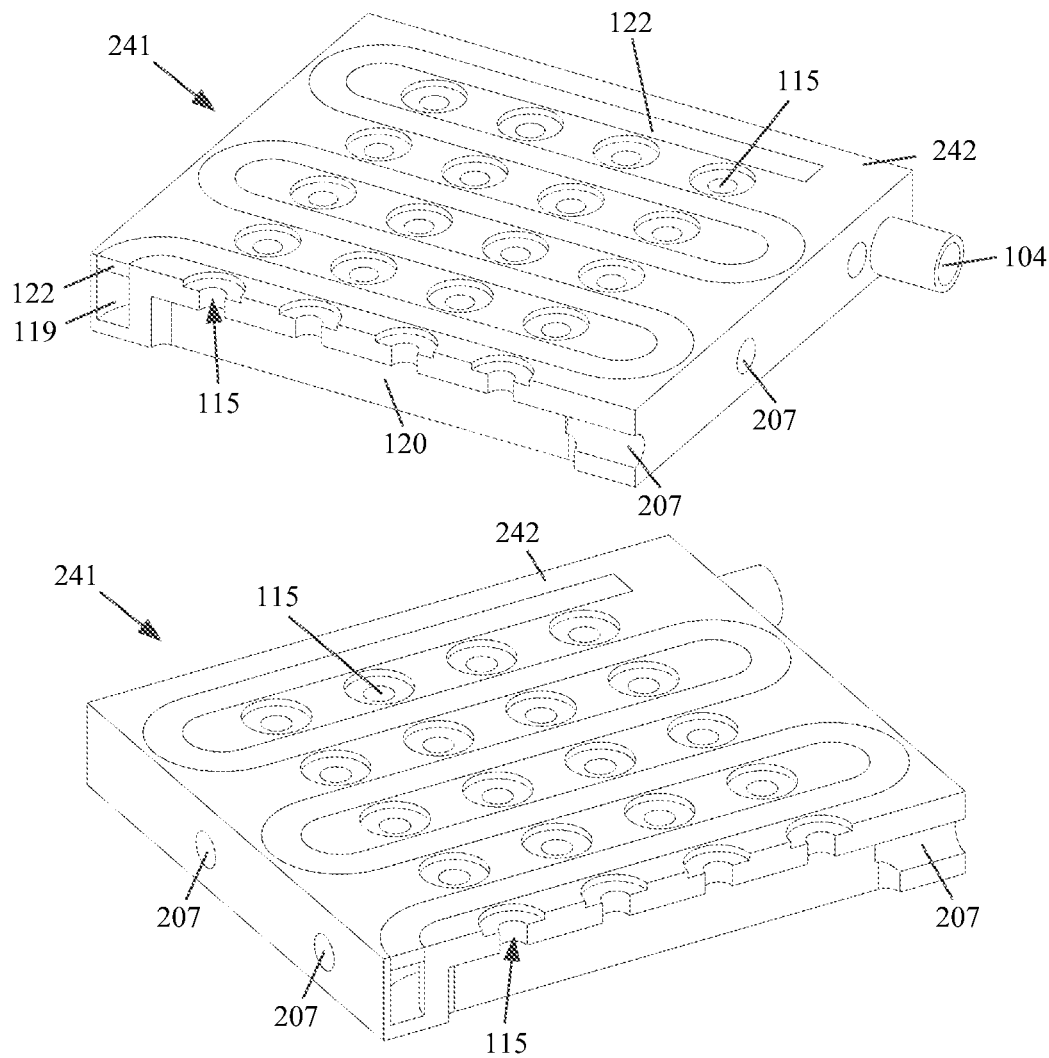

FIG. 77 shows the partial sectional views of the liquid-cooled radiator 241. The partial sectional views show the relative positions of the through holes 207 and the groove 120 for a respective row of diode lasers (e.g., at positions corresponding to a respective row of through holes 115). The use method of the liquid-cooled radiator 241 is totally the same as that of the liquid-cooled radiator 204, which will be not repetitively described herein.

Figure 78:
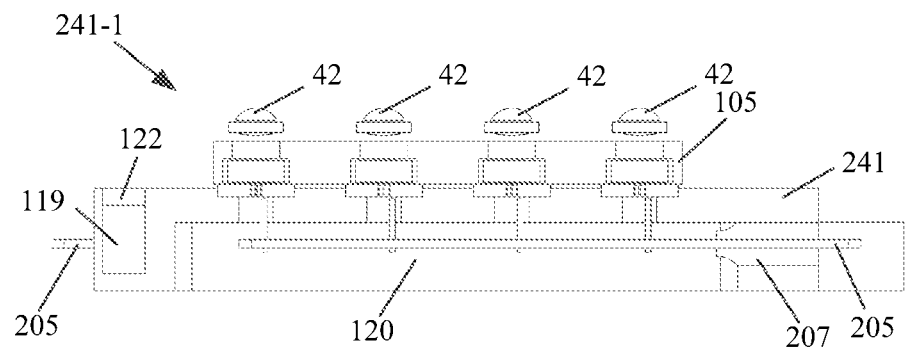
FIG. 78 is a schematic view of a diode laser array module 241-1 utilizing a liquid-cooled radiator 241 in accordance with some embodiments.

FIG. 78 shows the cross-sectional view of a laser diode array module 241-1. The liquid-cooled radiator 204 of the diode laser array module 203 is replaced with the liquid-cooled radiator 241 to form the diode laser array module 241-1. The principle is the same as that of the diode laser array module 203, which will not be repetitively described herein.

In some embodiments, the liquid-cooled radiators are made using a heat sink with a preformed water passage (e.g., a winding groove) in the top surface of the heat sink and a water passage sealing plate pressed into the preformed water passage and seal the water passage by adhesive or welding. In some embodiments, the processing complexity and process accuracy requirements for using the preformed water passage and water passage sealing plate are relatively high, leading to higher manufacturing costs. In some embodiments, the liquid-cooled radiator is optionally made by two preformed parts, e.g., an upper part and a lower part. The processing requirements of the two parts are very close. For example, the two parts may be processed to the same crude parts first, and then processed separately according to their differences, so that overall processing time and manufacturing costs can be reduced. The liquid-cooled radiator made by combining an upper part and a lower part, as described below, can replace any liquid-cooled radiator made by a heat sink with preformed water passage channel and a water passage sealing plate described above.

Figure 79:
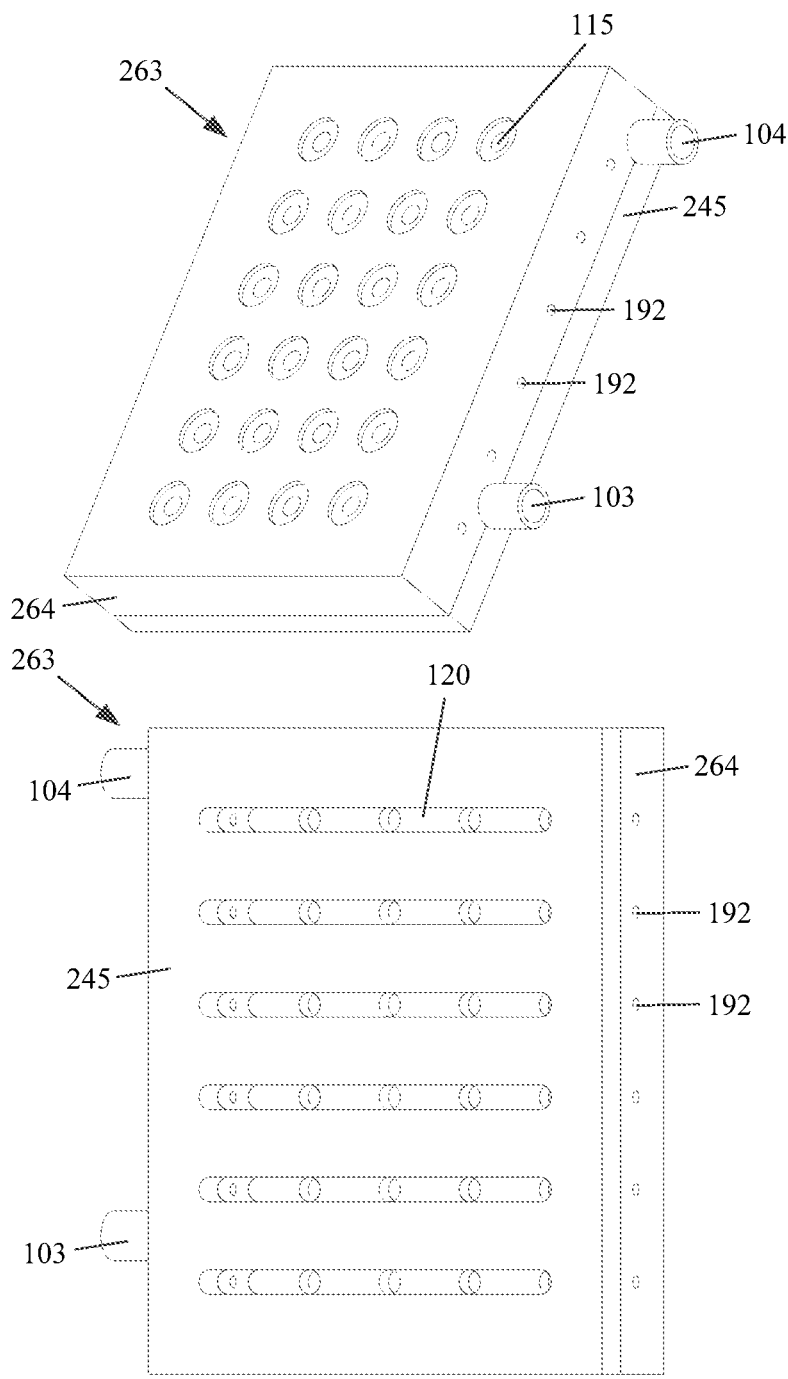
FIGS. 79-82 illustrate a liquid-cooled radiator 263 and components thereof in accordance with some embodiments.

In some embodiments, a liquid-cooled radiator 263 can completely replace the liquid-cooled radiator 188. Using the same principal, a liquid-cooled radiator made by combining an upper half and a lower half replace other liquid-cooled radiators described herein. FIG. 79 shows two perspective views (e.g., view from top, and view from bottom) of the liquid-cooled radiator 263 in accordance with some embodiments. The final external and internal shape characteristics of the liquid-cooled radiator 263 are exactly the same as that of the liquid-cooled radiator 188, which will be not repetitively described any longer. The use method of the liquid-cooled radiator 263 and the use method of the liquid-cooled radiator 188 are exactly the same, which will be not repetitively described any longer.

Figure 80:
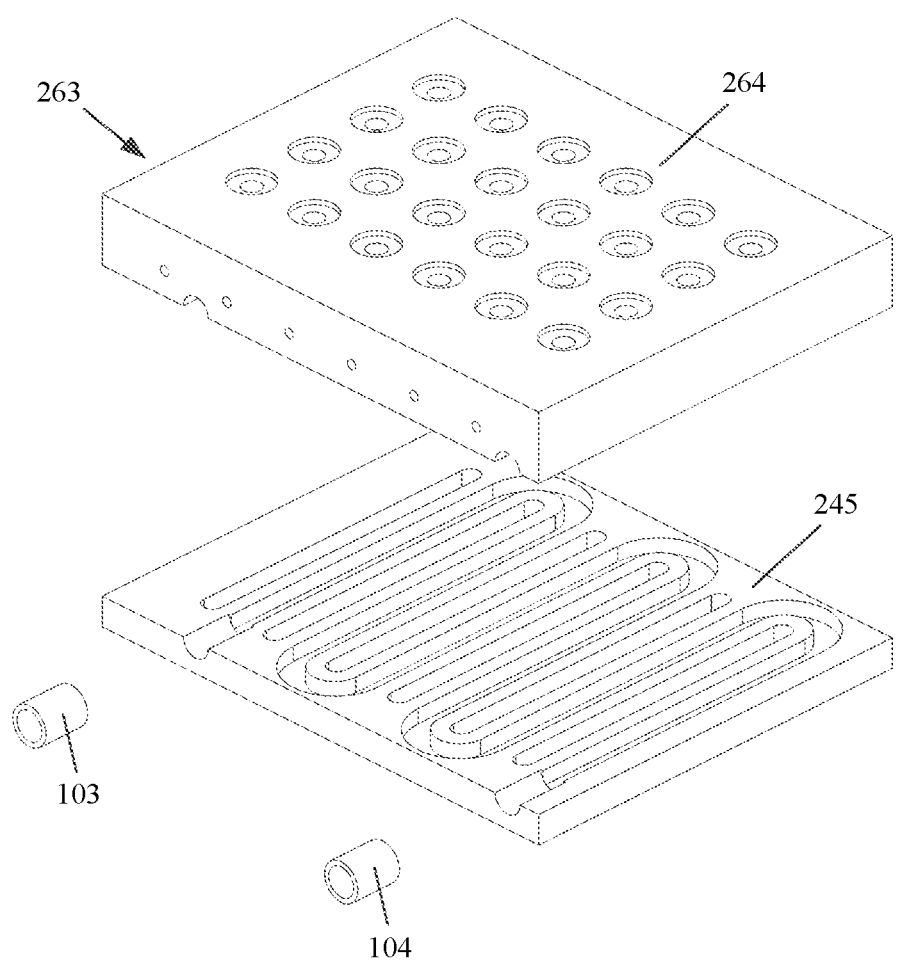

FIG. 80 illustrates an exploded view of the liquid-cooled radiator 263 showing the upper part and the lower part before they are adhered or welded together to form the liquid-cooled radiator 263. The liquid-cooled radiator 263 includes an upper half part 264, a lower half part 245, an inlet 103 and an outlet 104, as shown in FIG. 80. The upper half part 264 has all the characteristics of the upper surface (e.g., holes 115, optionally linear groove 118, etc.) of the liquid-cooled radiator 263 in its upper side, and the upper half of the water passage and the upper portion of the linear grooves 120 in its underside. The lower half part 245 the lower half of the water passage and the lower half of the linear groove 120 in its upper side, and the lower portion of the linear groove 120 in its underside as well. The horizontal through holes 192 are optionally included in the upper half part 264 of the liquid-cooled radiator 263.

Figure 81:
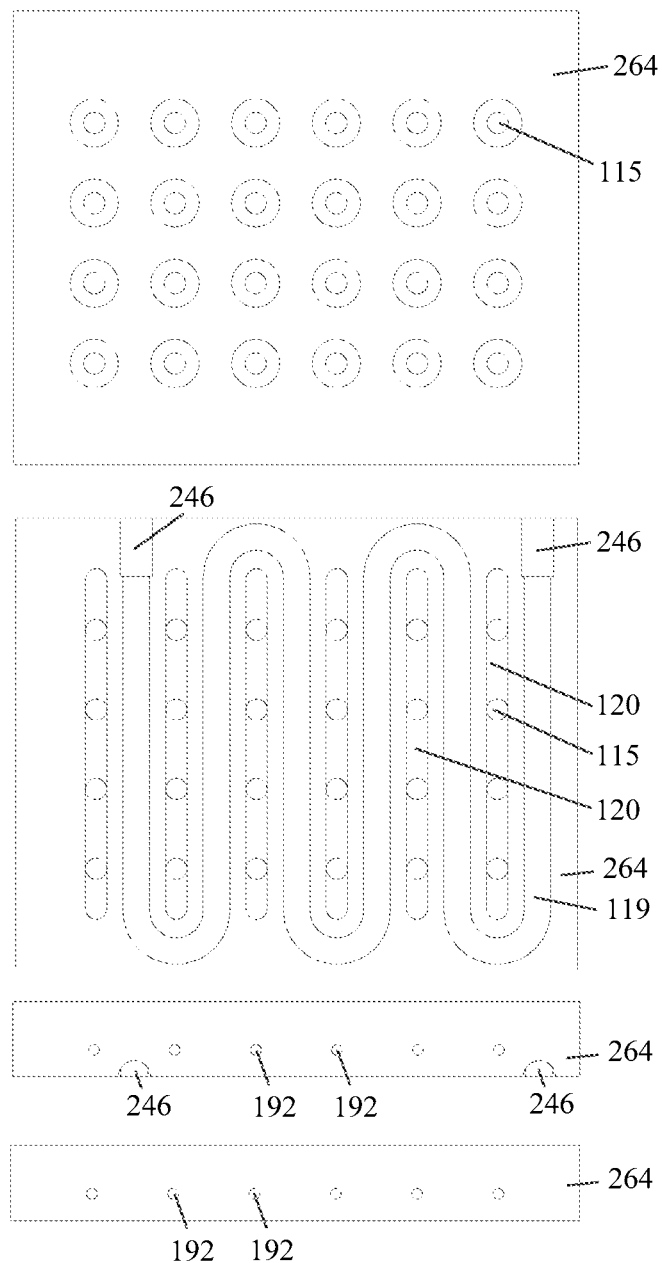
Figure 82:
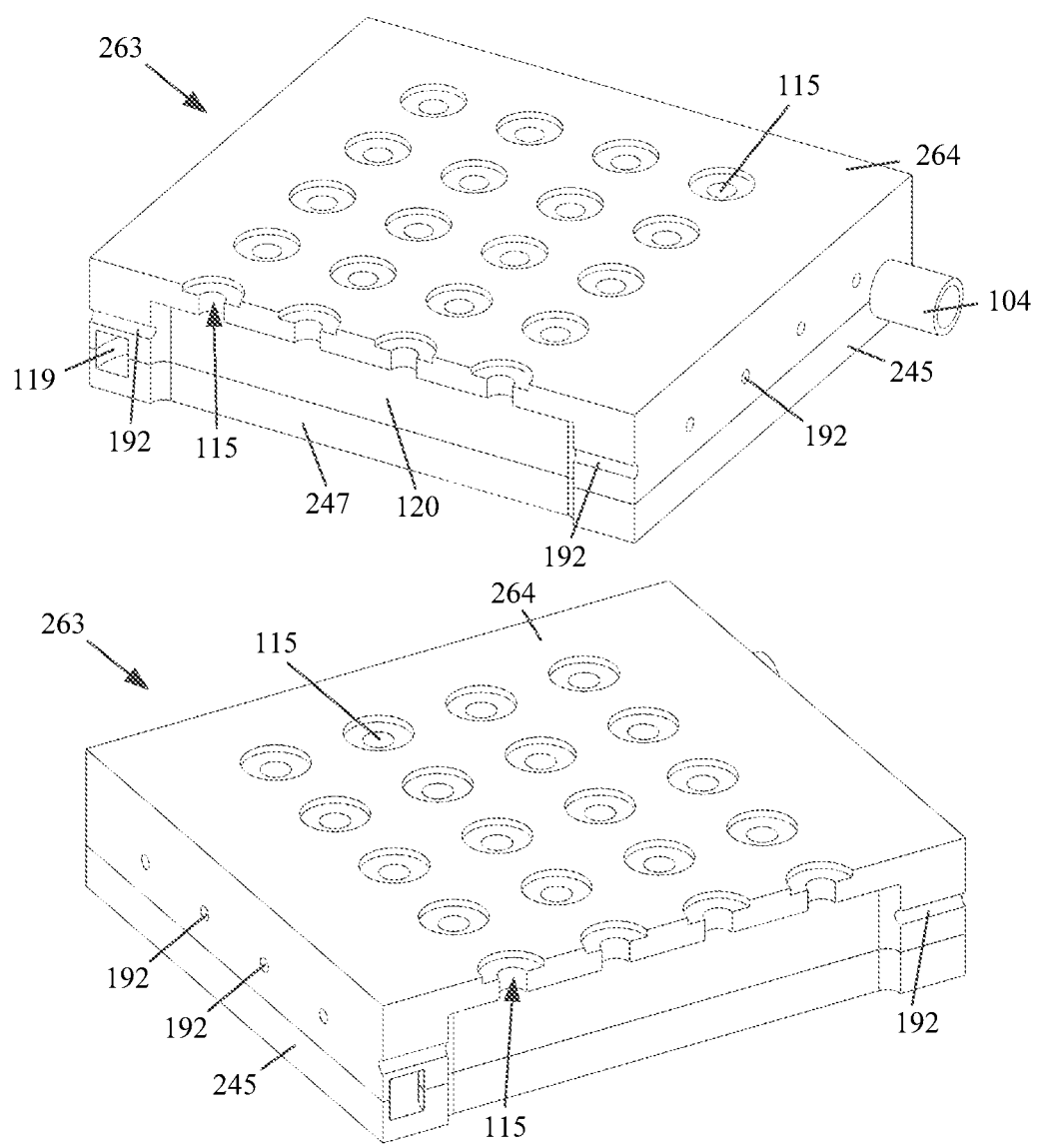

FIG. 81 shows several views (e.g., top, bottom, left, right) of the upper half part 264 of the liquid-cooled radiator 263. As shown in FIG. 81, the upper surface of the upper half part 264 a plurality of stepped through holes 115 running through the upper surface and the lower surface of the upper half part 264. The side surfaces of the upper half part 264 include a plurality of through holes 192 communicated with the upper portions of the grooves 120 formed in the upper half part 264. The lower surface of the upper half part 264 include the upper portions of the grooves 120, each linking a plurality of stepped through holes 115 in the same row. The upper half part of a water passage 119 communicated with the upper half parts of the two grooves 246. The upper half parts of the grooves 246 are communicated with the inlet 103 and the outlet 104. The upper half part of the water passage 119 is inserted between adjacent ones of the grooves 120. The upper half part of the water passage 119 and the upper half parts of the grooves 246 are all used for the transmission of coolant, when they are combined with the lower half part of the water passage 119 and the lower half parts of the grooves 246 in the lower half part 245 of the liquid-cooled radiator 263. The upper half part 264 and the lower half part 245 are both made of a thermal conductive material FIG. 82 shows partial sectional views of the liquid-cooled radiator 263 from two different perspectives. As shown in FIG. 82, the lower surface of the upper half part 264 is closely fit with the upper surface of the lower half part 245 to form the liquid-cooled radiator 263. The sizes and positions of the upper part of the water passage 119 of the upper half part 264, the upper parts of the grooves 246 and the grooves 120 respectively correspond to and are aligned with those of the lower part of the water passage 119 of the lower half part 245, the lower parts of the grooves 246 and the through holes 247. When the upper half part of the water passage 119 is aligned with the lower half part of the water passage 119, a closed water channel 119 is formed to replace the water passage 119 of the liquid-cooled radiator 188. When the upper half parts of the grooves 246 are aligned with the lower half parts of the grooves 246, closed grooves 246 are formed. The upper portions of the grooves 120 in the upper half part 164 and the through holes 247 in the lower half part 245 together form grooves in the bottom surface of the liquid-cooled radiator 263 to replace the grooves 120 of the liquid-cooled radiator 188. The through holes of the inlet 103 and the outlet 104 are respectively communicated with the corresponding grooves 246 in the upper half part 264 and the lower half part 245. As shown in FIG. 82, the horizontal through holes 192 are formed in the upper half part 264, and each of the horizontal through hole 192 links the end of the upper portion of a respective groove 120 to the side surface of the upper half part 264.

Figure 83:
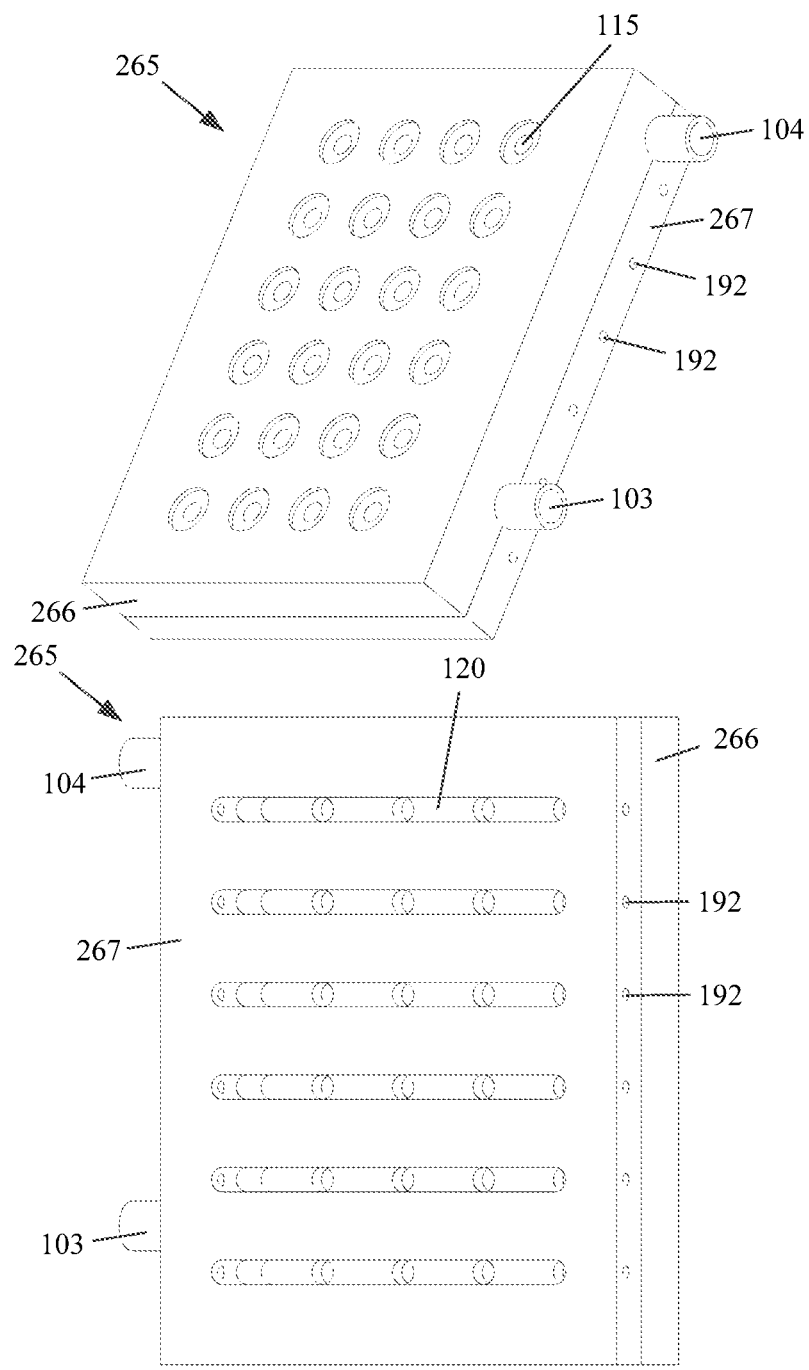
FIGS. 83-87 illustrate a liquid-cooled radiator 265 and components thereof in accordance with some embodiments.

FIG. 83 illustrates a liquid-cooled radiator 265 that is similar to the liquid-cooled radiator 263, except that the horizontal through holes 192 are formed in the lower half part of the liquid-cooled radiator 265 and that each horizontal through hole 192 links the end of the through hole 247 in the lower half part of the liquid-cooled radiator 265. The final internal external shape characteristics of the liquid-cooled radiator 265 are exactly the same as that of the liquid-cooled radiator 263, except that the locations of the through holes 192 are moved to the lower half part of the liquid-cooled radiator. Aspects that are not changed will be not repetitively described any longer. The use method of the liquid-cooled radiator 265 and the use method of the liquid-cooled radiator 263 are exactly the same, except that the respective pin connector modules each have a horizontal portion that pass through the horizontal through holes 192 at a vertical position that is lower on the side surface of the liquid-cooled radiator. Aspects that are not changed will not be not repetitively described any longer.

Figure 84:
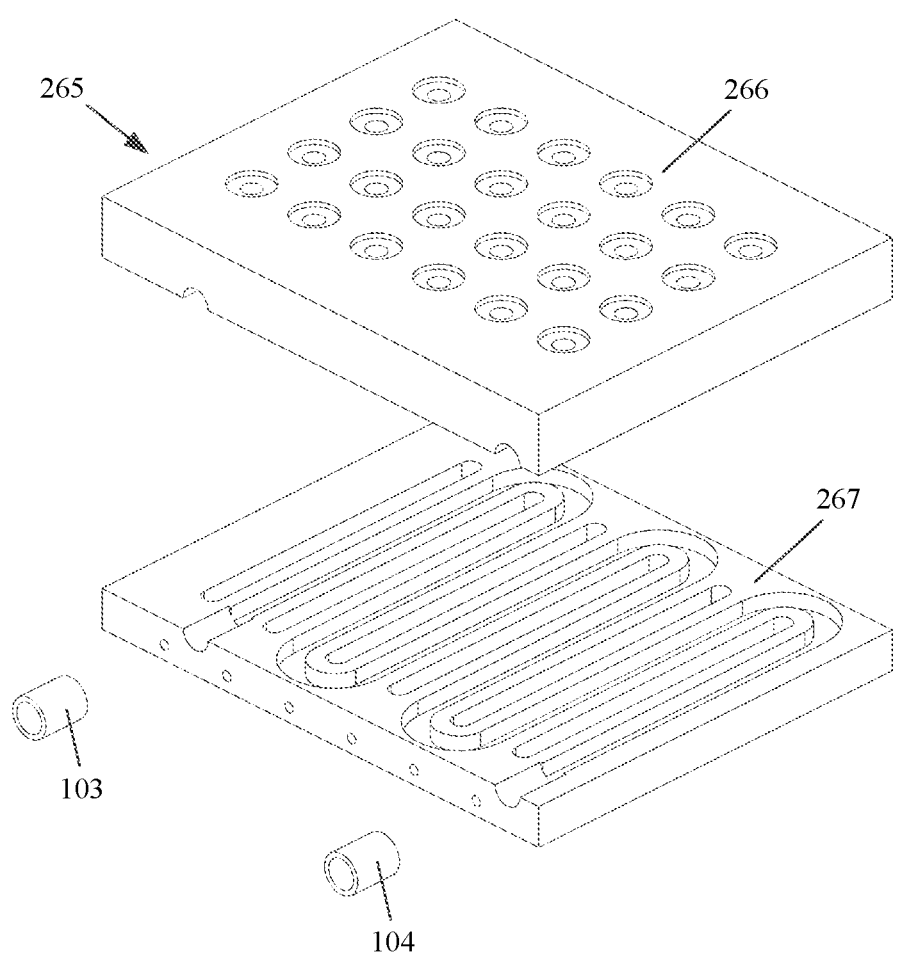

FIG. 84 shows an exploded view of the liquid cooled radiator 265 in accordance with some embodiments. The liquid-cooled radiator 265 is made of an upper half part 266, a lower half part 267, an inlet 103 and an outlet 104, as shown in FIG. 84. The upper half part of the liquid-cooled radiator 265 has a plurality of through holes 115 in its upper surface, and the upper half of the water passage 119 in its lower surface. The lower half part 267 of the liquid-cooled radiator 265 through holes 247 that corresponds to the lower half of the grooves 120. The lower half part 267 of the liquid-cooled radiator 265 also has the lower half of the water passage 119 in its upper surface. The through holes 192 are formed in the lower half part 267 linking the end of the through holes 247 to the side surface of the lower half part 267.

Figure 85:
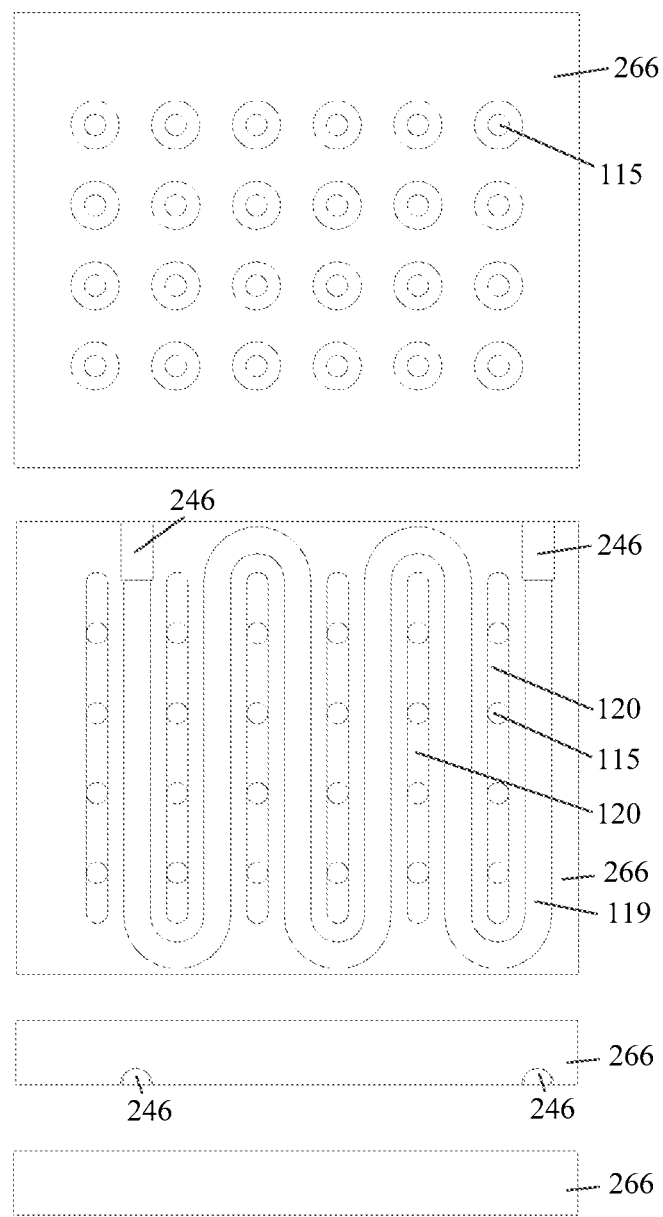

FIG. 85 shows several views (top, bottom, left, right) of the upper half part 266 of the liquid-cooled radiator 265. As shown in FIG. 85, the upper surface of the upper half part 266 has a plurality of stepped through holes 115 running from the upper surface and the lower surface of the upper half part 266. The lower surface of the upper half part 266 include the upper portions of the grooves 120 that link the plurality of stepped through holes 115 in the same row. The lower surface of the upper half part 266 also has the upper half parts of the grooves 246 and the upper half part of a water passage 119 communicated with the upper half parts of the two grooves 246. The upper half parts of the grooves 246 are communicated with the upper half part of the water passage 119, the inlet 103 and the outlet 104. The upper half part of the water passage 119 is inserted between adjacent ones of the grooves 120. The upper half part of the water passage 119 and the upper half parts of the grooves 246 are all used for the transmission of coolant when combined with the lower half part of the water passage 119 and the lower half parts of the grooves 246. The upper half part 266 and the lower half part 267 are made of a thermal conductive material.

Figure 86:
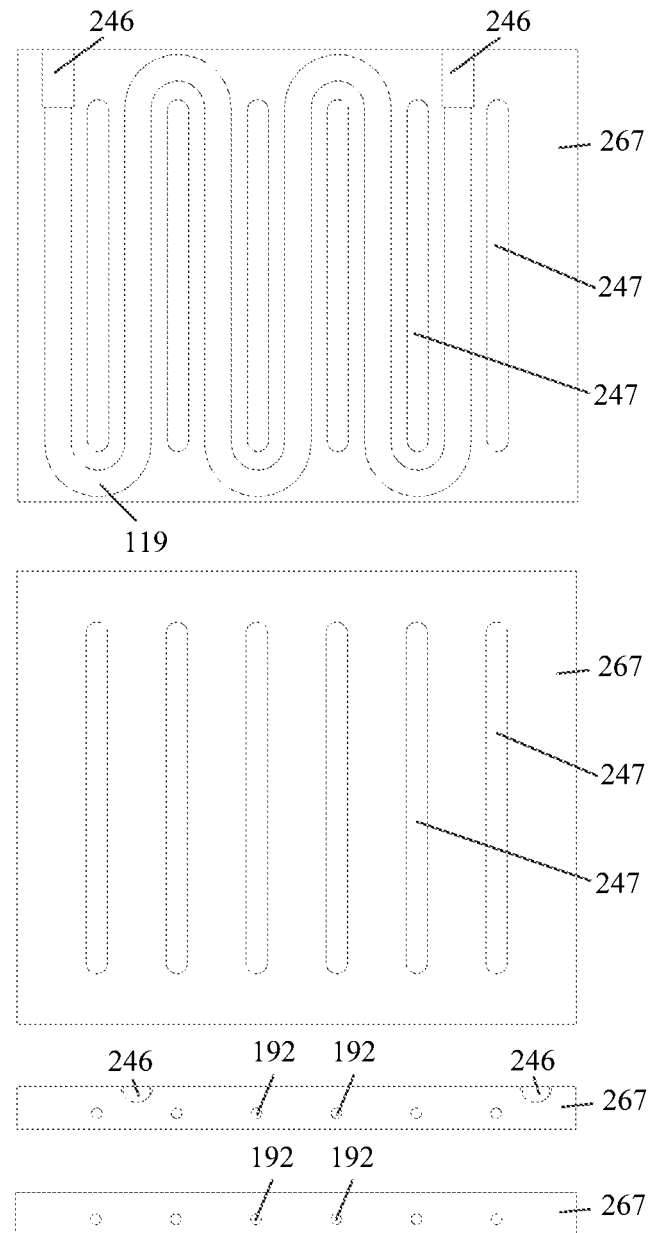

FIG. 86 shows several views (top, bottom, left, and right) of the lower half part 267 of the liquid-filled radiator 265. As shown in FIG. 86, the upper surface of the lower half part 267 has a plurality of through holes 247 running from the upper surface and the lower surface of the lower half part 267, the lower half parts of the grooves 246, and the lower half part of the water passage 119 communicated with the lower half parts of the two grooves 246. The through holes 247 will serve as the lower portions of the linear grooves 120 when the upper half part 266 and the lower half part 267 are adhered or welded together to the form the liquid-cooled radiator 265. The lower half parts of the grooves 246 are communicated with the lower half part of the water passage 119, the inlet 103 and the outlet 104. The lower half part of the water passage 119 is inserted between the through holes 247. The lower half part of the water passage 119 and the lower half parts of the grooves 246 are all used for the transmission of coolant. The lower half part 267 is made of a thermal conductive material. The side surfaces of the lower half part 267 include a plurality of through holes 192 communicated with the end of the through holes 247.

Figure 87:
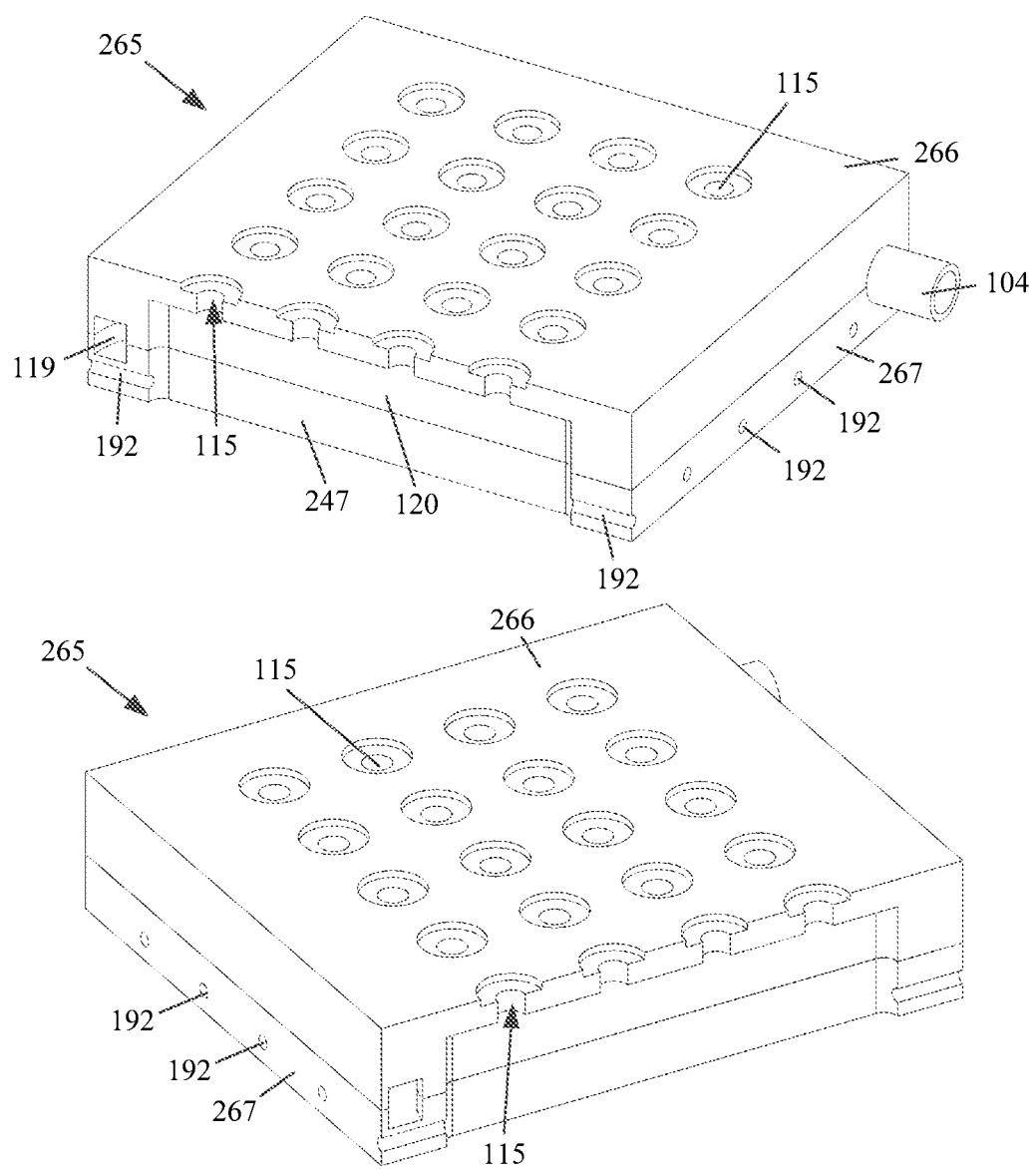

FIG. 87 shows two partial sectional views of the liquid-cooled radiator 265. As shown in FIG. 87, the lower surface of the upper half part 266 is closely fit with the upper surface of the lower half part 267 to form the liquid-cooled radiator 265. The sizes and positions of the upper part of the water passage 119 of the upper half part 266, the upper parts of the grooves 246 and the grooves 120 respectively correspond to and are aligned with those of the lower part of the water passage 119 of the lower half part 245, the lower parts of the grooves 246 and the through holes 247. When the upper half part of the water passage 119 is aligned with the lower half part of the water passage 119, a closed water channel 119 is formed to replace the water passage 119 of the liquid-cooled radiator that is made by covering a preformed water passage with a water passage sealing plate disclosed earlier. When the upper half parts of the grooves 246 are overlapped with the lower half parts of the grooves 246, closed grooves 246 are formed. The upper portions of the grooves 120 in the upper half part 266 and the through holes 247 in the lower half part 267 form the grooves 120. The holes of the inlet 103 and the outlet 104 are respectively communicated with the corresponding grooves 246. Each of the horizontal through holes 192 links the end of a respective through holes 247 to the side surface of the lower half part 267 of the liquid-cooled radiator 265.

In some embodiments, a liquid-cooled radiator 268 can completely replace the liquid-cooled radiator 204 disclosed earlier. The final internal and external shape characteristics of the liquid-cooled radiator 268 are exactly the same as that of the liquid-cooled radiator 204, which will be not repetitively described any longer. The use method of the liquid-cooled radiator 268 and the use method of the liquid-cooled radiator 204 are exactly the same, which will be not repetitively described any longer. The only difference between the liquid-cooled radiator 268 and the liquid-cooled radiator 204 is in the way they are made.

Figure 88:
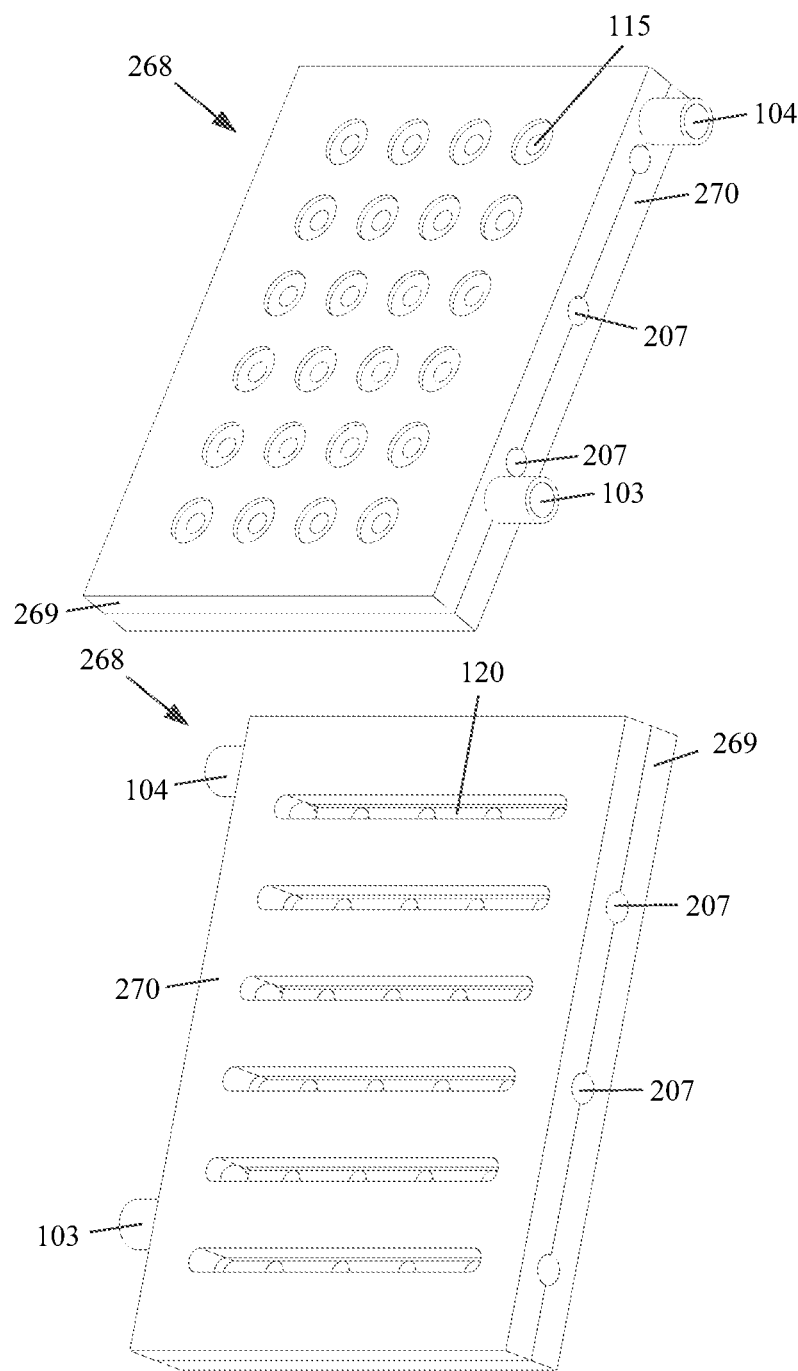
FIGS. 88-92 illustrate a liquid-cooled radiator 268 and components thereof in accordance with some embodiments.
Figure 89:
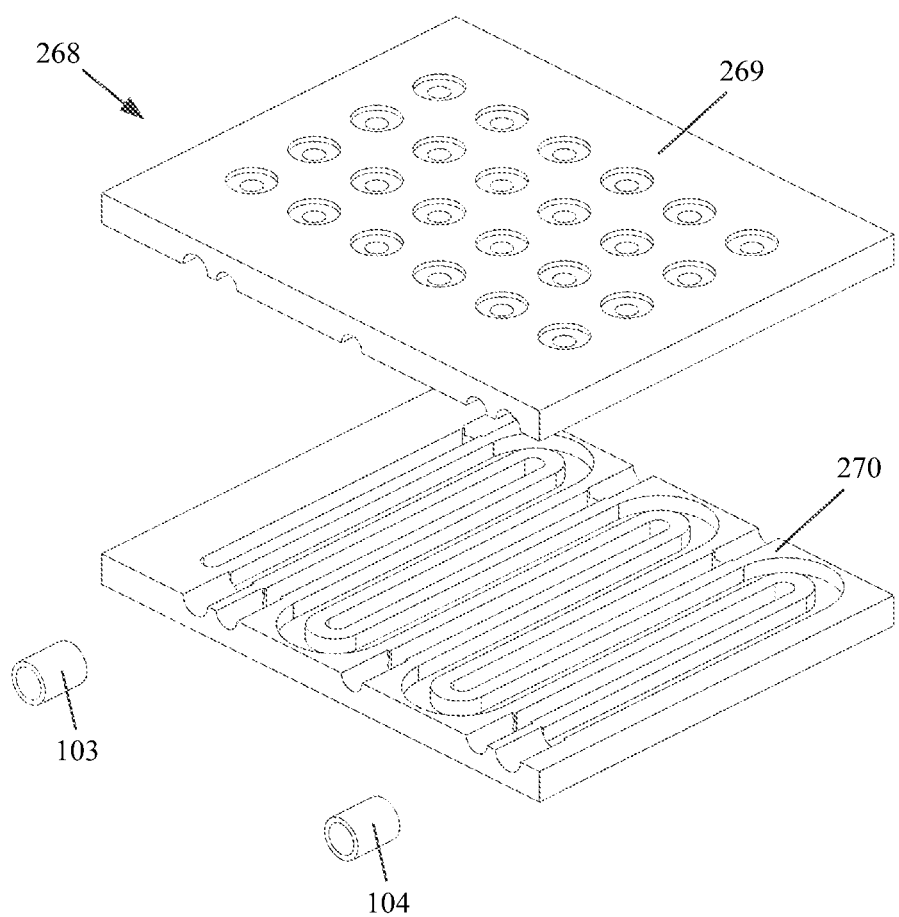
Figure 90:
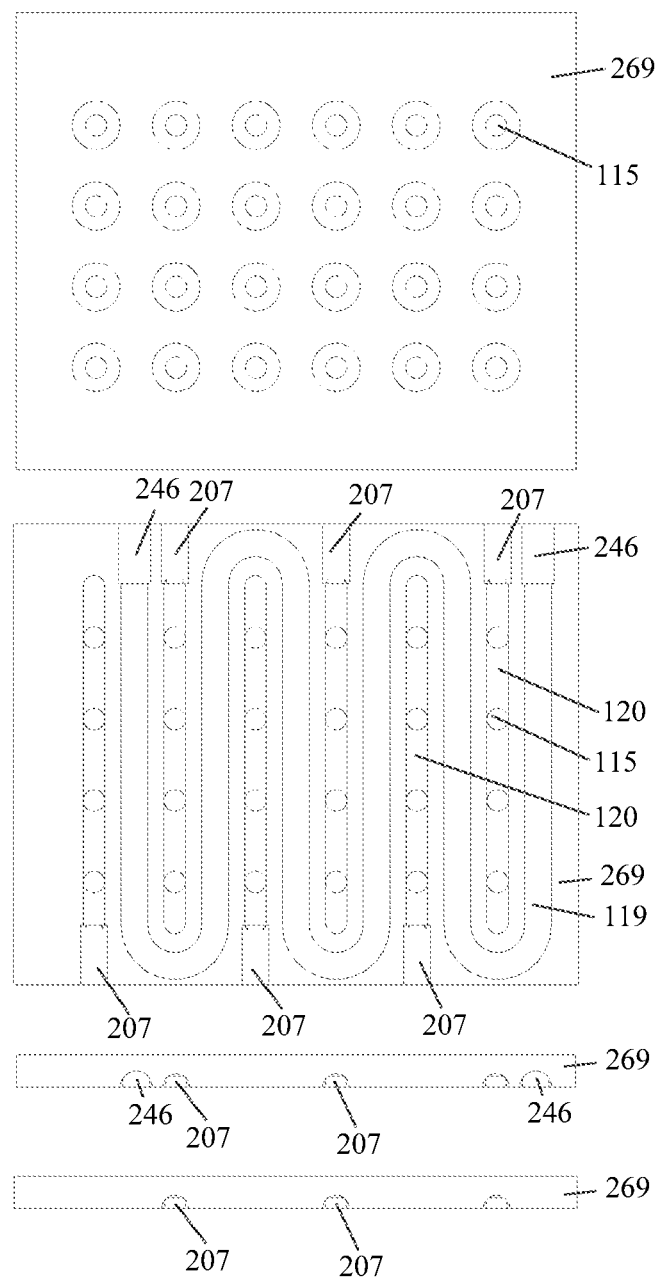
Figure 91:
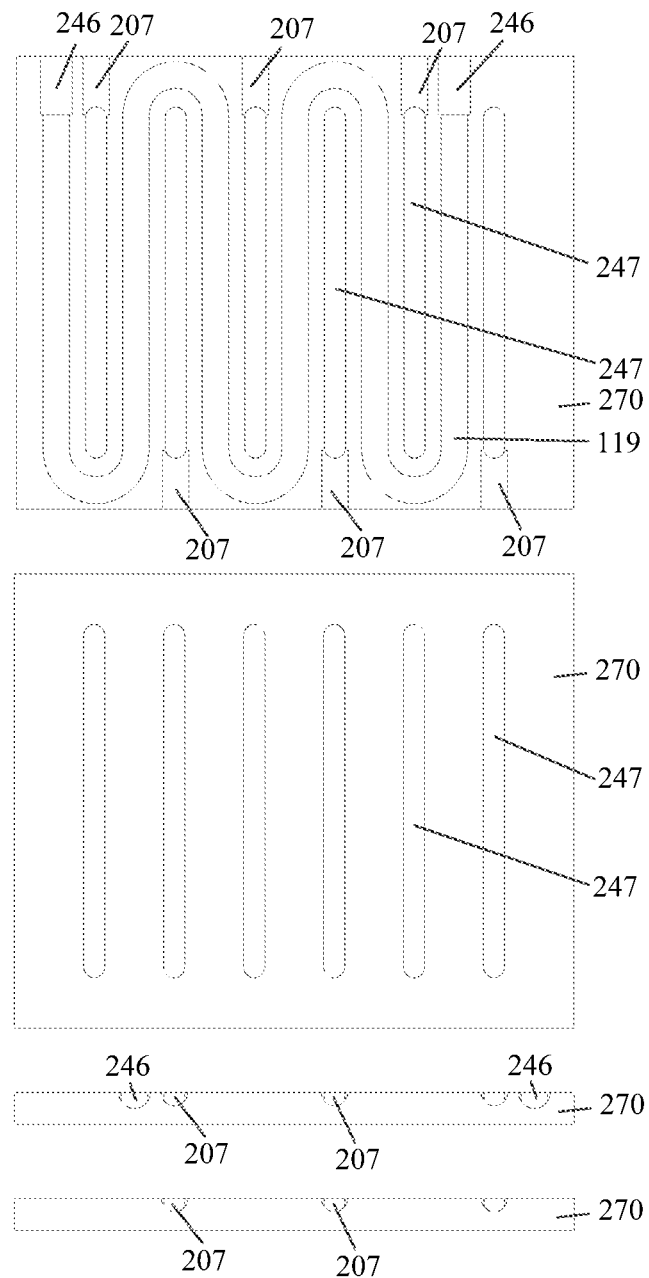
Figure 92:
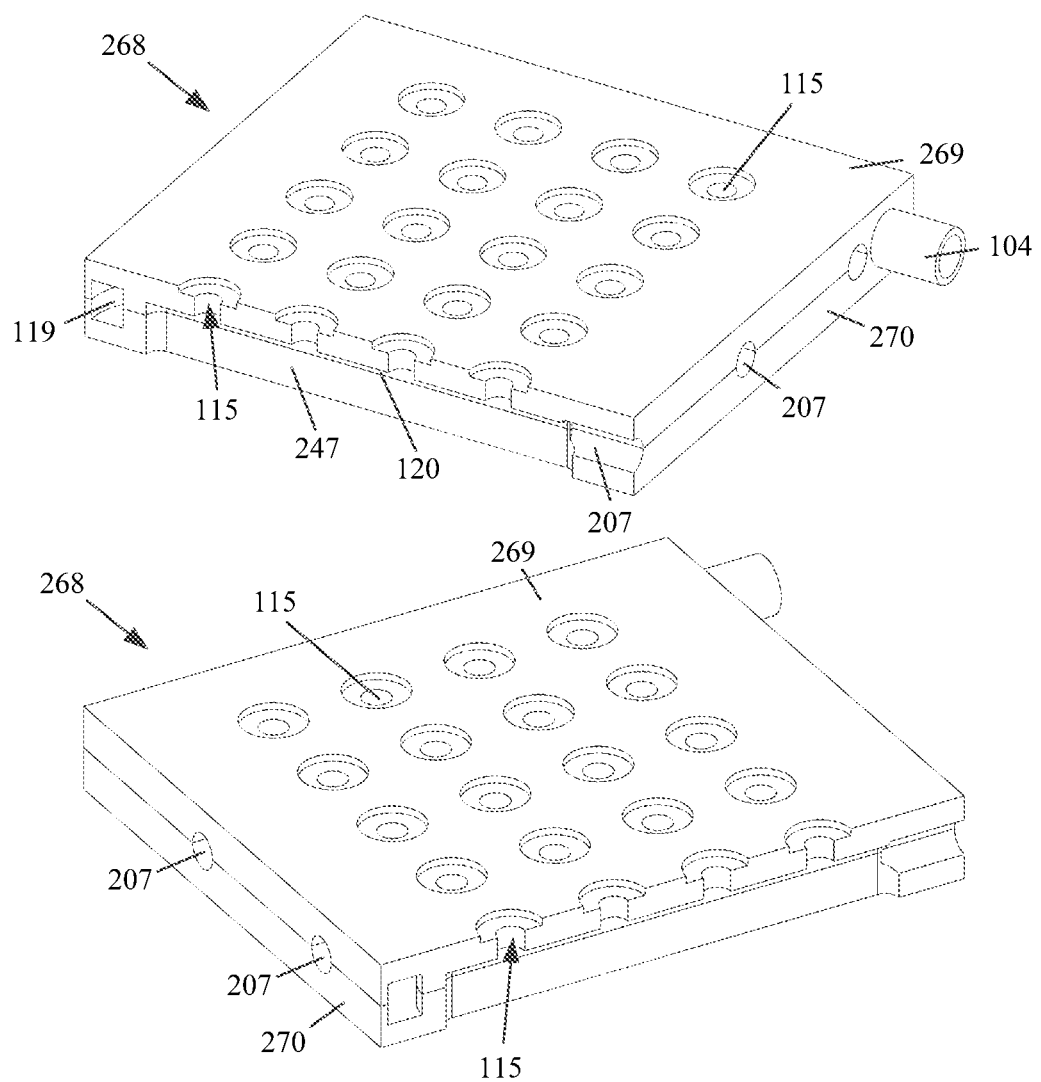

FIG. 88 shows two perspective views of the liquid-cooled radiator 268 in accordance with some embodiments. As shown in FIG. 88, the liquid-cooled radiator 268 includes an upper half part 269, a lower half part 270, an inlet 103 and an outlet 104. FIG. 89 shows an exploded view of the liquid-cooled radiator 268. FIG. 90 shows multiple views (top, bottom, left, right) of the upper half part 269. FIG. 91 shows multiple views (top, bottom, left, right) of the lower half part 270. FIG. 92 shows two partial cross-sectional views of the liquid-cooled radiator 268.

As shown in FIGS. 88-92, the upper surface of the upper half part 269 includes a plurality of stepped through holes 115 running from the upper surface to the lower surface of the upper half part 269. The lower surface of the upper half part 269 incudes the upper portion of the water passage 119, the upper portions of the grooves 120 that each link the through holes 115 of the same row. The lower surface of the upper half part 269 includes the upper half parts of a plurality of through holes 207 running from the ends of the upper halves of the grooves 120 to the side surfaces of the upper half part 269. The lower surface of the upper half part 269 also includes the upper half parts of the grooves 246, and the upper half part of a water passage 119 communicated with the upper half parts of the two grooves 246. The upper half parts of the grooves 246 are communicated with the upper half part of the water passage 119, the inlet 103 and the outlet 104. The upper half part of the water passage 119 is inserted between adjacent ones of the upper portions of the grooves 120. The upper half part of the water passage 119 and the upper half parts of the grooves 246 are all used for the transmission of coolant. The upper half part 269 is made of a thermal conductive material.

The lower half part 270 is shown in FIG. 91. The upper surface of the lower half part 270 includes a plurality of through holes 247 running from the upper surface to the lower surface of the lower half part 270. The through holes 247 will serve the lower portions of the linear grooves 120 when the upper half part 269 and the lower half part 270 are combined to form the liquid-cooled radiator 268. The lower half parts of the grooves 246, the lower half part of the water passage 119 communicated with the lower half parts of the two grooves 246. The lower half part of the plurality of through holes 207 run through the side surfaces of the lower half part 270 and are communicated with the through holes 247. The lower half parts of the grooves 246 are communicated with the lower half part of the water passage 119, the inlet 103 and the outlet 104. The lower half part of the water passage 119 is inserted between adjacent ones of the through holes 247. The lower half part of the water passage 119 and the lower half parts of the grooves 246 are all used for the transmission of coolant. The lower half part 270 is made of a thermal conductive material.

As shown in the partial sectional views of the liquid-cooled radiator 268 in FIG. 92, the lower surface of the upper half part 269 is closely fit with the upper surface of the lower half part 270 to form the liquid-cooled radiator 268. The sizes and positions of the upper part of the water passage 119 of the upper half part 269, the upper parts of the grooves 246 and the grooves 120, the upper half parts of the through holes 207 respectively correspond to and are aligned with those of the lower part of the water passage 119 of the lower half part 270, the lower parts of the grooves 246, the through holes 247 and the lower half parts of through holes 207. When the upper half part of the water passage 119 is overlapped with the lower half part of the water passage 119, a closed water channel 119 is formed to replace the water passage 119 of the liquid-cooled radiator 204. When the upper half parts of the grooves 246 are overlapped with the lower half parts of the grooves 246, closed grooves 246 are formed. The upper portions of the grooves 120 and the through holes 247 form grooves to replace the grooves 120 of the liquid-cooled radiator 204. The holes 248 of the inlet 103 and the outlet 104 are respectively communicated with the corresponding grooves 246. When the upper half parts of the through holes 207 are aligned with the lower half parts of the through holes 207, the through holes 207 are formed to replace the through holes 207 of the liquid-cooled radiator 204.

The use method of the liquid-cooled radiator 268 and the use method of the liquid-cooled radiator 204 are exactly the same, which will be not repetitively described any longer.

Figure 93:
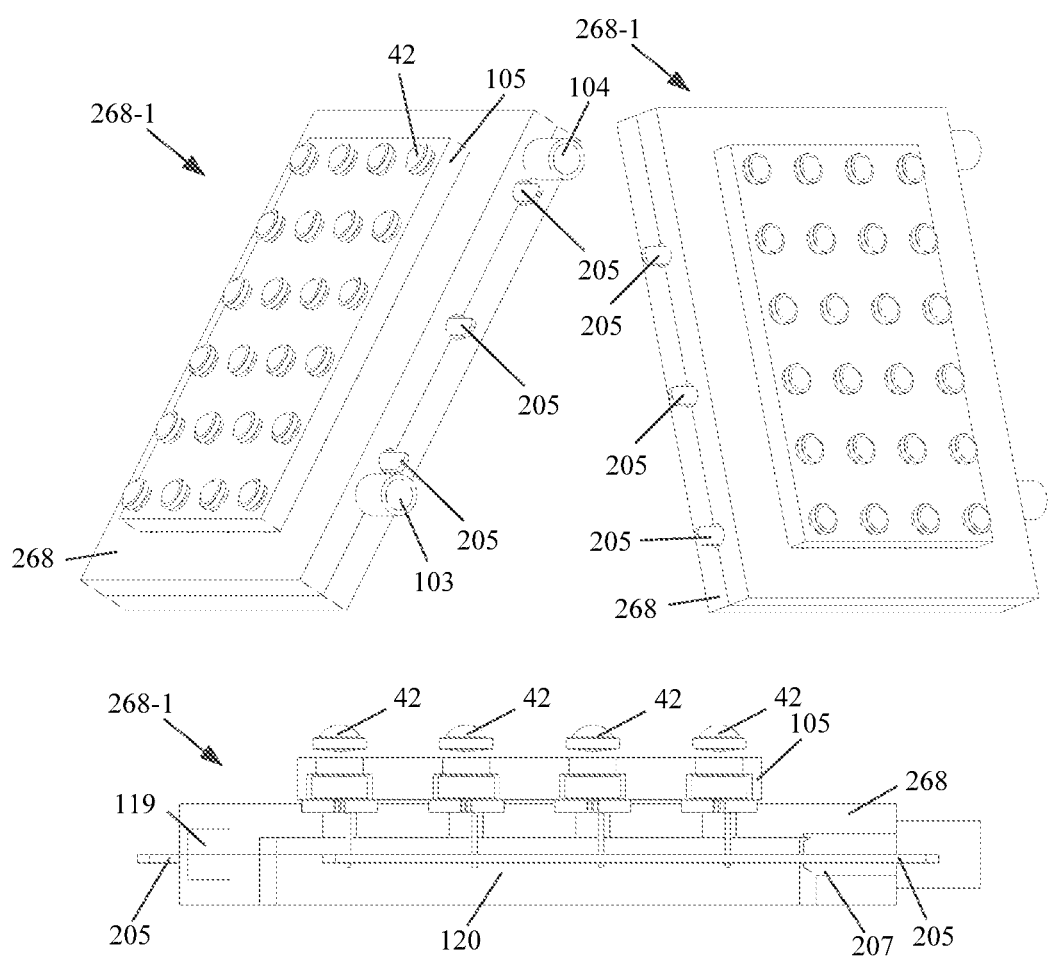
FIG. 93 illustrates a liquid-cooled radiator 268 utilizing a liquid-cooled radiator 268 in accordance with some embodiments.
Figure 154:
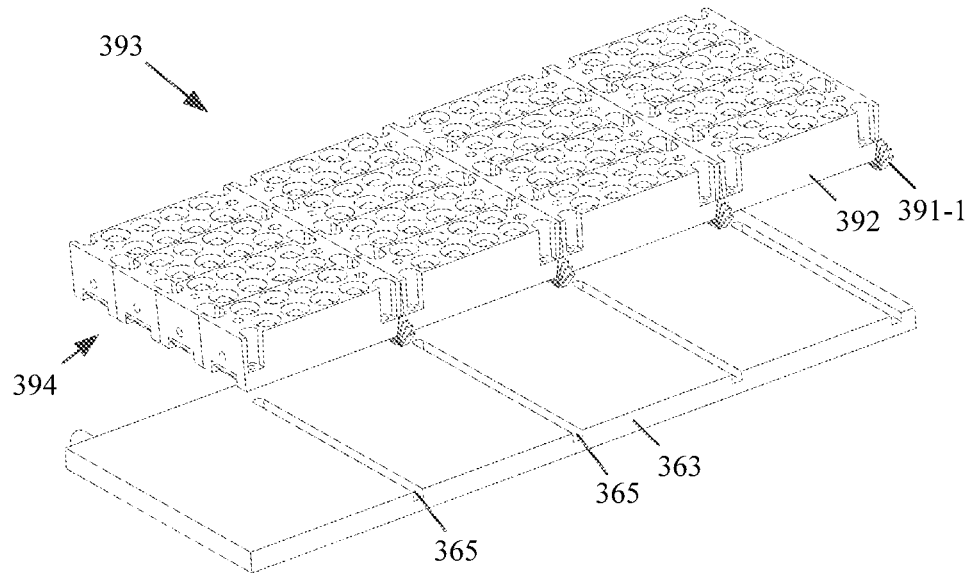
Figure 160:
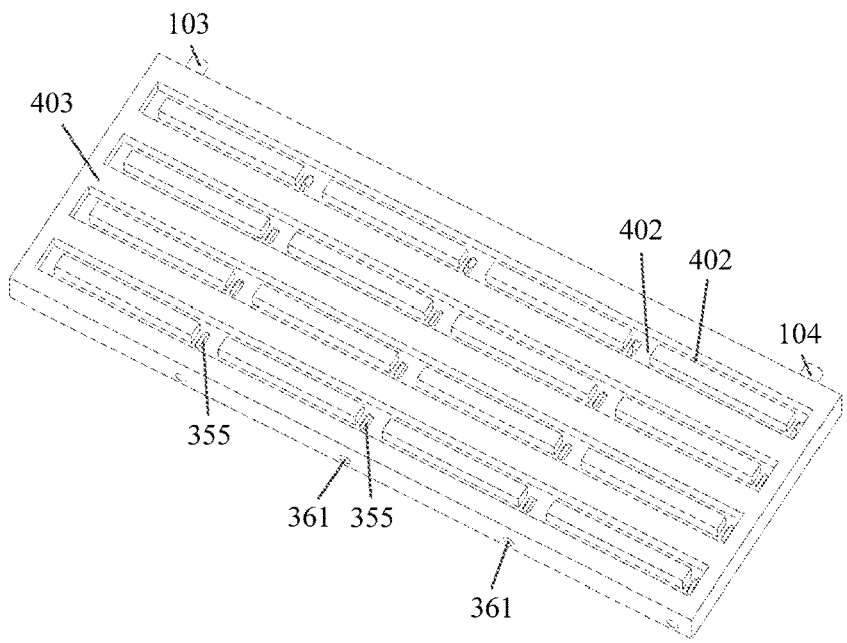
FIGS. 160-161 illustrate a diode laser array module 403-1 and components thereof in accordance with some embodiments.

FIG. 93 shows the perspective views and the cross-section view of the diode laser array module 268-1 using the liquid-cooled radiator 268, in accordance with some embodiments. As shown in FIG. 93, the liquid-cooled radiator 204 of the diode laser array module 203 in FIGS. 154 and 160 is replaced with the liquid-cooled radiator 268 to form the diode laser array module 268-1. The principle is the same as that of the diode laser array module 203, and aspects of the diode laser array module 268-1 that are identical to the diode laser array module 203 will be not repetitively described any longer.

In some embodiments, a liquid-cooled radiator, such as the liquid-cooled radiators disclosed earlier in the specification can be replaced with other types of cooled radiators. Liquid-cooled radiators must use liquid as a heat transfer medium, and cannot be applied to an environment without flowing liquid. To solve the issue of heat transfer, an exchange heat sink and heat pipes can be adopted to transfer heat to a radiator to achieve radiation in some embodiments, instead of using a liquid-cooled radiator.

As disclosed herein, various cooled radiators, such as a cooled radiator 291 and a cooled radiator 293 respectively, can replace the liquid-cooled radiators in any solution provided herein.

In some embodiments, the driving circuit PCB 106 may be used continually with the cooled radiators, or be replaced with another driving circuit.

Taking the cases that the cooled radiator 291 replaces the liquid-cooled radiator 102 and the liquid-cooled radiator 293 replaces the liquid-cooled radiator 204 as examples, the method for replacement and differences will be demonstratively described. Other liquid-cooled radiators may be replaced by adopting the same principle, which will be not repetitively described any longer.

A demonstrative description will be made below by adopting diode lasers 15. The diode laser 15 may be replaced with the diode laser 11, the diode laser 17, the diode laser 43, the diode laser 46, the diode laser 48, the diode laser 50, or diode laser 51. The principle is the same, which will be not repetitively described any longer.

Figure 94:
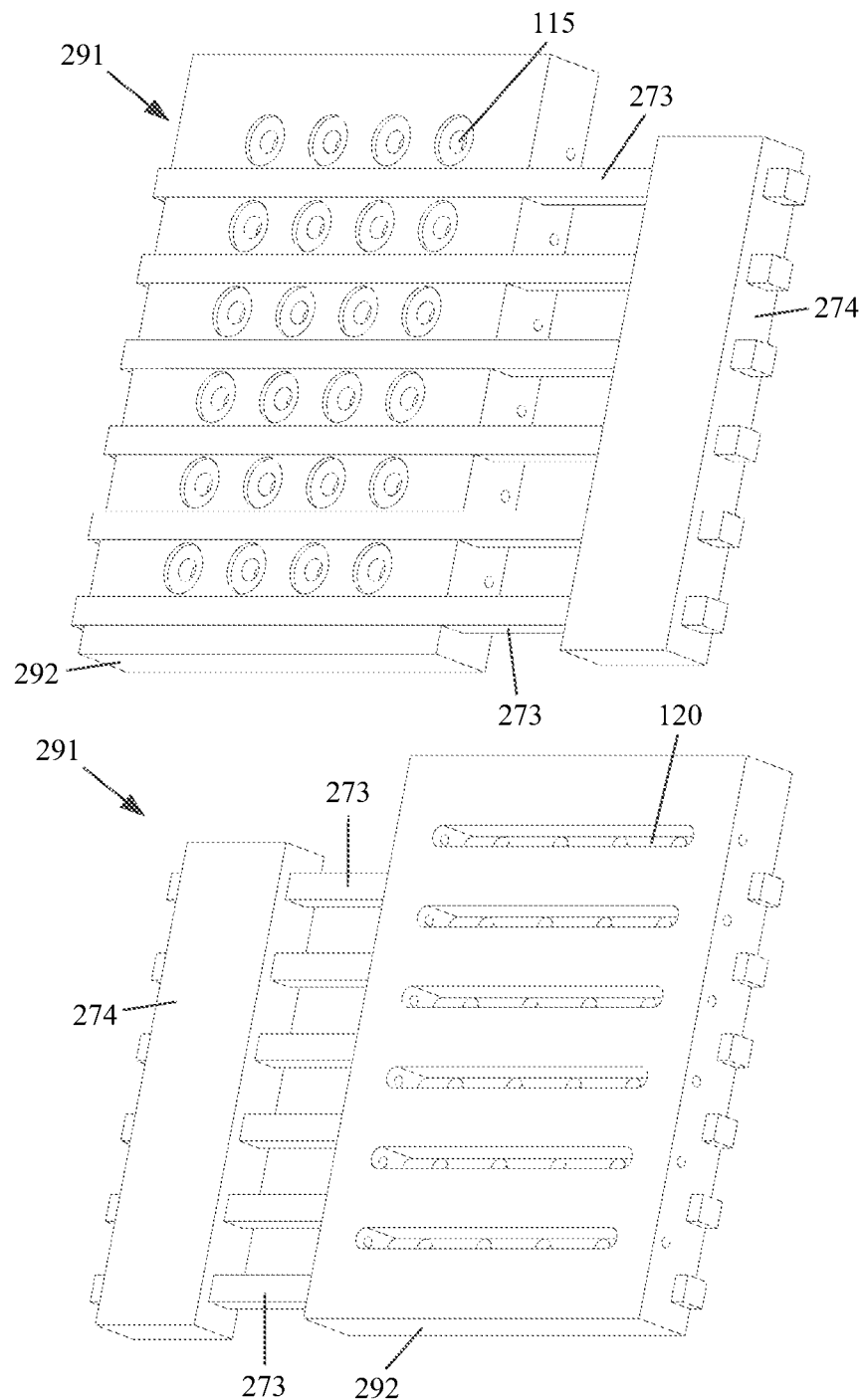
FIGS. 94-96 illustrate a cooled radiator 292 and components thereof in accordance with some embodiments.

FIG. 94 shows two perspective views of the cooled radiator 291 in accordance with some embodiments. The cooled radiator 291 can completely replace the liquid-cooled radiator 188 and other similar liquid-cooled radiators in some embodiments.

As shown in FIG. 94, the cooled radiator 291 includes an exchange heat sink 292, a plurality of heat pipes 273, and an external radiator 274. The heat pipes draw heat from the exchange heat sink 292 and transfers the heat to the external radiator 271, and the external radiator 271 dissipates the heat by radiation or other means.

Figure 95:
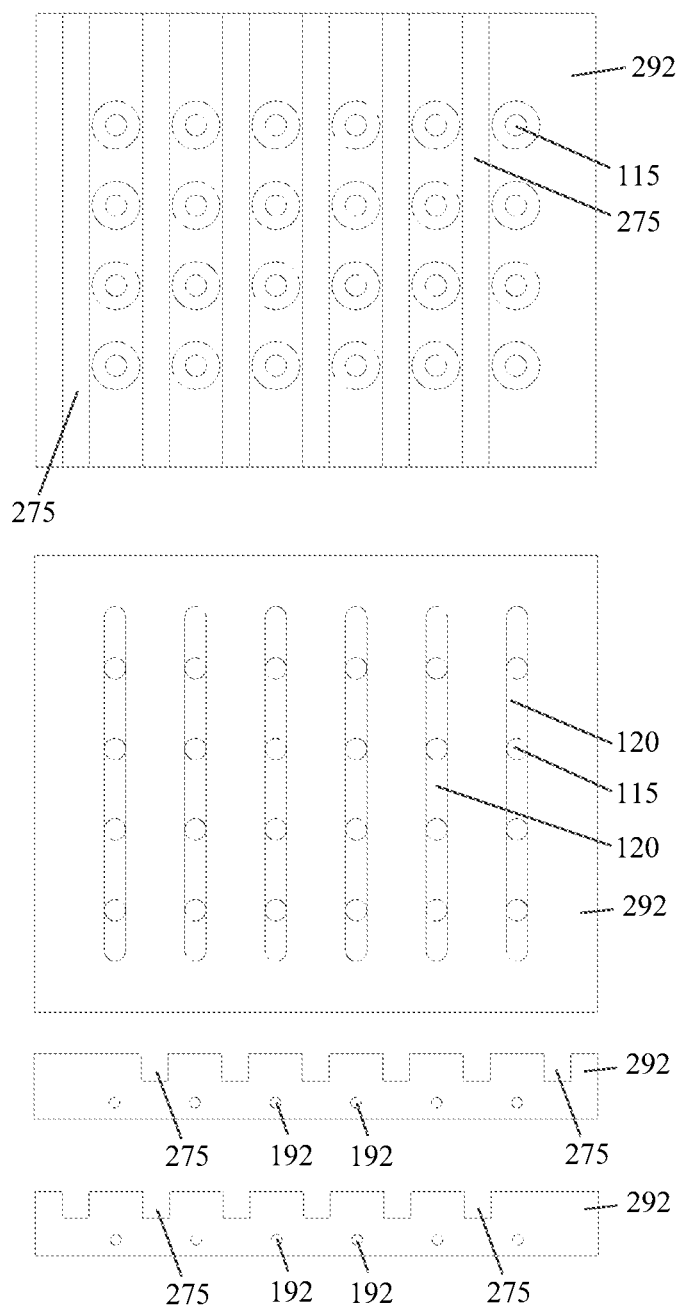

FIG. 95 shows several views (e.g., top, bottom, left, right) of the exchange heat sink 292. The upper surface of the exchange heat sink 292 includes a plurality of stepped through holes 115 running from the upper surface to the lower surface of the exchange heat sink 292, and a plurality of linear grooves 275 running through two side surfaces of the exchange heat sink 292. The side surfaces of the exchange heat sink 292 include a plurality of through holes 192 running through the side surfaces and penetrate the ends of the grooves 120 in the bottom surface of the exchange heat sink 292. The lower surface of the exchange heat sink 292 includes the plurality of grooves 120, each groove 120 links a respective set of the stepped through holes 115 in the same row. The heat pipes 273 are mounted at least partially within or completely within the grooves 275 and form close thermal contact with the exchange heat sink 292 to realize heat transfer. The heat produced by the diode lasers 15 during working is transferred to the exchange heat sink 292, and the heat pipes 273 transfer the heat from the exchange heat sink 292 to the radiator 274 to complete radiation.

Figure 96:
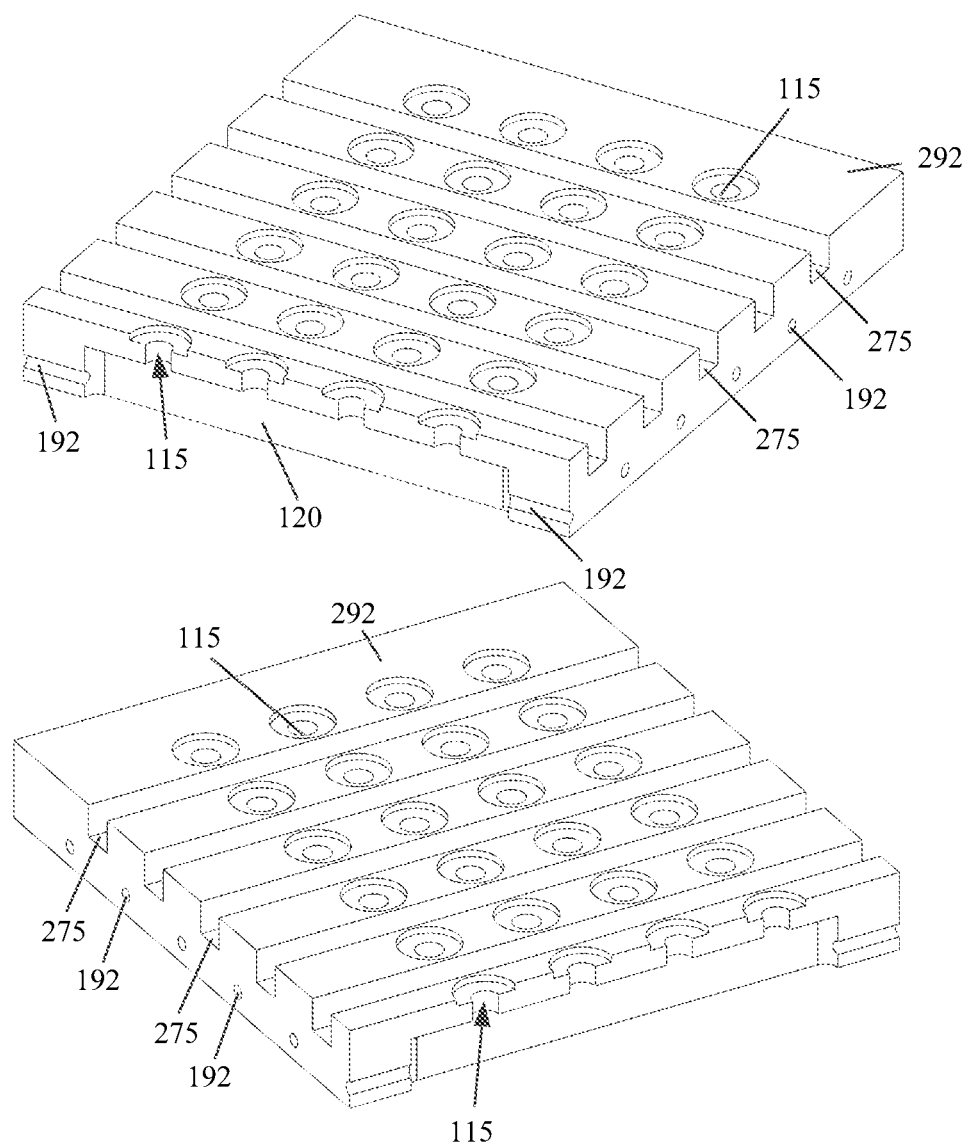

The partial sectional views of the exchange heat sink 292 in FIG. 96 show the relative positions of the grooves 275, the horizontal holes 192, the linear grooves 120, and the through holes 115 in the exchange heat sink 292.

Figure 97:
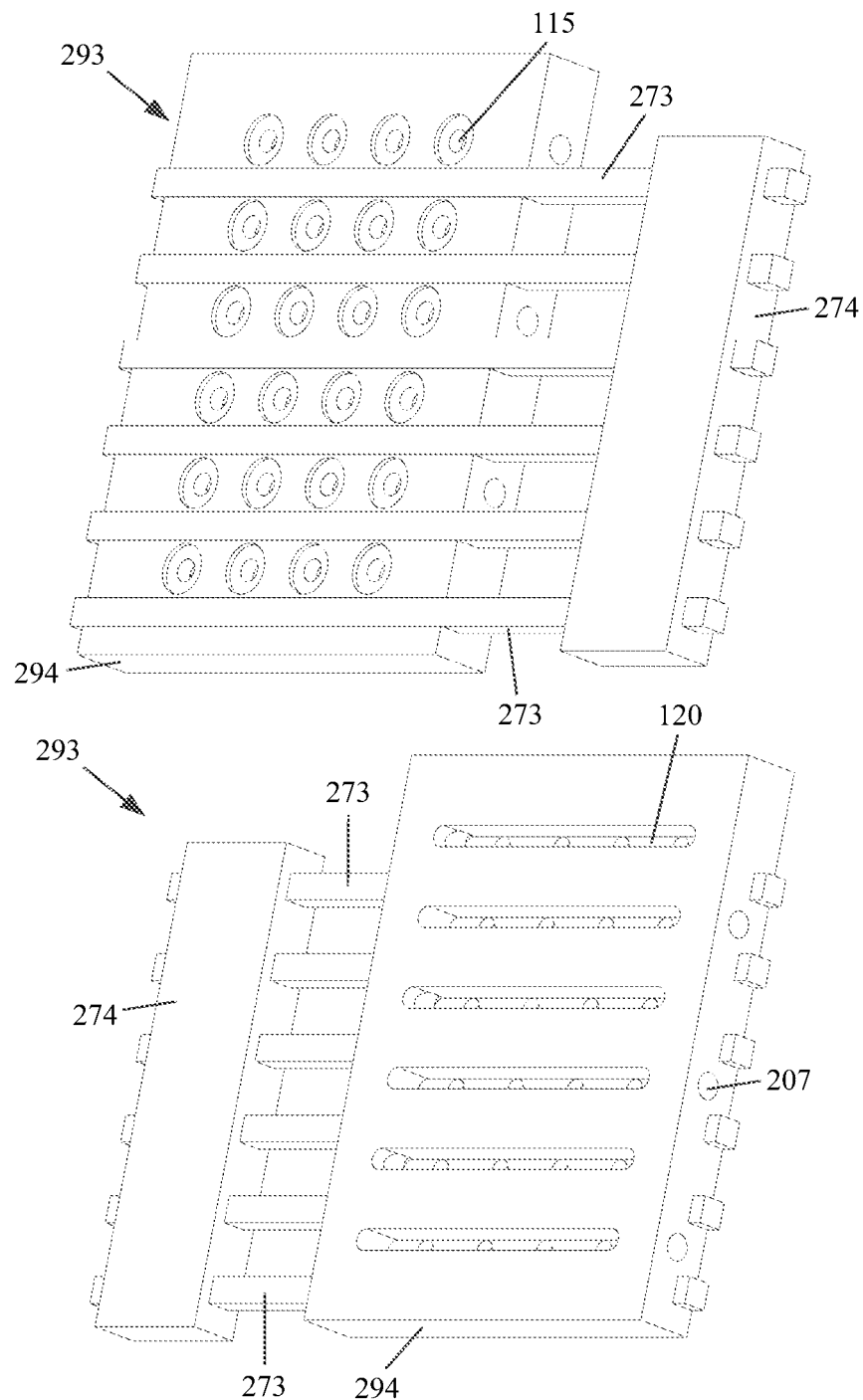
FIGS. 97-99 illustrate a cooled radiator 293 and components thereof in accordance with some embodiments.
Figure 98:
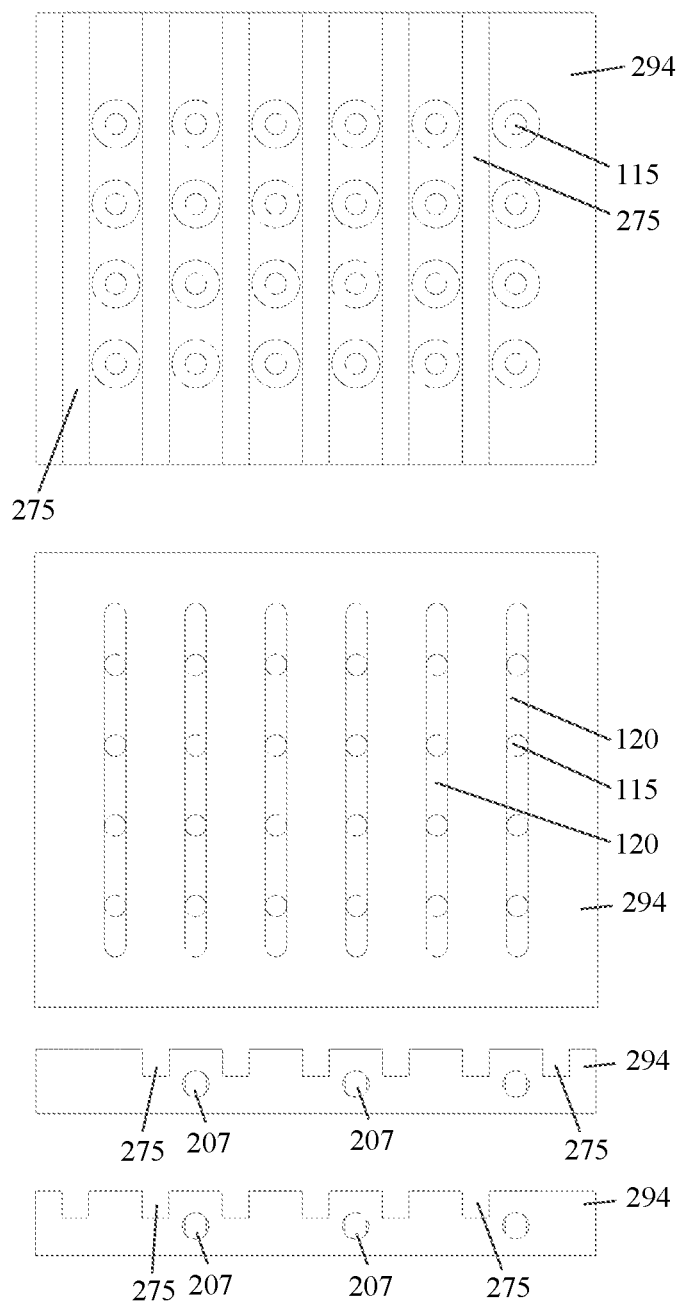

In some embodiments, a cooled radiator 293 can completely replace the liquid-cooled radiator 204. FIG. 97 shows two perspective views of the cooled radiator 293. As shown in FIG. 97, the cooled radiator 293 includes an exchange heat sink 294, a plurality of heat pipes 273, and an external radiator 274. FIG. 98 shows several views (top, bottom, left, right) of the exchange heat sink 294. As shown in FIG. 98, the upper surface of the exchange heat sink 294 includes a plurality of stepped through holes 115 running from the upper surface to the lower surface of the exchange heat sink 294, and a plurality of grooves 275 running through two side surfaces of the exchange heat sink 294. The side surfaces of the exchange heat sink 294 include a plurality of through holes 207 running through the side surfaces and penetrate the ends of corresponding grooves 120. The lower surface of the exchange heat sink 294 includes a plurality of grooves 120, each groove 120 links a respective set of the stepped through holes 115 in the same row. The heat pipes 273 are mounted in the grooves 275 and in close thermal contact with the exchange heat sink 294 to realize heat transfer. The heat produced by the diode laser 15 during working is transferred to the exchange heat sink 294, and the heat pipes 273 transfer the heat from the exchange heat sink 294 to the radiator 274 to complete radiation.

Figure 99:
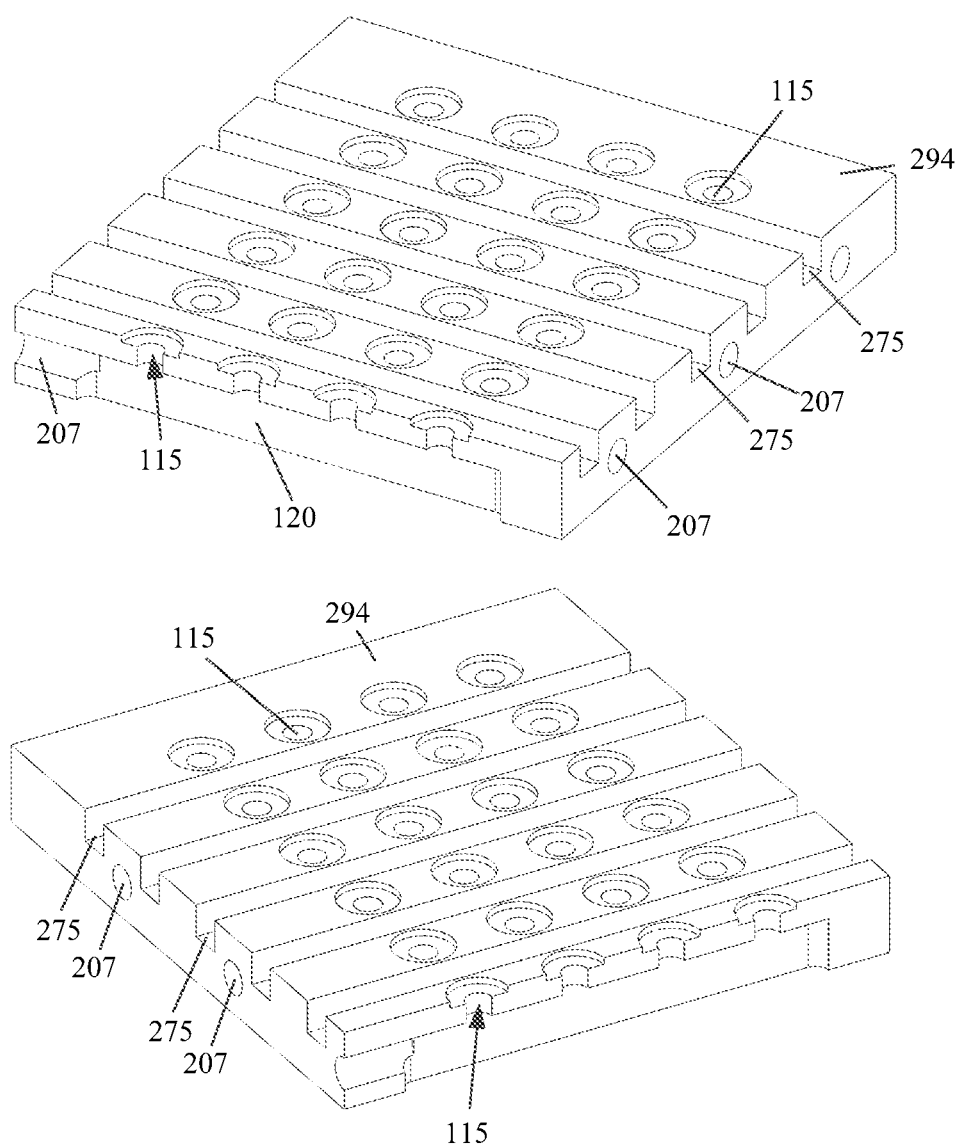
Figure 100:
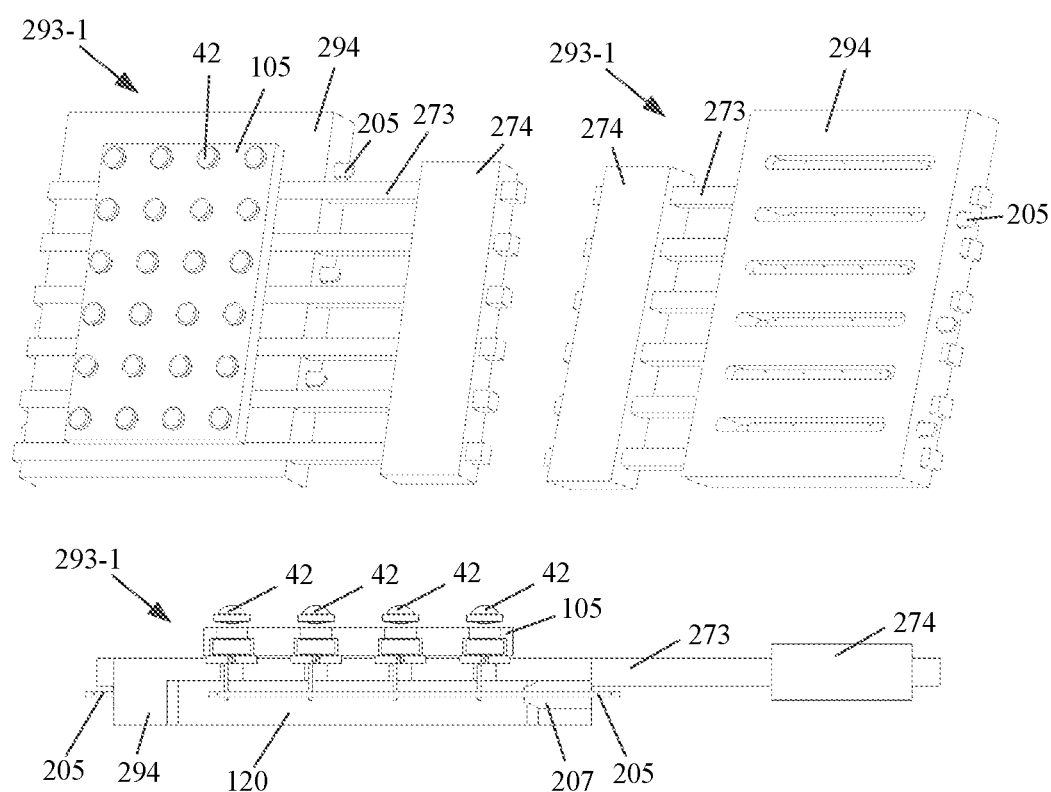
FIG. 100 illustrates a diode laser array module 293-1 utilizing a cooled radiator 293 in accordance with some embodiments.

The partial sectional views of the exchange heat sink 294 shown in FIG. 99 illustrate the relative positions and orientations of the linear grooves 275, the through holes 207, the through holes 115, and the linear grooves 120 in the exchange heat sink 294. The use method of the cooled radiator 293 and the use method of the liquid-cooled radiator 204 are exactly the same, which will be not repetitively described any longer. FIG. 100 shows perspective views (e.g., view from the top, and view from the bottom) and a cross-sectional view of the diode laser array module 293-1 that uses the cooled radiator 294 instead of the liquid-cooled radiator 204. The liquid-cooled radiator 204 of the diode laser array module 203 is replaced with the liquid-cooled radiator 293 to form the diode laser array module 293-1. The principle is the same as that of the diode laser array module 203, which will be not repetitively described any longer.

In some embodiments, when a liquid-cooled radiator is made using a heat sink and a water passage sealing plate, because the processing requirements of the heat sink with preformed water passage and the water passage sealing plate are different, and both are high in processing complexity and require high processing accuracy, the manufacturing costs for making this type of liquid-cooled radiators are relatively high. In some embodiments, a water passage pipe may be directly embedded into a heat sink to form a liquid-cooled radiator, so as to satisfy the radiation requirements and reduce the cost. Moreover, a new liquid cooling solution can be formed by directly combining the heat sink of the above-mentioned cooled radiator with the water passage pipe.

A liquid-cooled radiator 303 and a liquid-cooled radiator 304 will optionally replace the liquid-cooled radiator 102, the liquid-cooled radiator 188, the liquid-cooled radiator 195, the liquid-cooled radiator 204, and similar liquid-cooled radiators in any solution described herein. The driving circuit PCB 106 may be used continually or be replaced with another driving circuit PCB in various embodiments.

Taking the cases that the liquid-cooled radiator 304 replaces the liquid-cooled radiator 204 as an example, the method for replacement and differences will be demonstratively described. Other liquid-cooled radiators may be replaced by adopting the same principle, which will be not repetitively described any longer.

A demonstrative description will be made below by adopting a diode laser 15. The diode laser 15 may be replaced with the diode laser 11, the diode laser 17, the diode laser 43, the diode laser 46, the diode laser 48, the diode laser 50, or the diode laser 51. The principle is the same, which will be not repetitively described any longer.

Figure 101:
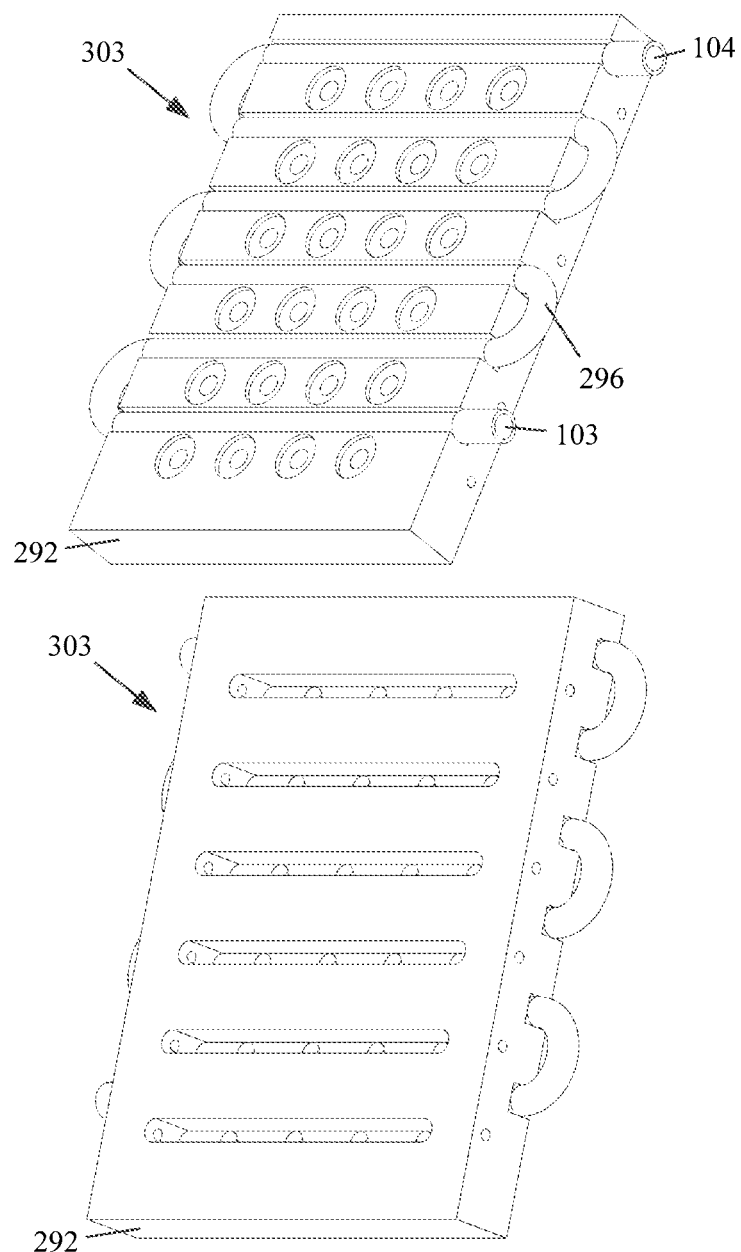
FIG. 101 illustrates a liquid-cooled radiator 303 in accordance with some embodiments.

FIG. 101 shows two perspective views (view from the top, and view from the bottom) of the liquid-cooled radiator 303 made by a preformed water passage pipe 296 that is mounted onto a heat sink 292 in accordance with some embodiments. The cooled radiator 303 can completely replace the liquid-cooled radiator 188 in a diode laser array module in accordance with various embodiments. The use method of the liquid-cooled radiator 303 and the use method of the liquid-cooled radiator 188 are exactly the same, which will be not repetitively described any longer.

As shown in FIG. 101, the liquid-cooled radiator 303 includes an exchange heat sink 292 and a water passage pipe 296. The water passage pipe 296 is mounted in the grooves 275 in the top surface of the heat sink 292, and makes thermal contact with the exchange heat sink 292 to realize heat transfer. The heat produced by the diode laser 15 during working is transferred to the exchange heat sink 292, and the water passage pipe 296 transfers the heat from the exchange heat sink 292 to the liquid to complete radiation.

The heat sink 292 includes through holes 115 in its top surface and that are linked by the grooves 120 in the bottom surface of the heat sink. The heat sink 292 includes through holes 192 on the side surfaces of the heat sink 292 that are in communication with the grooves 120 in the bottom surface of the heat sink 292.

Figure 102:
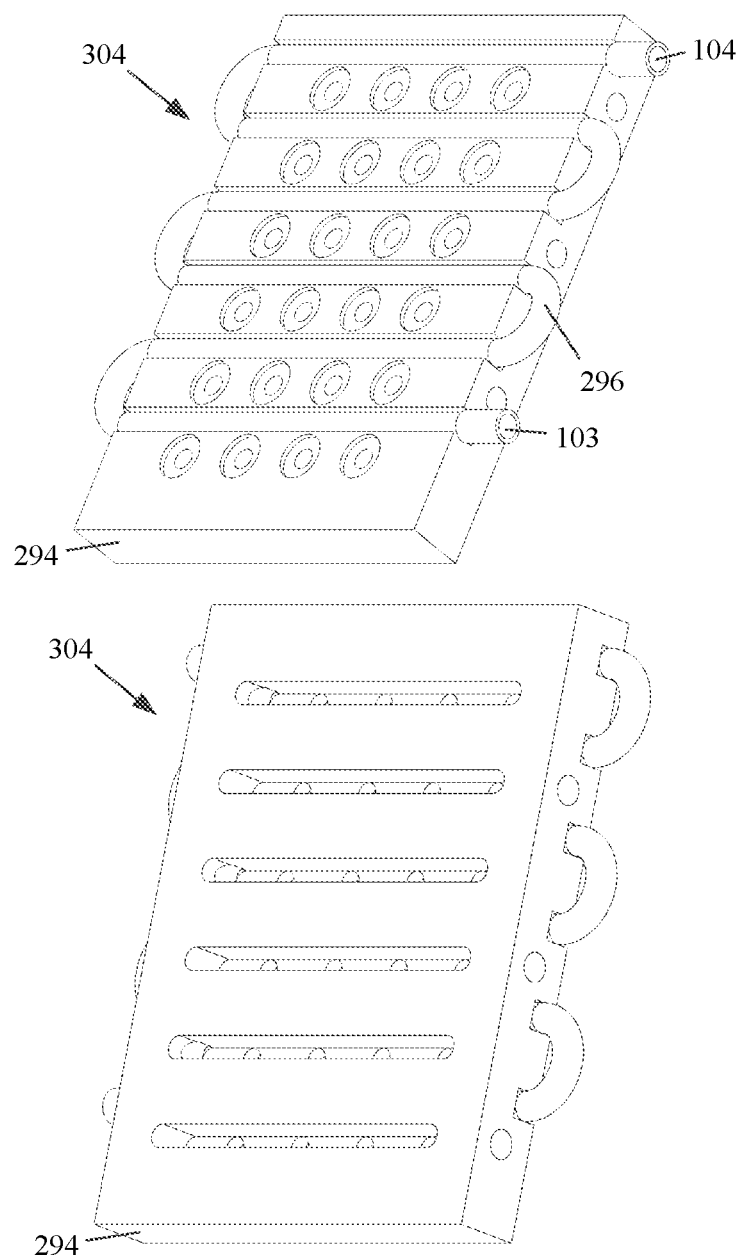
FIG. 102 illustrates a liquid-cooled radiator 304 in accordance with some embodiments.

In some embodiments, a liquid-cooled radiator 304 can completely replace the liquid-cooled radiator 204 in a diode laser array module. FIG. 102 shows two perspective views of the liquid-cooled radiator 204 in accordance with some embodiments. The use method of the liquid-cooled radiator 304 and the use method of the liquid-cooled radiator 204 are exactly the same, which will be not repetitively described any longer. The liquid-cooled radiator 304 includes an exchange heat sink 294 with a plurality of preformed linear grooves in which a water passage pipe 296 is mounted. The grooves for mounting the water passage pipe 296 are formed in the top surface of the heat sink 294 at locations between adjacent rows of through holes 115. The bottom surface of the heat sink 294 includes grooves 120 that each link a respective set of through holes 115 that are in the same row. The side surfaces of the heat sink 294 include through holes 207 that communicably link the grooves 120 and the side surfaces of the heat sink 292. The water passage pipe 296 is mounted in the grooves 275 and makes thermal contact with the exchange heat sink 294 to realize heat transfer. The heat produced by the diode laser 15 during working is transferred to the exchange heat sink 294, and the water passage pipe 296 transfers the heat from the exchange heat sink 294 to the liquid to complete radiation.

Figure 103:
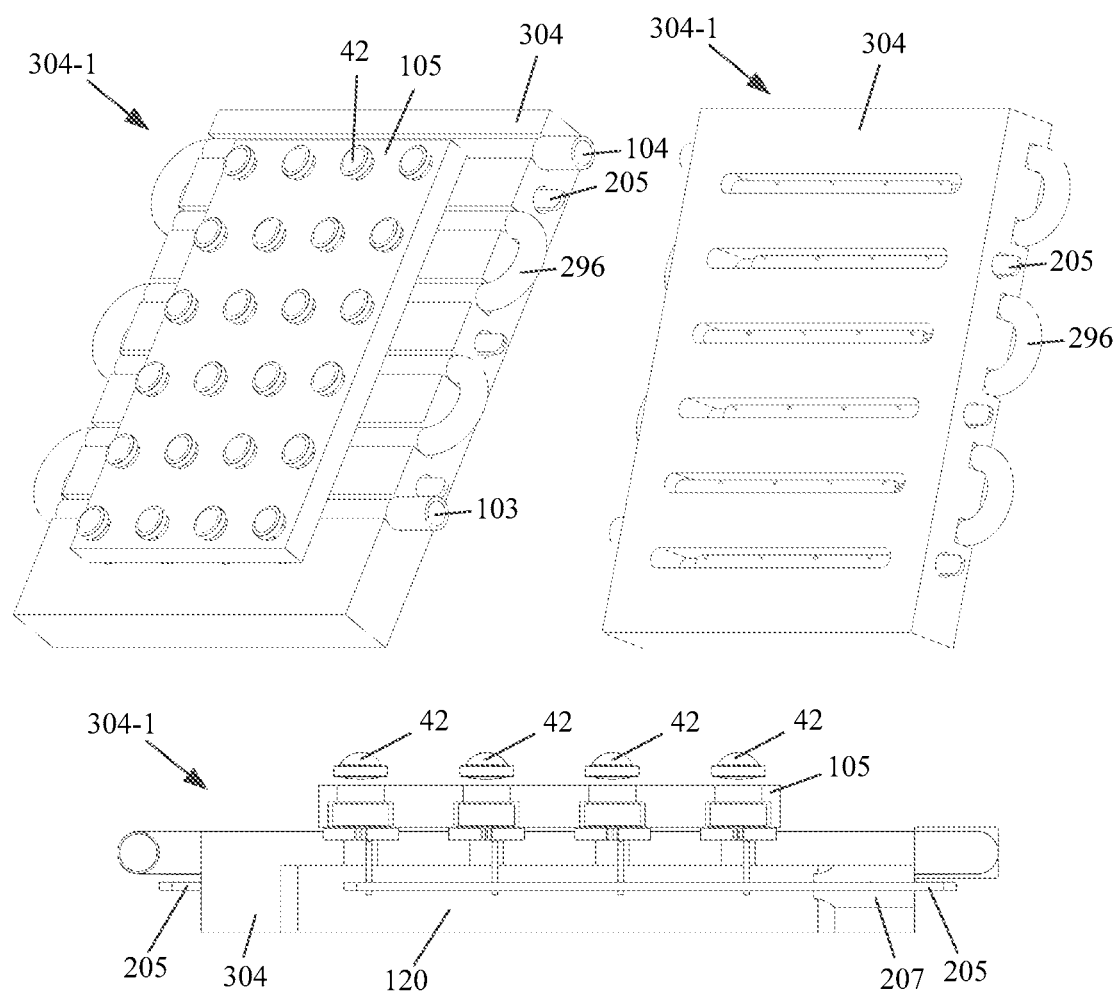
FIG. 103 illustrates a diode laser array module 304-1 utilizing a liquid-cooled radiator 304 in accordance with some embodiments.

The use method of the cooled radiator 304 and the use method of the liquid-cooled radiator 204 are exactly the same, which will be not repetitively described any longer. The liquid-cooled radiator 204 of the diode laser array module 203 is replaced with the liquid-cooled radiator 304 to form a diode laser array module 304-1. The principle is the same as that of the diode laser array module 203, which will be not repetitively described any longer. FIG. 103 shows two perspective views of the diode laser array module 304-1 in which the liquid-cooled radiator 204 is replaced by the liquid-cooled radiator 304, and all other corresponding parts of the diode laser array modules are the same. FIG. 103 shows the relative positions and orientations of the grooves 120, the horizontal through holes 207, the PCBs 205, the diode lasers 15, the through holes 115, etc.

In all the above-mentioned solutions, the liquid-cooled radiators, such as the liquid-cooled radiator 102, the liquid-cooled radiator 188, the liquid-cooled radiator 204, the liquid-cooled radiator 239, the liquid-cooled radiator 241, the liquid-cooled radiator 263, the liquid-cooled radiator 265, the liquid-cooled radiator 268, the liquid-cooled radiator 303, and the liquid-cooled radiator 304, and the cooled radiators, such as the cooled radiator 291 and the cooled radiator 293, are combined with the diode laser 15 to form the diode laser array modules. The diode laser 15 may be replaced with the diode laser 11, the diode laser 17, the diode laser 43, the diode laser 46, the diode laser 48, the diode laser 50 or the diode laser 51. The principle is the same, which will be not repetitively described any longer.

Figure 104:
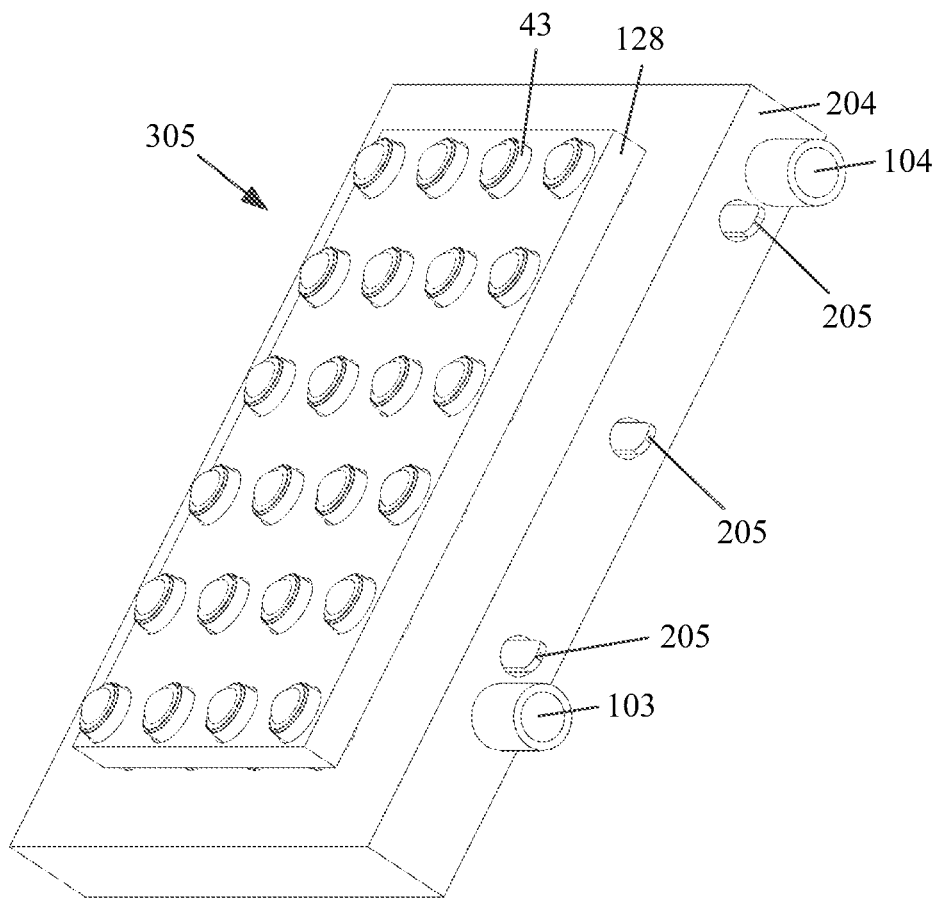
FIGS. 104-105 illustrate a diode laser array module 305 and components thereof in accordance with some embodiments.
Figure 105:
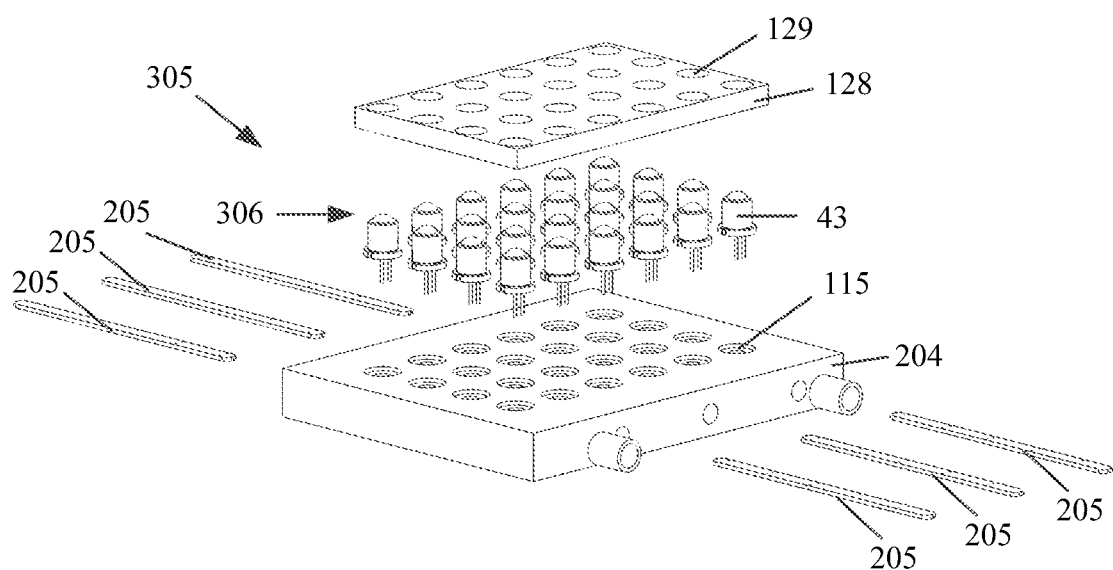

Description will be made by taking the case that the diode lasers 43 and the liquid-cooled radiator 204 are used to form a diode laser array module 305 as a demonstrative example. FIG. 104 shows a perspective view of the diode laser array module 305 in accordance with some embodiments. FIG. 105 shows an exploded view of the diode laser array module 305. As shown in FIG. 104 and FIG. 105, the diode laser array module 305 includes a diode laser array 306 comprising a plurality of diode lasers 43 arranged in multiple rows, a module pressing plate 128, a pin connection circuit PCB 205 and a liquid-cooled radiator 204. The liquid-cooled radiator 204 includes a plurality of through holes 207. Each PCBs 205 passes through a respective through hole and connects with a set of diode lasers in a respective row in a linear groove 120 in the bottom surface of the liquid-cooled radiator 204.

The heat produced by the diode laser 43 during working is transferred to the liquid-cooled radiator 204 for cooling. Coolant flows in from the inlet 103 and out from the outlet 104. The coolant may be water, ethylene glycol, etc. The diode laser 43 is placed in a respective through hole 129 in the module pressing plate 128, the metal base 9 of the diode laser 43 makes contact with the liquid-cooled radiator 204, the metal housing 10 of the diode laser 43 passes through the through hole 129, and the module pressing plate 128 and the liquid-cooled radiator 204 squeeze each other to fix the diode laser 43. A first portion of the pin connection circuit PCB 205 is placed in the groove 120 and connected with the diode lasers 43 in the same row. A second portion of the pin connection circuit PCB 205 extends into the through hole 207 in the heat sink body of the liquid-cooled radiator from the end of the groove 120 and emerges from the side surface of the liquid-cooled radiator, and is connected with an external circuit outside of the side surface of the liquid-cooled radiator 305.

In all the above-mentioned solutions, the diode lasers are always pressed onto the cooled radiator by a cover plate (e.g., a module pressing plate) to fix the diode lasers and keep heat transfer to the cooled radiator. In some embodiments, the diode lasers may be fixed on the cooled radiator by welding or thermal conductive adhesive bonding, so as to fix without using a cover plate and reduce the cost.

The diode laser 11, the diode laser 15, the diode laser 17, the diode laser 43, the diode laser 46, the diode laser 48, the diode laser 50 or the diode laser 51 may be fixed on the cooled radiator by welding or thermal conductive adhesive bonding. The principle is the same, which will be not repetitively described any longer.

Description will be made by taking the case that the diode laser 43 and the liquid-cooled radiator 204 form a diode laser array module 307 as a demonstrative example. The liquid-cooled radiator 102, the liquid-cooled radiator 188, the liquid-cooled radiator 195, the liquid-cooled radiator 204, the liquid-cooled radiator 211, the liquid-cooled radiator 239, the liquid-cooled radiator 241, the liquid-cooled radiator 263, the liquid-cooled radiator 265, the liquid-cooled radiator 268, the cooled radiator 291, the cooled radiator 293, the liquid-cooled radiator 303, the liquid-cooled radiator 304, the liquid-cooled radiator 305, the liquid-cooled radiator 307, the auxiliary heat sink 308, the auxiliary heat sink 316, and the auxiliary heat sink 317 can be realized by adopting the same principle, which will be not repetitively described any longer.

Figure 106:
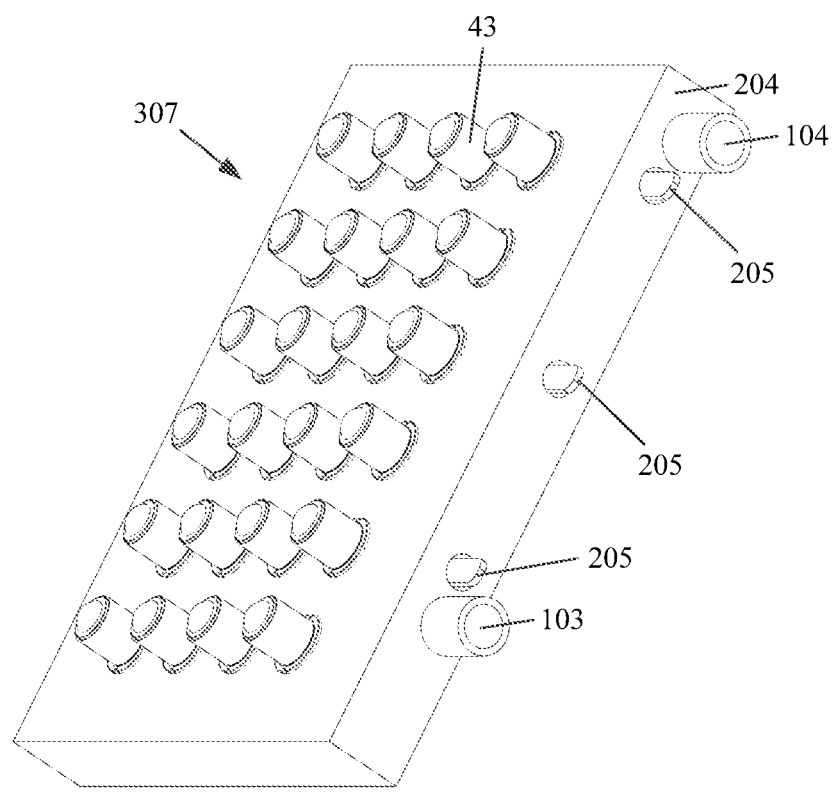
FIG. 106 is a schematic view of a diode laser array module 307 in accordance with some embodiments.

FIG. 106 shows a perspective view of the diode laser array module 307 in accordance with some embodiments. The diode laser array module 307 includes a diode laser array 306 comprising a plurality of diode lasers 43 arranged in multiple rows, a pin connection circuit PCB 205 and a liquid-cooled radiator 204. As shown in FIG. 106, the diode lasers 43 are fixed to the liquid-cooled radiator 204 by welding or thermal conductive adhesive. The heat produced by the diode laser 43 during working is transferred to the liquid-cooled radiator 204 for cooling. Coolant flows in from the inlet 103 and out from the outlet 104. The coolant may be water, ethylene glycol, etc.

In some embodiments, a cooled radiator may use an auxiliary heat sink to achieve double-sided radiation, thereby improving the utilization ratio of the radiator.

In some embodiments, the liquid-cooled radiator 102, the liquid-cooled radiator 195, the liquid-cooled radiator 204, the liquid-cooled radiator 211, the liquid-cooled radiator 239, the liquid-cooled radiator 241, the liquid-cooled radiator 263, the liquid-cooled radiator 265, the liquid-cooled radiator 268, the cooled radiator 291, the cooled radiator 293, the liquid-cooled radiator 303, the liquid-cooled radiator 304, the liquid-cooled radiator 305, the liquid-cooled radiator 307 and the auxiliary heat sinks can achieve double-sided radiation in accordance with some embodiments as described herein.

Compared with the heat sink 191 of the liquid-cooled radiator 188, the auxiliary heat sink 316 has the same structure except that there is no water passage 119 inside the heat sink 316. The rest of the aspects are the same between the heat sink 191 and the heat sink 316 and will be not repetitively described any longer. The structural features of the heat sink 316 are shown in FIG. 312 which shows two perspective views of the heat sink 316 from the top and from the bottom. Similar to the heat sink 191, the auxiliary heat sink 316 includes a plurality of through holes 115 on the top surface of the heat sink 316, and a plurality of grooves 120 on the bottom surface of the heat sink 316. Each groove 120 links the through holes 115 in the same row. The side surfaces of the heat sink 316 includes through holes 192. Each through hole 192 links the end of a respective groove 120 to the side surface of the heat sink 316. The through holes 115 of the auxiliary heat sink 316 are used to accommodate a second plurality of diode lasers, and the pins of the diode lasers in the same row are connected by a PCB 139 or a series of U-shaped pin connectors 112. Then the PCB 139 and the U-shaped pin connectors or the first/last diode laser in the row is connected with L-shaped lead connectors 110 or 189 which are inserted through the through holes 129 to reach outside of the side surfaces of the auxiliary heat sink 316. Once the second set of diode lasers and their corresponding pin connector modules are installed into the auxiliary heat sink 316 in accordance with the principles shown with respect to the diode laser array modules described above, the auxiliary heat sink are placed into thermal contact with the cooled radiator of a single-sided diode laser array module described earlier. The bottom surface of the auxiliary heat sink 316 (the bottom surface is the portion shown in the lower portion of FIG. 107) is attached and put into thermal contact with the bottom surface of the previously single-sided diode laser array module to form a double-sided diode laser array module. The two sides of the resulting double-sided diode laser array module now share the same cooled radiator.

Figure 107:
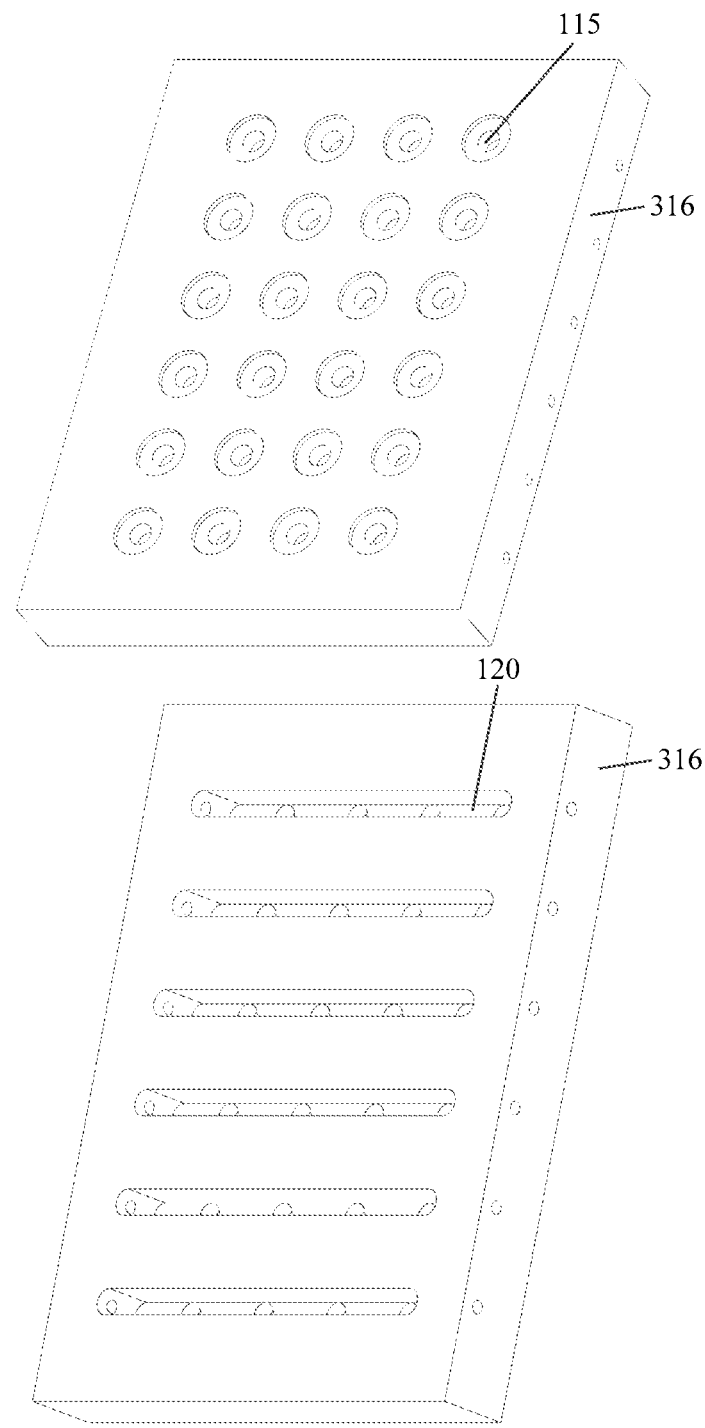
FIGS. 107-108 illustrate a plurality of auxiliary heat sinks in accordance with various embodiments.
Figure 108:
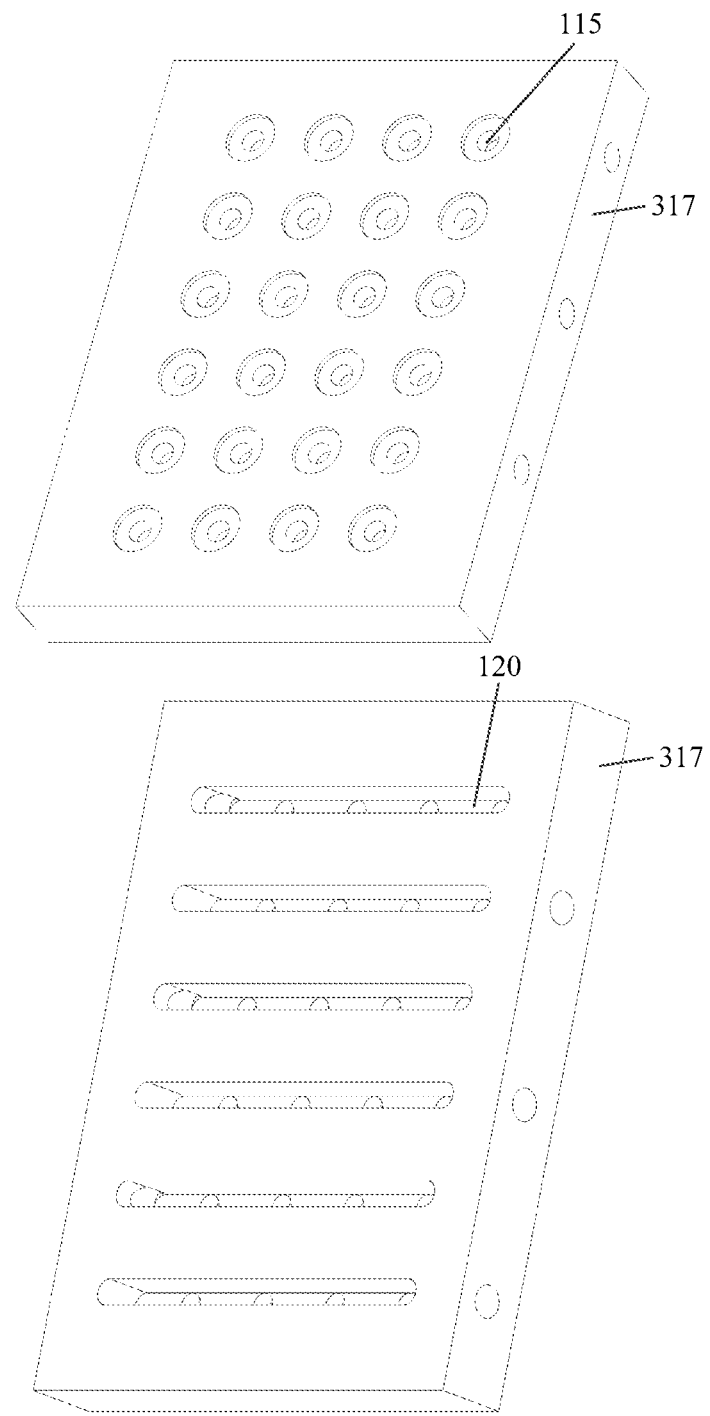

In some embodiments, compared with the heat sink 206 of the liquid-cooled radiator 204, an auxiliary heat sink 317 has the same structure except that there is no water passage 119 inside the auxiliary heat sink 317. Other aspects are the same between the heat sink 206 and the auxiliary heat sink 317 and will be not repetitively described any longer. FIG. 108 shows two perspective views of the auxiliary heat sink 317. As shown in FIG. 107, the auxiliary heat sink 317 includes a plurality of through holes 115 for accommodating a second plurality of diode lasers arranged in multiple rows. The bottom surface of the auxiliary heat sink 317 includes a plurality of grooves 120 at locations that correspond to respective rows of through holes 115. The side surfaces of the auxiliary heat sink 317 include a plurality of through holes 207 that each connects the end of a respective groove 120 to the side surface of the heat sink 317. A respective PCB 205 will be placed within each respective groove 120. The portion of the PCB 205 within a respective groove 120 connects the pins of the diode lasers placed in the row of through holes 115 that are connected by the respective groove 120. An end portion of the PCB 205 passes through the through hole 207 and reaches outside of the side surface of the heat sink 317. A portion of the PCB 205 resides within the through hole 207. The top surface of the auxiliary heat sink 317 is shown in the top portion of FIG. 108, and the bottom portion of the auxiliary heat sink 317 is shown in the bottom portion of FIG. 108. Once the second plurality of diode lasers and corresponding pin connector modules are installed into the auxiliary heat sink 317, the bottom surface of the auxiliary heat sink 317 is attached to and placed in thermal contact with the bottom surface of the cooled radiator of a single-sided diode laser array module to form a double-sided diode laser array module. The two sides of the double-sided diode laser array module share the same cooled radiator of the previously single-sided diode laser array module.

As described above, in some embodiments, a second plurality of diode lasers and the auxiliary heat sink can form a diode laser array module without a complete radiating function. The diode laser array module without its own heat radiating function then forms a cooled radiator with double-sided radiation together with a single-sided diode laser array module with a radiating function.

Description will be made below by taking a second plurality of diode lasers 15 as a demonstrative example in the following solution. The diode lasers may be replaced with diode lasers 1, diode lasers 8 or diode lasers 16. The principle is the same, which will be not repetitively described any longer.

Figure 109:
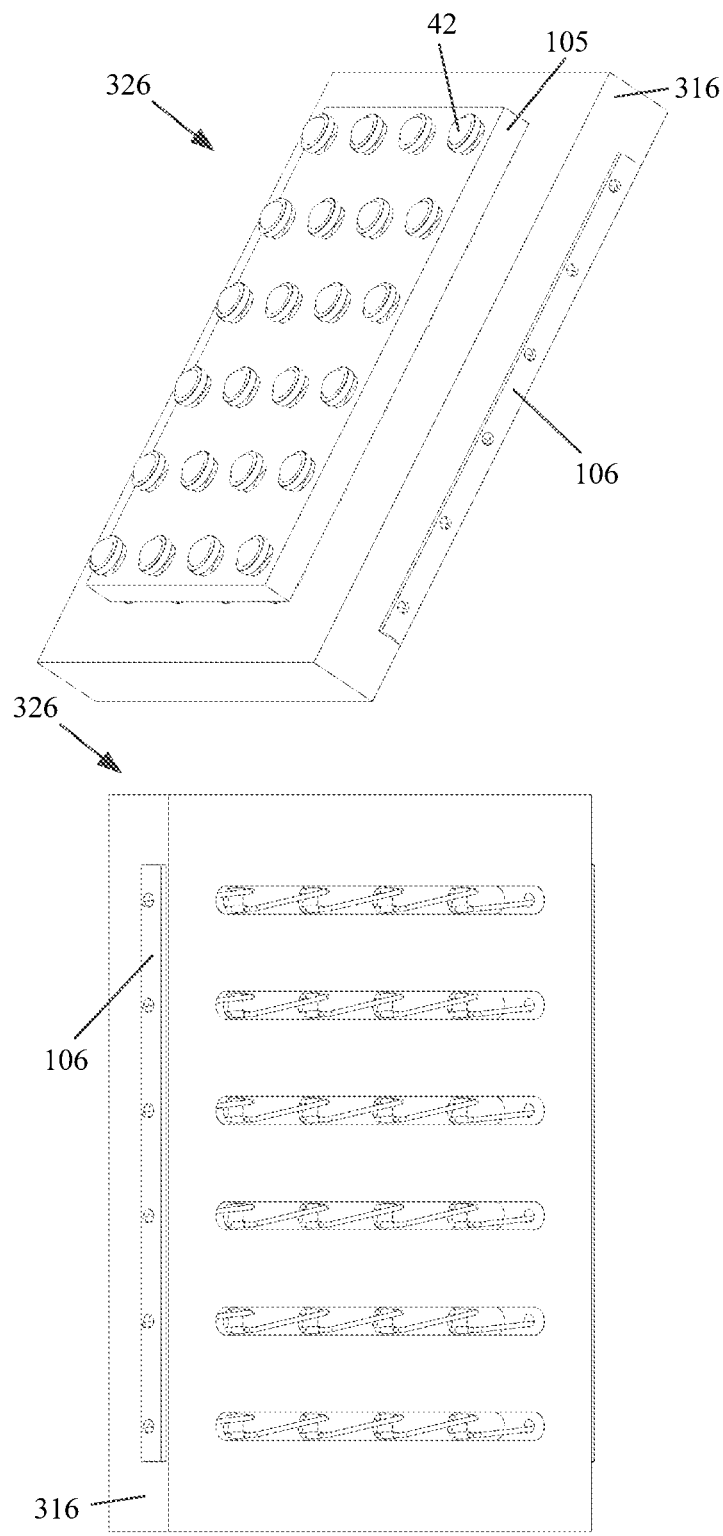
FIGS. 109-113 illustrate a plurality of diode laser array modules make with auxiliary heat sinks in accordance with various embodiments.

In some embodiments, a diode laser array module 326 is formed by replacing the liquid-cooled radiator 188 of the diode laser array 187 with the auxiliary heat sink 316. The other parts are totally the same, which will be not repetitively described any longer. FIG. 109 shows perspective views (view from the top at an angle, and view from the bottom) of the diode laser array module 326 without a cooled radiator.

Figure 110:
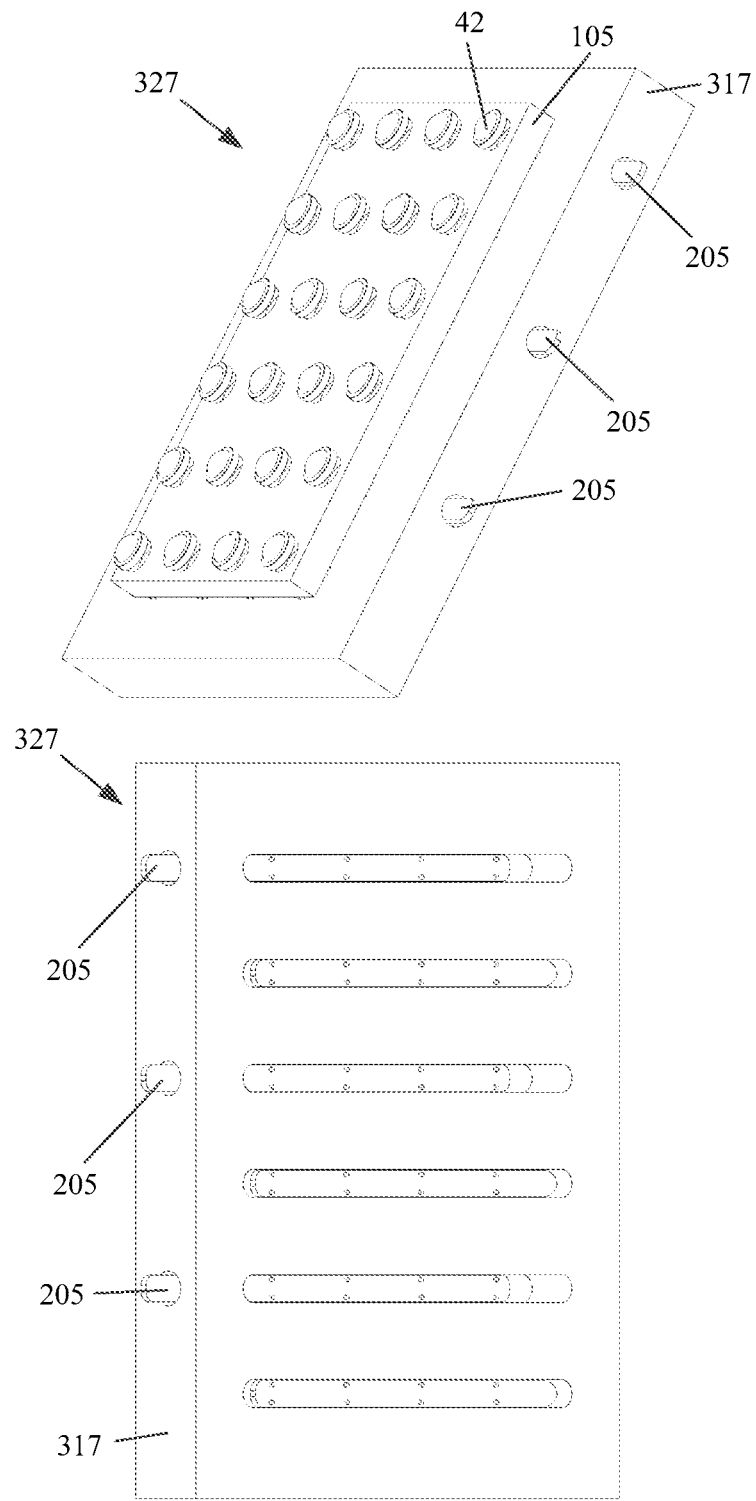

In some embodiments, a diode laser array module 327 is formed by replacing the liquid-cooled radiator 204 of the diode laser array 203 with the auxiliary heat sink 317. The other parts are totally the same, which will be not repetitively described any longer. FIG. 110 shows perspective views (view from the top at an angle, and view from the bottom) of the diode laser array module 327 without a cooled radiator.

In the above-mentioned solution, the diode laser 15 may be further replaced with a diode laser 11, a diode laser 17, a diode laser 43, a diode laser 46, a diode laser 48, a diode laser 50, or a diode laser 51, which will be not repetitively described any longer.

Description will be made by taking the case that the diode laser 43 and the auxiliary heat sink 317 form the diode laser array module 328 as a demonstrative example.

The diode laser array module 328 is formed by replacing the liquid-cooled radiator 204 of the diode laser array 305 with the auxiliary heat sink 317. The other parts are totally the same, which will be not repetitively described any longer. The diode laser array module 327 is the same as the diode laser array module 328, except that different diode lasers are used.

Figure 111:
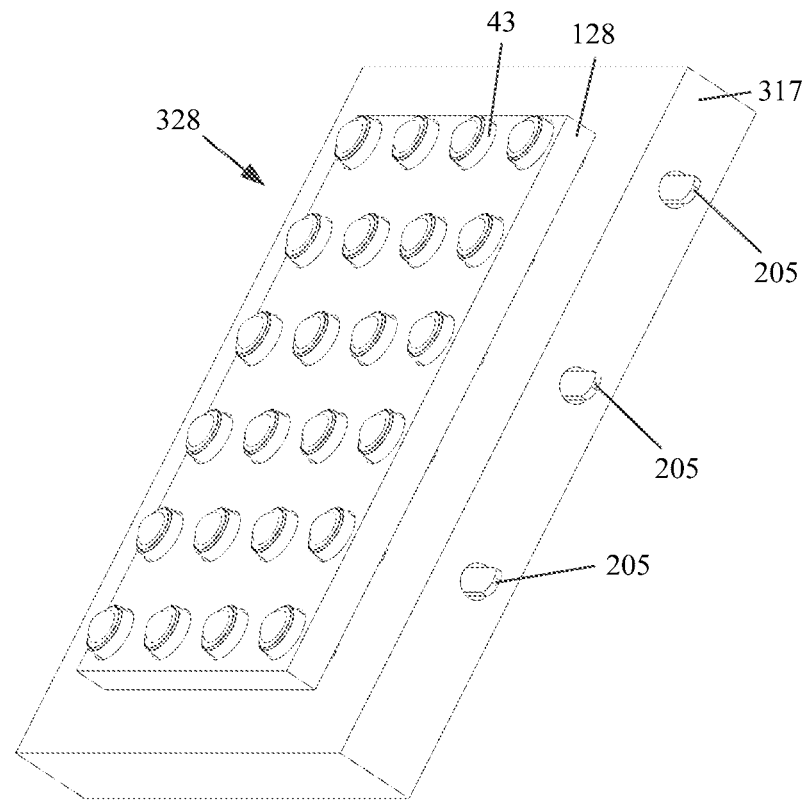
Figure 112:
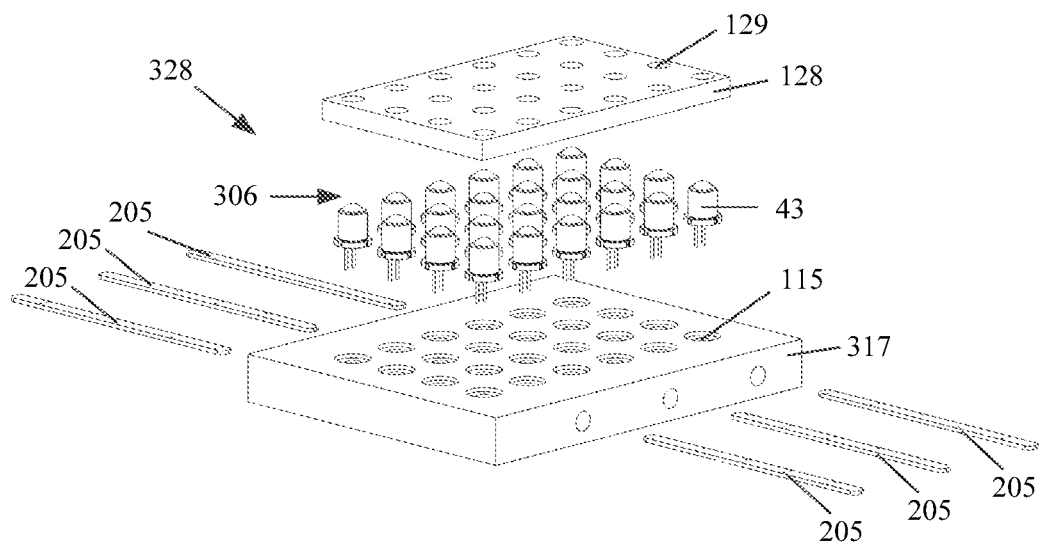

FIG. 111 shows a perspective view of the diode laser array module 328 without a cooled radiator. FIG. 112 shows an exploded view of the diode laser array module 328 without a cooled radiator.

In the above-mentioned solution, the diode lasers are pressed onto the auxiliary heat sink by a cover plate (e.g., a module pressing plate 105) to fix the diode lasers and keep heat transfer to the auxiliary heat sink. In some embodiments, the diode lasers may be fixed on the auxiliary heat sink by welding or thermal conductive adhesive bonding, so as to fix without using a cover plate. The diode laser 11, diode laser 15, diode laser 17, diode laser 43, diode laser 46, diode laser 48, diode laser 50, or diode laser 51 may be fixed on the auxiliary heat sink by welding or thermal conductive adhesive bonding in various embodiments. The principle is the same, which will be not repetitively described any longer.

Description will be made by taking the case that the diode lasers 43 and the auxiliary heat sink 317 are used to form a diode laser array module 329 as a demonstrative example. The auxiliary heat sink 308, auxiliary heat sink 315, auxiliary heat sink 316, and auxiliary heat sink 317 can be formed by adopting the same principle, which will be not repetitively described any longer.

FIG. 113 shows a perspective view of the diode laser array module 329 in accordance with some embodiments. The diode laser array module 329 is formed by replacing the liquid-cooled radiator 204 of the diode laser array 307 with the auxiliary heat sink 317. The other parts are totally the same, which will be not repetitively described any longer.

All the above-mentioned diode laser array modules using the liquid-cooled radiators or cooled radiators, and the diode laser array modules using the auxiliary heat sinks may be freely combined to form a variety of double-sided cooling solutions.

The liquid-cooled radiator in a double-sided radiation solution will be demonstratively described by taking the diode laser array module 203, the diode laser array module 307, the diode laser array module 327, and the diode laser array module 329 as an example. The auxiliary heat sink 308, auxiliary heat sink 315, auxiliary heat sink 316, auxiliary heat sink 317 can be utilized by adopting the same principle, which will be not repetitively described any longer.

Figure 114:
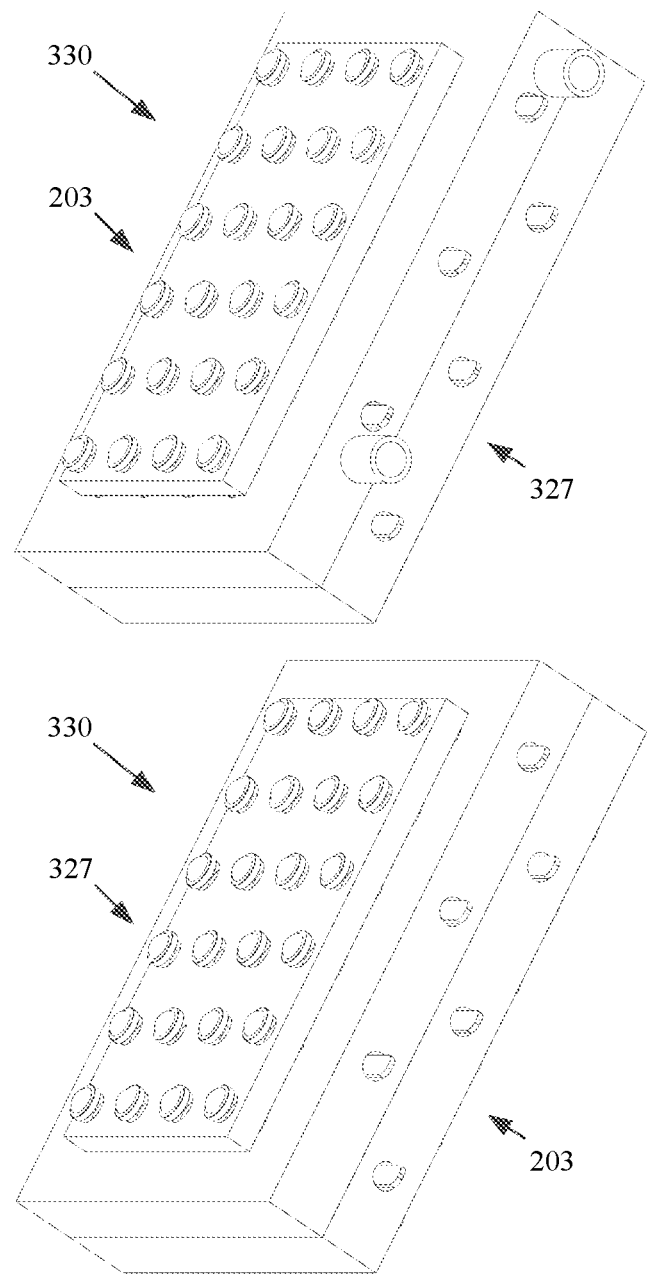
FIGS. 114-118 illustrate a plurality of double-sided diode laser array modules made with a liquid-cooled radiator and an auxiliary heat sink in accordance with various embodiments.
Figure 115:
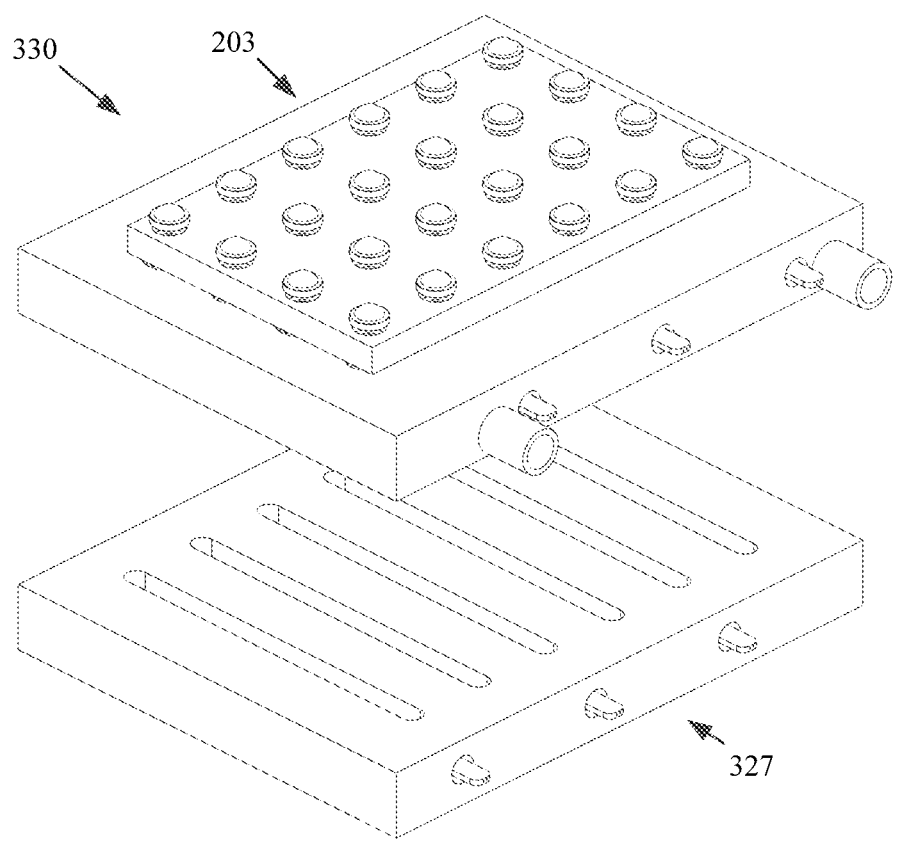

In some embodiments, a double-sided diode laser array module 330 is formed by combining a diode laser array module with a cooled radiator with a diode laser array module with just a heat sink and without a cooled radiator. FIG. 114 shows perspective views (view from the side of the cooled radiator, and view from the side with the auxiliary heat sink). FIG. 115 shows an exploded view of the double-sided diode laser array module with the cooled radiator on top. As shown in FIG. 114 and FIG. 115, the double-sided diode laser array module 330 includes a diode laser array module 203 and a diode laser array module 327. The two diode laser array modules are closely bonded together by their bottom surfaces (e.g., with the grooves 120 on the auxiliary heat sink and the grooves 120 on the cooled radiator aligned with each other). Thermal conductive filling materials (e.g., thermal conductive silicone grease) are arranged between the bottom surfaces of the diode laser array modules 203 and 327, and the heat produced by the diode laser array module 327 is transferred to the liquid-cooled radiator 204 of the diode laser array module 203 for dissipation.

Figure 116:
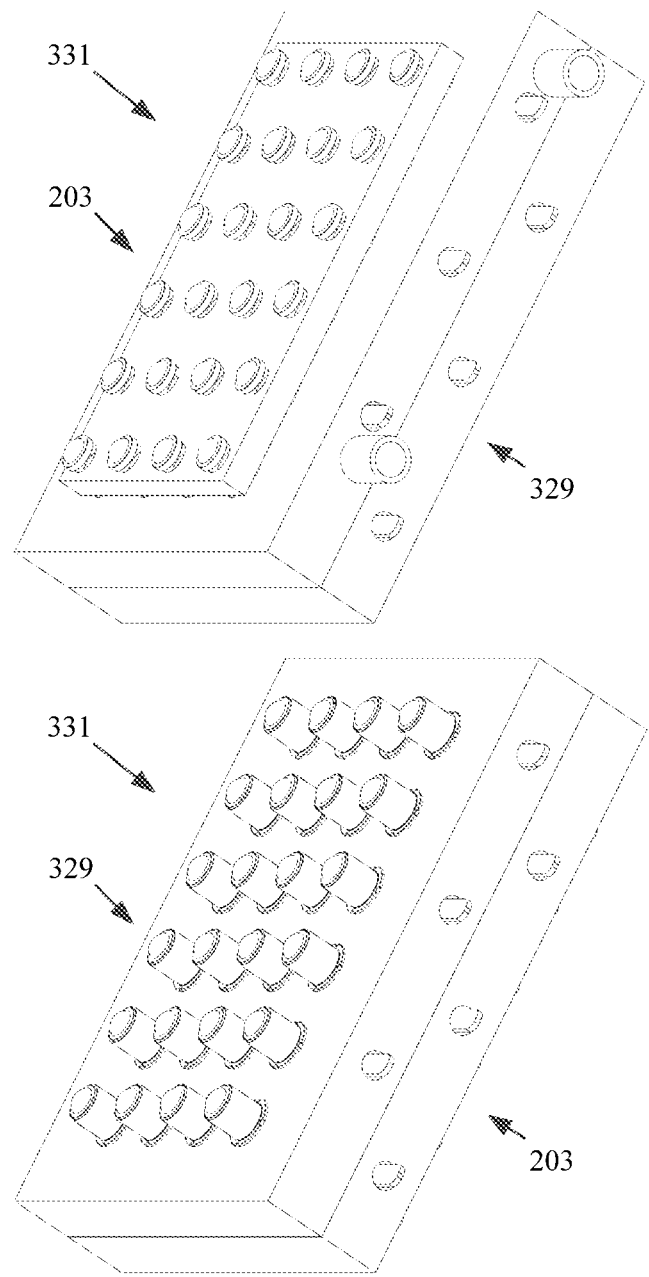

In some embodiments, a double-sided diode laser array module 331 includes a diode laser array module 203 and a diode laser array module 329. The two diode laser array modules are closely bonded together by the bottom surfaces of the diode laser array module 203 and the diode laser array module 329, optionally with the grooves 120 on the bottom surfaces aligned. Thermal conductive filling materials (e.g., thermal conductive silicone grease) are arranged between the bottom surfaces of the diode laser array modules 203 and 329, and the heat produced by the diode laser array module 329 is transferred to the liquid-cooled radiator 204 of the diode laser array module 203. A perspective view of the double-sided laser array module 331 is shown in FIG. 116.

Figure 117:
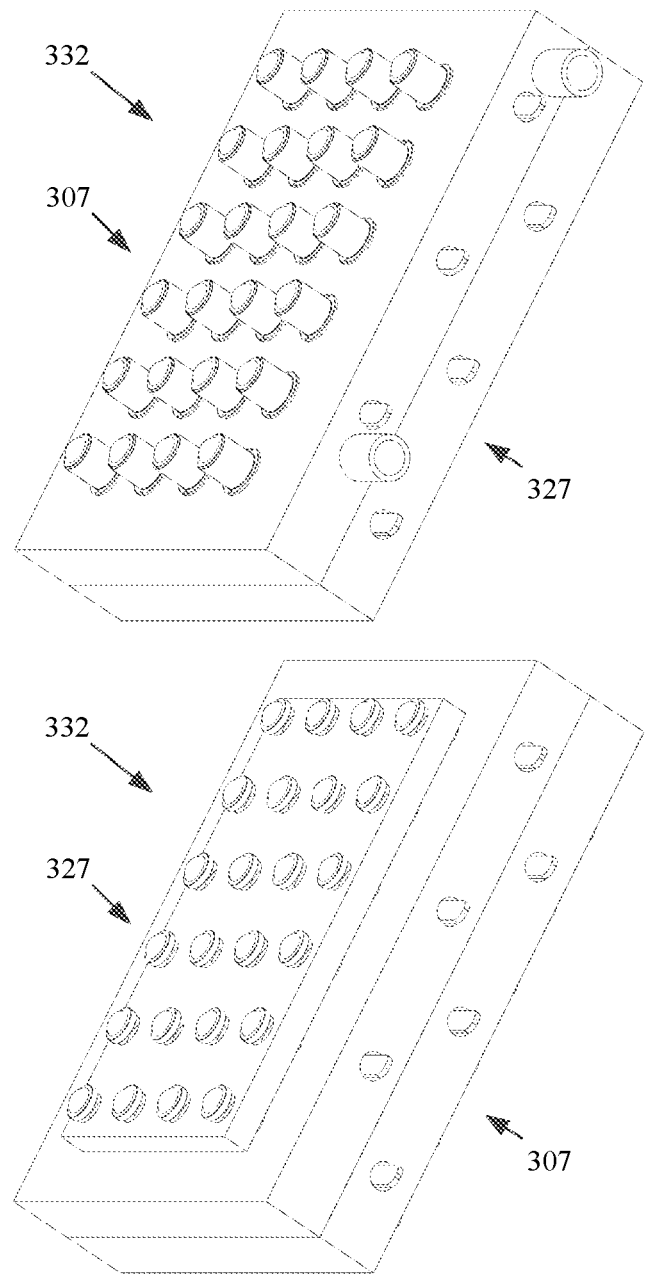

In some embodiments, a double-sided diode laser array module 332 is formed by a diode laser array module 307 and a diode laser array module 327, in accordance with some embodiments. The two diode laser array modules are closely bonded together by their bottom surfaces. Thermal conductive filling materials (e.g., thermal conductive silicone grease) are arranged between the bottom surfaces of the diode laser array module 307 and the diode laser array module 327, and the heat produced by the diode laser array module 327 is transferred to the liquid-cooled radiator 204 of the diode laser array module 307. FIG. 117 shows two perspective views of the double-sided diode laser array module 332 (view from the side with cooled radiator, and view from the side with just the heat sink).

Figure 118:
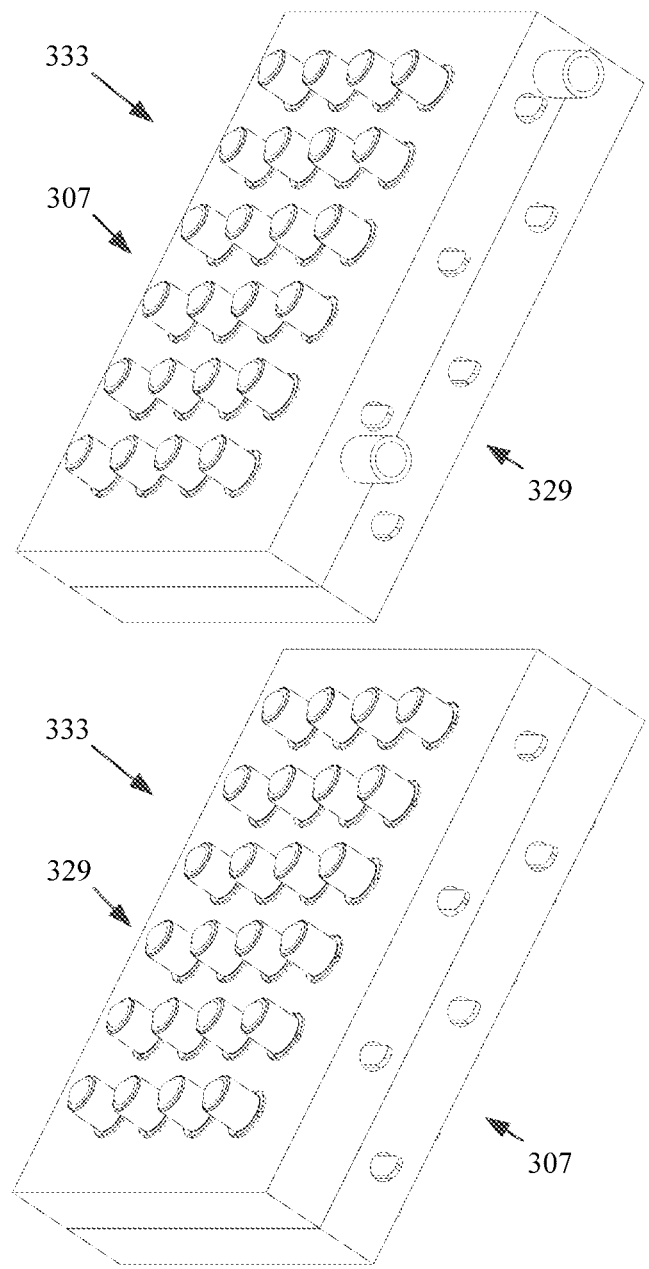

In some embodiments, a double-sided diode laser array module 333 is formed by combining a diode laser array module 307 and a diode laser array module 329 in accordance with some embodiments. The two diode laser array modules are closely bonded together by their bottom surfaces. Thermal conductive filling materials (e.g., thermal conductive silicone grease) are arranged between the bottom surfaces of the diode laser array modules 307 and 329. The heat produced by the diode laser array module 329 is transferred to the liquid-cooled radiator 204 of the diode laser array module 307. FIG. 118 shows two perspective views (view from the side with cooled radiator, and view from the side with just the heat sink) of the double-sided diode laser array module 333 in accordance with some embodiments.

In the solution of the double-sided diode laser array module described above, an auxiliary heat sink is used and the module as a whole has a larger volume. In some embodiments, by redesigning the cooled radiator, double-sided mounting of the diode lasers in the same cooled radiator can be achieved, thus reducing the overall volume of the diode laser array module. Diode lasers mounted on both sides of the cooled radiator are cooled by the same cooled radiator.

Demonstrative description will be made below by taking the diode laser 15 as an example, the diode laser 15 may be replaced by the diode laser 11, diode laser 17, diode laser 43, diode laser 46, diode laser 48, diode laser 50, or diode laser 51, and the principle is the same, which will be not repetitively described any longer.

The following is a design of a liquid-cooled radiator 335 based on the liquid-cooled radiator 268. The basic structure of the liquid-cooled radiator 335 is the same as that of the liquid-cooled radiator 268, except that a second set of through holes 115 and grooves 120 are added to the heat sink of the liquid-cooled radiator 268 on the opposite sides from before, with positions that are offset from their positions from before. The various liquid-cooled radiators and other cooled radiators disclosed earlier can be revised in similar manners to accommodate a second plurality of diode lasers and corresponding pin connector modules, such that a two-sided diode laser array module can be realized. The modifications will not be exhaustively described herein, but should be apparent to a person skilled in the art reading this disclosure.

Figure 119:
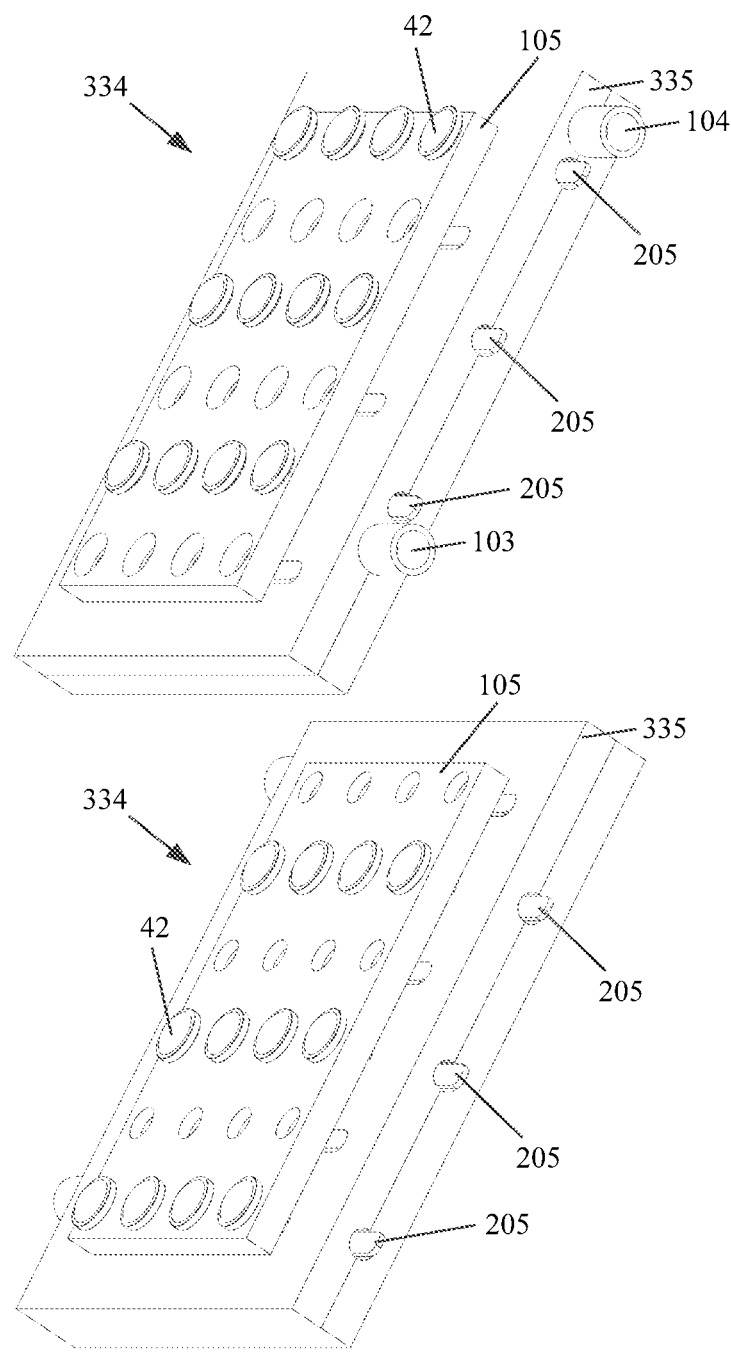
FIGS. 119-125 illustrate a double-sided diode laser array module 334 and components thereof in accordance with some embodiments.
Figure 120:
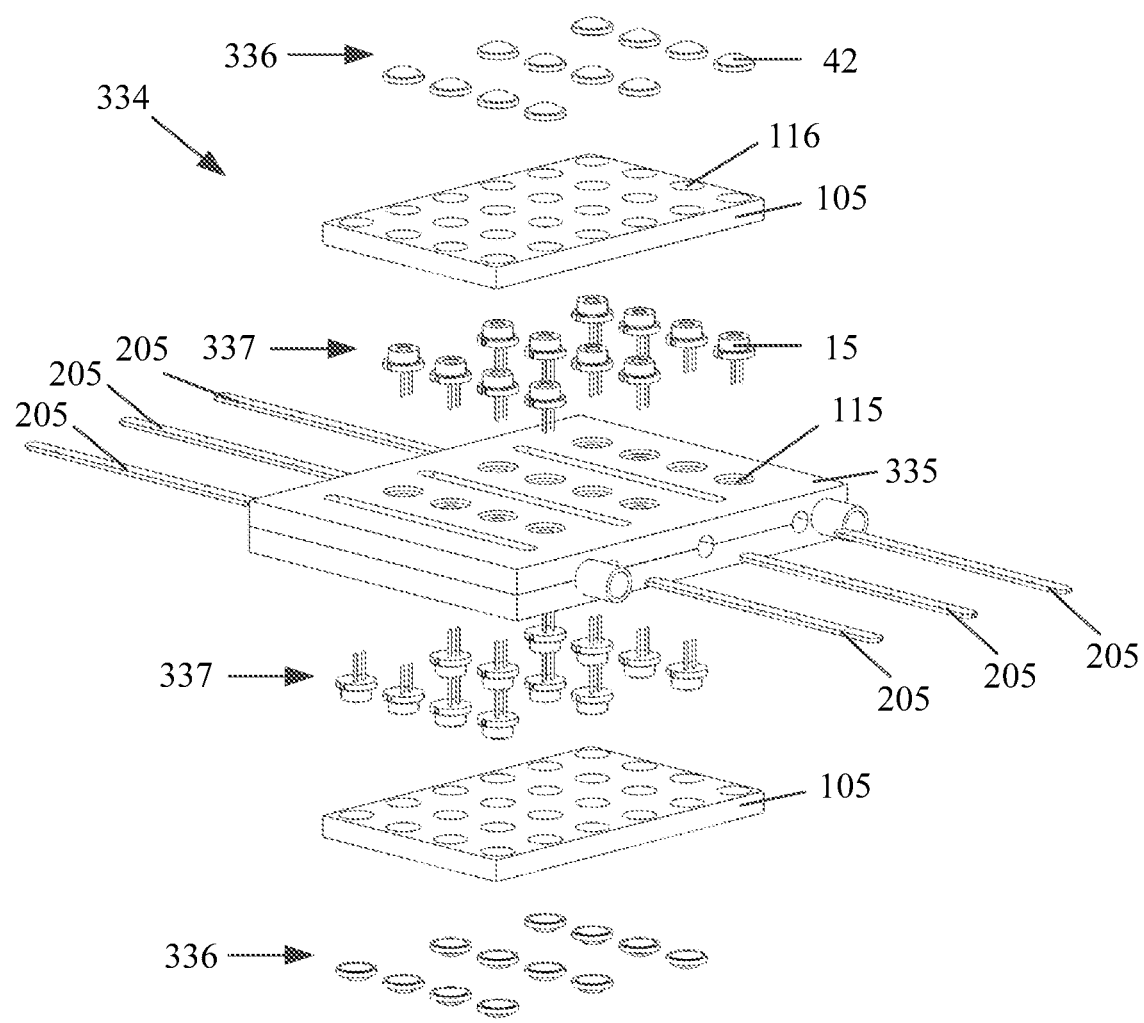

FIG. 119 shows two perspective views of a double-sided diode laser array module 334 (e.g., view from the top at an angle, view from the bottom at an angle) in accordance with some embodiments. FIG. 120 shows an exploded view of the double-sided diode laser array module 334. The double-sided diode laser array module 334 include two sets of diode lasers are mounted on two opposite sides of the liquid-cooled radiator 335 and are cooled by the same liquid-cooled radiator 335, in accordance with some embodiments. Since the diode laser array module 334 is substantially symmetric on the upper side and the lower side, the description will be given, based on one of the two sides of the diode laser array module 334 being the upper side.

As shown in FIG. 119 and FIG. 120, the double-sided diode laser array module 334 includes a diode laser array 337 comprising a plurality of diode lasers 15 arranged in multiple rows, a lens array 336 consisting of a plurality of lenses 42 arranged above the diode lasers 15, a module pressing plate 105, a respective pin connection circuit PCB 205 for each row of diode lasers 15, and a liquid-cooled radiator 335.

The heat produced by the diode laser 15 during working is transferred to the liquid-cooled radiator 335 for cooling. Coolant flows in from the inlet 103 and out from the outlet 104. The coolant may be water, ethylene glycol, etc.

Figure 121:
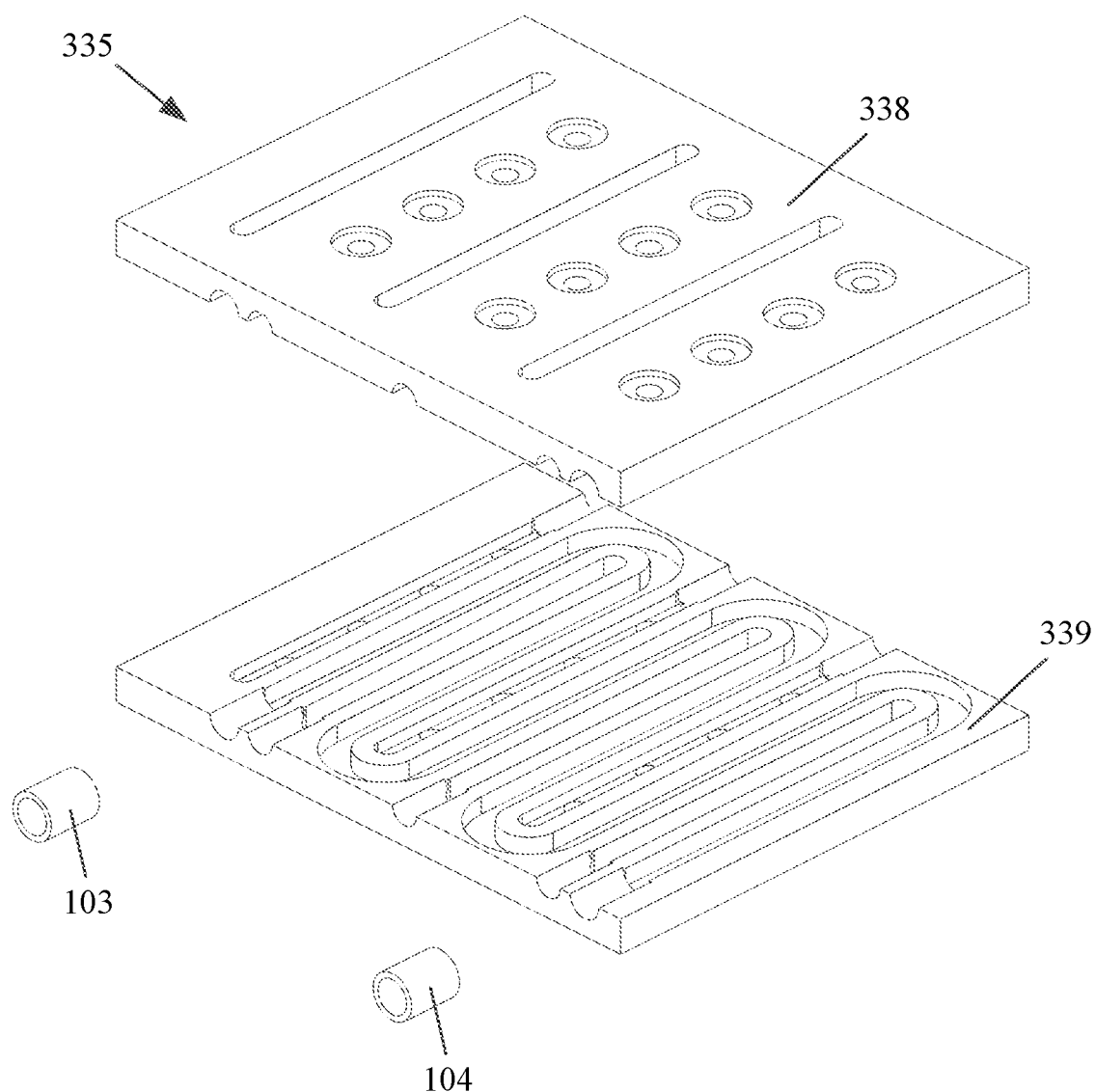
Figure 122:
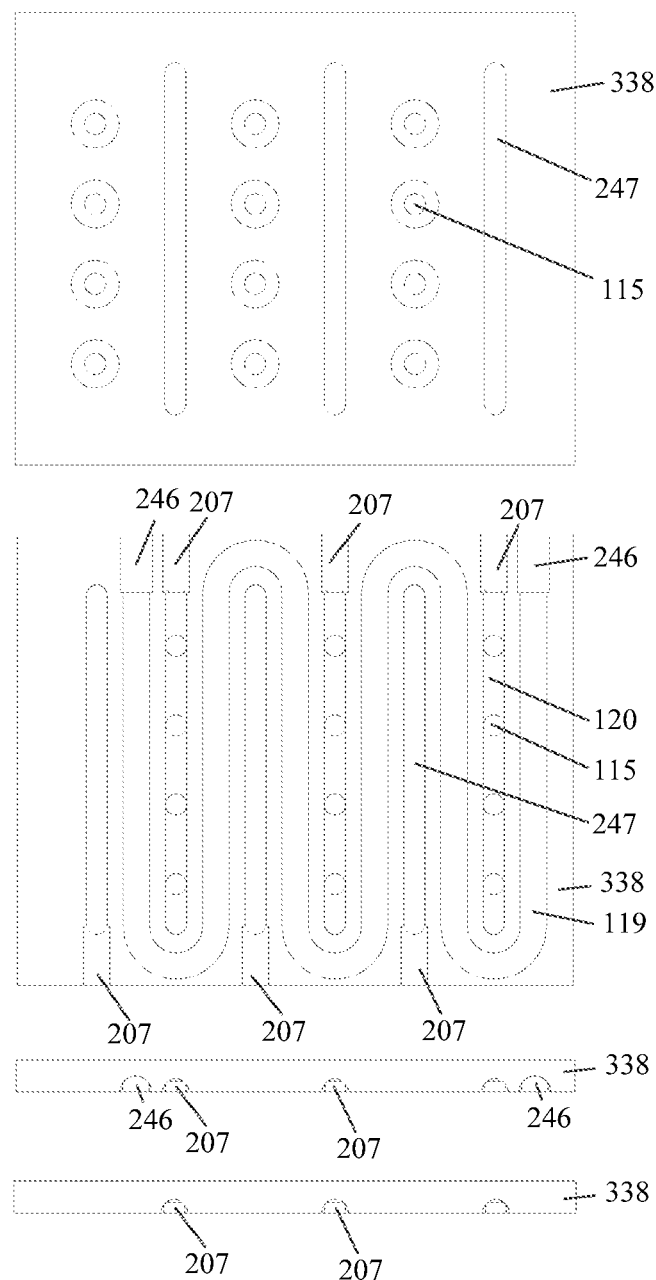

FIG. 121 shows an exploded view of two parts that form the liquid-cooled radiator 335 in accordance with some embodiments. The liquid-cooled radiator 335 is made of an upper half part 338, a lower half part 339, an inlet 103 and an outlet 104, as shown in FIG. 121. FIG. 122 shows multiple views (top, bottom, left, right) of the upper half part 338 and FIG. 123 shows multiple views (top, bottom, left, right) of the lower half part 339.

As shown in FIG. 122, the upper surface of the upper half part 338 includes a plurality of stepped through holes 115 running from the upper surface to the lower surface of the upper half part 338, a plurality of through holes 247 running from the upper surface to the lower surface of the upper half part 338. The through holes correspond to lower portions of a first set of grooves 120 that will be formed in the top surface of the liquid-cooled radiator 335 when the top half part 338 and the lower half part 339 are combined. The first set of grooves 120 will link the rows of through holes 115 that are formed on the bottom surface of the lower half part 339, and used to accommodate the pin connector modules for rows of diode lasers disposed in the through holes 115 formed on the bottom surface of the lower half part 339. The upper halves of the through holes 207 are in the side surfaces of the upper half part 338 and will be used to accommodate the pin connector modules (e.g., PCBs 205) of the different rows of diode lasers that are placed in the grooves 120 formed partially by the holes 247 in the upper half part 338.

The lower surface of the upper half part 338 includes a plurality of grooves 120 of stepped through holes 115 in the top surface of the upper half part 338 in the same row. The upper half parts of a plurality of through holes 207 running through one side surface communicate with corresponding grooves 120 in the upper half part 338. The upper half parts of a plurality of through holes 207 running through the other side surface communicate with the ends of corresponding through holes 247. The upper half part of a water passage 119 communicated with the upper half parts of the two grooves 246 in the bottom surface of the upper half part 338. The upper half parts of the grooves 246 are communicated with the upper half part of the water passage 119, the inlet 103 and the outlet 104. The upper half part of the water passage 119 is inserted between each pair of adjacent groove 120 and through holes 247. The upper half part of the water passage 119 and the upper half parts of the grooves 246 are all used for the transmission of coolant, and the upper half part 338 is made of a thermal conductive material.

Figure 123:
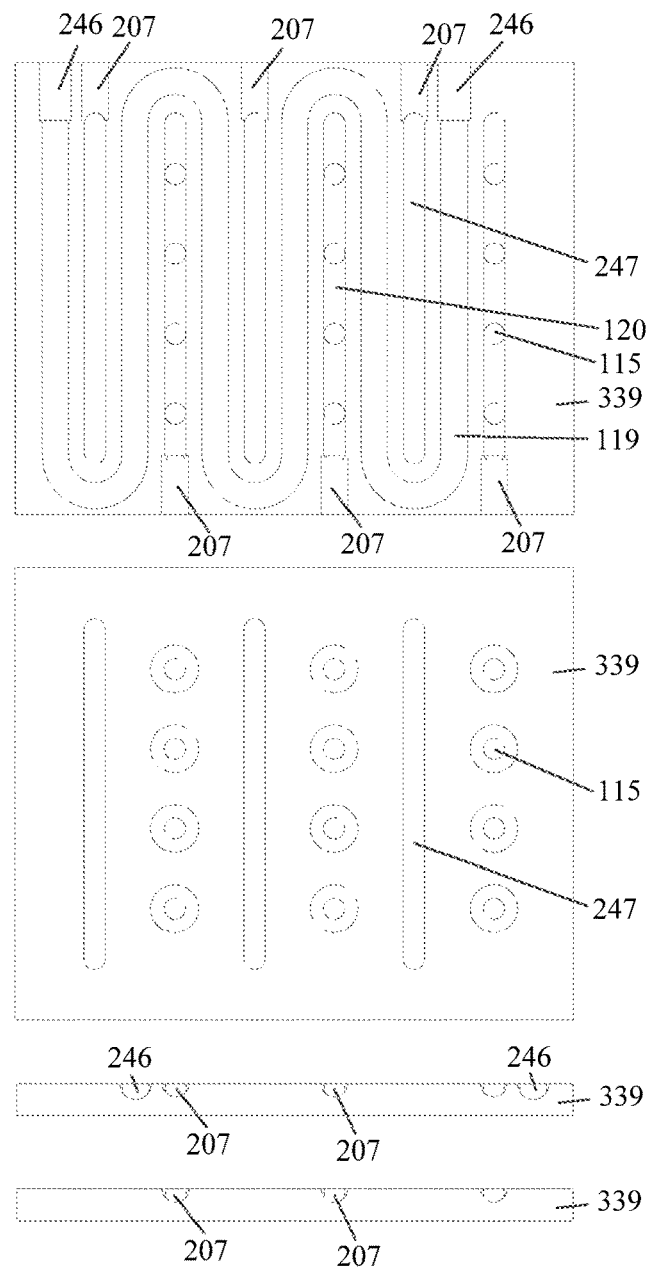

The lower half part 339 is shown in FIG. 123. The upper surface of the lower half part 339 includes a plurality of through holes 247 running from the upper surface to the lower surface of the lower half part 339. The through holes 247 in the lower half part are off set from the through holes 247 in the upper half part, and will serve as the lower portions of the grooves 120 formed in the lower surface of the liquid-cooled radiator 335. The upper surface of the lower half part 339 also includes the lower half parts of the grooves 246, and the lower half part of the water passage 119 communicated with the lower half parts of the two grooves 246, the lower half parts of the plurality of through holes 207. The lower half parts of the plurality of through holes 207 running through a first side surface of the lower half part 339 communicate with ends of corresponding through holes 247 in the lower half part. The lower half parts of the plurality of through holes 207 running through a second side surface of the lower half part 339 communicate with the ends of corresponding grooves 120 in the lower half part 339. The lower half parts of the grooves 246 are communicated with the lower half part of the water passage 119, the inlet 103 and the outlet 104. The lower half part of the water passage 119 is inserted between each pair of adjacent through hole 247 and groove 120 in the lower half part 339. The lower half part of the water passage 119 and the lower half parts of the grooves 246 are all used for the transmission of coolant, and the lower half part 339 is made of a thermal conductive material.

Figure 124:
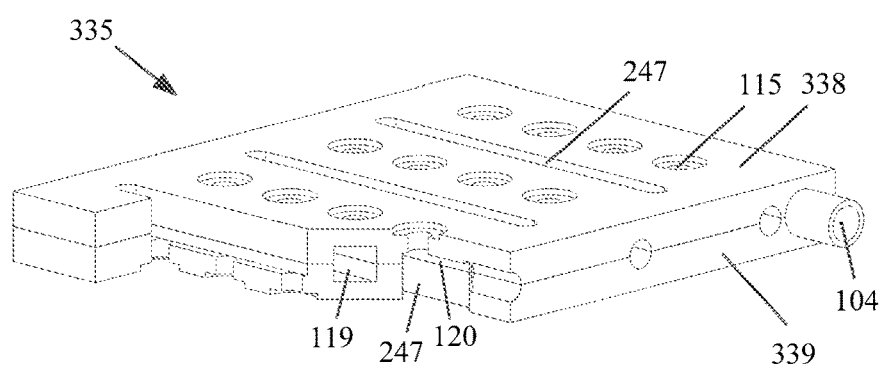

FIG. 124 shows a partial sectional view of the liquid-cooled radiator 335 from one side at an angle. As shown in FIG. 124. The lower surface of the upper half part 338 is closely fit with the upper surface of the lower half part 339 to form the liquid-cooled radiator 335. The sizes and positions of the upper part of the water passage 119 of the upper half part 338, the upper parts of the grooves 246, the grooves 120, the upper half part of through holes 247 and the upper half part of through holes 207 respectively correspond to and are overlapped with those of the lower part of the water passage 119 of the lower half part 245, the lower parts of the grooves 246 and the upper half part of through holes 247, the lower half part of grooves 120, the lower half part of through holes 247. When the upper half part of the water passage 119 is overlapped with the lower half part of the water passage 119, a closed water channel 119 is formed. When the upper half parts of the grooves 246 are overlapped with the lower half parts of the grooves 246, closed through holes 246 are formed. The upper half parts of grooves 120 and lower half parts of through holes 247 form grooves 120 in the bottom surface of the liquid-cooled radiator 335. The upper half parts of through holes 247 and lower half parts of grooves 120 form grooves 120 in the top surface of the liquid-cooled radiator 335. The holes 248 of the inlet 103 and the outlet 104 are respectively communicated with the corresponding holes 246. When the upper half parts of through holes 207 and the lower half parts of through holes 207 are overlapped, through holes 207 are formed on the sides of the liquid-cooled radiator 335. The principle of correspondence and overlapping mentioned above is similar to that of the liquid-cooled radiator 269, which will be not repetitively described any longer.

Figure 125:
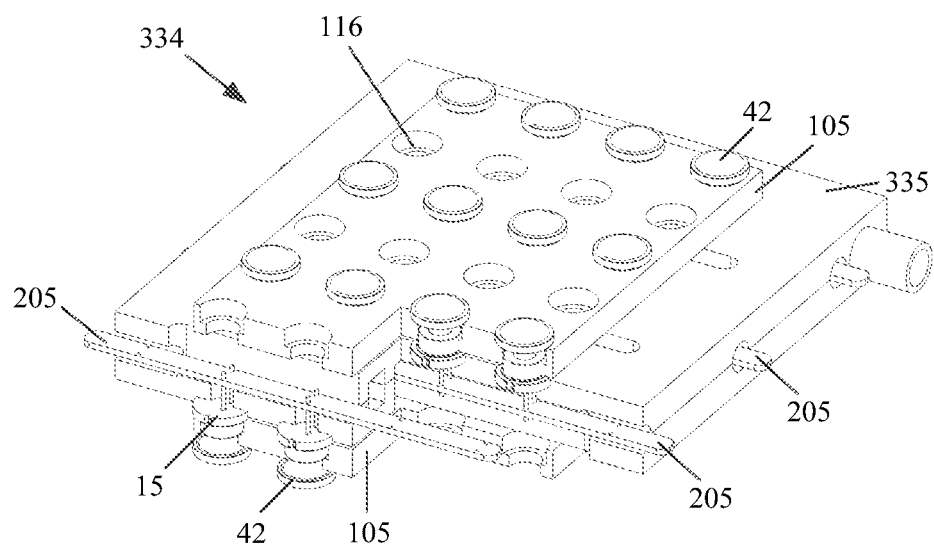

FIG. 125 shows the cross-sectional view of the double-sided diode laser array module 334 that is formed using two sets of diode lasers 42, two module pressing plates 105, and two sets of pin connector modules (e.g., two sets of PCBs 205), and a single liquid-cooled radiator 335, in accordance with some embodiments. The connection principle of the diode laser arrays 337 and the pin connection circuit PCBs 205 is the same as that of the diode laser array 107 and the pin connection circuit PCB 205, which will be not repetitively described any longer.

The diode lasers 15 are placed in the stepped through holes 115 on two sides of the liquid-cooled radiator 335. The metal base 9 is in contact with the liquid-cooled radiator 335. The metal housing 10 passes through the stepped through holes 116. The module pressing plate 105 and the liquid-cooled radiator 335 squeeze each other to fix the diode lasers 15. One lens 42 corresponds to one diode laser 15 and is fixed on the corresponding stepped through hole 116 by adhesive. The adhesive may be silica gel, thermo-setting adhesive, etc. A portion of the pin connection circuit PCB 205 is placed into each groove 120 and an end portion extends through the through hole 207 and is connected with an external circuit outside of the side surface of the liquid-cooled radiator 335.

In some embodiments, the two diode laser arrays 337 of the double-sided diode laser array module 334 are fixed through mutual squeezing between the module pressing plate 105 and the liquid-cooled radiator 335 on both sides of the liquid-cooled radiator 335. In some embodiments, the diode lasers on the two sides of a two-sided diode array module do not have to be fixed to the liquid-cooled radiator in the same manner. In some embodiments, in order to reduce the cost, only one module pressing plate 105 or no module pressing plate 105 may be used.

In some embodiments, the diode laser array 337 without a module pressing plate 105 is fixed on the cooled radiator by welding or thermal conductive adhesive bonding. The principle is the same as that of the diode laser array module 307, which will be not repetitively described any longer.

Description will be made by taking the diode laser array 340 and the diode laser array 341 respectively as two demonstrative examples.

Figure 126:
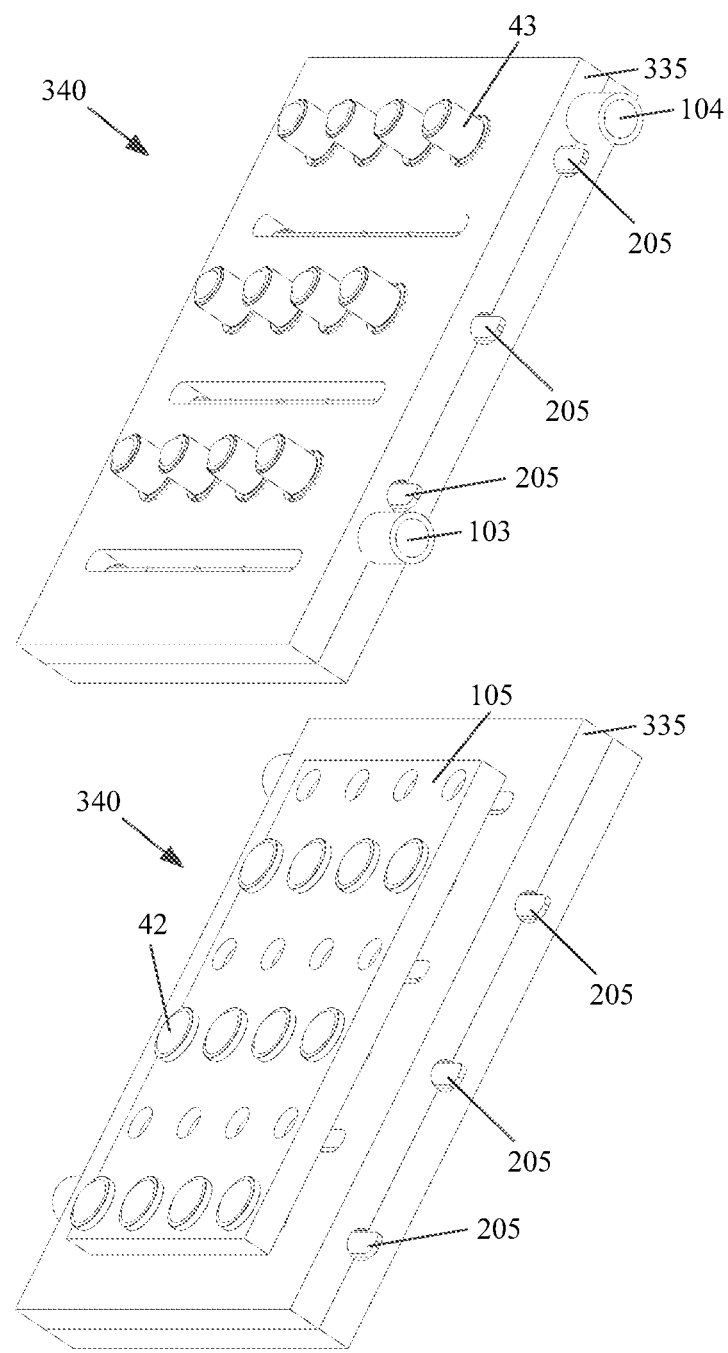
FIGS. 126-130 illustrate a plurality of double-sided diode laser array modules in accordance with various embodiments.

FIG. 126 shows two perspective views (e.g., view from the top at an angle, and view from the bottom at an angle) of a double-sided diode laser array module 340 in accordance with some embodiments. As shown in FIG. 126, the diode laser array module 340 includes a diode laser array 337 comprising a plurality of diode lasers 43 welded to the top side of the liquid-cooled radiator 335, a plurality of pin connection circuit PCBs 205 for the plurality of diode lasers 43 welded to the top side of the liquid-cooled radiator 335, and a plurality of pin connection circuit PCBs 205 for the plurality of diode lasers pressed in the bottom side of the liquid-cooled radiator 335, a module pressing plate 105, and a liquid-cooled radiator 335.

A first set of the diode lasers 43 are fixed on the top surface of the liquid-cooled radiator 335 by welding or thermal conductive adhesive bonding. The principle is the same as that of the diode laser array module 307, which will be not repetitively described any longer.

A second set of the diode lasers 43 are fixed on the bottom surface of the liquid-cooled radiator 335 by the module pressing plate 105. The principle is the same as that of the diode laser array module 334, which will be not repetitively described any longer.

The heat produced by the diode lasers 43 during working is transferred to the liquid-cooled radiator 335 for cooling. Coolant flows in from the inlet 103 and out from the outlet 104. The coolant may be water, ethylene glycol, etc.

Figure 127:
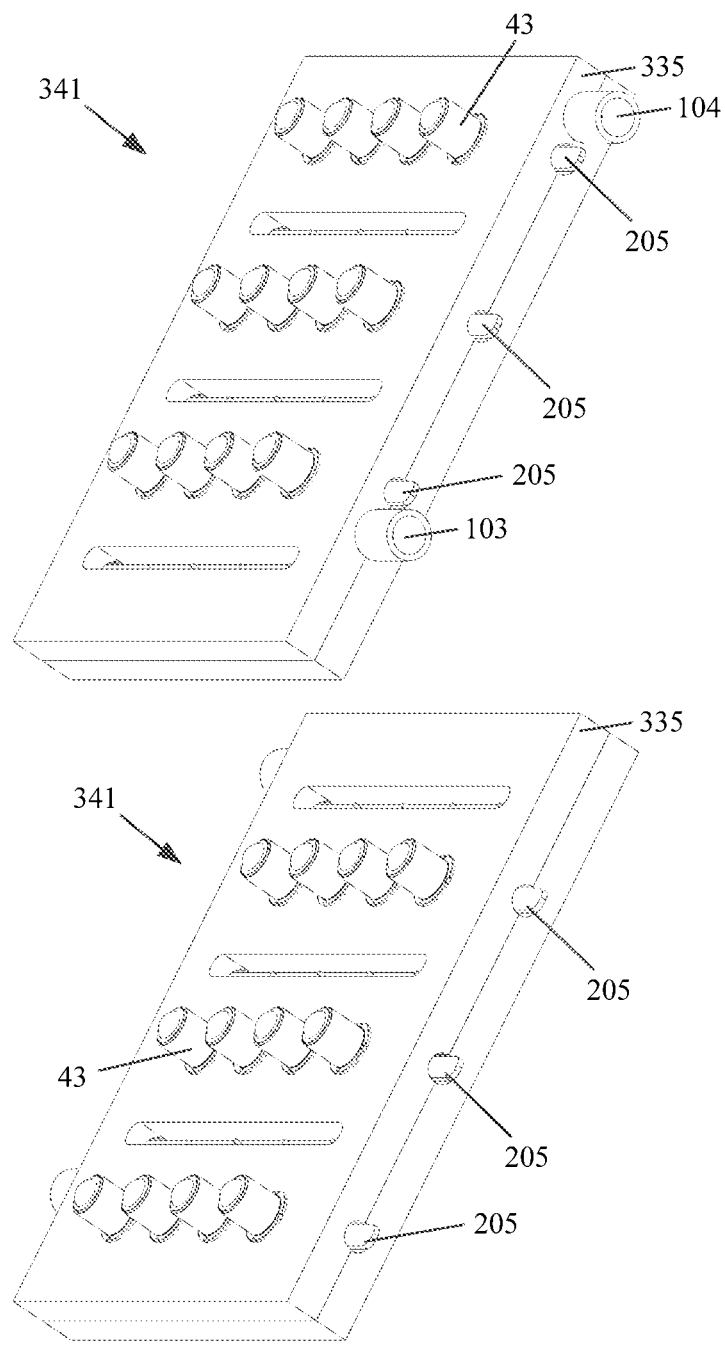

FIG. 127 shows another double-sided diode laser array module 341 in accordance with some embodiments. The diode laser array module 341 includes two diode laser arrays 337 each comprising a plurality of diode lasers 43, a first set of pin connection circuit PCBs 205 for connecting the first diode laser array on the top surface of the liquid-cooled radiator 335, and a second set of pin connection circuit PCBs 205 for connecting the second diode laser array on the bottom surface of the liquid-cooled radiator 335, and the liquid-cooled radiator 335. All diode lasers 43 may be fixed on the cooled radiator 335 by welding or thermal conductive adhesive bonding. The principle is the same as that of the diode laser array module 307, which will be not repetitively described any longer. The heat produced by the diode laser 43 during working is transferred to the liquid-cooled radiator 335 for cooling. Coolant flows in from the inlet 103 and out from the outlet 104. The coolant may be water, ethylene glycol, etc.

If two or more types of diode lasers are needed on the same surface of a cooled radiator, and the packaging structure and mounting requirements of each type of laser are different, it is sometimes necessary to mount the diode lasers on the same surface of the cooled radiator by adopting different fixing modes.

Demonstrative description will be made below by taking the diode laser 15 and the diode laser 43 as an example, the diode laser 15 and the diode laser 43 may be replaced by the diode laser 11, the diode laser 17, the diode laser 46, the diode laser 48, the diode laser 50, the diode laser 51, and the principle is the same, which will be not repetitively described any longer.

Demonstrative description will be made below by taking the liquid-cooled radiator 204, the auxiliary heat sink 317 and the liquid-cooled radiator 335 as an example. Other liquid-cooled radiators, cooled radiators, and auxiliary heat sinks can be utilized by adopting the same principle, which will be not repetitively described any longer.

Figure 128:
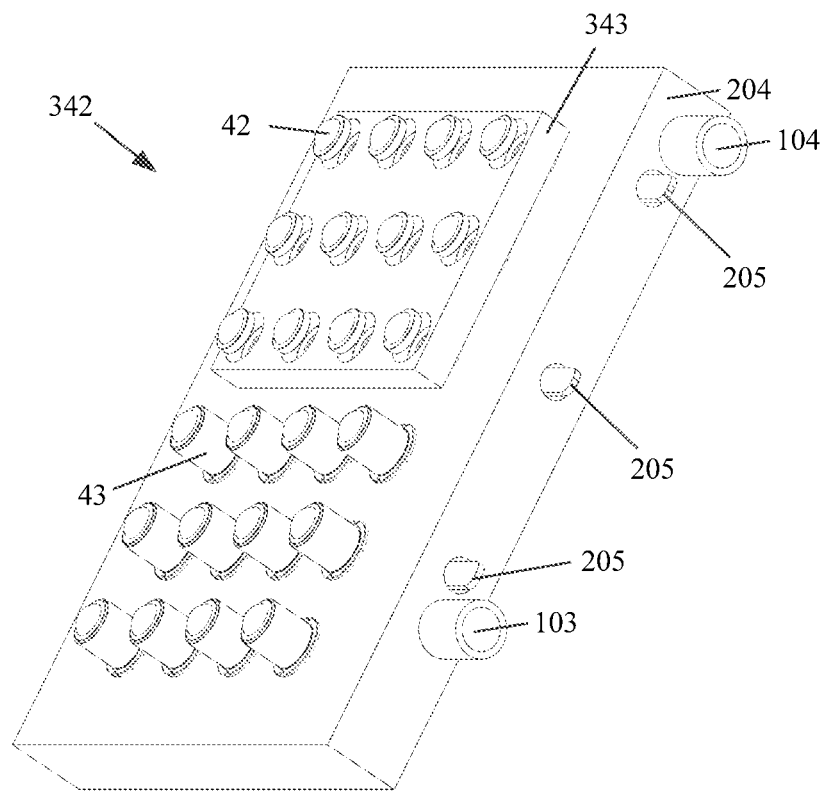

FIG. 128 shows a perspective view of a diode laser array module 342 in accordance with some embodiments. As shown in FIG. 128, for the liquid-cooled radiator 204 of the diode laser array module 342, diode lasers are mounted respectively by adopting two modes: the diode lasers 15 are fixed on the liquid-cooled radiator 204 by adopting a module pressing plate 343, and the diode lasers 43 are fixed on the cooled radiator 204 by welding or thermal conductive adhesive bonding. The principle is the same as that of the above-mentioned solutions, which will be not repetitively described any longer.

The module pressing plate 343 includes a plurality of stepped through holes 116 running through the upper surface and the lower surface thereof. The principle is the same as that of the module pressing plate 105, which will be not repetitively described any longer.

For the auxiliary heat sink, the diode lasers may also be mounted by adopting the same method as the diode laser array module 342.

Figure 129:
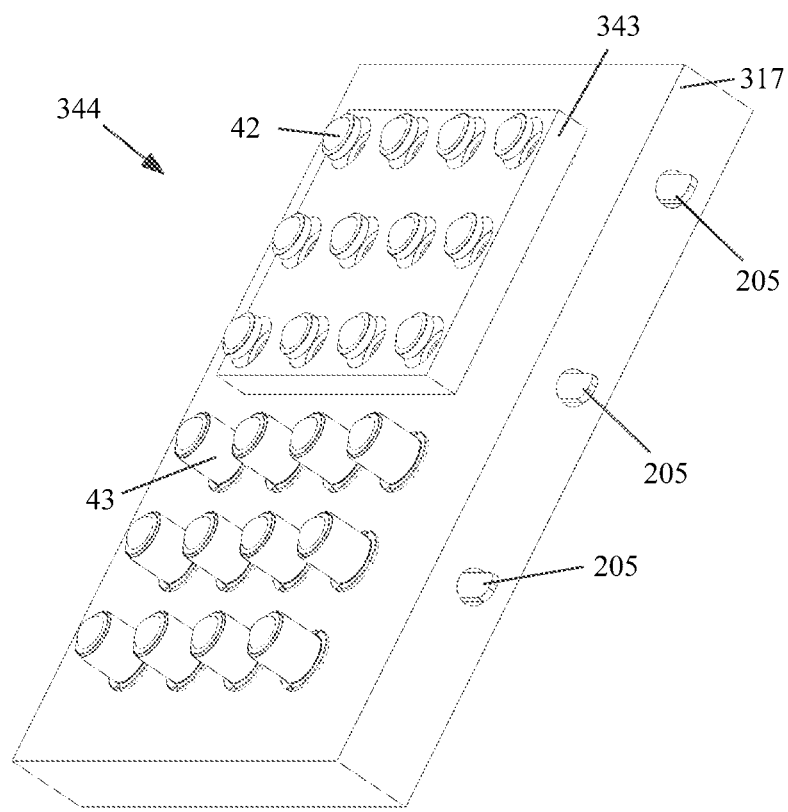

FIG. 129 shows a perspective view of an auxiliary heat sink 344 in accordance with some embodiments. As shown in FIG. 129, for the auxiliary heat sink 317 of the diode laser array module 344, diode lasers are mounted respectively by adopting two modes: the diode lasers 15 are fixed on the auxiliary heat sink 317 by using the module pressing plate 343, and the diode lasers 43 are fixed on the auxiliary heat sink 317 by welding or thermal conductive adhesive bonding. The principle is the same as that of the above-mentioned solutions, which will be not repetitively described any longer.

FIG. 130 shows perspective views (view from the top at an angle, and view from the bottom at an angle) of a double-sided diode laser array module 345 in accordance with some embodiments. As shown in FIG. 130, for the liquid-cooled radiator 335 of the double-sided diode laser array module 345, diode lasers are respectively mounted on two sides by adopting two modes: the diode lasers 15 are fixed on the liquid-cooled radiator 335 by using the module pressing plate 343, and the diode lasers 43 are fixed on the auxiliary heat sink 335 by welding or thermal conductive adhesive bonding. The principle is the same as that of the above-mentioned solution, which will be not repetitively described.

In some embodiments, bank packaged diode laser modules may also adopt the radiating method similar to TO-CAN packaged diode laser modules as disclosed earlier.

In some embodiments, the pin connector modules of the bank packaged diode laser modules each include a first portion that is used to connect the pins of the diode lasers in each bank packaged diode laser module, and a second portion that is used to connect the first portion to a location that is outside of the diode laser array module where the second portion can be connected to a driving circuit PCB. The pin connector modules of individual bank packaged diode lasers are optionally integrated into the same component (e.g., a FPC with multiple first rectangular portions) that has different first portions of similar forms for the different bank packaged diode lasers. The pin connector module for each individual bank packaged diode laser is optionally made of a PCB (e.g., a PCB shaped like a rectangular loop) that connects the pins of the bank packaged diode lasers and a pair of lead connectors. In some embodiments, the pin connector module for each individual bank packaged diode laser is optionally made of an FPC with a first portion that is shaped like a rectangular loop that connects the pins of the bank packaged diode lasers and has a second portion that serves as the lead connector for the first portion and is bendable relative to the plane of the first portion. In some embodiments, the second portion of the FPC is further connected to a third portion that is bendable relative to the plane of the second portion. In some embodiments, the respective lead connectors of the pin connector modules of multiple diode laser banks are connected to a driving circuit module outside of the interface between the diode laser banks and the cooling module underneath the diode laser banks.

In some embodiments, in order to accommodate the first portions of the pin connector modules that connect the respective pins of the diode lasers in the diode laser banks and allowing the second portions of the pin connector modules to move away from the interface between the bottom surfaces of the diode laser banks and the top surface of the cooling module, one or more recessed areas are formed between the bottom surfaces of the diode laser banks and the top surface of the cooling module. The recessed areas are either made in the bottom surfaces of the diode laser banks, or in the top surface of the cooling modules. Variations of the pin connector modules and the designs of the recess areas are disclosed below with respect to various example embodiments.

In some embodiments, a diode laser array module includes a first plurality of diode laser modules (e.g., two or more bank packaged diode laser modules 21 and 398, etc. arranged in one or more rows on top of a cooling module). Each diode laser module of the first plurality of diode laser modules has a respective module body (e.g., a generally cuboid body made of heat conducting materials) having a top surface, a bottom surface, a first side surface, and a second side surface (e.g., the two longer opposing side surfaces of the diode laser module, in addition to two shorter opposing side surfaces of the diode laser module). The respective module body of said each diode laser module includes a respective plurality of first holes (e.g., straight through holes, or stepped through holes, for accommodating the individual diode lasers) in the top surface of the respective module body. Said each diode laser module includes a respective plurality of diode lasers mounted at least partially within the respective plurality of first holes of the respective module body of said each diode laser module, with respective pins of the respective plurality of diode lasers extending downward out of the respective plurality of first holes (e.g., from the respective plurality of first holes into a respective groove (a rectangular groove for accommodating the first conductive portion of the pin connector module) in the bottom surface of the respective module body (e.g., in the case of the diode laser module 21); or beyond the bottom surface of the respective module body where the bottom surface does not include the respective groove (e.g., in the case of the diode laser module 398)).

The diode laser array module also includes a first plurality of pin connector modules, where each respective pin connector module is configured to connect the respective pins of the respective plurality of diode lasers of at least one of the first plurality of diode laser modules to a driving circuit module that is disposed at a location separate from the bottom surface of the module body of said at least one diode laser module. The pin connector module(s) have many variations that will described in more detail with respect to the various example embodiments disclosed herein.

The diode laser array module further includes a cooling module, wherein the cooling module includes a heat conducting body (e.g., a heat sink) defined by a top surface, a bottom surface, and at least a first side surface and a second side surface of the cooling module, and includes a cooling structure (e.g., liquid passage tubes or channels, or heat pipes) that is at least partially embedded in the heat conducting body of the cooling module (e.g., embedded between the top surface and the bottom surface (e.g., buried below the top surface of the cooling module, and optionally, covered by the bottom surface of the cooling module as well (e.g., covered in the cases of liquid passage channels, and exposed in the cases of liquid passage tubes or heat pipes))). The top surface of the heat conducting body of the cooling module is in thermal contact with the bottom surfaces of the plurality of diode laser modules. Either the bottom surface of the module body of the respective diode laser module or the top surface of the body of the cooling module (e.g., the heat sink of the cooling module) includes one or more recessed areas (e.g., a respective groove in the bottom surface of the respective module body of the diode laser module (e.g., the rectangular groove that links the two rows of first holes in the bottom surface of the diode laser module 21 in FIG. 131); or groove 438 in the top surface of the cooling module (e.g., liquid cooled radiator 403 in FIG. 160)) at locations corresponding to the respective plurality of first holes (e.g., holes for passing through the conductive leads of the individual diode lasers in the diode laser bank) of the respective module body of the respective diode laser module, such that one or more channels are formed by the one or more recessed areas when the top surface of the body of the cooling module is in thermal contact with the bottom surfaces of the respective module bodies of the plurality of diode laser modules.

Each pin connector module (e.g., a PCB 347 with pins 348, FPC 381 in FIG. 142) includes a respective first conductive portion (e.g., PCB 347, the rectangular loop portion of the FPC 382, one rectangular loop portion of the FPC 387, the rectangular loop portion of the FPC 391, etc.) that is located within the one or more channels formed between the top surface of the body of the cooling module and the bottom surfaces of the respective plurality of diode laser modules and electrically connects the respective plurality of diode lasers that are inserted into the respective plurality of first holes of a respective diode laser module (e.g., the pin connector module connects the plurality of diode lasers by their pins that are inserted into the plurality of first holes and extending into the channels (e.g., in the bottom surface of the diode laser module or the top surface of the cooling module) connecting the plurality of first holes in a continuous path). Each pin connector module includes a respective second conductive portion (e.g., lead connectors 348 in FIG. 131, lead connectors 382-1 in FIG. 142, a respective vertical portion of the lead connector 387-1 in FIG. 144, the vertical portion of the lead connector 391-1 in FIG. 148, etc.) that extends out of the channel formed between the top surface of the body of the cooling module and the bottom surfaces of the plurality of diode laser modules to a location where electrical connections to the driving circuit module (e.g., PCB 358, or an external driving circuit) are to be made (e.g., extending out to a position beyond the side surface of the cooling module, extending above the top surface of the laser diode module, extending beyond the side surface of the laser diode module, extending below the bottom surface of the cooling module, etc.).

Figure 131:
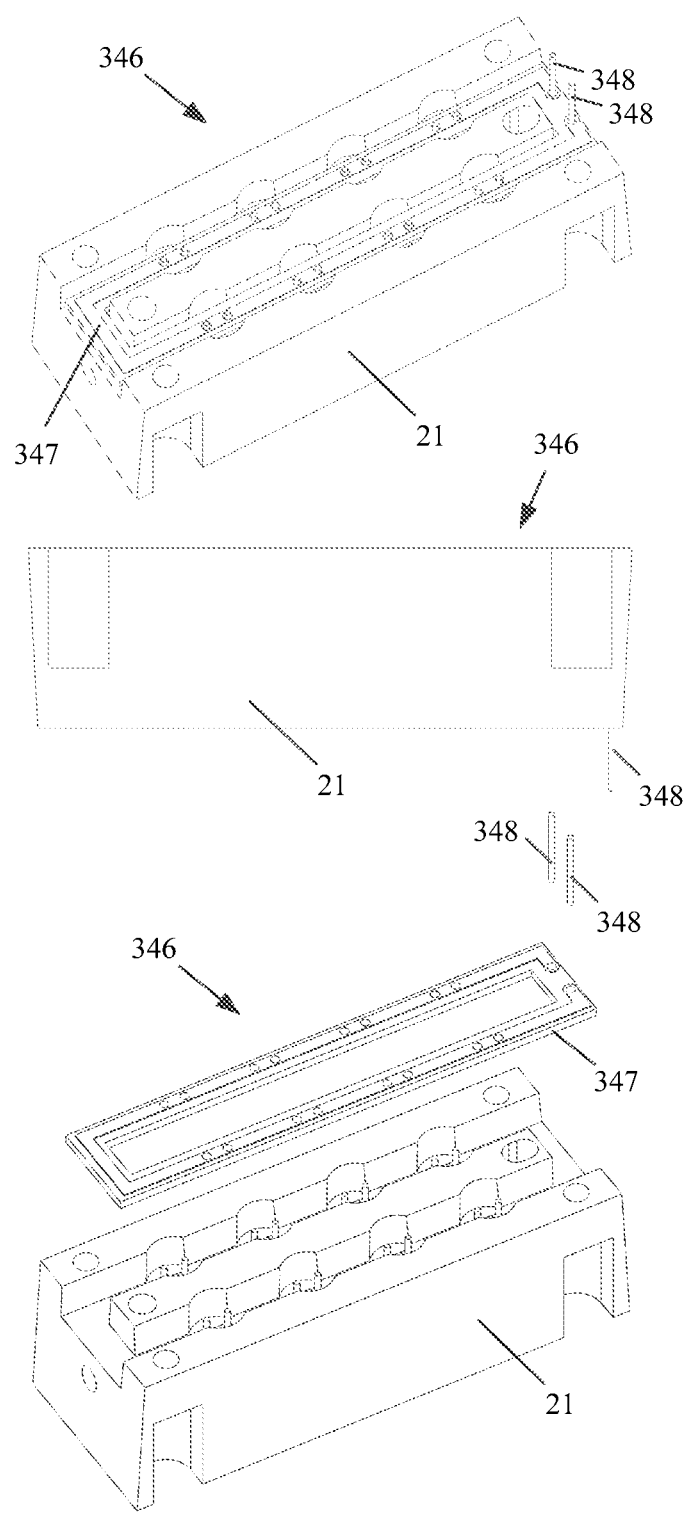
FIG. 131 illustrates a diode laser module 346 in accordance with some embodiments.
Figure 203:
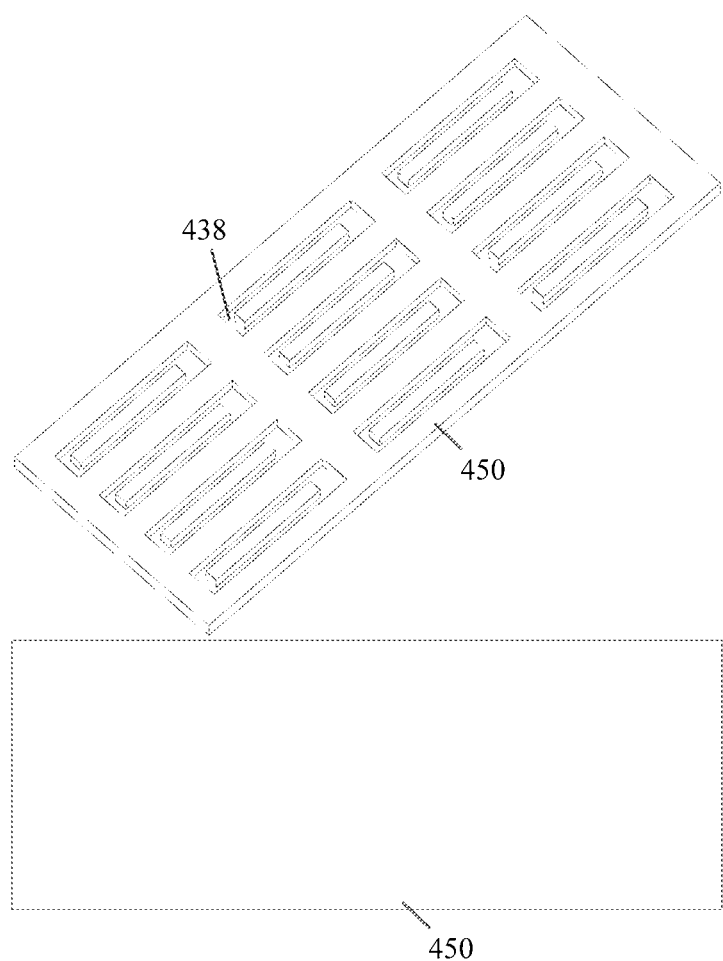
FIG. 203 illustrates an auxiliary heat sink 450 in accordance with some embodiments.

Embodiments of the diode laser array module are described with respect to the examples shown in FIGS. 131-203, for example. Individual diode laser modules include diode laser module 21 and diode laser module 53, for example. In some embodiments, diode laser array module includes rows or arrays of multiple individual diode laser modules. Examples of the diode laser array module include diode laser module 349, diode laser module 356, diode laser module 362, diode laser module 388, diode laser module 393, diode laser module 396, diode laser module 396-1, diode laser module 398-1, diode laser module 403-1, etc. described with respect to FIGS. 131-203.

In some embodiments, the pin connector modules include separate pin connector modules for each diode laser module. In some embodiments, the pin connector modules include a shared pin connector module that is used by several diode laser module arranged in a row or an array. Examples of the pin connector module include, e.g., pin connector module formed by PCB 347 and conductive leads 348 in FIGS. 131, 159, and 176, pin connector module formed by FPC 382 with lead connector 382-1 in FIGS. 142 and 164, pin connector module formed by FPC 387 with lead connector 387-1 in FIGS. 144 and 165, pin connector module formed by FPC 391 with lead connector 391-1 in FIGS. 149, 151, and 169, pin connector module formed by PCB 347 and lead connector 348 in FIG. 159, pin connector module formed by PCB 419-1 and lead connector 419-2 in FIGS. 177 and 185, pin connector module formed by FPC 421 and lead connector 421-1 in FIGS. 178 and 186, pin connector module formed by FPC 423 and lead connector 423-1 in FIGS. 179, 180, and 187, pin connector module formed by PCB 417-1 and lead connectors 348 in FIGS. 176 and 184, etc.).

Examples of the cooling module include the cooling modules (e.g., liquid cooled radiator 357, liquid cooled radiator 363, liquid cooled radiator 395, liquid cooled radiator 403-2, liquid cooled radiator 404-2, liquid cooled radiator 414-1, liquid cooled radiator 416, liquid cooled radiator 433, liquid cooled radiator 438-1, cooled radiator 439, liquid cooled radiator 443, etc.) described with respect to the embodiments shown in FIGS. 131-203.

In some embodiments, the recessed areas are under diode laser module. In some embodiments, the one or more recessed areas include a first groove in the bottom surface of each diode laser module (e.g., the rectangular groove (or two parallel grooves that run through the side surfaces of the diode laser module 21) in the bottom surface of the diode laser module 21 that connects the two rows of first holes in the diode laser module 21 in FIG. 131). The first groove accommodates at least a portion of a respective first conductive portion (e.g., PCB 347) of a respective pin connector module (e.g., PCB 347 and a pair of lead connectors 348) when the top surface of the heat conducting body of the cooling module is in thermal contact with the bottom surfaces of the plurality of diode laser modules (e.g., the PCB 347 is placed in the rectangular groove of the diode laser module 21 first before the cooling module is attached to the diode laser module 21). This structure of the diode laser module is used in the example diode laser array modules, such as diode laser module 356, diode laser module 362, diode laser module 388, diode laser module 393, diode laser module 396, diode laser module 396-1, diode laser module 415, diode laser module 425, diode laser module 426, and diode laser module 427, etc. described with respect to FIGS. 131-203.

In some embodiments, the recessed area is on the top surface of cooling module. In some embodiments, the one or more recessed areas include a first groove (e.g., linear grooves or rectangular grooves) in the top surface of the cooling module at locations corresponding to the diode laser modules, wherein the first groove accommodates at least a respective first conductive portion (e.g., PCB 347) of a respective pin connector module (e.g., PCB 348 and a pair of lead connectors 348) when the top surface of the body of the cooling module is in thermal contact with the bottom surfaces of the plurality of diode laser modules (e.g., the PCB 347 is connected with the diode laser modules first and placed in the groove when the cooling module is attached to the diode laser module). This structure of the cooling module is used in the example diode laser array modules, such as diode laser module 403-1, diode laser module 410-1, diode laser module 412, diode laser module 413, diode laser module 414-2, diode laser module 432, diode laser module 434, diode laser module 435, diode laser module 436, diode laser module 438-5, diode laser module 442, diode laser module 447, diode laser module 448, and diode laser module 449, etc. described with respect to FIGS. 131-203.

In some embodiments, a PCB is used as the first conductive portion of the pin connector module. In some embodiments, the respective first conductive portion of the respective pin connector module is a PCB (e.g., PCB 347 in FIGS. 131, 176, 184, and PCB 398 in FIG. 159, etc.) that electrically connects the respective plurality of diode lasers of at least one of the plurality of diode laser modules. This structure of the pin connector module is illustrated in the example diode laser array modules, such as diode laser module 356, diode laser module 362, diode laser module 403-1, diode laser module 415, and diode laser module 432, etc., described with respect to FIGS. 131-203.

In some embodiments, U-shaped pin connectors replace the rectangular PCB under the diode laser modules as the first conductive portion of the pin connector module. In some embodiments, the respective first conductive portion of the respective pin connector module is a series of pin connectors (e.g., U-shaped pin connectors) that electrically connects the respective plurality of diode lasers of at least one of the plurality of diode laser modules.

In some embodiments, straight pin type lead connectors serve as the second conductive portion of the pin connector module. In some embodiments, the respective second portion of the respective pin connector module is a pair of conductive leads (e.g., conductive leads 348), wherein the pair of conductive leads form electrical contacts with a cathode and an anode of the first conductive portion of the respective pin connector module (e.g., PCB 347 or a series of U-shaped pin connectors) within the one or more channels formed between the top surface of the body of the cooling module and the bottom surfaces of the respective plurality of diode laser modules.

In some embodiments, a FPC serves as the pin connector module. In some embodiments, the respective pin connector module is a FPC (e.g., FPC 382 in FIGS. 142 and 164, FPC 387 in FIGS. 144 and 165, FPC 391 in FIGS. 149, 151, and 169, FPC 419 in FIGS. 177 and 185, FPC 421 in FIGS. 178 and 186, and FPC 423 in FIGS. 179, 180, and 187, etc.) that includes a first portion (e.g., rectangular loop portion of FPC 382 in FIG. 142, one rectangular loop portion of FPC 387 in FIG. 144, etc.) that electrically connects the respective plurality of diode lasers of at least one of the plurality of diode laser modules and a second portion that (e.g., lead connector 382-1 in FIG. 142, vertical portion of the lead connector 387-1 in FIG. 144, etc.) extends out of the channel formed between the top surface of the body of the cooling module and the bottom surfaces of the plurality of diode laser modules to a location where electrical connections to the driving circuit module are to be made. This structure of the pin connector module is illustrated in the example diode laser array modules, such as diode laser module 388, diode laser module 393, diode laser module 396, diode laser module 396-1, diode laser module 410-1, diode laser module 412, diode laser module 413, diode laser module 414-2, diode laser module 425, diode laser module 426, and diode laser module 427, diode laser module 434, diode laser module 435, diode laser module 436, diode laser module 438-5, diode laser module 442, diode laser module 447, diode laser module 448, and diode laser module 449, etc. described with respect to FIGS. 131-203.

In some embodiments, the lead connectors of the pin connector module extend downward relative to the upward output direction of the diode lasers. In some embodiments, the respective second conductive portion (e.g., conductive leads 348 in FIGS. 131 and 159, lead connector 382-1 in FIGS. 142 and 164, one or more vertical portions of the lead connector 387-1 in FIGS. 144 and 165, vertical portion of the lead connector 391-1 in FIGS. 149, 151, and 169) of each respective pin connector module extends downward (e.g., relative to the plane of the respective first conductive portion of said each pin connector module) through one or more openings (e.g., holes 355, or groove 365, groove 397, etc.) in the top surface of the cooling module to a location below the top surface of the cooling module (e.g., to a location below the bottom surface of the cooling module, or to within a groove carved in the bottom surface of the cooling module, or to a groove carved in the top surface of the cooling module, where the respective second conductive portions of multiple pin connector modules are electrically connected by another PCB (e.g., a PCB 358, as described with respect to FIG. 133 or FIG. 139). This is illustrated by the vertical lead connectors or vertical portions of FPCs used as the second conductive portions of the pin connector modules of various example diode laser array modules, such as diode laser module 356, diode laser module 362, diode laser module 388, diode laser module 393, diode laser module 396, diode laser module 396-1, diode laser module 403-1, diode laser module 404-1, diode laser module 410-1, diode laser module 412, diode laser module 413, and diode laser module 414-2, etc. described with respect to FIGS. 131-173.

Figure 174:
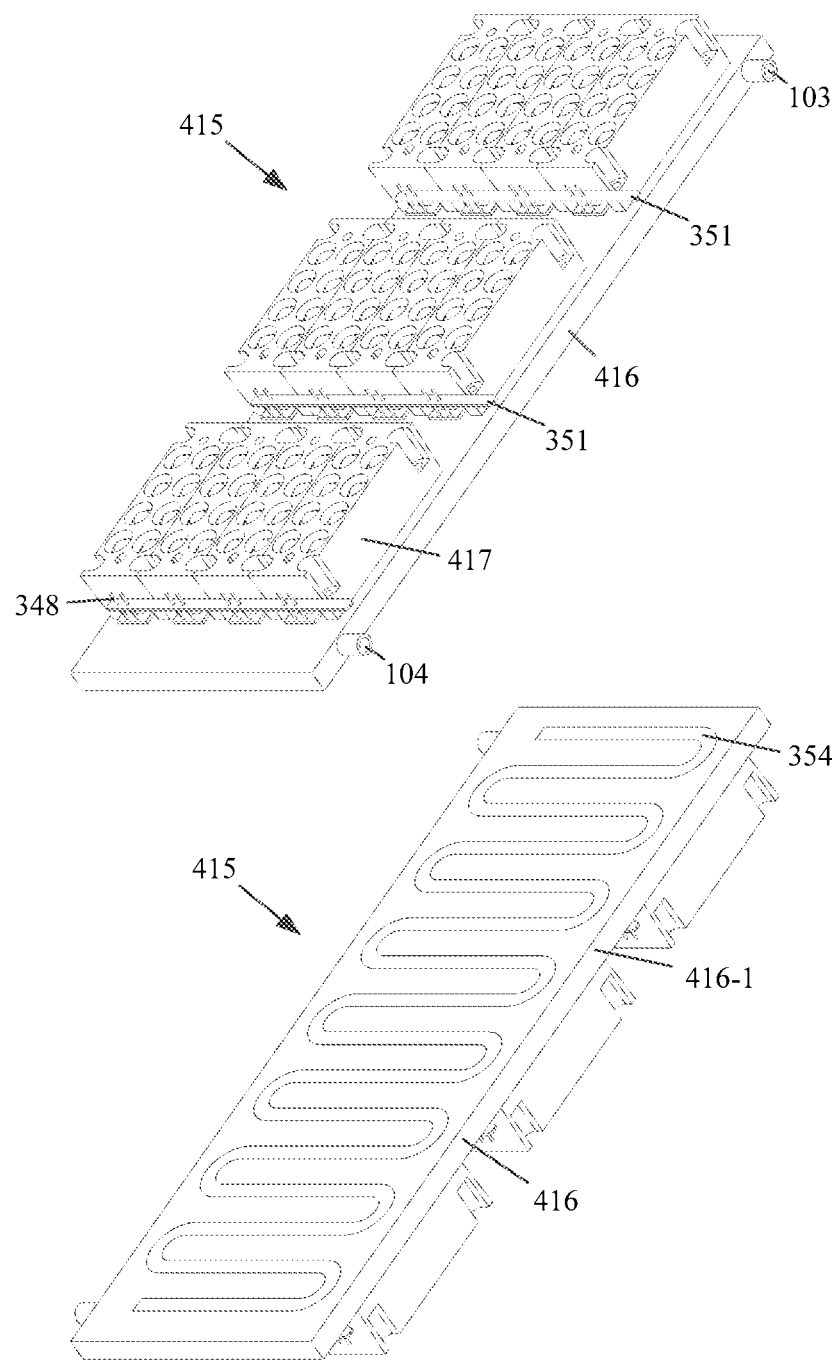
FIGS. 174-175 illustrate a diode laser array module 415 in accordance with some embodiments.

In some embodiments, the lead connectors of the pin connector module extend upward relative to the upward output direction of the diode lasers. In some embodiments, the respective second conductive portion (e.g., lead connectors 348 in FIGS. 174, 184, and 188, lead connector 419-2 in FIGS. 177, 185, and 189, vertical portions of lead connector 421-1 in FIGS. 178, 186, and 190, and vertical portion of lead connector 423-1 in FIGS. 179, 180, 187, and 191, etc.) of each respective pin connector module extends upward (e.g., relative to the respective first conductive portion of said each pin connector module) relative to the bottom surface of a corresponding diode laser module (e.g., as shown in FIG. 174). This is illustrated by the vertical lead connectors or vertical portions of FPCs used as the second conductive portions of the pin connector modules of various example diode laser array modules, such as diode laser module 415, diode laser module 425, diode laser module 426, diode laser module 427, diode laser module 432, diode laser module 434, diode laser module 435, diode laser module 436, diode laser module 448, and diode laser module 449, etc. described with respect to FIGS. 174-203.

In some embodiments, the top surface of the cooling module includes openings to pass the second conductive portions of the pin connector modules. In some embodiments, the heat conducting body of the cooling module includes a plurality of first openings (e.g., holes 355, or groove 365, and groove 397, etc.) in the top surface of the cooling module, wherein the first openings are located at locations corresponding to the respective second conductive portions of the pin connector modules connected to a respective row of diode laser modules (e.g., a row of first openings 355 are located at positions in the top and bottom surfaces of the cooling module 357 that correspond to the respective pairs of conductive leads 348 of a row of diode laser modules 346; a groove 365 in the top surface of the cooling module in FIGS. 139 and 147). This is illustrated in the cooling modules of various example diode laser array modules, such as diode laser module 356, diode laser module 362, diode laser module 388, diode laser module 393, diode laser module 396, diode laser module 396-1, diode laser module 403-1, diode laser module 404-1, diode laser module 410-1, diode laser module 412, diode laser module 413, and diode laser module 414-2, etc. described with respect to FIGS. 131-173.

In some embodiments, through holes are formed in the cooling module to pass the second conductive portions of the pin connector modules. In some embodiments, each of the first openings in the top surface of the cooling module is a through-hole that connects the top surface and the bottom surface of the body of the cooling module. The conductive leads of the diode lasers can pass all the way beyond the bottom surface of the cooling module and connect with a PCB that is part of the driving circuit module.

In some embodiments, the first openings in the top surface of the cooling modules optionally do not go through the whole vertical thickness of the cooling module, and are intersected by a horizontal through hole through which a PCB is passed and connected to the lead connectors of the pin connector modules. In some embodiments, the first openings (e.g., holes 355 in FIG. 134) corresponding to the respective row of diode laser modules are connected by a respective second opening (e.g., horizontal through hole 361 in FIG. 134) that connects the first side surface and the second side surface of the cooling module.

In some embodiments, the first openings are grooves on the top surface of cooling module. In some embodiments, each of the first openings is a respective groove (e.g., groove 365 in FIG. 139 and FIG. 147, groove 397 in FIG. 155 and FIG. 158, etc.) in the top surface of the cooling module (e.g., cooling module 363 in FIGS. 139 and 147, cooling module 395 in FIG. 158, etc.) that accommodate a respective lead connector (e.g., PCB 358 in FIG. 353, the horizontal portion of the lead connector 387-1 in FIG. 144, or horizontal portion of the lead connector 391-1 that is part of an FPC 391 in FIG. 148) that electrically connects one or more of a respective row of diode laser modules by the respective second conductive portions (e.g., conductive leads 348 in FIG. 138, the vertical portions of the FPC 387 in FIG. 144, the vertical portion of the FPC 391 in FIG. 152, etc.) of the pin connector modules of the one or more of the respective row of diode laser modules (e.g., the row of diode laser modules 346 in FIG. 138, the row of diode laser modules 385 in FIG. 145, each diode laser module of a row of diode laser modules 392 in FIG. 152, etc.).

In some embodiments, the respective groove in the top surface of the cooling module does not extend through the side surfaces of the cooling module (e.g., groove 397 in FIGS. 155 and 157, 158, 171, and 173, etc.).

In some embodiments, a row of bank packaged diode laser modules are connected by a PCB. In some embodiments, a respective row of diode laser modules are electrically connected by the respective second conductive portions (e.g., pairs of conductive leads 348) of the pin connector modules (e.g., formed by a PCB 347 and a pair of conductive leads 348, or formed by an FPC 382, etc.) of the respective row of diode laser modules (e.g., the row of diode laser modules 346 in FIG. 138) to a PCB (e.g., PCB 358 in FIGS. 134 and 161, and 162; and PCB 358 in FIG. 139; etc.) corresponding to the respective row of diode laser modules.

In some embodiments, the PCB connecting the row of bank packaged diode laser modules are located at the bottom of cooling module. In some embodiments, the diode laser array module includes multiple rows of diode laser modules (e.g., diode laser module 346) arranged on the top surface of the cooling module, and each row of the diode laser module is electrically connected by a respective PCB located below the bottom surface of the cooling module.

Figure 134:
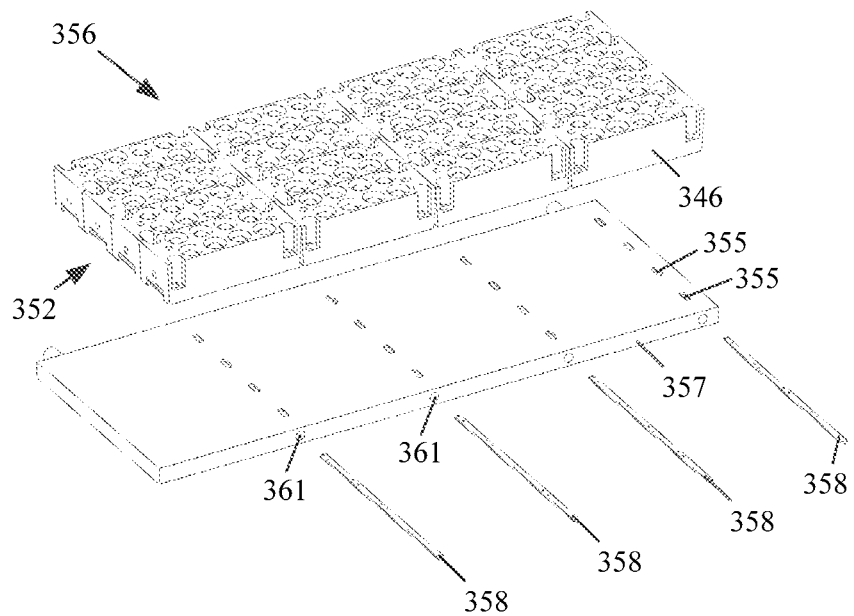
Figure 135:
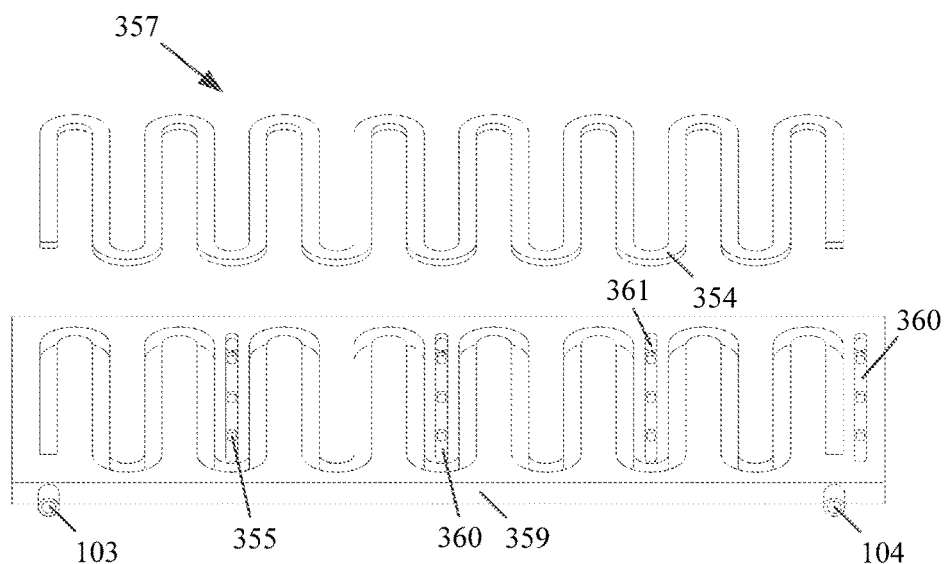

In some embodiments, the PCB that connects a row of bank packaged diode laser modules are located in the middle of cooling module, e.g., passing through a horizontal through hole 361 that connects the two side surfaces of the cooling module. In some embodiments, the diode laser array module includes multiple rows of diode laser modules (e.g., diode laser module 346) arranged on the top surface of the cooling module, and wherein each row of the diode laser module is electrically connected by a respective PCB (e.g., PCB 358, as shown in FIG. 134) that passes through a respective hole in the body of the cooling module (e.g., hole 361 that passes through the sides of the cooling module 357 in FIG. 134). In some embodiments, the respective hole 361 passes through the bottom portions of the holes 355 in the same row, such that the second conductive portions of the pin connector modules of the row of diode laser modules can be connected to the PCB within the through hole 361.

Figure 139:
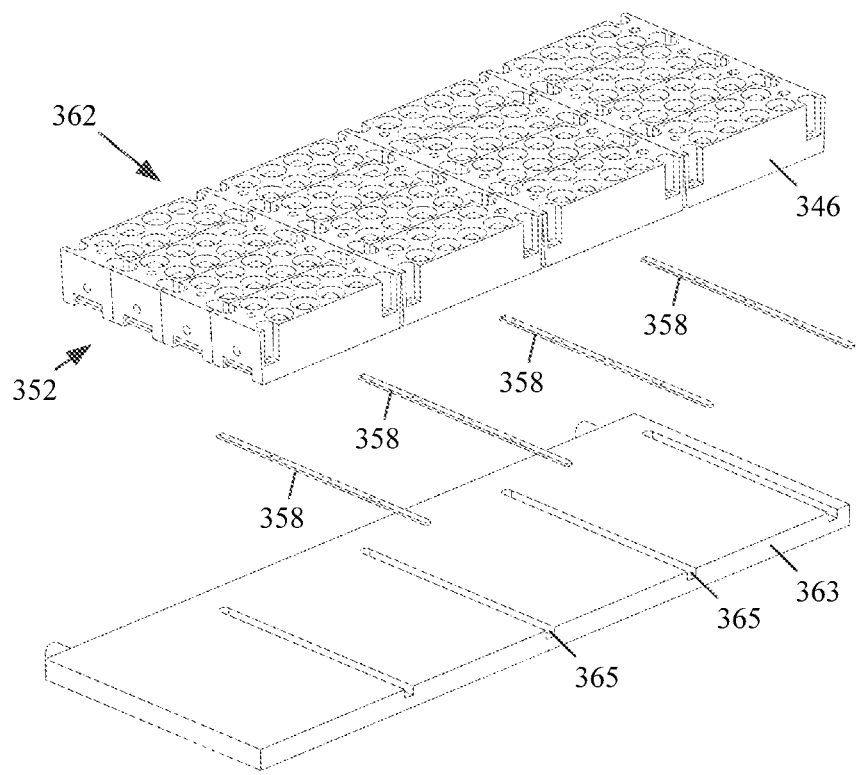

In some embodiments, the PCB that connects a row of bank packaged diode laser modules is located at the top surface of cooling module. In some embodiments, the diode laser array module includes multiple rows of diode laser modules (e.g., diode laser module 346) arranged on the top surface of the cooling module, and wherein each row of the diode laser module is electrically connected by a respective PCB (e.g., PCB 358, as shown in FIG. 139) disposed within a groove in the top surface of the cooling module (e.g., groove 365 in the top surface of the cooling module 364 in FIG. 141). In some embodiments, the PCB 358 is exposed (e.g., not covered by the material of the heat sink of the cooling module) in the groove 365 in the top surface of the cooling module. In some embodiments, the PCB 358 includes a first portion that resides within the groove 365, and a second, end portion that extends beyond the side surface of the cooling module. The second portion of the PCB 358 includes electrical contacts with a driving circuit module.

In some embodiments, two rows of bank packaged diode laser modules share the same first opening in the cooling module to access the PCB that connects the two rows of bank packaged diode laser modules. In some embodiments, at least one pair of adjacently located rows of diode laser modules arranged on the top surface of the cooling module have the respective second conductive portions of their respective pin connector modules reach into the same first opening in the body of the cooling module and are electrically connected to a same respective PCB at a location below the top surface of the cooling module.

Figure 144:
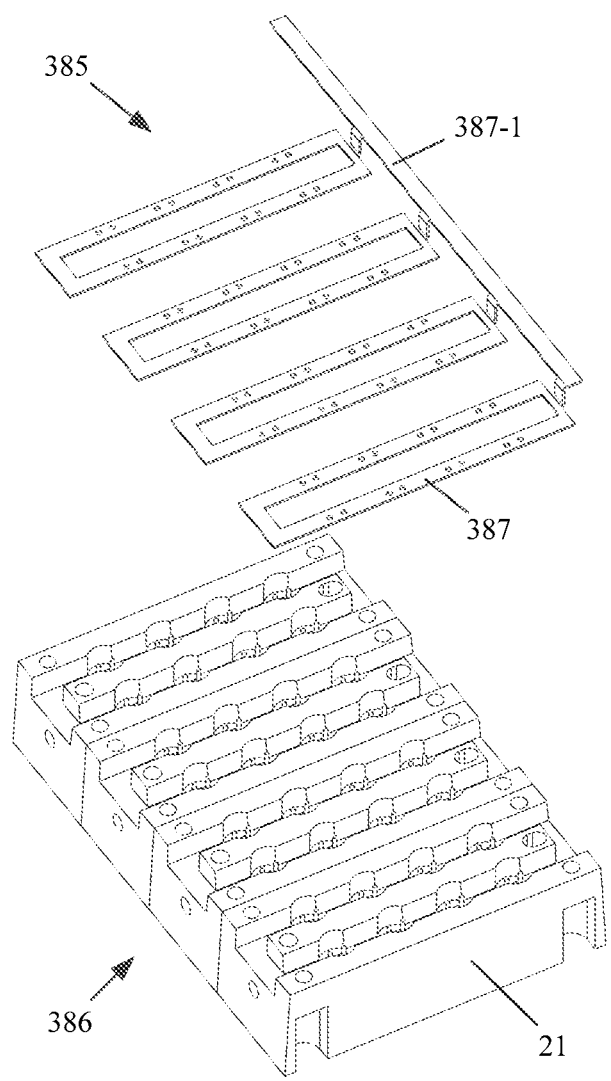
Figure 178:
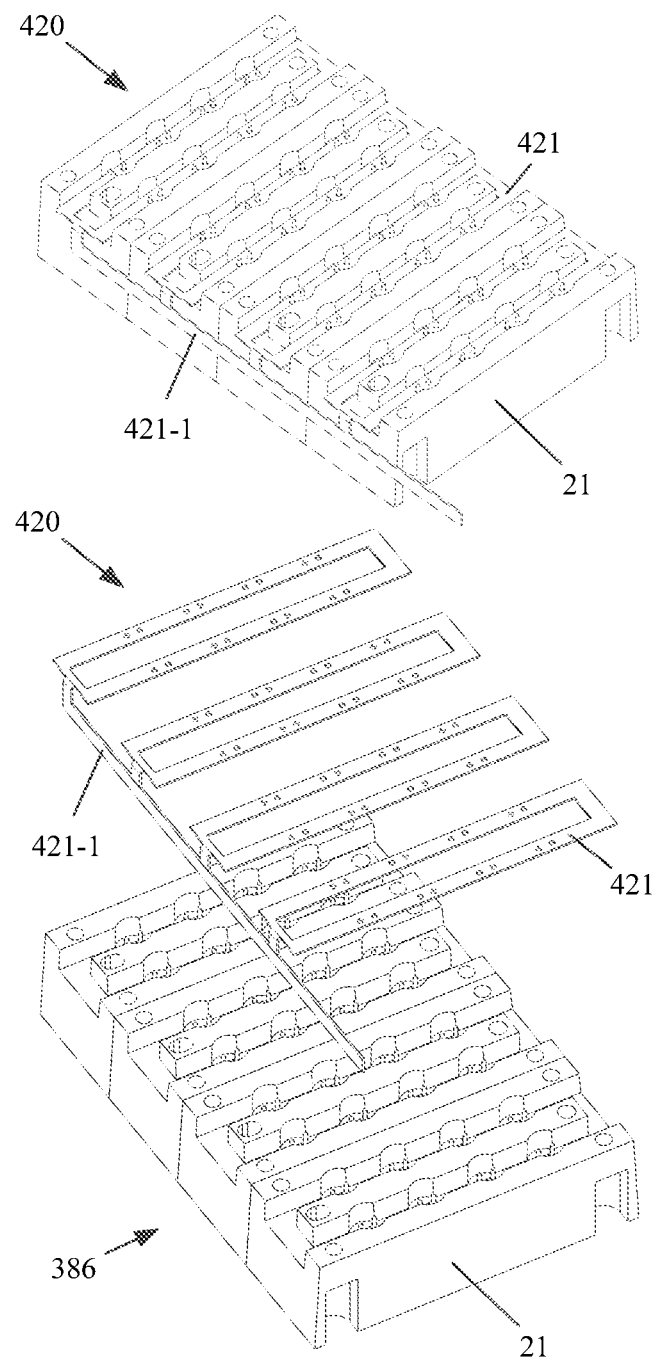

In some embodiments, multiple rows of bank packaged diode laser modules share the same FPC as their pin connector modules. In some embodiments, a row of diode laser modules of the diode laser array module are electrically connected by an FPC (e.g., FPC 387 in FIG. 144, FPC 421 in FIG. 178, etc.), wherein the FPC includes a plurality of first portions (e.g., a plurality of rectangular loop portions) that serve as the respective first conductive portions of the pin connector modules for a row of diode laser modules and a plurality of second portions (e.g., vertical portions of the lead connector 387-1 in FIG. 144, vertical portions of the lead connector 421-1 in FIG. 178, etc.) that serve as the respective second conductive portions of the pin connector modules for the row of diode laser modules, and wherein the FPC includes a third portion (e.g., the single long horizontal portion of the lead connector 387-1 in FIG. 144, the single long horizontal portion of the lead connector 421-1 in FIG. 178, etc.) that is integrally connected to the plurality of second portions of the FPC. As shown in FIG. 144 and FIG. 178, the different portions of the FPC can be bent relative to the planes of other portions, and the FPC can be manufactured as an integral flat piece that is bent at the boundaries of different portions during assembly of the diode laser array modules, thus saving storage space, and decreases manufacturing costs.

In some embodiments, each bank packaged diode laser module has its own FPC as its pin connector module. In some embodiments, the respective first conductive portion of a respective pin connector module for each diode laser module is provided by a first portion of an FPC (e.g., the rectangular loop portion of the FPC 382, 387, or 421), and the respective second conductive portion of the respective pin connector module for said each diode laser module is provided by a second portion of the FPC (e.g., the vertical portion of the lead connector 382-1 in FIG. 142, a vertical portion of the lead connector 387-1 in FIG. 149, the vertical portion of the lead connector 391-1 in FIG. 149; the vertical portion of the lead connector 423-1 in FIG. 179, etc.). In some embodiments, the FPC includes a third portion (e.g., the horizontal portion of the lead connector 391-1 in FIG. 149, the horizontal portion of the lead connector 423-1 in FIG. 179) that is integrally connected to the second portion and extends away from the first portion. In some embodiments, the FPC includes a third portion (e.g., the horizontal portion of the lead connector 387-1 in FIG. 144) that is integrally connected to the second portions of multiple diode laser modules and extends away from the first portions of the multiple diode laser modules. In some embodiments, the respective lead connectors of multiple rows are of different lengths. In some embodiments, the respective third portions of the respective FPCs for a respective row of diode laser modules are of different lengths (e.g., they all extend out of the side surface of the cooling module by about the same amount despite of having started at different portions along the length of the respective groove due to the different positions of the diode laser modules in the row of diode laser modules) (and optionally, share the same respective groove (e.g., groove 365 in FIG. 154) in the top surface of the cooling module).

In some embodiments, the cooling module includes liquid channels. In some embodiments, the cooling structure of the cooling module includes a liquid filled channel (e.g., water passage 119 in FIG. 351) that is embedded in the body of the cooling module. In some embodiments, the cooling structure is a liquid passage. In some embodiments, the cooling structure of the cooling module includes a liquid filled passage with an inlet and an outlet on one of the first and second side surfaces of the cooling module. In some embodiments, the cooling structure is a plurality of heat pipes. (e.g., heat pipes 441 in FIG. 198) that are embedded at least partially within the body of the cooling module. In some embodiments, the cooling structure is a tube pressed into the surface of the cooling module. In some embodiments, the cooling structure of the cooling module includes a plurality of liquid filled tubes (e.g., tubes 445 in FIG. 199) that are pressed into a groove in the top or bottom surface of the cooling module.

In some embodiments, the diode laser array module is a double-sided diode laser array module, and the cooling structure of the cooling module is shared between the plurality of laser diode modules and an additional plurality of laser diode modules disposed on the bottom surface of the cooling module.

More examples and details of various aspects of the diode laser array modules utilizing bank packaged diode laser modules are provided below. The features described with respect to different examples are optionally combined with the features describe with other examples without limitation, unless stated explicitly otherwise.

In some embodiments, by adopting a PCB and conductive leads, the anode and cathode of the diode laser module are extended through the body of the liquid-cooled radiator before being connected with the power supply, such that the radiation interface and driving power supply are distributed on two sides of the liquid-cooled radiator.

FIG. 131 is a schematic view of a diode laser module 346 in accordance with some embodiments. As shown in FIG. 131, the diode laser module 21 is mounted with a PCB (Printed Circuit Board) 347 and a pair of conductive leads 348 on the backside (also referred to as the bottom side of the diode laser module) to form a diode laser module 346. The PCB 347 is welded with respective sets of pins 4 of eight diode lasers 11 in the diode laser module 21 to form a series or parallel circuit. At the same time, the PCB 347 is electrically connected with the two conductive leads 348, and the two conductive leads 348 are respectively connected with the anodes and cathodes of the series or parallel circuit formed by the eight diode lasers 11. The PCB 347 does not exceed the side surface of the diode laser module 21, in some embodiments.

The PCB 347 and the conductive leads 348 are placed in a recessed area in the bottom surface of the diode laser module 21 (e.g., in a continuous groove that link the through holes that accommodate the diode lasers 11). Usually, multiple diode laser modules (e.g., one or more rows of diode laser modules 346) are used together as array modules and share the same liquid-cooled radiator.

In some embodiments, a PCB 351 is used to connect the pairs of conductive leads 348 of multiple diode laser modules 346 in each row of diode laser modules 346. In some embodiments, a row of through holes are made in the top surface of the cooling module, such that the conductive leads 348 can pass through the cooling module and be connected to the PCB at the bottom surface of the cooling module. In some embodiments, the PCB 351 is optionally hidden in the liquid-cooled radiator to prevent the PCB from hindering the use of the other surface of the liquid-cooled radiator and improve the utilization ratio of the liquid-cooled radiator.

Figure 132:
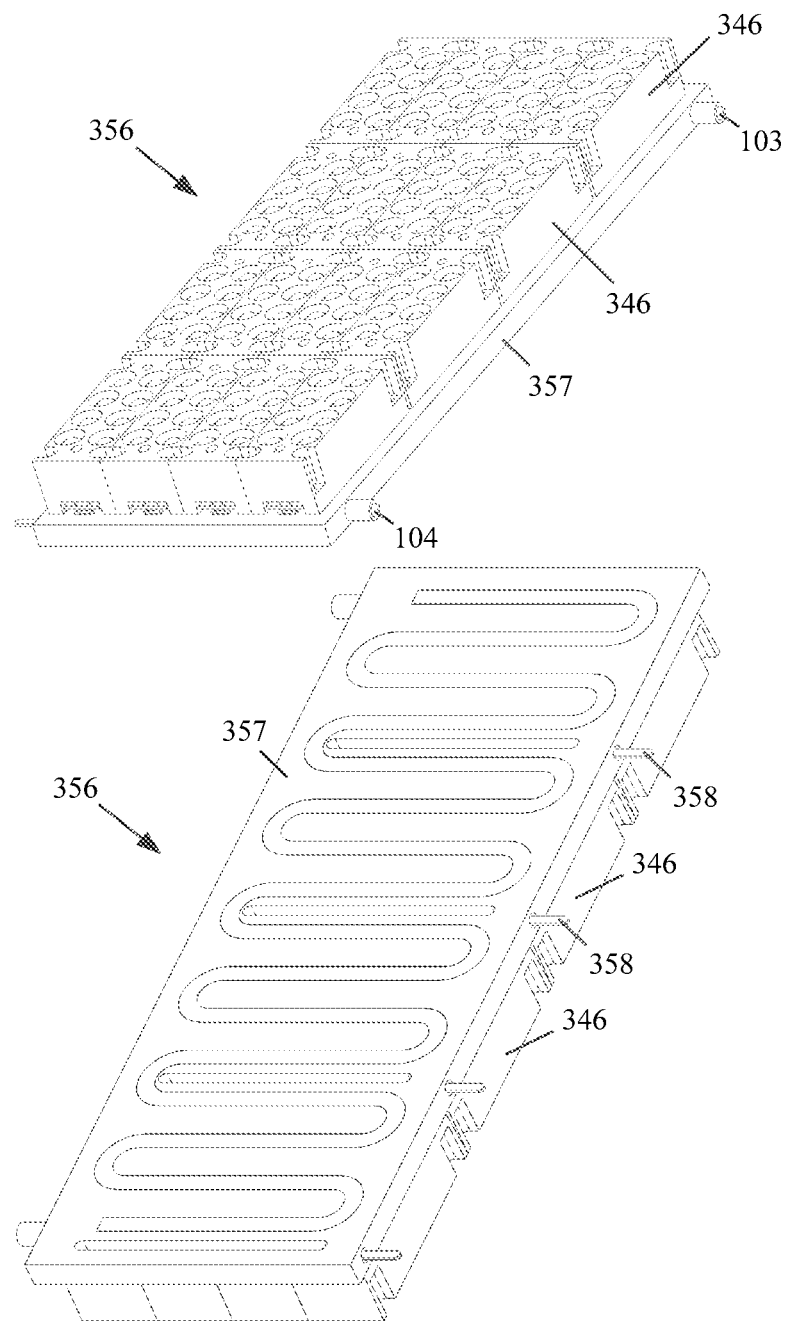
FIGS. 132-136 illustrate a diode laser array module 356 and components thereof in accordance with some embodiments.
Figure 133:
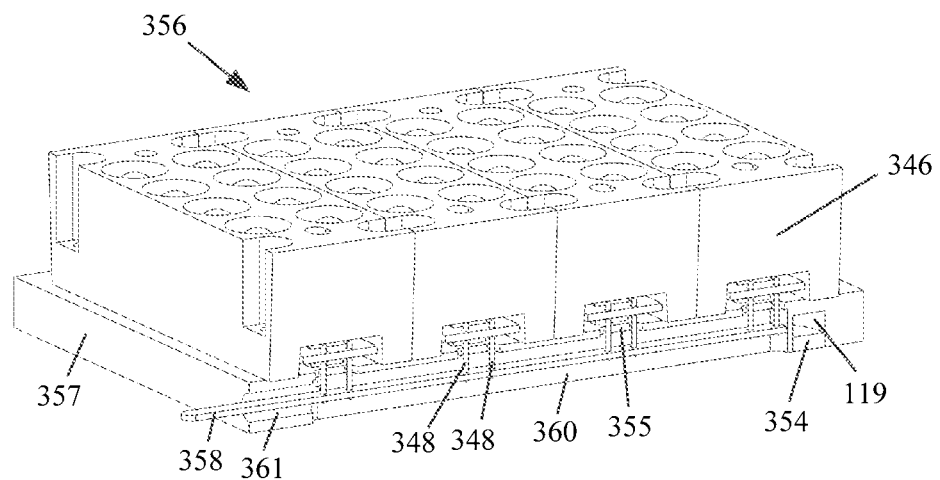

FIG. 132 shows two perspective views (e.g., view from the top at an angle, and view from the bottom at an angle) of a diode laser array module 356, in accordance with some embodiments. FIG. 133 is a partial sectional view of the diode laser array module 356, in accordance with some embodiments. FIG. 134 is an exploded schematic view of a diode laser array module 356, in accordance with some embodiments. As shown in FIG. 132, FIG. 133 and FIG. 124, the diode laser array module 356 includes a diode laser module array 352 comprising a plurality of diode laser modules 346 arranged in multiple rows, a liquid-cooled radiator 357 and a plurality of PCBs 358. The bottom surfaces of the diode laser modules 21 are in close thermal contact with the top surface of the liquid-cooled radiator 357, and heat conducting filling materials such as heat conducting paste are arranged on the contact interface. The heat produced during working of the diode laser modules 21 is transferred to the liquid-cooled radiator 357 for radiation. Coolant flows in from the inlet 103 and out from the outlet 104 disposed on the side surface of the liquid-cooled radiator 357, which takes away the heat transferred to the liquid-cooled radiator 357. The coolant may be water, ethylene glycol, etc.

The respective pairs of conductive leads 348 of the plurality of diode laser modules 346 arranged in the same row are welded to the same PCB 358 through the corresponding through holes 355 of the liquid-cooled radiator 357 to form a connected circuit. Each PCB 358 is placed into a respective groove 360 on the bottom surface of the cooling module after passing through the through hole 361 disposed on the side surface of the body of the liquid-cooled radiator 357.

The liquid-cooled radiator 357 includes a heat sink 359 and a water passage sealing plate 354. The water passage sealing plate 354 is pressed into the preformed water passage 119 in the bottom surface of the heat sink 359 and a sealed water passage is formed by bonding through adhesive or welding, as shown in the exploded view of the liquid-cooled radiator 357 in FIG. 350.

Figure 136:
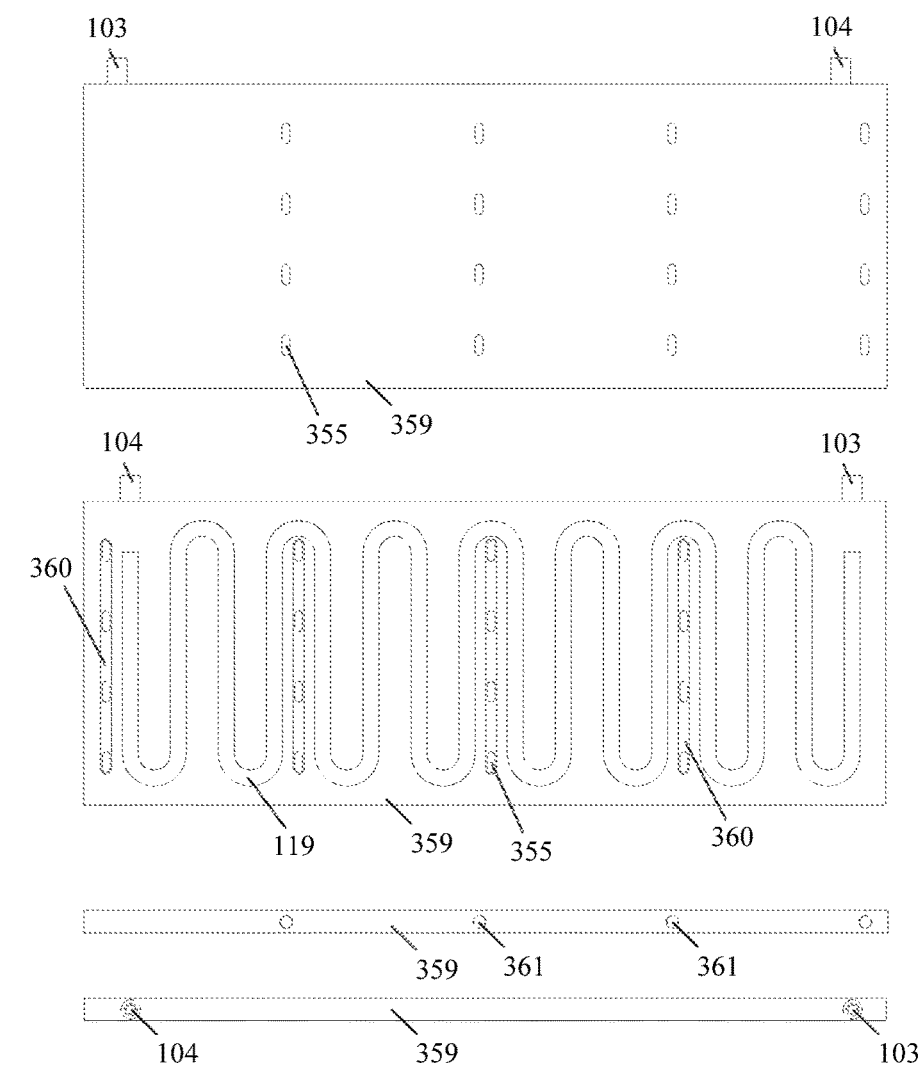

FIG. 136 illustrates a plurality of views (top, bottom, first side, and second side) of the heat sink 359 in accordance with some embodiments. FIG. 136 illustrates the relative locations of the grooves 360 and the through holes 355 in the bottom surface of the liquid-cooled radiator 359, the liquid-passage 119, and the through holes 361 on the side surface of the liquid-cooled radiator 359.

In some embodiments, variations are made on the basis of the diode laser array module 356. The PCBs and the diode laser modules 346 are placed on the same side of the liquid-cooled radiator to reduce the difficulty in manufacturing the liquid-cooled radiator.

Figure 137:
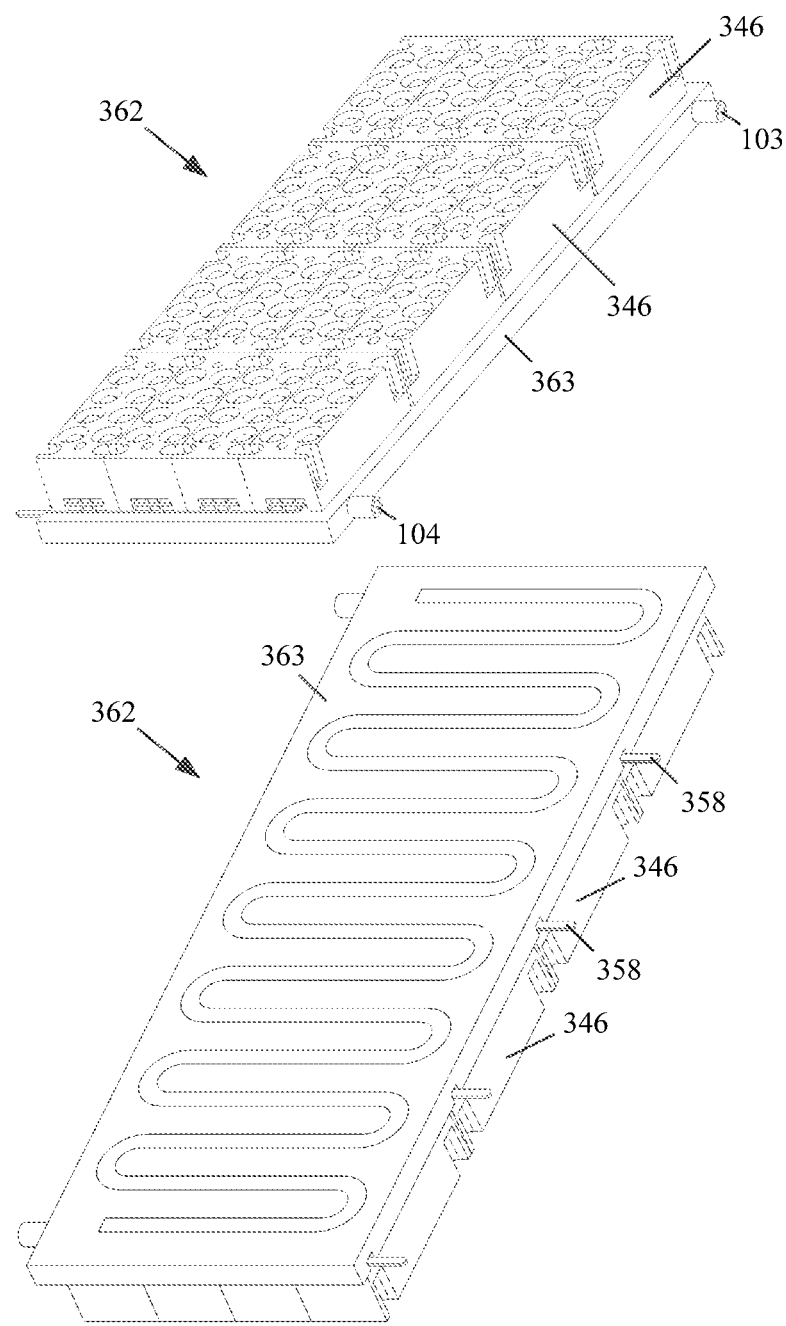
FIGS. 137-141 illustrate a diode laser array module 362 and components thereof in accordance with some embodiments.
Figure 138:
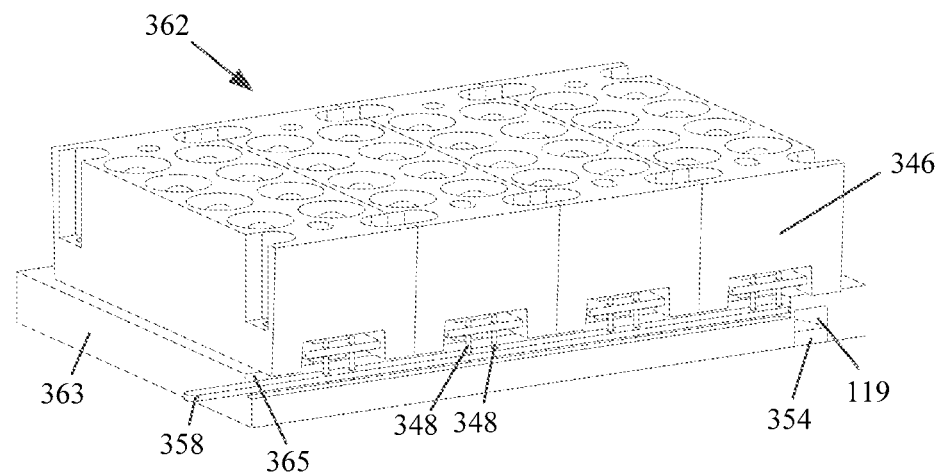

FIG. 137 shows two perspective views (view from the top at an angle, view from the bottom at an angle) of a diode laser array module 362, in accordance with some embodiments. FIG. 138 is a partial cross-sectional view of the diode laser array module 362, in accordance with some embodiments. FIG. 139 is an exploded schematic view of the diode laser array module 362, in accordance with some embodiments. As shown in FIGS. 137-139, the diode laser array module 362 includes a diode laser module array 352 comprising a plurality of diode laser modules 346 arranged in multiple rows, a liquid-cooled radiator 363 and a plurality of PCBs 358. The bottom surfaces of the diode laser modules 21 are in close thermal contact with the top surface of the liquid-cooled radiator 363, and heat conducting filling materials such as heat conducting paste are arranged on the contact interface. The heat produced during working of the diode laser modules 21 is transferred to the liquid-cooled radiator 363 for radiation. Coolant flows in from the inlet 103 and out from the outlet 104 disposed on the side surface of the liquid-cooled radiator 363, which takes away the heat transferred to the liquid-cooled radiator 363. The coolant may be water, ethylene glycol, etc.

The conductive leads 348 of the plurality of diode laser modules 346 in the same row are welded to the same PCB 358 to form a connected circuit. The PCB 358 is placed into the groove 365 formed in the top surface of the liquid-cooled radiator 363.

Figure 140:
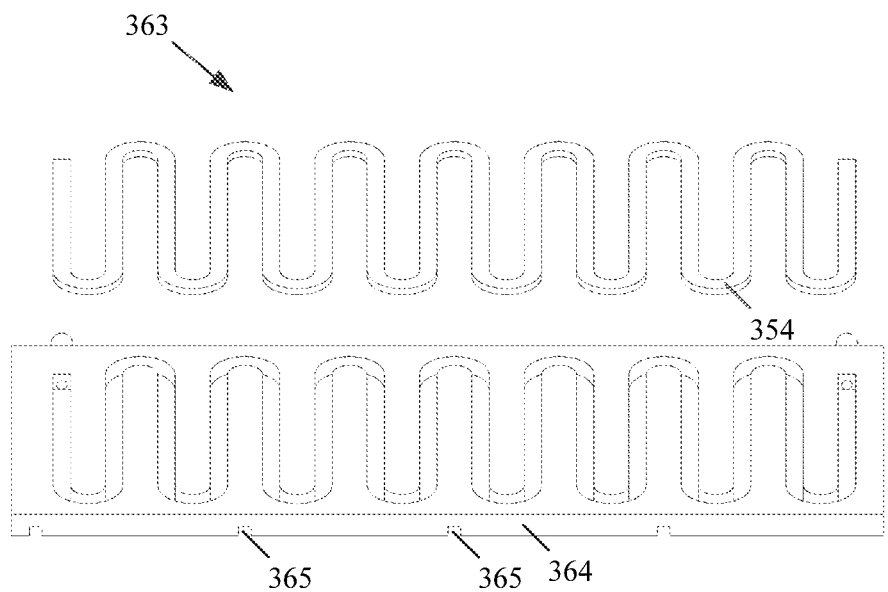

FIG. 140 is an exploded view of the liquid-cooled radiator 363. As shown in FIG. 140, the liquid-cooled radiator 363 includes a heat sink 364 and a water passage sealing plate 354. The water passage sealing plate 354 is pressed into the preformed water passage 119 in the bottom surface of the heat sink 364 and a sealed water passage is formed by bonding through adhesive or welding.

Figure 141:
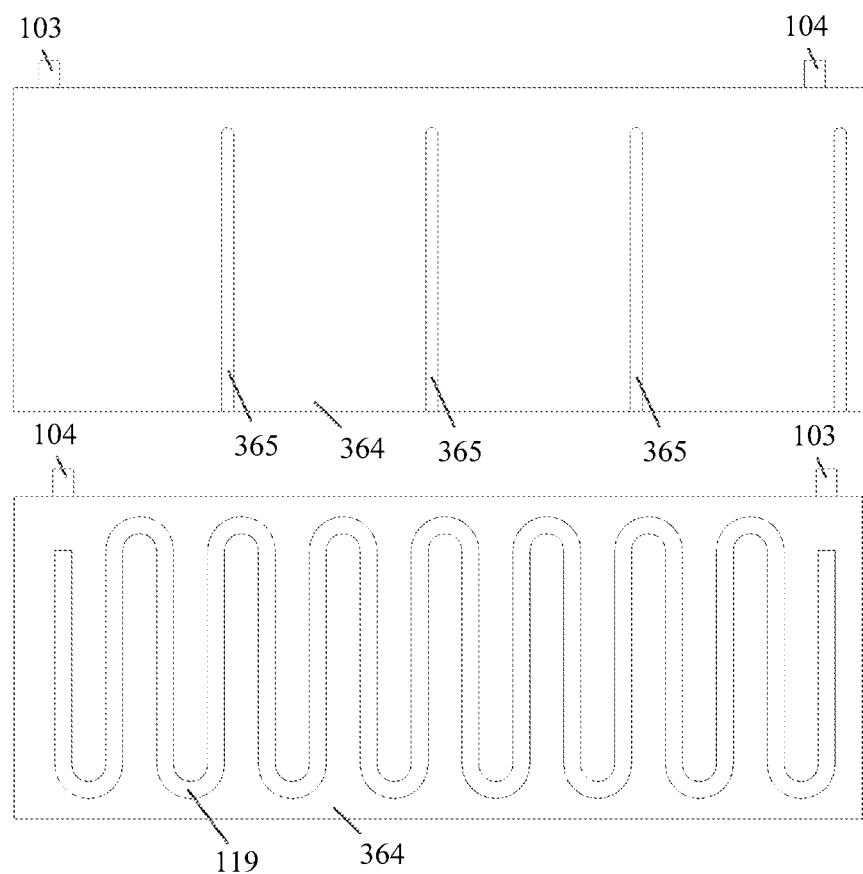

FIG. 141 illustrates a plurality of views (top, bottom) of the heat sink 364 from different sides (top and bottom), in accordance with some embodiments. The top view shows the locations of the grooves 365 on the top surface of the liquid-cooled radiator 364 as corresponding to the locations of the lead connectors 348 for each row of diode laser modules 346 on top.

In some embodiments, the diode laser module optionally include FPCs (Flexible Printed Circuit Boards) used for replacing the PCBs and/or pin connectors for forming circuits (e.g., to electrically connect the pins 4 of the individual diode lasers and/or to electrically connect the lead connectors of multiple diode laser arrays (e.g., diode laser modules 346, 377, etc.)). More flexible circuit layout is realized by the FPCs and facilitates achieving excellent sealing performance such as dust-proof and moisture-proof performance of the diode laser array modules.

In some embodiments, the diode laser module 381 optionally replaces the diode laser module 346 in various diode laser array modules described herein, such as the diode laser array module 349 to form a corresponding diode laser array module. Description will be made below by taking that the diode laser module 346 in the diode laser array module 349 is replaced as an example. The other aspects of the diode laser array modules can remain the same, which will be not repetitively described any longer.

Figure 142:
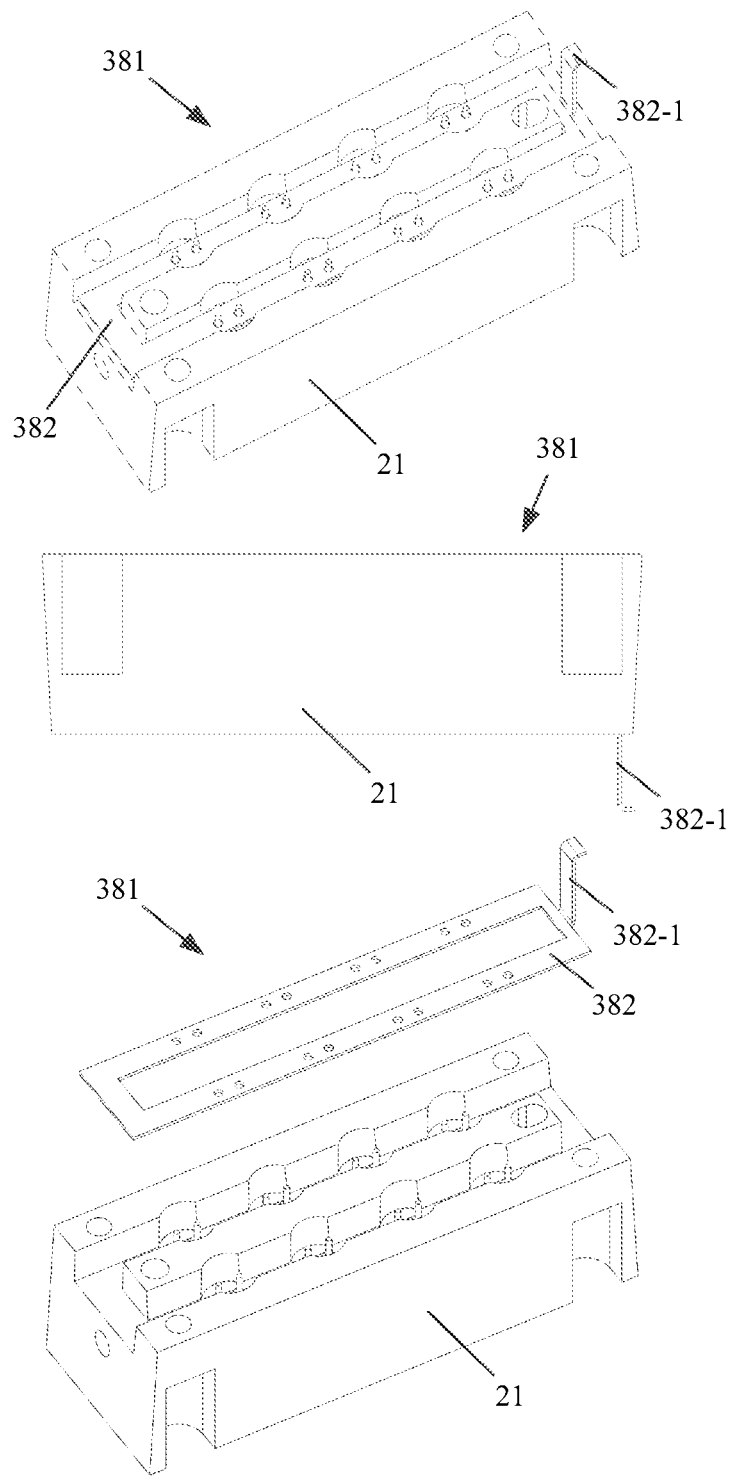
FIG. 142 illustrates a diode laser module 381 in accordance with some embodiments.

FIG. 142 shows several views (perspective view from the bottom at an angle, side view, exploded view) of a diode laser module 381 in accordance with some embodiments. As shown in FIG. 142, the diode laser module 21 is mounted with an FPC 382 in the recessed area in the back surface of the diode laser module 21 to form a diode laser module 381. The FPC 382 includes a first portion (e.g., the rectangular loop portion) that is welded with the respective sets of pins 4 of the eight diode lasers 11 in the diode laser module 21 to form a series or parallel circuit, which is also connected with the anode and cathode of the FPC 382 residing in the second portion of the FPC 382, namely the lead connector 382-1 of the FPC 382. The first portion of the FPC 382 does not extend beyond the side edge of the bottom surface of the diode laser module 21. The conductive lead connector 382-1 of the FPC 382 (serving as a second conductive portion of the pin connector module for the diode laser module 21) is bent downward relative to the bottom surface of the diode laser module 21, as shown in the side view of the diode laser module 381 in FIG. 364. The FPC 382 is placed in the recessed area in the bottom surface of the diode laser module 21. The lead connectors 382-1 in the FPC 382 replace the conductive leads 348 or pin connectors 380 in the other embodiments described herein, and can be welded together with the PCB 358 to form a connected circuit, as described with respect to other diode laser array modules described herein.

For example, the specific application of the diode laser module 381 is as follows. The various aspects of the diode laser array module formed using the diode laser module 381 is similar or identical to those of the diode laser array module 349. The difference is that the modified diode laser array module adopts diode laser modules 381 on top of the liquid-cooled radiator instead of diode laser module 346.

In some embodiments, an FPC can also replace the PCB 358 that is used to link the circuits of multiple diode laser modules in a row of diode laser modules, such that the structure of the diode laser module array is simpler and the sealing further is improved.

Figure 143:
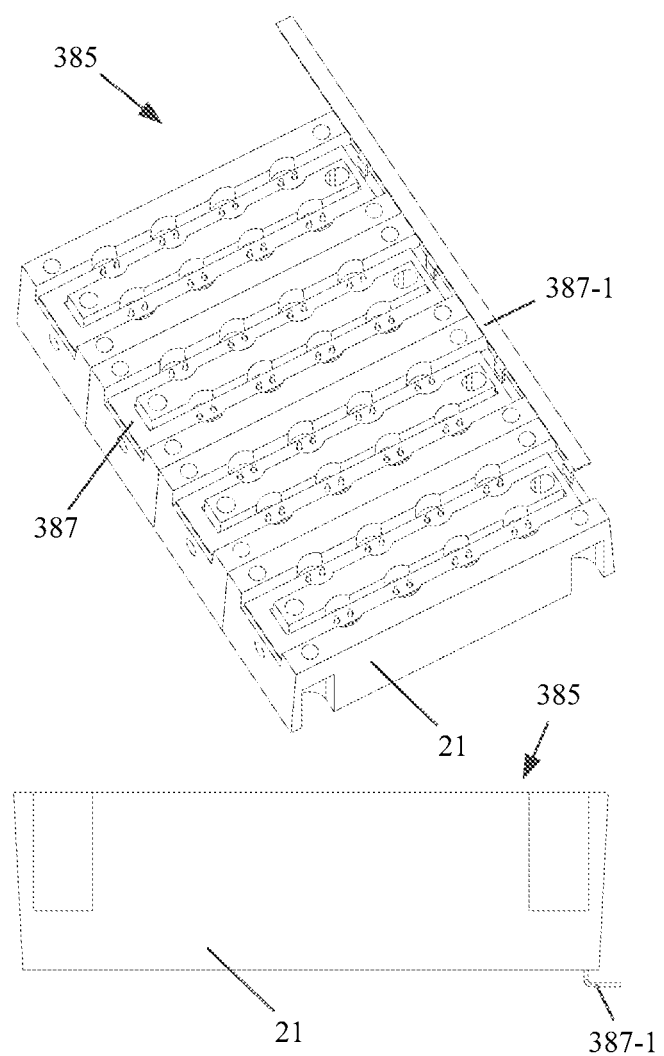
FIGS. 143-144 illustrate a diode laser module 385 in accordance with some embodiments.

FIG. 143 shows two views (perspective view from the bottom at an angle, side view) of a diode laser module 385 in accordance with some embodiments. FIG. 368 is an exploded view of the diode laser module 385 in accordance with some embodiments. As shown in FIG. 143 and FIG. 144, a plurality of diode laser modules 21 form a diode laser module array 386 and the same integrated FPC 387 is mounted on the back surface of the diode laser module array 386 to form a diode laser module 385. The FPC 387 has multiple first portions (e.g., the individual rectangular loop portions) that each fits within a respective recessed area in the bottom surface of a respective diode laser module 21. The FPC 387 has respective second portions (e.g., the vertical portions of the lead connector 387-1 of the FPC 387) connected to each of the first portions, and has a third portion (e.g., the horizontal portion of the lead connector 387-1) that is connected to all of the respective second portions. The FPC 387 (e.g., by a respective first portion of the FPC 387) is welded together with the respective sets of pins 4 of eight diode lasers 11 in each diode laser module 21 to form a series or parallel circuit. The series or parallel circuits formed by each diode laser module 21 converge at the lead connector 387-1 (e.g., by the respective second portions of the FPC 387), and the lead connector 387-1 is part of the FPC 387.

The vertical portions of the lead connector 387-1 bend downward away from the bottom side of the diode laser module array, and the horizontal portion of the lead connector 387-1 bent relative to the vertical portions of the lead connector 387-1, such that the horizontal portion of the lead connector 387-1 lies flat relative to the bottom surface of the diode laser module array 386, and is placed at below the bottom surface of the diode laser module array 386, as shown in FIG. 367.

Figure 145:
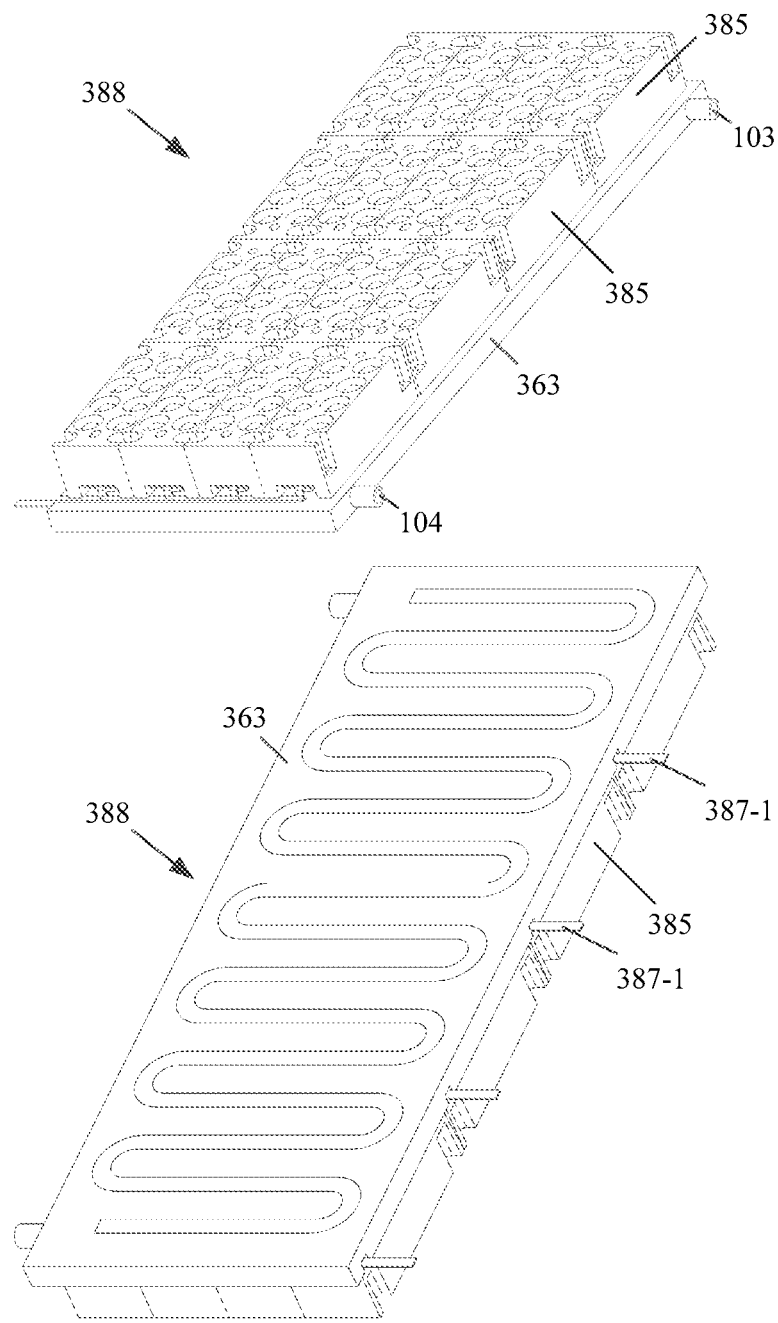
FIGS. 145-147 illustrate a diode laser array module 388 utilizing the diode laser modules 385 in accordance with some embodiments.
Figure 146:
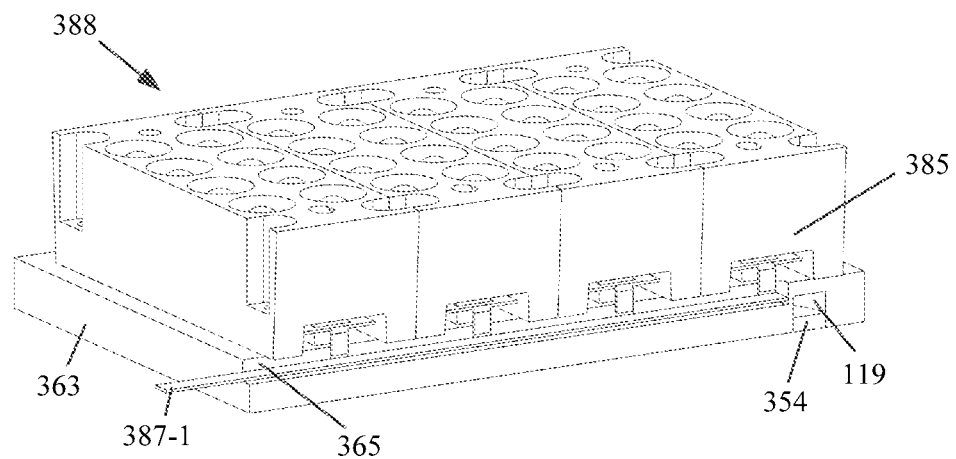
Figure 147:
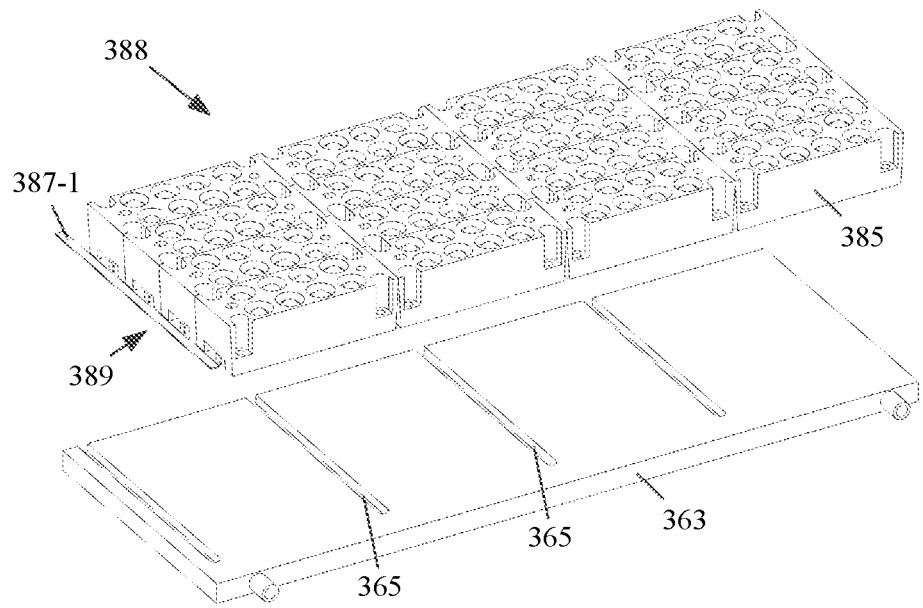

FIG. 145 shows two perspective views (view from top at an angle, view from bottom at an angle) of a diode laser array module 388 in accordance with some embodiments. FIG. 146 is a partial cross-sectional view of the diode laser array module 388 in accordance with some embodiments. FIG. 147 is a schematic exploded view of arrangement of the diode laser module 388 in accordance with some embodiments. As shown in FIGS. 145-147, the diode laser array module 388 includes a diode laser module array 389 comprising a plurality of diode laser modules 385 arranged in multiple rows, and a liquid-cooled radiator 363. The bottom surfaces of the diode laser modules 21 are in close contact with the top surface of the liquid-cooled radiator 363, and heat conducting filling materials such as heat conducting paste are arranged on the contact surface. The heat produced during working of the diode laser modules 21 is transferred to the liquid-cooled radiator 363 for radiation. Coolant flows in from the inlet 103 and out from the outlet 104, which takes away the heat transferred to the liquid-cooled radiator 363. The coolant may be water, ethylene glycol, etc.

The lead connector 387-1 is placed into the groove 365 in the top surface of the liquid-cooled radiator 363. As shown in FIG. 369-1, the horizontal portion of the lead connector 387-1 lies flat within the groove 365 in the top surface of the liquid-cooled radiator due to the downward extension of the vertical portions of the lead connector 387-1 from the first portions of the FPC 387.

In some embodiments, the functions realized by the diode laser array module 388 are similar to those realized by the diode laser array module 362. By replacing the combination of the PCB 347, conductive lead 348 and PCB 358 with the FPC 387, similar functions can be achieved. Other aspects of the diode laser array module will remain the same and will be not repetitively described any longer.

In some embodiments, the FPC 387 in the diode laser module array 385 may be inconvenient in the mounting process. For more flexible mounting, a separate FPC may be equipped for each diode laser module 21 in a row of diode laser modules in a diode laser module array.

Figure 148:
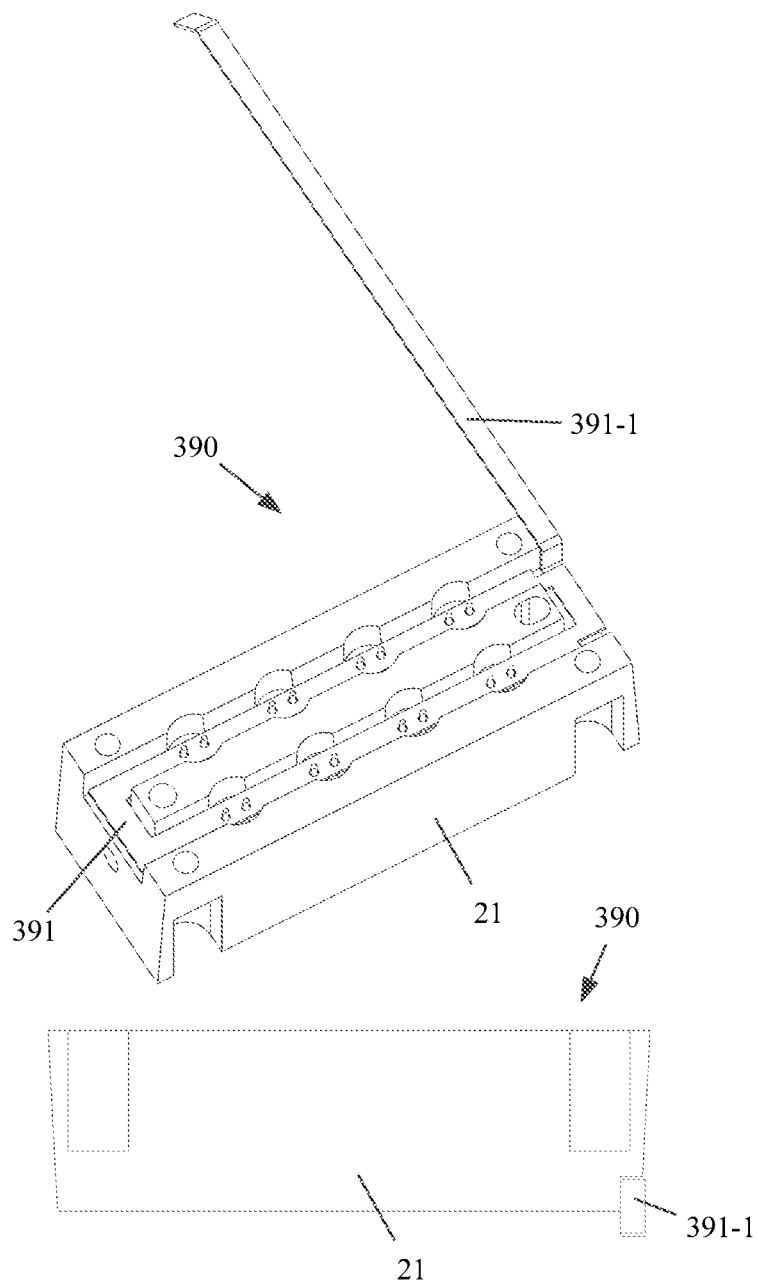
FIGS. 148-149 illustrate a diode laser module 390 in accordance with some embodiments.
Figure 149:
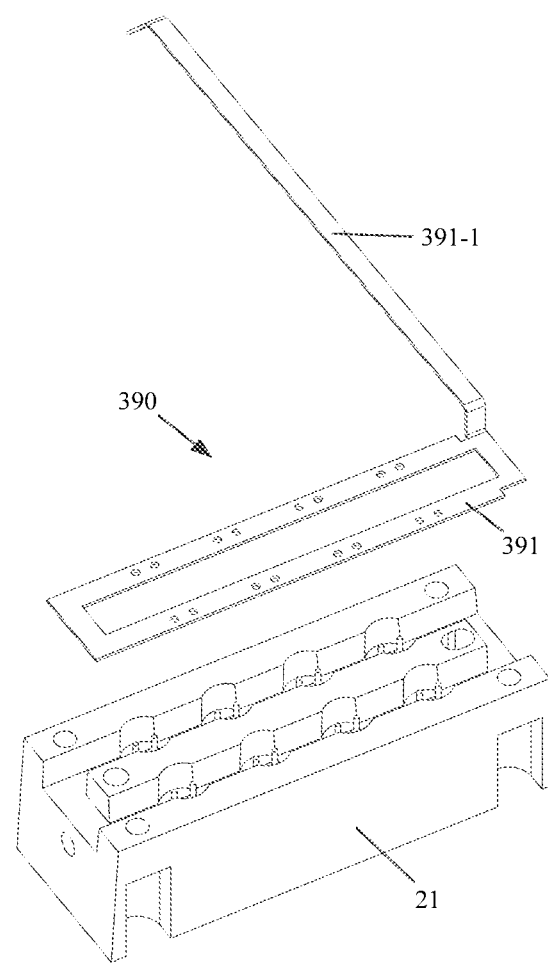
Figure 150:
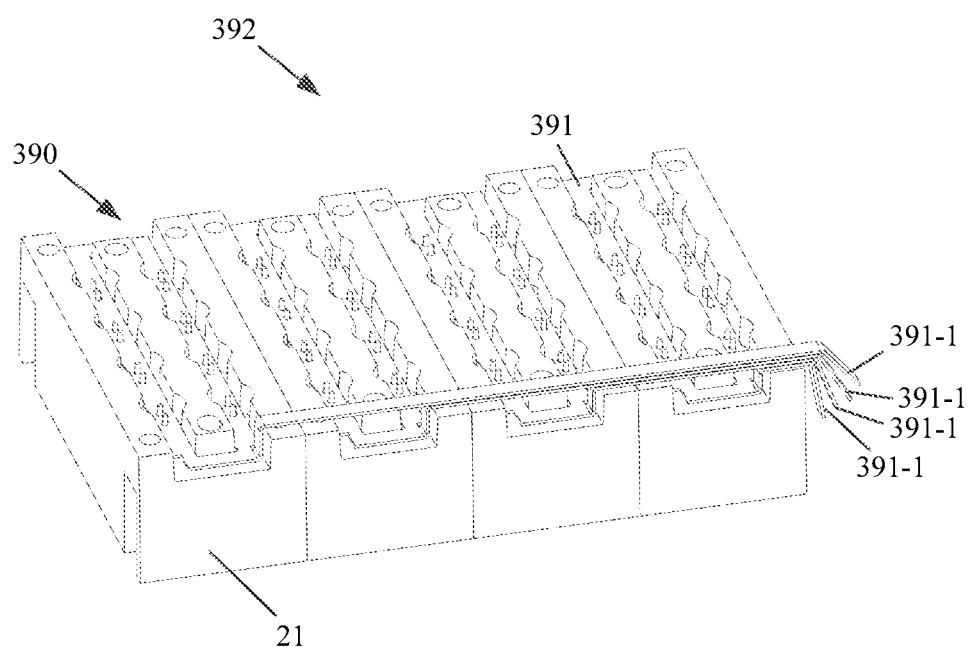
FIGS. 150-154 illustrate a diode laser array module 392 utilizing the diode laser modules 390 in accordance with some embodiments.

FIG. 148 includes multiple views (perspective view from the bottom at an angle, side view) of a diode laser module 390 in accordance with some embodiments. FIG. 149 is an exploded view of the diode laser module 390 in accordance with some embodiments. As shown in FIGS. 148-149, the FPC 391 is mounted in a recessed area on the back surface of the diode laser modules 21 to form the diode laser module 390. The first portion (e.g., the rectangular loop portion) of the FPC 391 is welded together with the respective sets of pin 4 of each diode laser 11 in the diode laser module 21 to form a series or parallel circuit. The anode and cathode of the circuit are guided by the lead connector 391-1 to designated positions (e.g., positions outside of the heat exchange interface between the cooling module and the diode laser array module) to connect with other circuits. The lead connector 391-1 is an integral part of the FPC 391. FIG. 150 shows a perspective view (view from the bottom at an angle) of the diode laser array module 392 formed by the diode laser modules 391. The horizontal portion of the lead connector 391-1 is placed below the bottom surface of the diode laser module 21, as shown in FIG. 150. As used herein with the descriptions of various embodiments, the terms "above", "below", "upward", "downward", "top", "bottom", "upper", "lower", "vertical", "horizontal" etc. are used to describe relative positions and orientations in reference to a diode laser used in the embodiment that is oriented upright with its flat output window oriented horizontally and facing upward. There is no limitation that the embodiments as a whole are actually orientated in the manner described in actual use.

Figure 151:
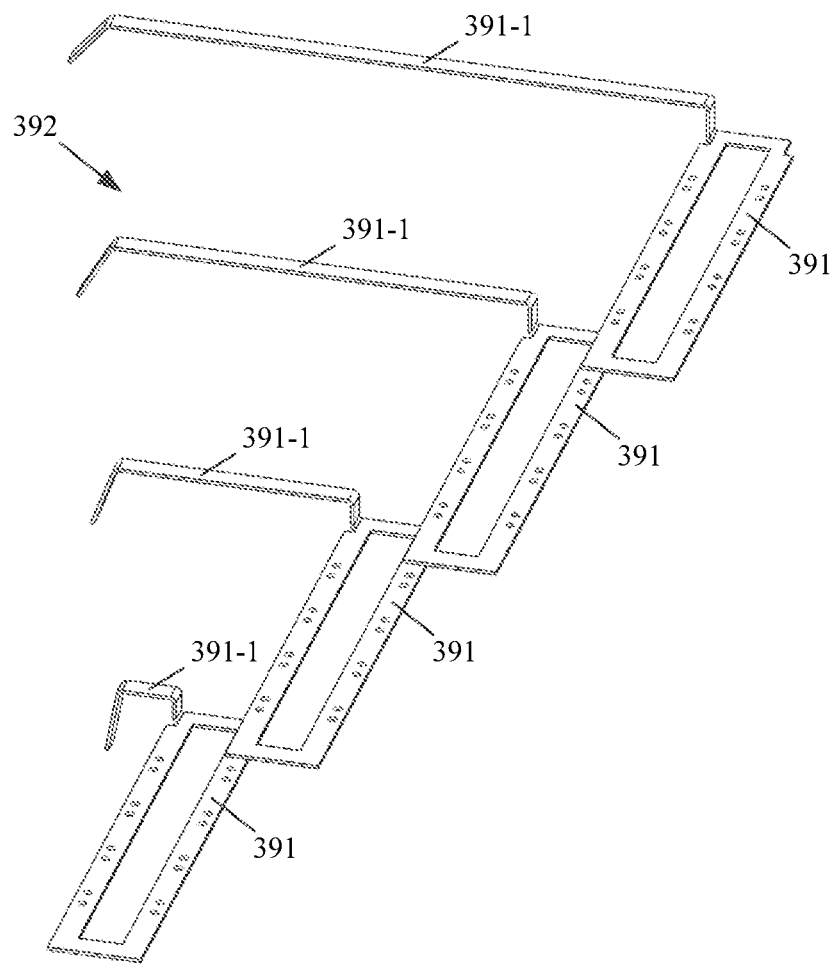
Figure 151:
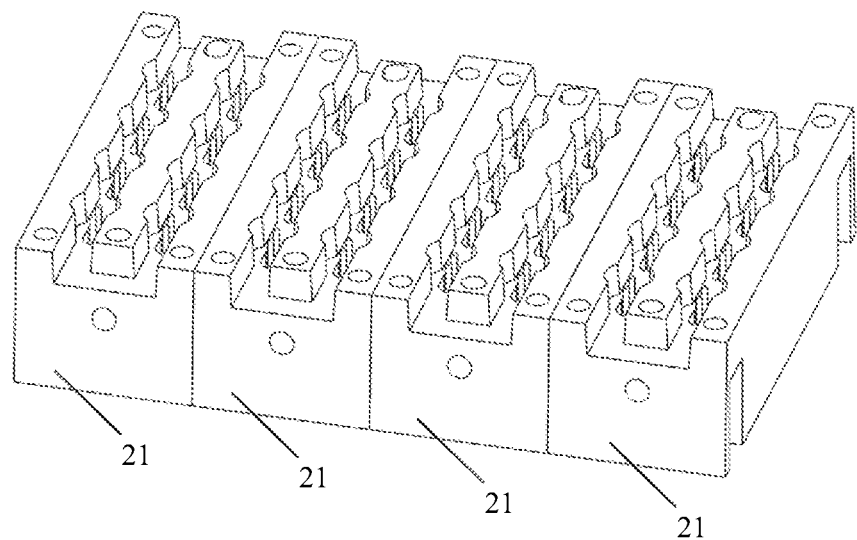

FIG. 150 is perspective view from the bottom side of the diode laser module array 392 in accordance with some embodiments. FIG. 151 is an exploded view of the diode laser module array 392. As shown in FIG. 150 and FIG. 151, a plurality of diode laser modules 390 are placed side by side to form the diode laser module array 392 (e.g., a row of diode laser modules). The vertical portions of the lead connector 391-1 of the FPC 391 of each diode laser module 390 is placed in a respective recessed area (e.g., the rectangular groove that also accommodate the rectangular loop portion of the FPC 391) in the bottom surface of said each diode laser module of the row of diode laser modules 21; and the respective horizontal portions of the lead connectors 391-1 of the FPC 391 for the row of diode laser modules are stacked together, as they are extended across the bottom surface of the diode laser modules 21. The horizontal portions of the lead connectors 391-1 for the different diode laser modules 21 are of different lengths as they are started from different locations along the row of diode laser modules 21.

Figure 152:
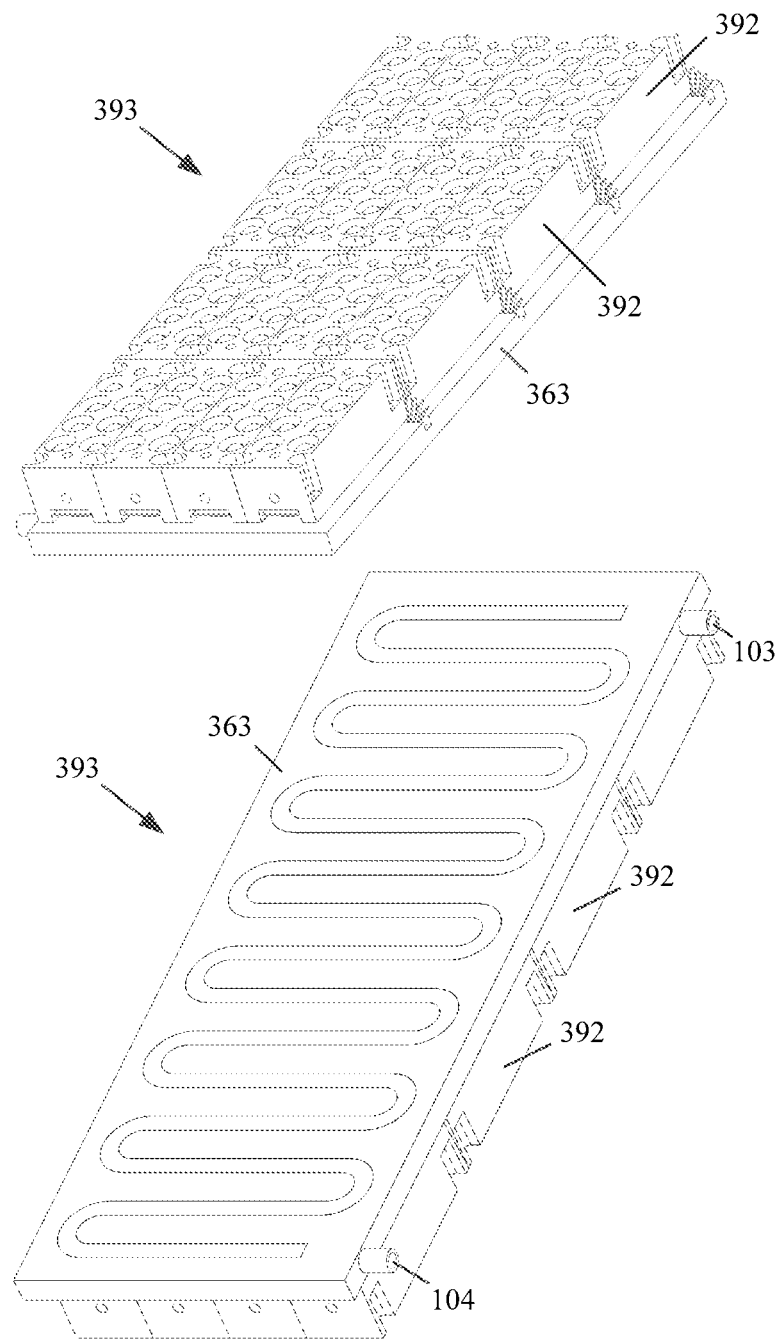
Figure 153:
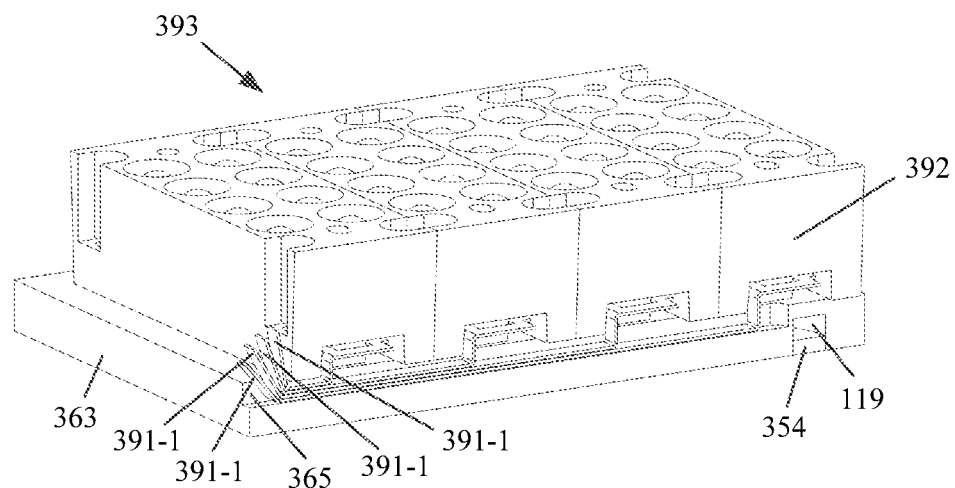

FIG. 152 shows two perspective views (view from the top at an angle, view from the bottom at an angle) of a diode laser array module 393 made with the diode laser modules 392 in accordance with some embodiments. FIG. 153 is a partial cross-sectional view of the diode laser array module 393 in accordance with some embodiments. FIG. 154 is an exploded schematic view of the diode laser array module 393. As shown in FIGS. 152-154, the diode laser array module 393 includes a diode laser module array 394 comprising a plurality of diode laser modules 392 arranged in multiple rows, and a liquid-cooled radiator 363. The bottom surfaces of the diode laser modules 21 are in close contact with the top surface of the liquid-cooled radiator 363, and heat conducting filling materials such as heat conducting paste are arranged on the contact surface. The heat produced during working of the diode laser modules 21 is transferred to the liquid-cooled radiator 363 for radiation. Coolant flows in from the inlet 103 and out from the outlet 104, which takes away the heat transferred to the liquid-cooled radiator 363. The coolant may be water, ethylene glycol, etc. The horizontal portions of the lead connectors 391-1 for the FPCs 391 of each row of diode laser modules 21 are placed into a respective groove 365 in the top surface of the liquid-cooled radiator 363. The horizontal portions of the lead connectors 391-1 for the FPCs 391 of each row of diode laser modules 21 are stacked and lie flat within the respective groove 365 in the top surface of the liquid-cooled radiator 363 at a location corresponding to the ends of the diode laser modules 21.

The functions realized by the diode laser array module 393 are similar to those realized by the diode laser array module 362. By replacing the combination of the PCB 347, conductive lead 348 and PCB 358 with the FPCs 391, similar functions can be achieved. Other aspects of the diode laser array module will be the same and will not be repetitively described any longer.

In some embodiments, the groove 365 of the liquid-cooled radiator 363 in the diode laser array module 393 runs through one side surface of the liquid-cooled radiator 363, which is not conducive to the overall sealing of the diode laser array module 393. Therefore, the following solution may be adopted to improve the sealing performance.

Figure 155:
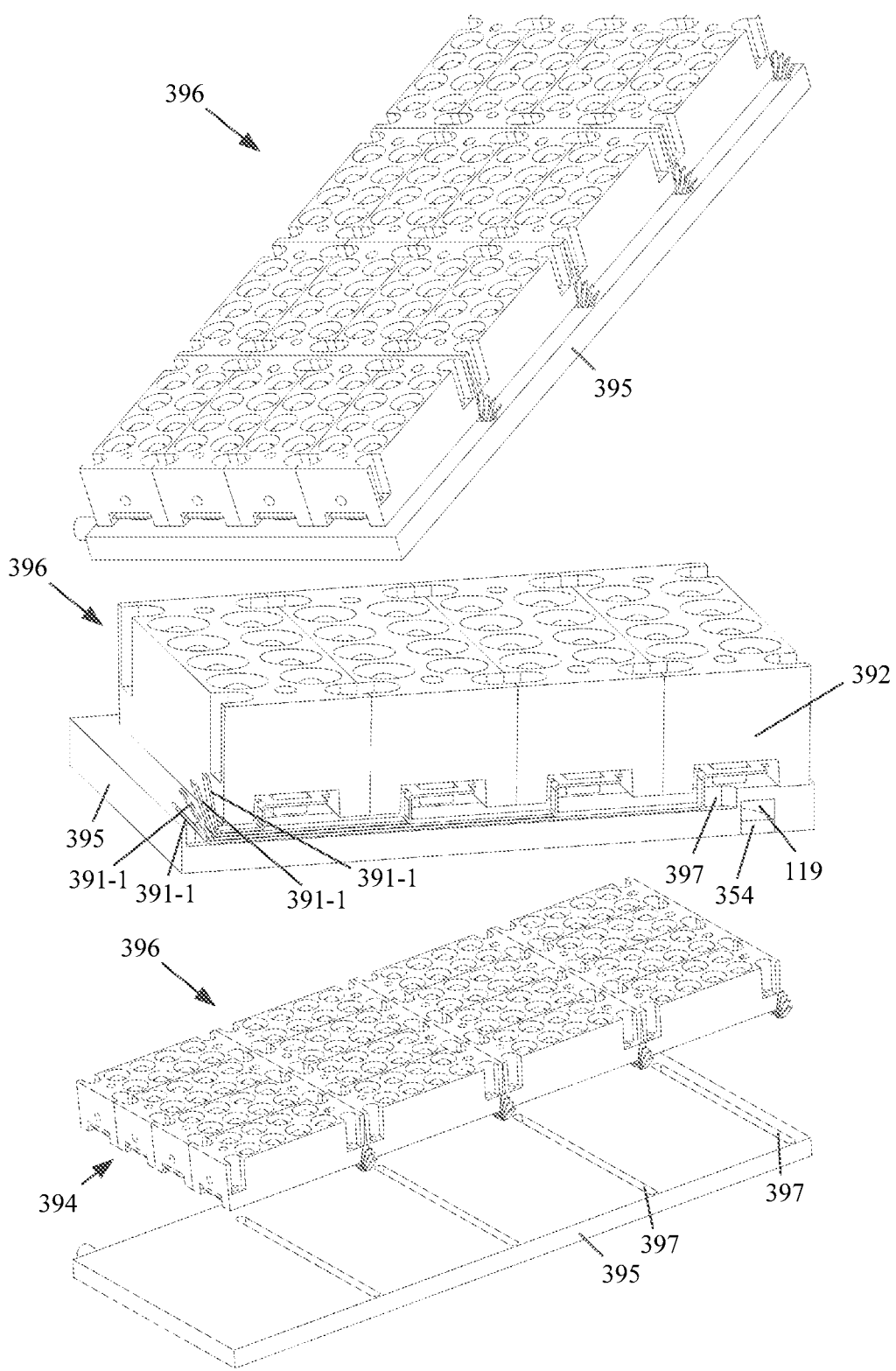
FIGS. 155-157 illustrate a diode laser array module 396 and components thereof in accordance with some embodiments.

FIG. 155 shows several views (perspective view from the top at an angle, partial cross-sectional view, exploded view) of a diode laser array module 396 in accordance with some embodiments. As shown in FIG. 155, the liquid-cooled radiator 363 of the diode laser array module 393 is replaced with the liquid-cooled radiator 395 to form the diode laser array module 396, and other aspects of the diode laser array module are identical to those in other embodiments described herein, which will be not repetitively described any longer. The lead connector 391-1 of the FPC 391 of each diode laser module is placed in the groove 397 which does not extend through the side surfaces of the liquid-cooled radiator 395 on either side.

Figure 156:
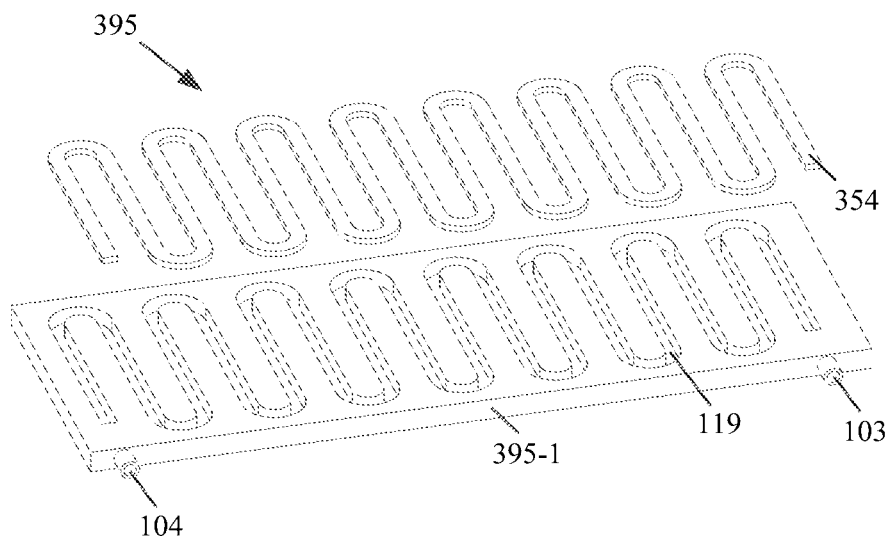

FIG. 156 is an exploded view (view from the bottom side at an angle) of the liquid-cooled radiator 395 used in the diode laser array module 396 in accordance with some embodiments. As shown in FIG. 156, the liquid-cooled radiator 395 includes a heat sink 395-1 and a water passage sealing plate 354. The water passage sealing plate 354 is pressed into the preformed water passage 119 in the bottom surface of the heat sink 395-1 and a sealed water passage is formed by bonding through adhesive or welding.

FIG. 157 illustrates a plurality of views (e.g., top, bottom) of the heat sink 395-1, and the groove 397 does not run through the side surface of the heat sink 395-1, as shown in FIG. 157.

Figure 158:
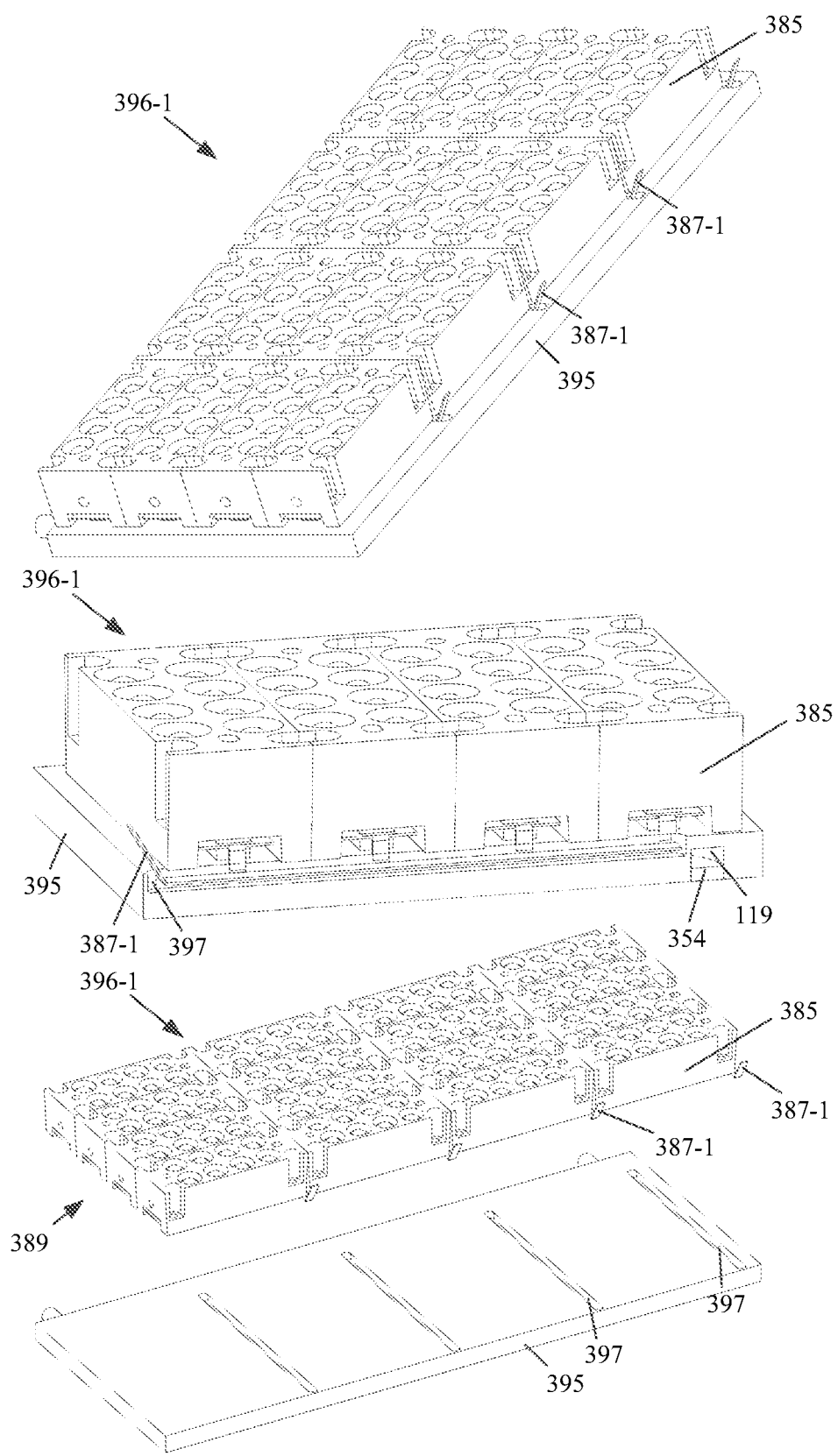
FIG. 158 illustrates a diode laser array module 396-1 and components thereof in accordance with some embodiments.

FIG. 158 shows a plurality of views (perspective view from the top at an angle, partial cross-sectional view, exploded view from the top at an angle) of a diode laser array module 396-1 in accordance with some embodiments. As shown in FIG. 158, the diode laser module array 394 in the diode laser array module 396 may be replaced with the diode laser module array 389 to form the diode laser array module 396-1. The horizontal portion of the lead connector 387-1 for each row of diode laser modules in the diode laser module array 385 is bent relative to the vertical portions of the lead connector 387-1 such that the surface of the horizontal portion is oriented parallel to the top surface of the liquid-cooled radiator underneath the diode laser modules. The horizontal portion of the lead connector 387-1 is placed into the groove 397 in the top surface of the liquid-cooled radiator 395. Other aspects of the diode laser array module 396-1 are the same as those of other diode laser array modules described herein and are not repeated again.

In some embodiments, the above-mentioned solutions are not only applicable to diode laser modules 21 with the recessed areas in the bottom surfaces of the diode laser modules 21, but also applicable to diode laser modules with other types of diode lasers but also with recessed areas in the bottom surfaces of the diode laser modules. Variations need to made to use diode laser modules that do not have those recessed areas, such as diode laser module 53, in diode laser array modules in accordance with various embodiments, because the diode laser modules (e.g., diode laser module 53) do not include recessed areas on their bottom surfaces to accommodate the PCBs or FPCs that electrically connect the pins of the diode lasers in the manner that diode laser module 21 does.

In some embodiments, when diode laser modules without the recessed areas in their bottom surfaces, such as diode laser module 53, are used, the following solution is adopted.

Figure 159:
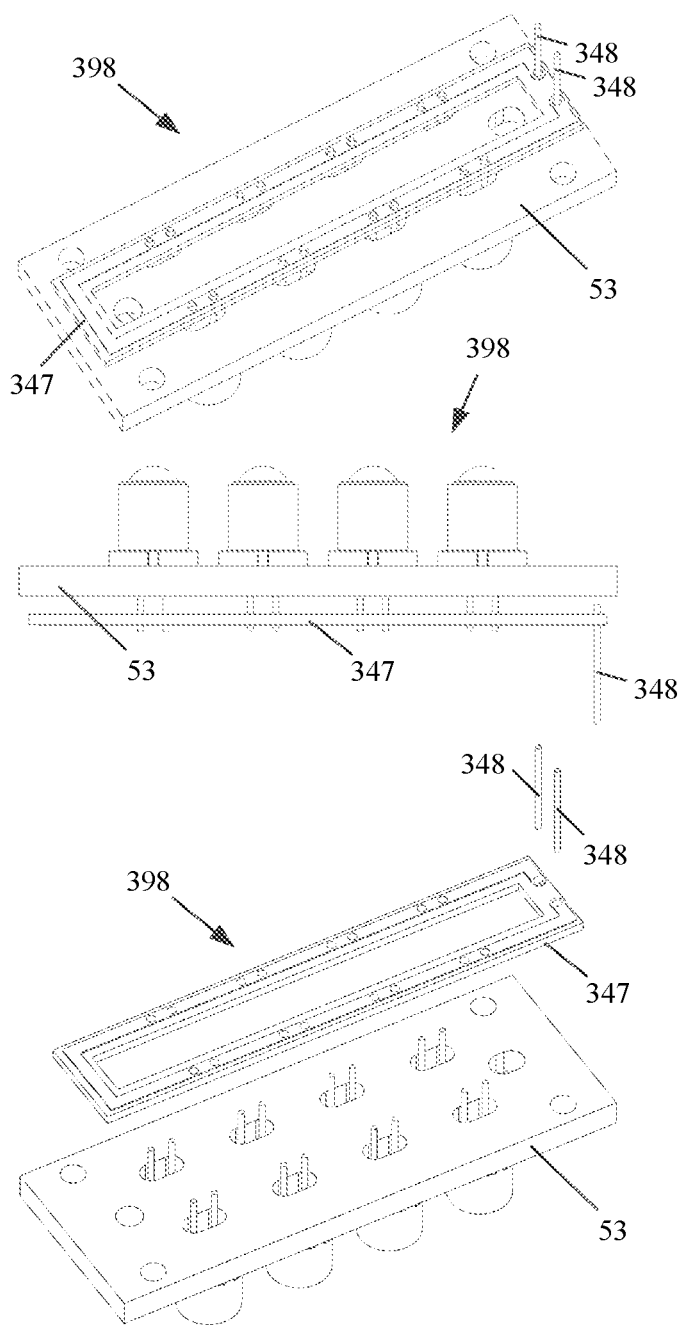
FIG. 159 illustrates a diode laser module 398 in accordance with some embodiments.

FIG. 159 shows several views (perspective view from the bottom at an angle, side view, exploded view seen from the bottom at an angle) of a diode laser module 398 in accordance with some embodiments. As shown in FIG. 159, the diode laser module 53 is mounted with a PCB (Printed Circuit Board) 347 and a conductive lead 348 on the bottom surface to form a diode laser module 398. The PCB 347 is welded with respective sets of pins 4 of eight diode lasers 11 in the diode laser module 53 to form a series or parallel circuit. At the same time, the PCB 347 is connected with the two conductive leads 348, and two conductive leads 348 are respectively connected with the anodes and cathodes of the series or parallel circuit formed by the eight diode lasers 11. The PCB 347 does not extend past the side surface of the diode laser module 53.

The PCB 347 and the conductive leads 348 are placed at the bottom side of the diode laser module 398 with the conductive leads 348 pointing downward away from the bottom surface of the diode laser module 398. The PCB 347 serves as the first conductive portion of the pin connector module of the diode laser module 53, and the conductive leads 348 serve as the second conductive portion of the pin connector module for the diode laser module 53.

The diode laser modules 53 and the diode laser modules 21 are very similar in use except for their different shapes. They may be used in conjunction with the liquid-cooled radiators based on the same principle.

In some embodiments, the diode laser modules 346 in the diode laser array module 356 and the diode laser array module 362 may all be replaced with the diode laser modules 398, and the heat sink 359 and the heat sink 364 will be respectively replaced with the heat sink 403 and the heat sink 404, such that the structural characteristic of the diode laser modules 398 can be matched to form new diode laser array modules (e.g., with recessed areas formed between the bottom surfaces of diode laser modules and the top surface of the liquid-cooled radiators to accommodate the PCB, conductive leads, or FPC that electrically connect the pins of different diode laser modules in a row of diode laser modules, when the bottom surfaces of the diode laser modules and the top surface of the liquid-cooled radiators are in close thermal contact with each other).

Figure 161:
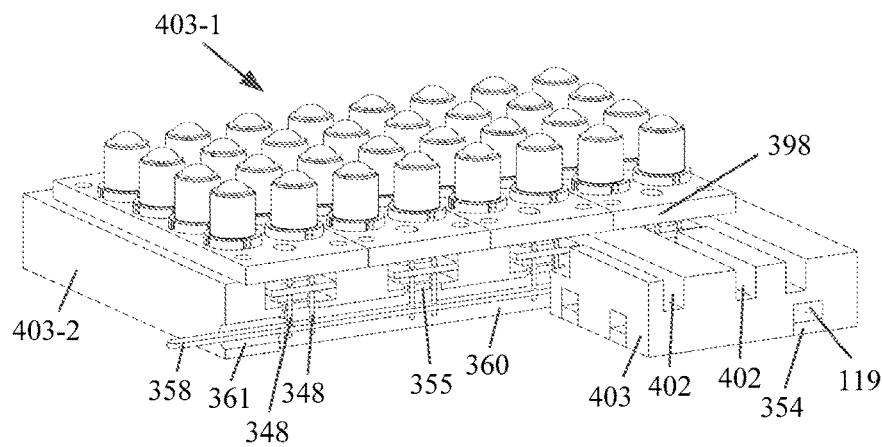

FIG. 160 shows a schematic perspective view of a heat sink 403 in accordance with some embodiments. FIG. 161 shows a partial cross-sectional view of a diode laser array module 403-1 made with the heat sink 403 in accordance with some embodiments. As shown in FIGS. 160-161, the structural characteristic of the diode laser array module 403-1 is similar to that of the diode laser array module 356. The liquid-cooled radiator 403-2 includes a heat sink 403 and a water passage sealing plate 354. The principle of the other aspects is the same as that of the diode laser array module 356.

The PCBs 347 are placed in the corresponding grooves 402 in the top surface of the liquid-cooled radiator. The conductive leads 348 are passed through the holes 355 in the top surface of the liquid-cooled radiator into the horizontal through hole 361 that passes through at least one side surface of the liquid-cooled radiator. The conductive leads 348 of each diode laser module of a row of diode laser modules 398 are welded to the same PCB 358 within the through hole 361, and the end portion of the PCB 358 protrudes from the side surface of the liquid-cooled radiator from the through hole 361.

Figure 162:
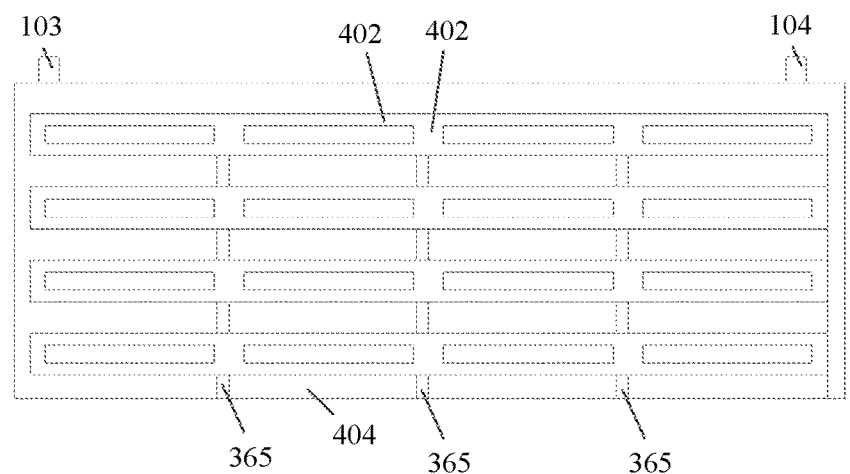
FIGS. 162-163 illustrate a diode laser array module 404-1 and components thereof in accordance with some embodiments.
Figure 163:
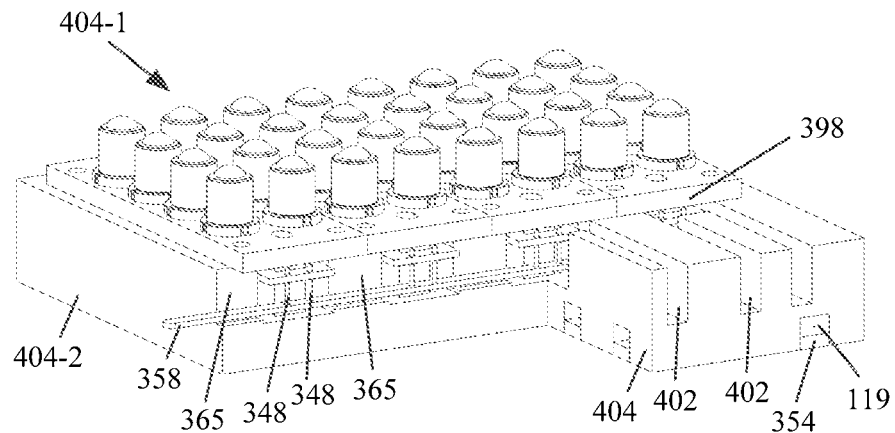

FIG. 162 shows a top view of a liquid-cooled radiator 404 that can be used to replace the liquid-cooled radiator 403 in the diode laser array module 403-1 to form a diode laser array module 404-1. FIG. 163 shows a partial cross-sectional view of the diode laser array module 404-1. As shown in FIGS. 162-163, the structural characteristic of the diode laser array module 404-1 is similar to that of the diode laser array module 362. The liquid-cooled radiator 404-2 includes a heat sink 404 and a water passage sealing plate 354. The top surface of the heat sink 404 includes a groove 365 in which the PCB 358 is placed and the PCB 358 is welded to the conductive leads 348 of a row of diode laser modules 398. The principle of the other parts is the same as that of the diode laser array module 362, which will be not repetitively described any longer. The PCBs 347 are placed in the corresponding grooves 402 and the PCBs 358 are placed in the grooves 365. The grooves 365 and grooves 402 are all open grooves in the top surface of the liquid-cooled radiator 404-2.

Figure 164:
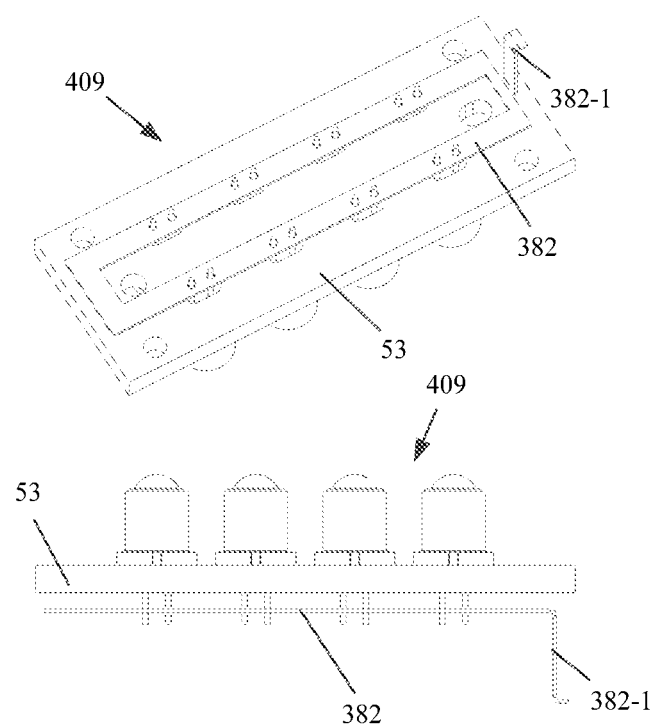
FIG. 164 illustrates a diode laser module 409 in accordance with some embodiments.
Figure 165:
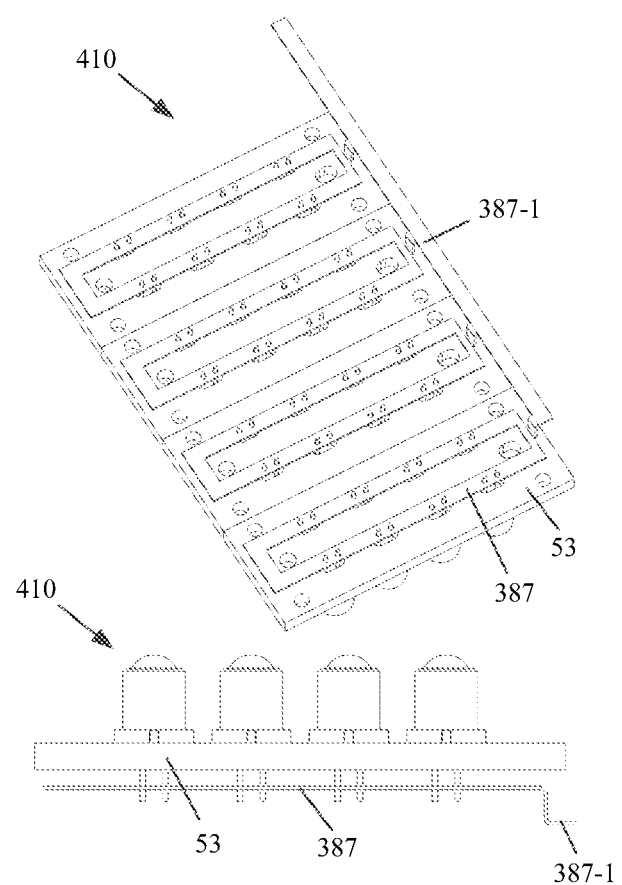
FIG. 165 is a schematic view of a diode laser module 410.
Figure 166:
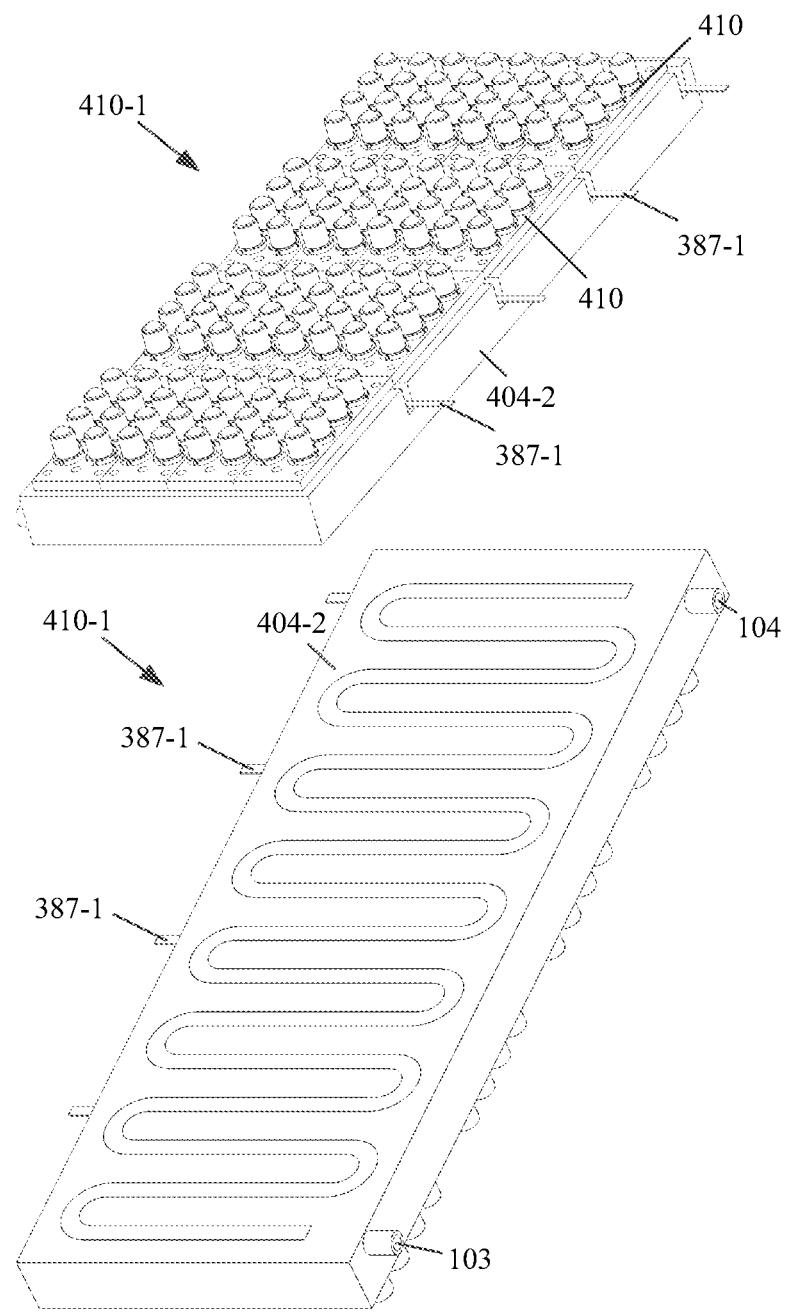
FIGS. 166-168 illustrate a diode laser array module 410-1 made with diode laser modules 410, and components thereof, in accordance with some embodiments.

FIG. 164 shows two views (perspective view from the bottom at an angle, and side view) of a diode laser module 409 that includes diode laser module 53 and an FPC 382 in accordance with some embodiments. FIG. 165 shows two views (perspective view from the bottom at an angle, and side view) of a diode laser module 410 that includes diode laser module 53 and an FPC 387 in accordance with some embodiments. FIG. 166 show a perspective view from the bottom at an angle of a row of diode laser modules 411 that includes diode laser modules 53 and a plurality of FPCs 391 in accordance with some embodiments. As shown in FIGS. 164-166, the diode laser module 53 may use the same FPC 382, FPC 387, and FPC 391 as the diode laser module 21 to respectively form a diode laser module 409, a diode laser module 410 and a diode laser module 411.

The using methods of the diode laser module 409, the diode laser module 410, and the diode laser module 411 are respectively the same as that of the diode laser module 381, the diode laser module 385 and the diode laser modules 392.

As shown in FIG. 164, in some embodiments, the diode laser module 53 is mounted with an FPC 382 on the back surface to form the diode laser module 409. The FPC 382 is welded with the pins 4 of the eight diode lasers 11 in the diode laser module 53 to form a series or parallel circuit, which is also connected with the anode and cathode on the FPC 382. The FPC 382 does not exceed the side surface of the diode laser module 53.

The vertical lead connectors 382-1 in the FPC 382 replace the conductive leads 348 and can be welded together with a PCB 358 to form a connected circuit. The FPC 382 is placed on the bottom surface of the diode laser module 53. The lead connector 382-1 is bent and extends downward away from the bottom surface of the diode laser module 53. Other aspects of the diode laser module 409 and its use is the same as that of the diode laser module 381, which will be not repetitively described any longer.

In some embodiments, a plurality of diode laser modules 53 may use the same FPC 387 as pin connector modules of the plurality of diode laser modules 53 to form the diode laser module array 410. As shown in FIG. 165, a plurality of diode laser module 53 is mounted with an FPC 387 on the back surface to form the diode laser module 410. Each rectangular loop portion of the FPC 387 is welded with the pins 4 of the eight diode lasers 11 in one of the diode laser modules 53 in a row of diode laser modules 53 to form a series or parallel circuit. The series or parallel circuits formed by each diode laser module 53 converge at the lead connector 387-1, and the lead connector 387-1 is part of the FPC 387. The lead connector 387-1 includes a plurality of vertical portions that serve as the second conductive portions of the pin connector modules of a row of diode laser modules 53, and the vertical portions all connect to the same horizontal third portion of the FPC 387. The lead connector 387-1 is placed at the bottom of the diode laser module array 410. The vertical portions of the lead connector 387-1 reside in the channel formed between the bottom surfaces of the diode laser modules and the top surface of the liquid-cooled radiator, and the horizontal portion of the lead connector 387-1 resides in the linear groove 365 formed in the top surface of the liquid-cooled radiator. The principle of the diode laser module 410 is the same as that of the diode laser module 385, which will be not repetitively described any longer.

Figure 167:
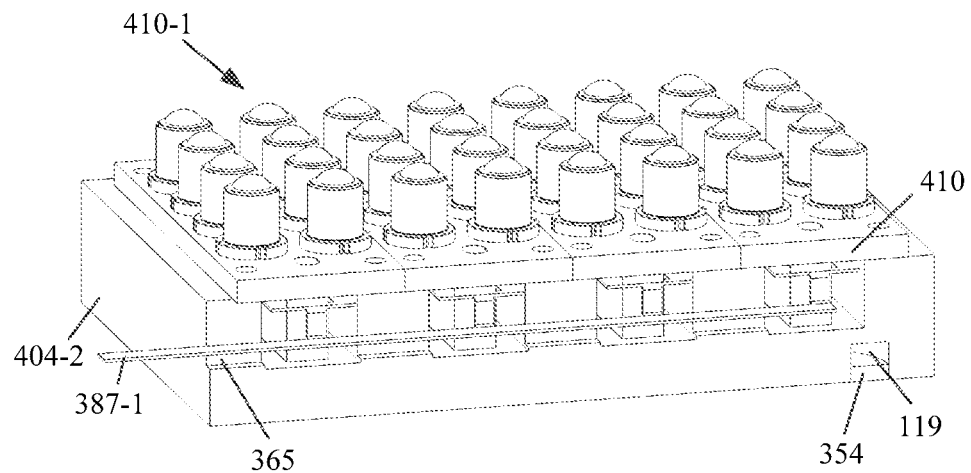
Figure 168:
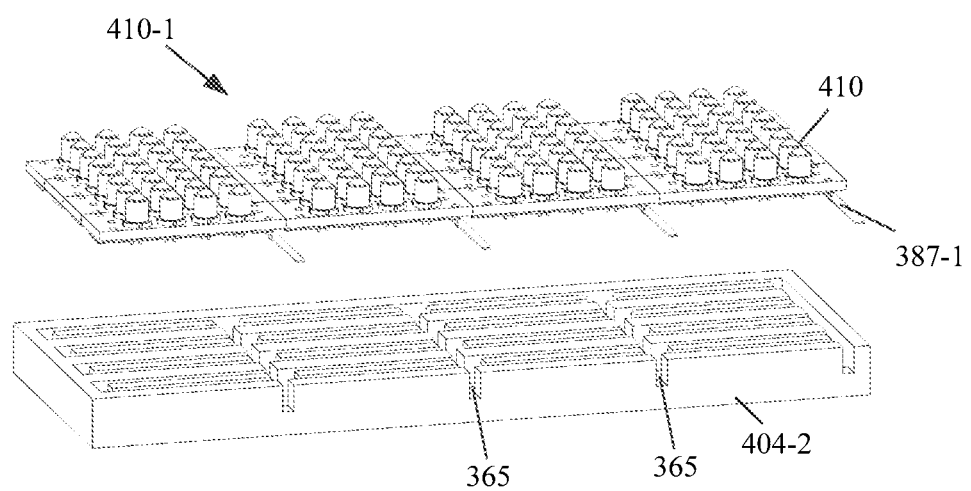

FIG. 166 shows two perspective views (view from the top at an angle, and view from the bottom at an angle) of a diode laser array module 410-1 made with multiple diode laser modules 410 (e.g., each includes a row of diode laser modules 53 and the FPC 387) in accordance with some embodiments. FIG. 167 shows a partial cross-sectional view of the diode laser array module 410. FIG. 168 shows an exploded view of the diode laser array module 410-1. As shown in FIGS. 166-168, the diode laser array module 410-1 includes a plurality of diode laser modules 410, and a liquid-cooled radiator 404-2. The bottom surfaces of the diode laser modules 53 are in close contact with the top surface of the liquid-cooled radiator 404-2, and heat conducting filling materials such as heat conducting paste are arranged on the contact surface. The heat produced during working of the diode laser modules 53 is transferred to the liquid-cooled radiator 404-2 for radiation. Coolant flows in from the inlet 103 and out from the outlet 104, which takes away the heat transferred to the liquid-cooled radiator 404-2. The coolant may be water, ethylene glycol, etc. The lead connector 387-1 of the FPC 387 is placed into the groove 365 formed in the top surface of the liquid-cooled radiator 404-2. The rectangular loop portions of the FPC 387 are placed in the corresponding grooves 402 formed in the top surface of the liquid-cooled radiator 404-2. The vertical portions of the lead connector 387-1 are placed in the intersections of the grooves 402 and the grooves 365 in the top surface of the liquid-cooled radiator 404-2.

The functions realized by the diode laser array module 410-1 is similar to that realized by the diode laser array module 404-1. By replacing the combination of the PCB 347, the conductive lead 348 and the PCB 358 with the FPC 387, the similar function is realized. Other aspects are the same and will be not repetitively described any longer.

Figure 169:
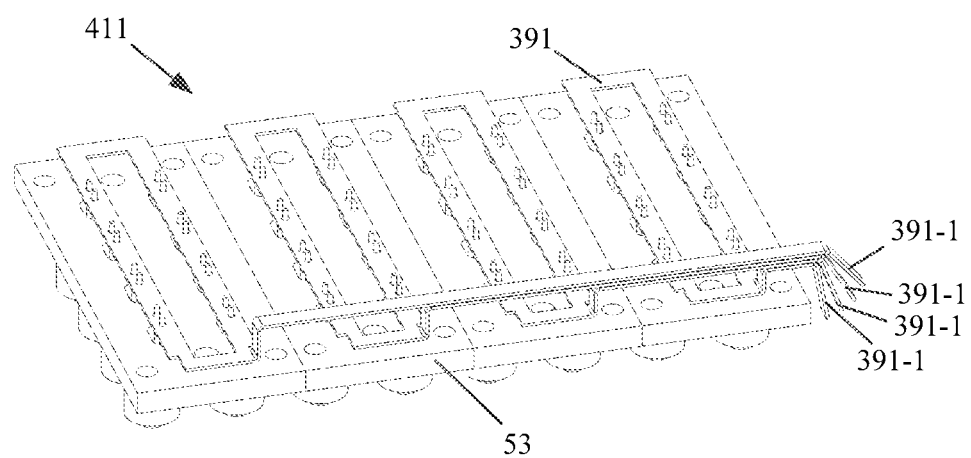
FIG. 169 illustrates a diode laser module array 411 in accordance with some embodiments.

As shown in FIG. 169, after a plurality of diode laser modules 53 are placed side by side, an FPC 391 is mounted on the back of each of the diode laser module 53 to form a diode laser module array 411.

The rectangular loop portion of the FPC 391 is welded with the pins 4 of the eight diode lasers 11 in each respective diode laser module 53 to form a series or parallel circuit. The anode and cathode of the circuit are guided by the lead connector 391-1 to designated positions to connect with other circuits (e.g., a driving circuit module). The lead connector 391-1 is part of the FPC 391. The lead connector 391-1 includes a vertical portion that is connected to the rectangular loop portion of the FPC 391 and includes a horizontal portion that is connected to the vertical portion of the lead connector 391-1.

The lead connector 391-1 of each FPC 391 is placed at the bottom of the adjacent diode laser modules 53; and adjacent lead connectors 391-1 are stacked together when they are extended horizontally in the same direction away from the diode laser array 411. The principle is the same as that of the diode laser module array 392, which will be not repetitively described any longer.

Figure 170:
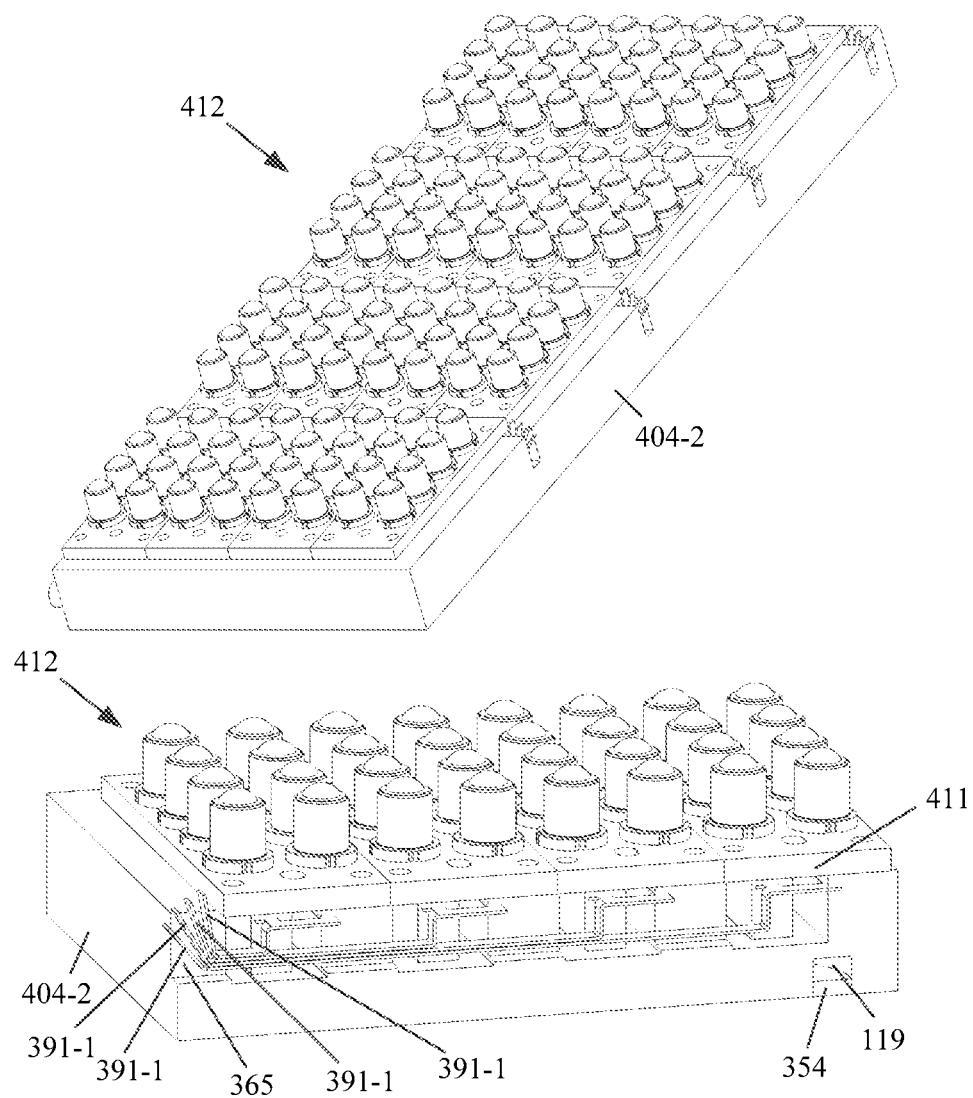
FIG. 170 illustrates a diode laser array module 412 made with multiple diode laser module arrays 411 in accordance with some embodiments.

FIG. 170 shows a perspective view (view from the top at an angle) and a partial cross-sectional view of a diode laser array module 412 formed using the diode laser array 411 in accordance with some embodiments. As shown in FIG. 170, the diode laser array module 412 includes a plurality of diode laser modules 411, and a liquid-cooled radiator 404-2. The bottom surfaces of the diode laser modules 53 are in close contact with the top surface of the liquid-cooled radiator 404-2, and heat conducting filling materials such as heat conducting paste are arranged on the contact surface. The heat produced during working of the diode laser modules 53 is transferred to the liquid-cooled radiator 404-2 for radiation. Coolant flows in from the inlet 103 and out from the outlet 104, which takes away the heat transferred to the liquid-cooled radiator 404-2. The coolant may be water, ethylene glycol, etc. The horizontal portions of the lead connectors 391-1 from the different diode laser modules 411 are placed into the grooves 365 in the top surface of the liquid-cooled radiator 404-2. The rectangular loop portions of the FPCs 391 are placed in the corresponding grooves 402 in the top surface of the liquid-cooled radiator. The horizontal portions of the lead connectors 391-1 for the FPCs 391 for the same row of diode laser modules 53 are stacked vertically and lying flat in a respective groove 365. End portions of the lead connectors 391-1 for the FPCs 391 for the same row of diode laser modules 53 all protrude out of the groove 365 near the side surface of the liquid-cooled radiator 404-2 where they can be connected to an external driving circuit.

Figure 171:
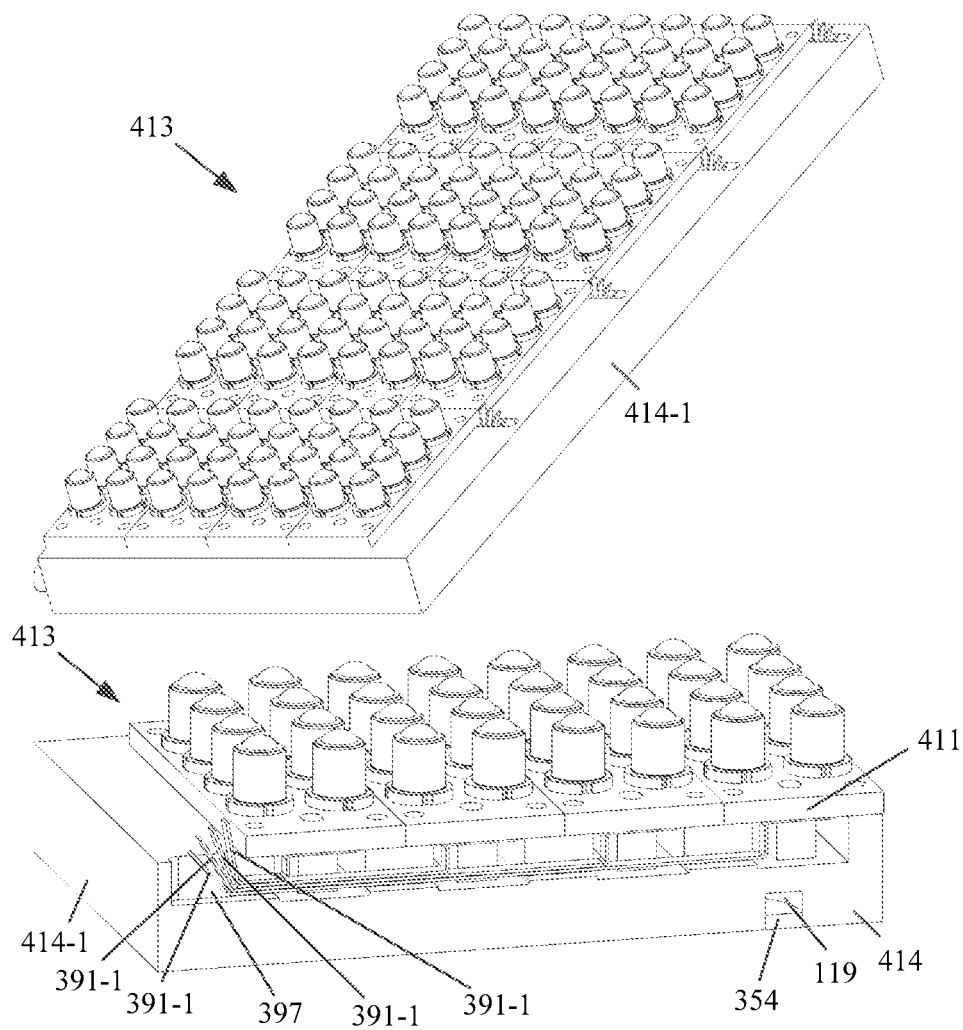
FIG. 171-172 is a schematic view of a diode laser array module 413 made with multiple diode laser module arrays 411, and components thereof, in accordance with some embodiments.

As shown in FIG. 171, the function realized by the diode laser array module 412 is similar to that realized by the diode laser array module 404-1. By replacing the combination of the PCB 347, the conductive lead 348 and the PCB 358 with the FPC 391, the similar function is realized.

In some embodiments, the groove 365 of the liquid-cooled radiator 404-2 in the diode laser array module 412 runs through one side surface of the liquid-cooled radiator 404-2, which is not conducive to the overall sealing of the diode laser array module 412. Therefore, the following solution may be adopted to improve the sealing performance. The liquid-cooled radiator 404-2 of the diode laser array module 412 is replaced with the liquid-cooled radiator 414-1 to form a diode laser array module 413, and other parts are identical, which will be not repetitively described any longer. The lead connector 391-1 of the FPC 391 is placed in the groove 397 in the top surface of the liquid-cooled radiator 414-1. The FPCs 391 are placed in the corresponding grooves 402 in the top surface of the liquid-cooled radiator 414-1.

Figure 172:
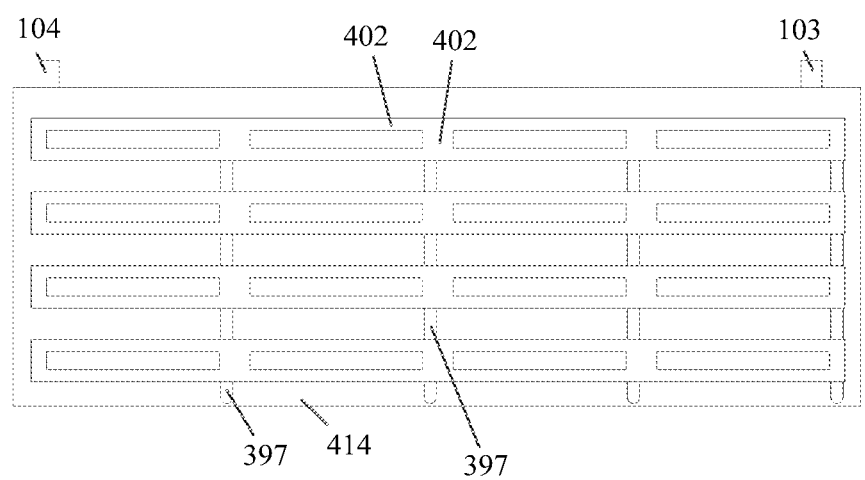

FIG. 172 shows a top view of the heat sink 414 of the liquid-cooled radiator 414-1. As shown in FIG. 171 and FIG. 172, the liquid-cooled radiator 414-1 includes the heat sink 414 and a water passage sealing plate 354. The water passage sealing plate 354 is embedded into the water passage 119 preformed in the bottom surface of the heat sink 414 and a sealed water passage is formed by bonding through adhesive or welding. As shown in FIG. 171 and FIG. 172, the groove 397 does not run through the side surfaces of the heat sink 414.

Figure 173:
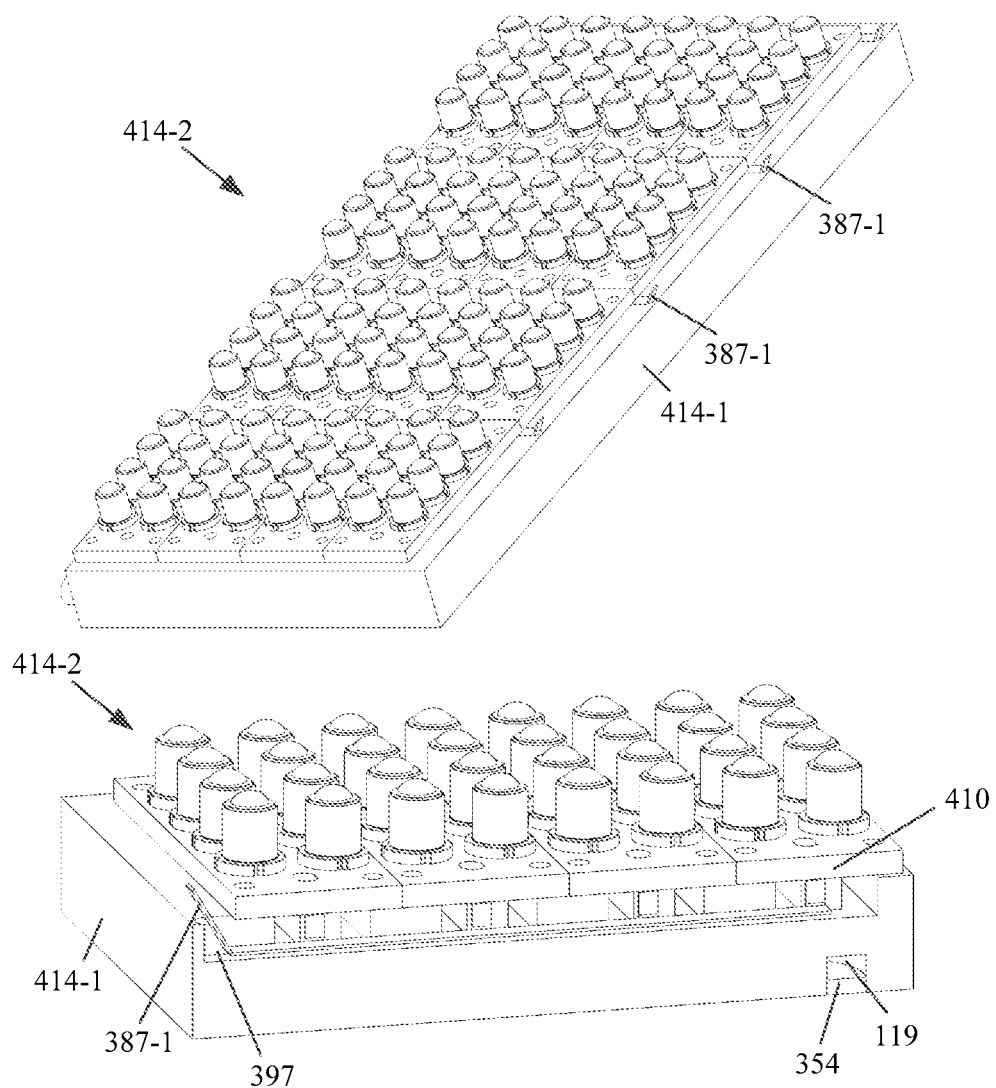
FIG. 173 illustrates a diode laser array module 414-2 in accordance with some embodiments.

FIG. 173 shows a perspective view of a diode laser array module 414-2 that includes the liquid-cooled radiator 414-1, and a partial cross-sectional view of the diode laser array module 414-2. As shown in FIG. 173, the diode laser module array 411 in the diode laser array module 413 may be replaced with the diode laser module array 410 to form the diode laser array module 414-2; wherein the lead connector 387-1 in the diode laser module array 411 is bent relative to the rectangular loop portions of the FPC 387, and then the horizontal portion of the lead connector 387-1 is bent relative to the vertical portions of the lead connector 387-1. Other aspects of its essence and performance are not changed. The horizontal portion of the lead connector 387-1 is placed into the corresponding groove 397 in the top surface of the liquid-cooled radiator 414-1. The rectangular loop portions of the FPC 387 are placed in the corresponding grooves 402 in the top surface of the liquid-cooled radiator 414-1.

The above-mentioned solutions are not only applicable to diode laser modules 53, but also applicable to other diode laser modules that are made using other types of diode lasers, and that may or may not have recessed areas on their bottom surfaces.

In all the above-mentioned solutions, the circuit is mounted at the bottom of the diode laser module; however, a diode laser array module can also be formed by mounting the circuit at the outer side of the diode laser module. Such a structure is relatively simple to make, thus reducing manufacturing costs.

Figure 175:
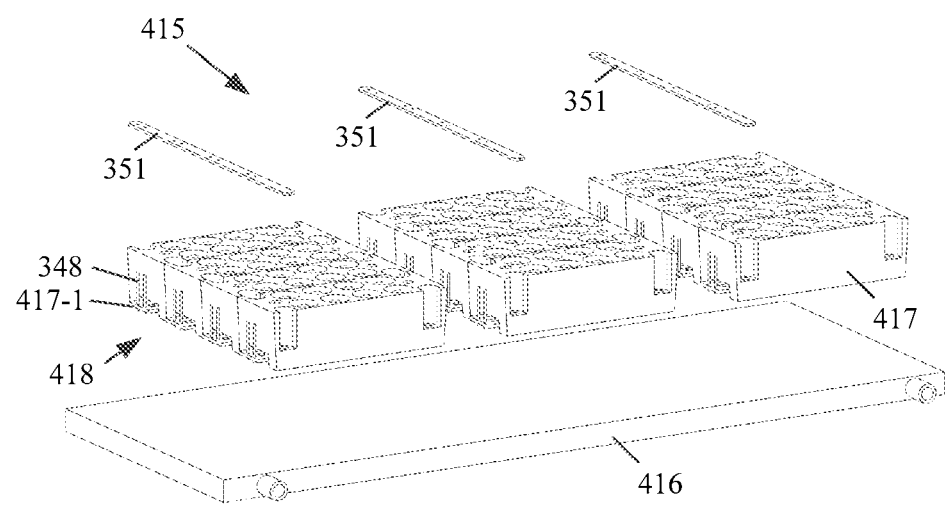

FIG. 174 shows perspective views (view from the top at an angle, view from the bottom at an angle) of a diode laser array module 415 in accordance with some embodiments. FIG. 175 shows an exploded view of the diode laser array module 415. As shown in FIG. 174, FIG. 175, the diode laser array module 415 includes a diode laser module array 418 comprising a plurality of diode laser modules 417 (shown in FIG. 176) arranged in multiple rows, a liquid-cooled radiator 416, and a plurality of PCBs 351. The bottom surfaces of the diode laser modules 21 in the diode laser array 418 are in close contact with the top surface of the liquid-cooled radiator 416, and heat conducting filling materials such as heat conducting paste are arranged on the contact surface. The heat produced during working of the diode laser modules 21 is transferred to the liquid-cooled radiator 416 for radiation. Coolant flows in from the inlet 103 and out from the outlet 104, which takes away the heat transferred to the liquid-cooled radiator 416. The coolant may be water, ethylene glycol, etc.

The respective pairs of conductive leads 348 of the plurality of diode laser modules 417 are welded together with the same PCB 351 to form a connected circuit. The PCB 351 are placed above the top surface of the liquid-cooled radiator 416, away from the interface between the bottom surfaces of the diode laser modules 21 and the top surface of the liquid-cooled radiator 416. The PCB 417-1 that connects the pins of the diode lasers in the diode laser module 21 extends beyond the side surface of the diode laser module 21, and the conductive leads 348 are welded to the portion of the PCB 417-1 that extends out of the sides of the diode laser module 21, and the conductive leads 348 extend upward toward the top of the diode laser module 21. The conductive leads 348 for a row of diode lasers 417 are connected by the same PCB 351 at a location above the top surface of the liquid-cooled radiator 416 next to the side surfaces of the diode laser modules 21.

FIG. 174 shows two perspective views (view from the top at an angle, view from the bottom at an angle) of the diode laser array module 415. FIG. 175 is an exploded view of the diode laser array module 415. The liquid-cooled radiator 416 includes a heat sink 416-1 and a water passage sealing plate 354. The water passage sealing plate 354 is embedded into the preformed water passage 119 in the bottom surface of the heat sink 416-1 and a sealed water passage is formed by bonding through adhesive or welding.

Figure 176:
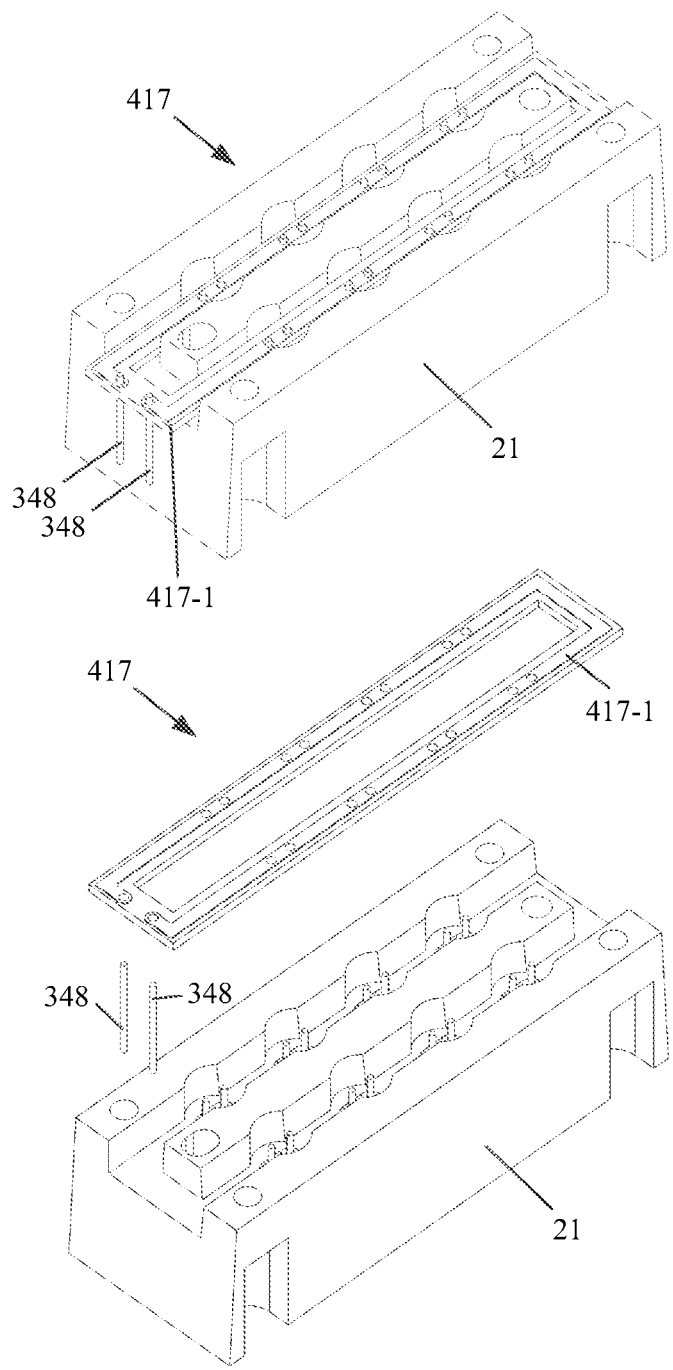
FIGS. 176-180 illustrate a plurality of diode laser modules and diode laser module arrays in accordance with various embodiments.

As shown in FIG. 176, the diode laser module 21 is mounted with a PCB 417-1 and a pair of conductive leads 348 on the back to form the diode laser module 417. The PCB 417-1 is welded with pins 4 of eight diode lasers 11 in the diode laser module 21 to form a series or parallel circuit. At the same time, the PCB 417-1 is connected with two conductive leads 348, and two conductive leads 348 are respectively connected with the anodes and cathodes of the series or parallel circuit formed by the eight diode lasers 11. The conductive lead 348 is located on the outside of the side surface of the diode laser module 21 and pointing upward away from the bottom side of the diode laser module 21. The PCB 417 reside within the grooves in the bottom surface of the diode laser module 21, and extend laterally beyond one side surface of the diode laser module 21.

In some embodiments, an FPC is used to replace the PCB 417-1 and the lead connectors 348 so that more flexible circuit layout can be realized.

Figure 177:
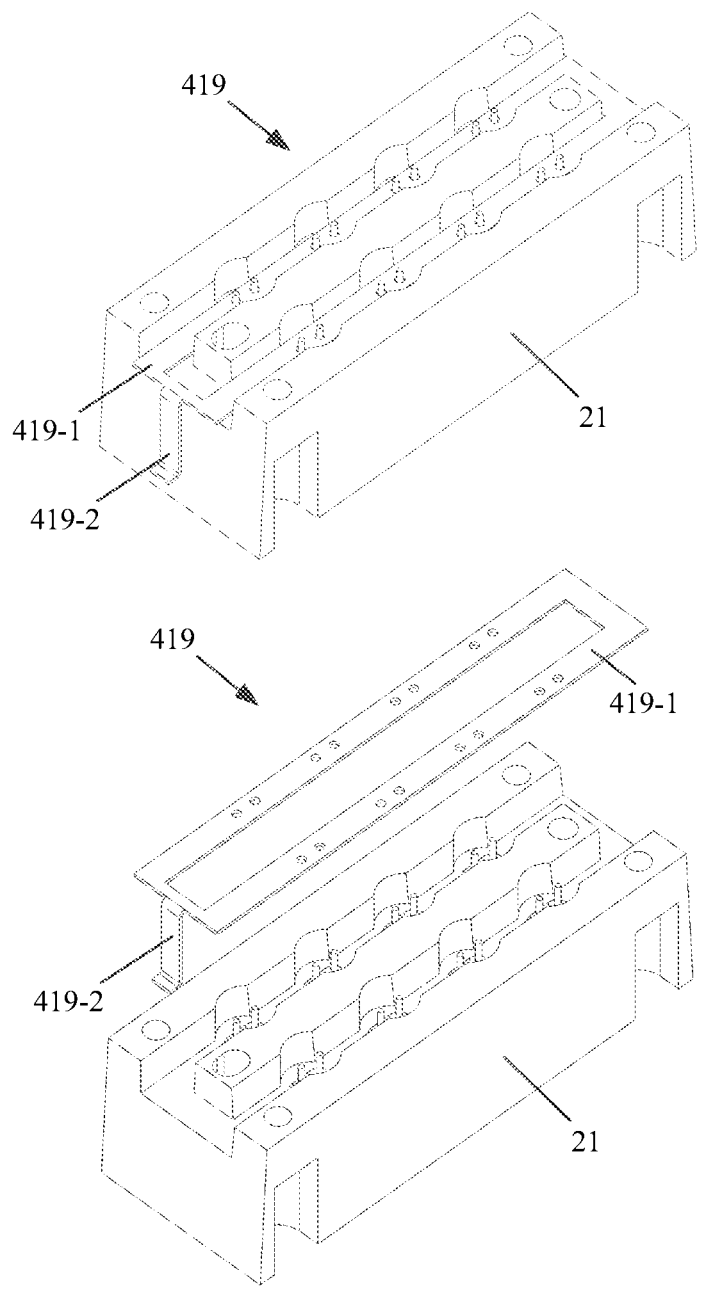

FIG. 177 shows the perspective view of the diode laser module 419 made with a diode laser module 21 and an FPC 419-1. FIG. 177 also includes an exploded view of the diode laser module 419. As shown in FIG. 177, the FPC 419-1 is mounted on the back surface of the diode laser modules 21 to form the diode laser module 419. The rectangular loop portion of the FPC 419-1 is welded with the pins 4 of the eight diode lasers 11 in the diode laser module 21 to form a series or parallel circuit, which is also connected with the anode and cathode on the FPC 419-1. The lead connector 419-2 of the FPC 419-1 is bent and located on the side surface of the diode laser module 21. The lead connector 419-2 in the FPC 419-1 replaces the pair of conductive leads 348, and can be welded together with the PCB 351 or PCB 358 to form a connected circuit.

The diode laser module 419 can replace the diode laser module 417 in the diode laser array module 415. The principle is the same, which will be not repetitively described any longer.

FIG. 178 shows a perspective view (view from the bottom at an angle) of a diode laser array 420 that is made with a row of diode laser modules 21 and an FPC 421 in accordance with some embodiments. FIG. 178 also includes an exploded view of the diode laser array 420. As shown in FIG. 178, a plurality of diode laser modules 21 form a diode laser module array 386 and the same FPC 421 is mounted on the back surface of the diode laser module array 386 to form a diode laser module 420. The FPC includes multiple rectangular loop portions, each of which is welded together with the pins 4 of eight diode lasers 11 in a respective diode laser module 21 of a row of diode laser modules 21 to form a series or parallel circuit. The series or parallel circuits formed by each diode laser module 21 converge at the lead connector 421-1 of the FPC 421, and the lead connector 421-1 is part of the FPC 421. The lead connector 421-1 includes a plurality of vertical portions that are connected to the rectangular loop portions of the FPC 421, and a horizontal portion of the lead connector 421-1. The lead connector 421-1 is bent relative to the rectangular loop portions of the FPC 421 and is located on the side surface of the diode laser module array 386. The lead connector 421-1 will be located above the top surface of the cooling module once the cooling module is attached to the bottom surfaces of the diode laser modules 420.

Figure 179:
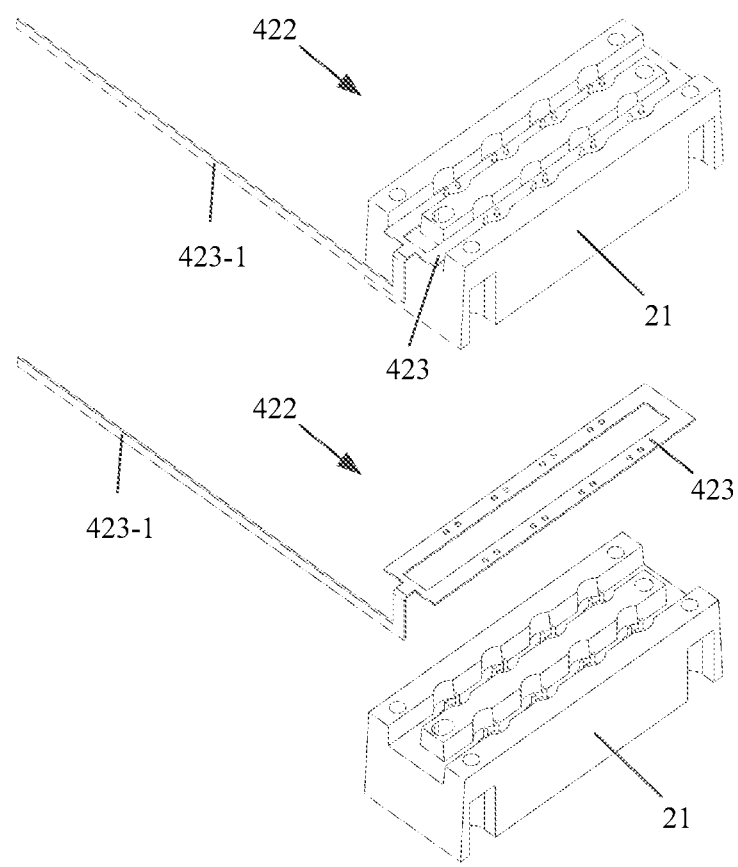

FIG. 179 shows a perspective view (view from the bottom at an angle) and an exploded view of a diode laser module 422 made with a diode laser module 21 and an FPC 423, in accordance with some embodiments. As shown in FIG. 179, the FPC 423 is mounted on the back surface of the diode laser modules 21 to form a diode laser module 422. The rectangular loop portion of the FPC 423 is welded together with the pin 4 of each diode laser 11 in the diode laser module 21 to form a series or parallel circuit. The anode and cathode of the circuit are guided by the lead connector 423-1 to designated positions to connect with other circuits. The lead connector 423-1 is part of the FPC 423. The lead connector 423-1 includes a vertical portion that is bent relative to the rectangular loop portions of the FPC 423 and is located on the side surface of the diode laser module 21. The lead connector 423-1 also includes a horizontal portion that is connected to the vertical portion and also lies flat on the side surface of the diode laser module 21.

Figure 180:
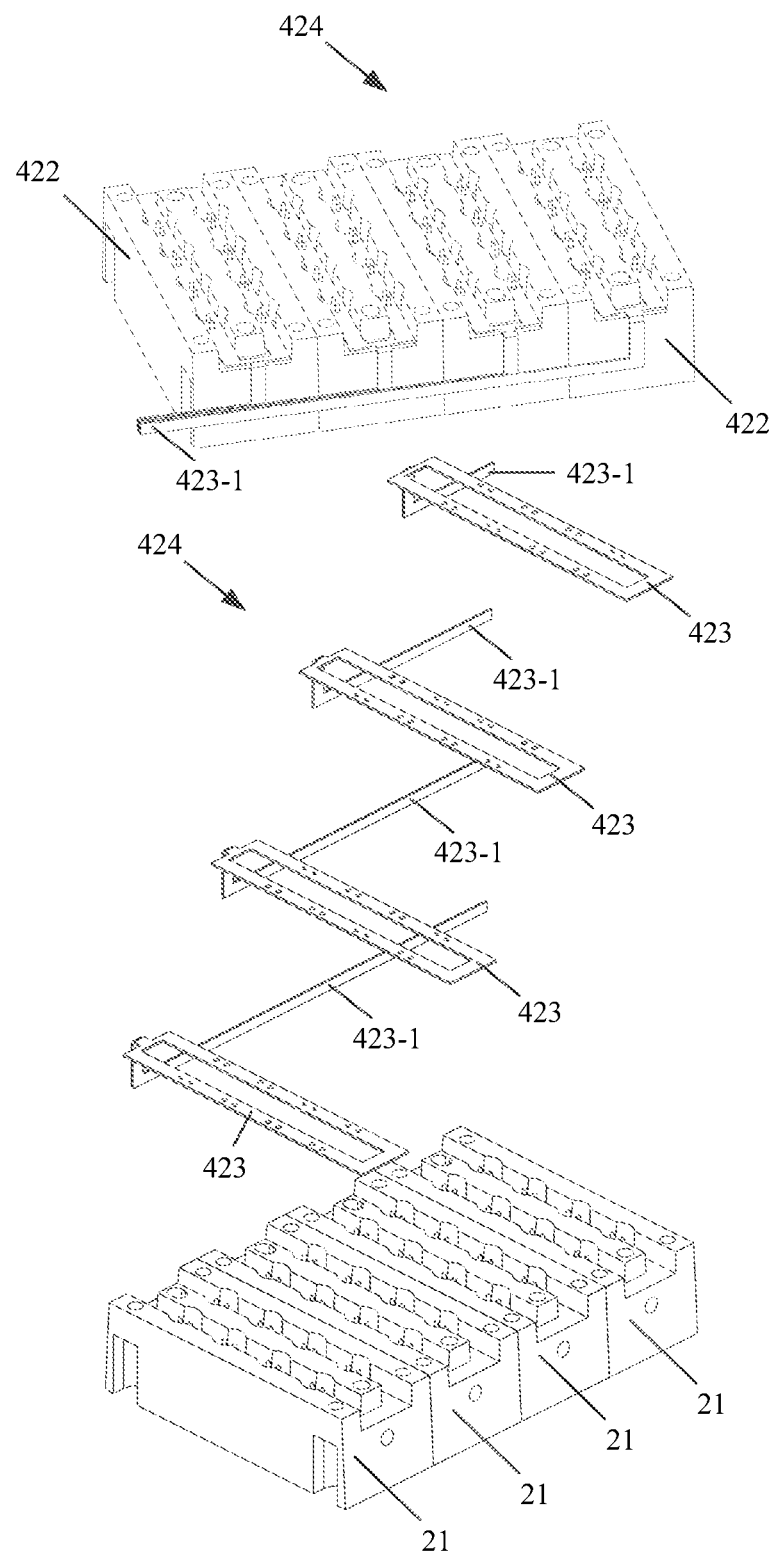

FIG. 180 shows a perspective view (view from the bottom at an angle) and an exploded view of a diode laser array module 424 made with a row of diode laser modules 422 in accordance with some embodiments. As shown in FIG. 180, a plurality of diode laser modules 422 are placed side by side to form a diode laser module array 424. The lead connector 423-1 of the FPC 423 of each diode laser module 422 is placed at the side surface of the adjacent diode laser module 21; and the adjacent lead connectors 423-1 are stacked together.

Figure 181:
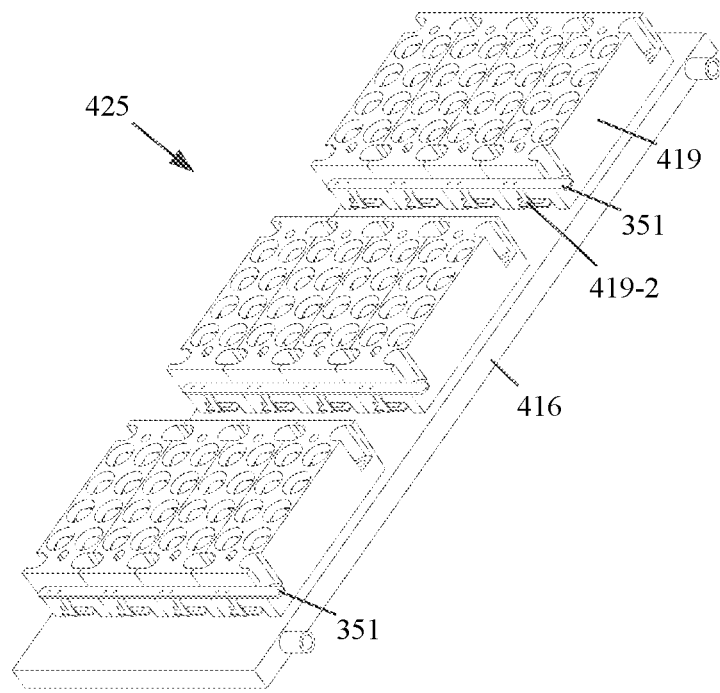
FIGS. 181-183 illustrate a plurality of diode laser array modules in accordance with various embodiments.

FIG. 181 shows a perspective view (view from the top at an angle) of a diode laser array module 425 made with multiple diode laser arrays 424 and a liquid-cooled radiator 410 in accordance with some embodiments. As shown in FIG. 181, the diode laser array module 425 includes a plurality of diode laser modules 419, a liquid-cooled radiator 416 and a plurality of PCBs 351. The bottom surfaces of the diode laser modules 21 are in close contact with the top surface of the liquid-cooled radiator 416, and heat conducting filling materials such as heat conducting paste are arranged on the contact surface. The heat produced during working of the diode laser modules 21 is transferred to the liquid-cooled radiator 416 for radiation. Coolant flows in from the inlet 103 and out from the outlet 104, which takes away the heat transferred to the liquid-cooled radiator 416. The coolant may be water, ethylene glycol, etc. The lead connectors 419-2 of the FPCs 419-1 of the plurality of diode laser modules 419 in the same row are connected with the same PCB 351 to form a connected circuit. The PCB 351 and the diode laser module 419 are placed on the same side of the liquid-cooled radiator 416 above the top surface of the liquid-cooled radiator and next to the side surfaces of the diode laser modules 21.

Figure 182:
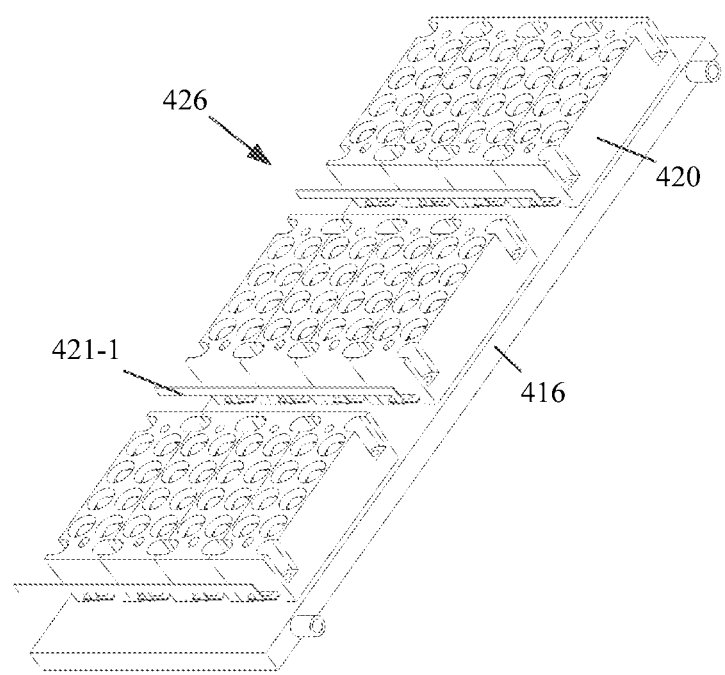

FIG. 182 shows a perspective view of a diode laser array module 426 made with multiple diode laser arrays 420 and a liquid-cooled radiator 416 in accordance with some embodiments. As shown in FIG. 182, the diode laser array module 426 includes a plurality of diode laser modules 420, and a liquid-cooled radiator 416. The bottom surfaces of the diode laser modules 21 are in close contact with the top surface of the liquid-cooled radiator 416, and heat conducting filling materials such as heat conducting paste are arranged on the contact surface. The heat produced during working of the diode laser modules 21 is transferred to the liquid-cooled radiator 416 for radiation. Coolant flows in from the inlet 103 and out from the outlet 104, which takes away the heat transferred to the liquid-cooled radiator 416. The coolant may be water, ethylene glycol, etc.

Figure 183:
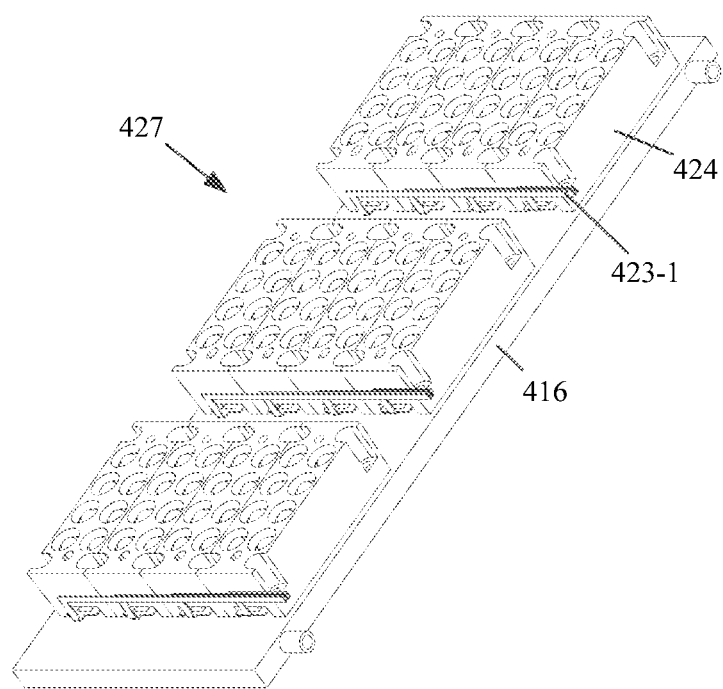

FIG. 183 shows a perspective view of a diode laser array module 426 made with diode laser arrays 420 and a liquid-cooled radiator 416 in accordance with some embodiments. As shown in FIG. 183, the diode laser array module 427 includes a plurality of diode laser modules 424, and a liquid-cooled radiator 416. The bottom surfaces of the diode laser modules 21 are in close contact with the top surface of the liquid-cooled radiator 416, and heat conducting filling materials such as heat conducting paste are arranged on the contact surface. The heat produced during working of the diode laser modules 21 is transferred to the liquid-cooled radiator 416 for radiation. Coolant flows in from the inlet 103 and out from the outlet 104, which takes away the heat transferred to the liquid-cooled radiator 416. The coolant may be water, ethylene glycol, etc.

The diode laser module 53 uses the same principle as the diode laser module 21 to realize a diode laser module similar to the diode laser module 417, the diode laser module 419, the diode laser module 420, and the diode laser module 422 in some embodiments.

Figure 184:
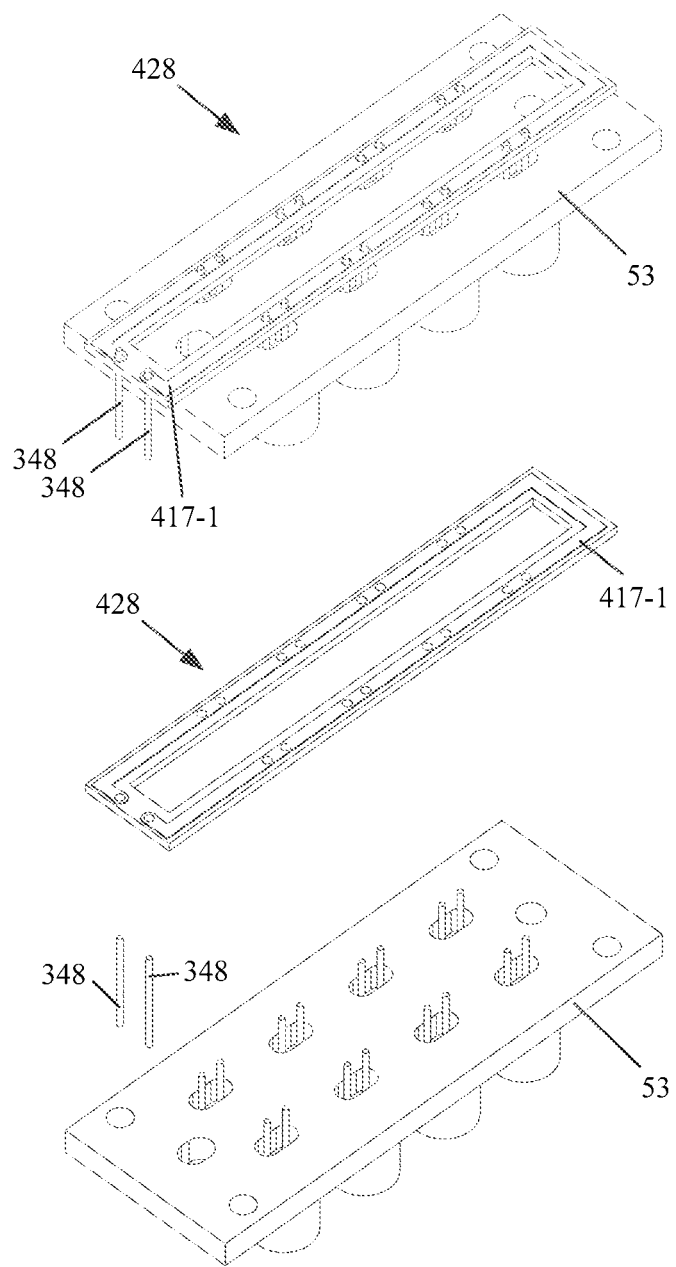
FIGS. 184-187 illustrate a plurality of diode laser modules and diode laser module arrays in accordance with various embodiments.

FIG. 184 shows a perspective view (view from the bottom at an angle) of a diode laser module 428 made with a diode laser module 53 and a PCB 417-1 and a pair of lead connectors 348, and an exploded view of the diode laser module 428, in accordance with some embodiments. The lead connectors 348 points upward away from the bottom surface of the diode laser module 428. As shown in FIG. 184, the diode laser module 53 is mounted with a PCB 417-1 and a pair of conductive leads 348 on the back to form a diode laser module 428. The PCB 417-1 is welded with pins 4 of eight diode lasers 11 in the diode laser module 53 to form a series or parallel circuit. At the same time, the PCB 417-1 is connected with two conductive leads 348, and two conductive leads 348 are respectively connected with the anodes and cathodes of the series or parallel circuit formed by the eight diode lasers 11. The conductive lead 348 is located next to the side surface of the diode laser module 53, extending upward away from the bottom surface of the diode laser module 53.

Figure 185:
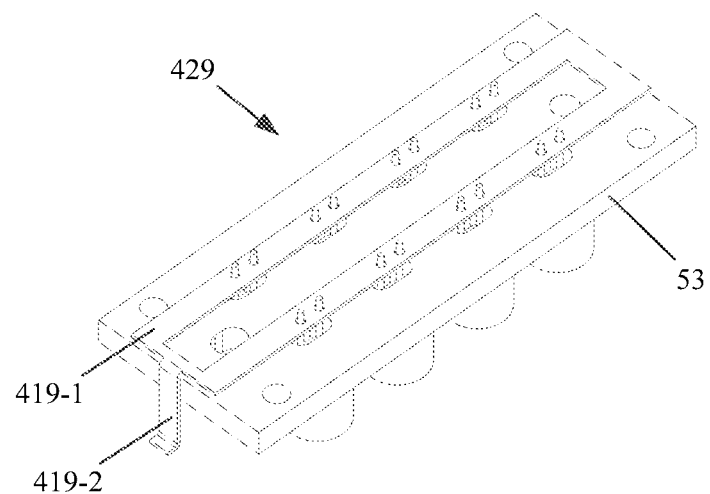

FIG. 185 shows a perspective view (view from the bottom at an angle) of a diode laser module 429 in accordance with some embodiments. As shown in FIG. 185, the diode laser module 53 is mounted with an FPC 419-1 on the back surface to form a diode laser module 429. The rectangular loop portion of the FPC 419-1 is welded with the pins 4 of the eight diode lasers 11 in the diode laser module 53 to form a series or parallel circuit, which is also connected with the anode and cathode on the FPC 419-1. The lead connector 419-2 of the FPC 419-1 is bent upward relative to the rectangular loop portion of the FPC 419-1 and is located on the side surface of the diode laser module 53. The lead connectors 419-2 in the FPC 419-1 replace the pair of conductive leads 348, and the lead connectors 419-2 of multiple diode laser modules 429 in the same row can be welded together with the same PCB 351 or PCB 358 to form a connected circuit.

Figure 186:
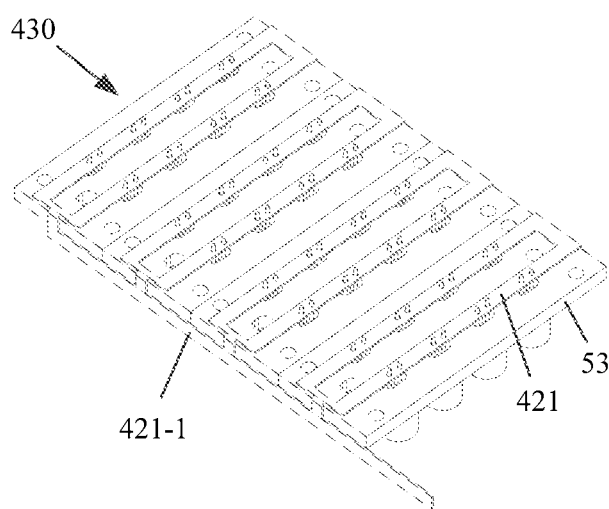

FIG. 186 shows a perspective view (view from the bottom at an angle) of a diode laser module array 430. As shown in FIG. 186, a plurality of diode laser modules 53 form an array of diode laser module 53 and the FPC 421 is mounted on the back surface of the array of diode laser modules to form a diode laser module array 430. The FPC 421 includes multiple rectangular loop portions and each of the rectangular loop portion of the FPC 421 is welded together with the pins 4 of eight diode lasers 11 in a respective diode laser module 53 in the diode laser module array 430 to form a series or parallel circuit. The series or parallel circuits formed by each diode laser module 53 converge at the lead connector 421-1, and the lead connector 421-1 is part of the FPC 421. The lead connector 421-1 includes a plurality of vertical portions that are connected to the plurality of rectangular loop portions of the FPC 421. The lead connector 421-1 includes a horizontal portion that is connected to the plurality of vertical portions of the lead connector 421-1. The lead connector 421-1 is bent relative to the rectangular loop portions of the FPC 421 and is located on the side surface of the diode laser module array 386. The vertical position of the horizontal portion of the lead connector 421-1 is above the interface between the bottom surfaces of the diode laser modules 53 and the top surface of the liquid-cooled radiator in a diode laser array module.

Figure 187:
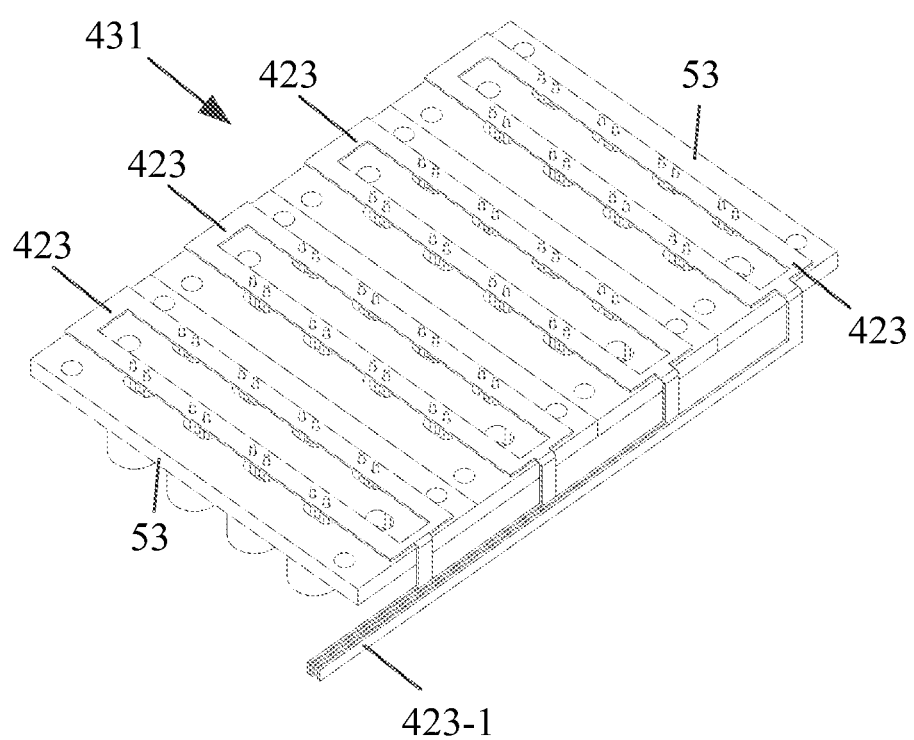

FIG. 187 shows a perspective view (view from the bottom at an angle) of a diode laser module array 431. As shown in FIG. 187, after a plurality of diode laser modules 53 are placed side by side, a plurality of FPCs 423 are mounted on the back surfaces of the plurality of diode laser modules 53 to form a diode laser module array 431. Each of the FPCs 423 includes a rectangular loop portion that is welded with the pins 4 of the eight diode lasers 11 in a respective diode laser module 53 in a row of diode laser modules 53 to form a series or parallel circuit. The anode and cathode of the circuit are guided by the lead connector 423-1 of each FPC 423 to designated positions to connect with other circuits. The lead connector 423-1 of each FPC 423 is part of the FPC 423. The lead connector 423-1 is bent relative to the rectangular loop portion of the FPC 423 and is located on the side surface of the diode laser module 53. The lead connector 423-1 of each FPC 423 is placed at the side surface of the adjacent diode laser module 53; and lead connectors 423-1 of the FPCs 423 for adjacent diode laser modules 53 are stacked together.

Figure 188:
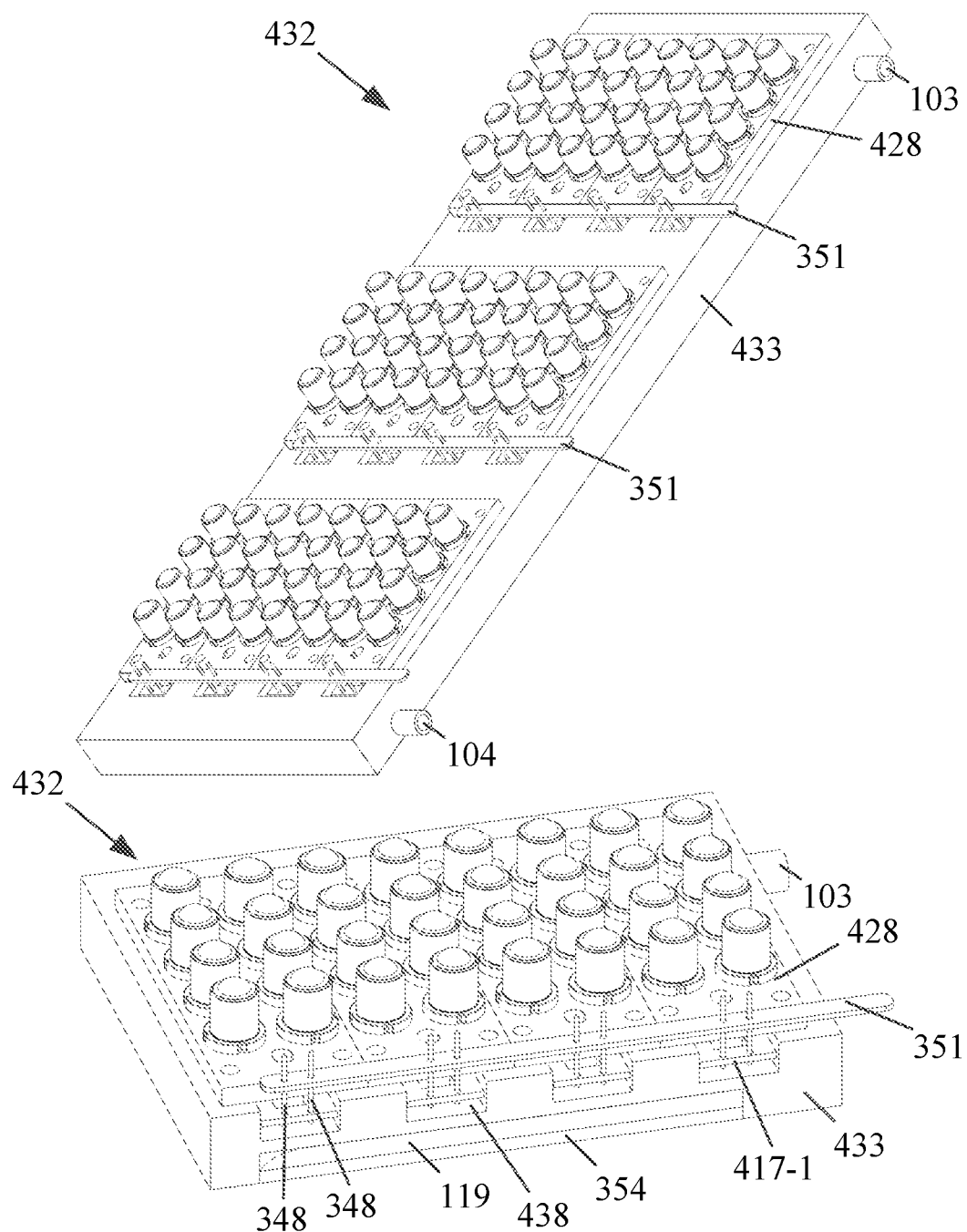
FIGS. 188-191 illustrate a plurality of diode laser array modules in accordance with various embodiments.

FIG. 188 includes a perspective view (view from the top at an angle) and a partial cross-sectional view of a diode laser array module 432 in accordance with some embodiments. As shown in FIG. 188, the diode laser array module 432 includes a plurality of diode laser modules 428, a liquid-cooled radiator 433 and a plurality of PCBs 351. The bottom surfaces of the diode laser modules 53 are in close contact with the top surface of the liquid-cooled radiator 433, and heat conducting filling materials such as heat conducting paste are arranged on the contact surface. The heat produced during working of the diode laser modules 53 is transferred to the liquid-cooled radiator 433 for radiation. Coolant flows in from the inlet 103 and out from the outlet 104, which takes away the heat transferred to the liquid-cooled radiator 433. The coolant may be water, ethylene glycol, etc. The respective pairs of conductive leads 348 of the plurality of diode laser modules 428 in the same row are welded together with the same PCB 351 to form a connected circuit. The PCB 351 and the diode laser modules 428 are respectively placed on the same side of the liquid-cooled radiator 433, above the top surface of the liquid-cooled radiator 433. The PCBs 471-1 are placed in the corresponding grooves 438 in the top surface of the liquid-cooled radiator 433. The liquid-cooled radiator 433 includes a heat sink 437 and a water passage sealing plate 354. The water passage sealing plate 354 is embedded into the preformed water passage 119 in the bottom surface of the heat sink 437 and a sealed water passage is formed by bonding through adhesive or welding.

Figure 189:
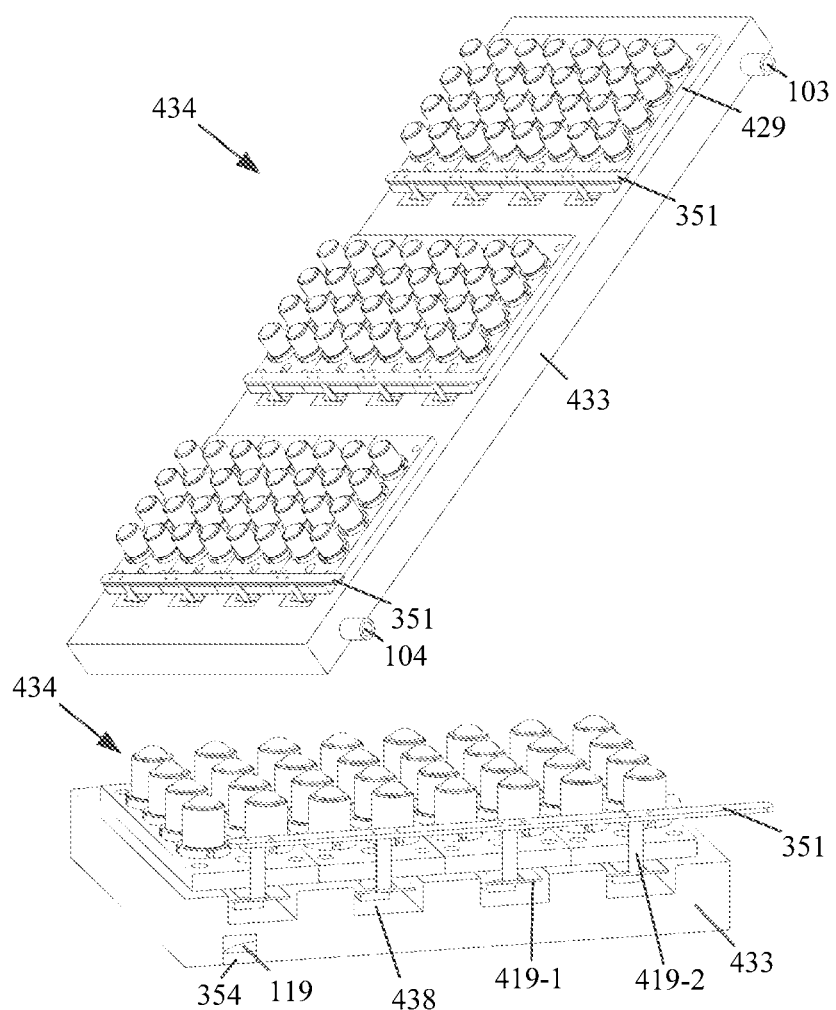

FIG. 189 includes a perspective view (view from the top at an angle) and a partial cross-sectional view of a diode laser array module 434 in accordance with some embodiments. As shown in FIG. 189, the diode laser array module 434 includes a plurality of diode laser modules 429, a liquid-cooled radiator 433 and a plurality of PCBs 351. The bottom surfaces of the diode laser modules 53 are in close contact with the top surface of the liquid-cooled radiator 433, and heat conducting filling materials such as heat conducting paste are arranged on the contact surface. The heat produced during working of the diode laser modules 53 is transferred to the liquid-cooled radiator 433 for radiation. Coolant flows in from the inlet 103 and out from the outlet 104, which takes away the heat transferred to the liquid-cooled radiator 433. The coolant may be water, ethylene glycol, etc. The lead connectors 419-2 of the FPCs 419-1 of the plurality of diode laser modules 429 in the same row are connected with the same PCB 351 to form a connected circuit. The PCB 351 and the diode laser module 429 are placed on the same side of the liquid-cooled radiator 416. The rectangular loop portions of the FPCs 419-1 are placed in the corresponding grooves 438 in the top surface of the liquid-cooled radiator 433.

Figure 190:
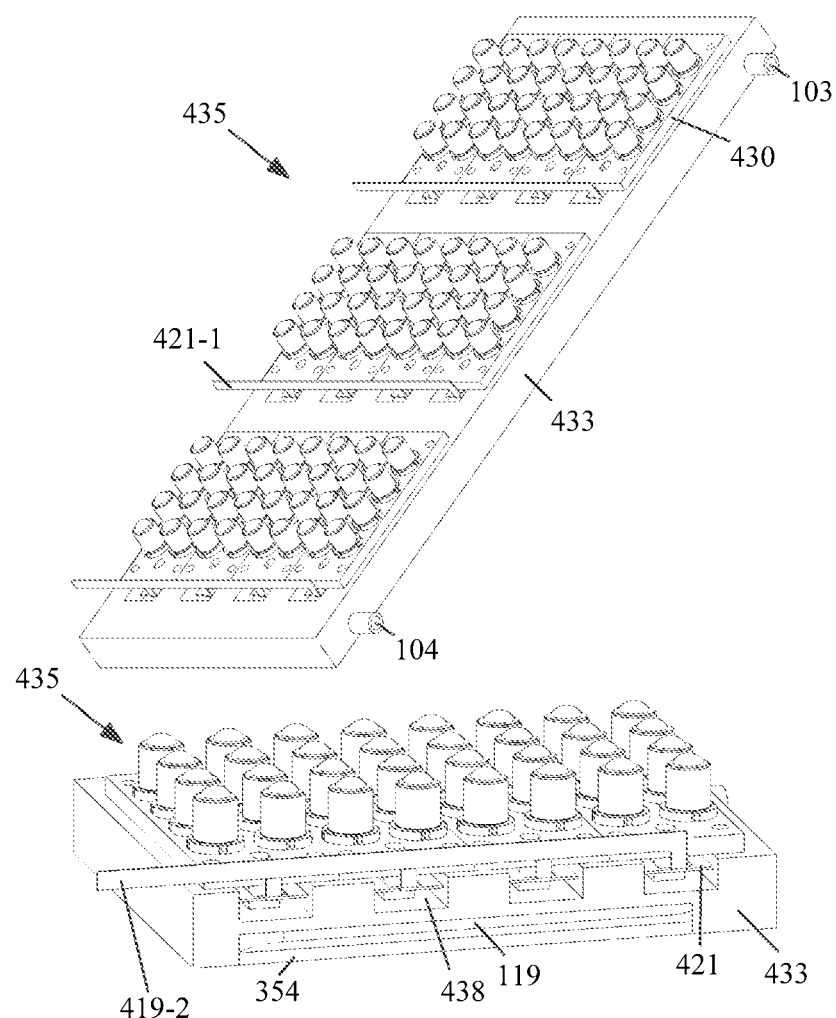

FIG. 190 includes a perspective view (view from the top at an angle) and a partial cross-sectional view of a diode laser array module 435 in accordance with some embodiments. As shown in FIG. 190, the diode laser array module 435 includes a plurality of diode laser modules 430, and a liquid-cooled radiator 433. The bottom surfaces of the diode laser modules 53 are in close contact with the top surface of the liquid-cooled radiator 433, and heat conducting filling materials such as heat conducting paste are arranged on the contact surface. The heat produced during working of the diode laser modules 53 is transferred to the liquid-cooled radiator 433 for radiation. Coolant flows in from the inlet 103 and out from the outlet 104, which takes away the heat transferred to the liquid-cooled radiator 433. The coolant may be water, ethylene glycol, etc. The rectangular loop portions of the FPCs 421 are placed in the corresponding grooves 438, and the lead connector 421-1 of the FPC 421 are placed on the side surface of the diode laser module array 430, above the interface between the diode laser modules and the liquid-cooled radiator.

Figure 191:
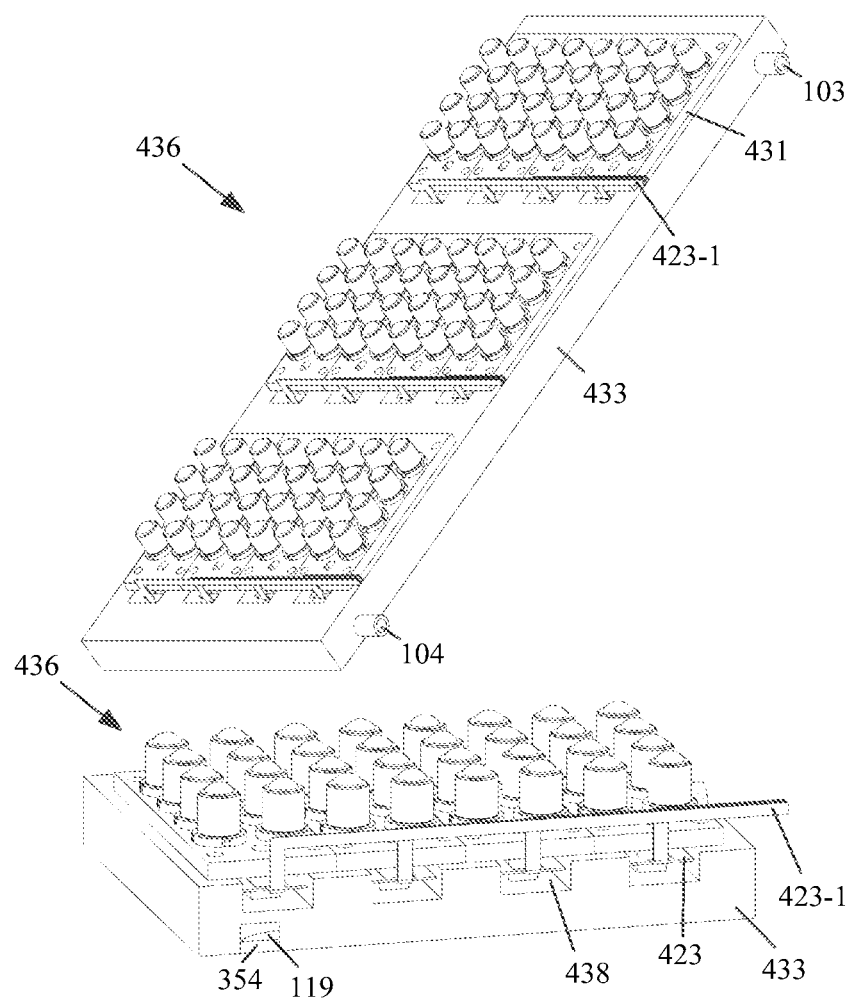

FIG. 191 includes a perspective view (view from the top at an angle) and a partial cross-sectional view of a diode laser array module 436 in accordance with some embodiments. As shown in FIG. 191, the diode laser array module 436 includes a plurality of diode laser modules 431, and a liquid-cooled radiator 433. The bottom surfaces of the diode laser modules 53 are in close contact with the top surface of the liquid-cooled radiator 433, and heat conducting filling materials such as heat conducting paste are arranged on the contact surface. The heat produced during working of the diode laser modules 53 is transferred to the liquid-cooled radiator 433 for radiation. Coolant flows in from the inlet 103 and out from the outlet 104, which takes away the heat transferred to the liquid-cooled radiator 433. The coolant may be water, ethylene glycol, etc. The rectangular loop portions of the FPCs 423 are placed in the corresponding grooves 438, and the lead connector 423-1 of the FPC 423 are placed on the side surface of the diode laser module array 436, above the interface between the diode laser modules and the liquid-cooled radiator. The horizontal portions of the lead connectors 423-1 of adjacent diode laser modules 53 in the same row are stacked together on the side of the diode laser modules 53

Figure 192:
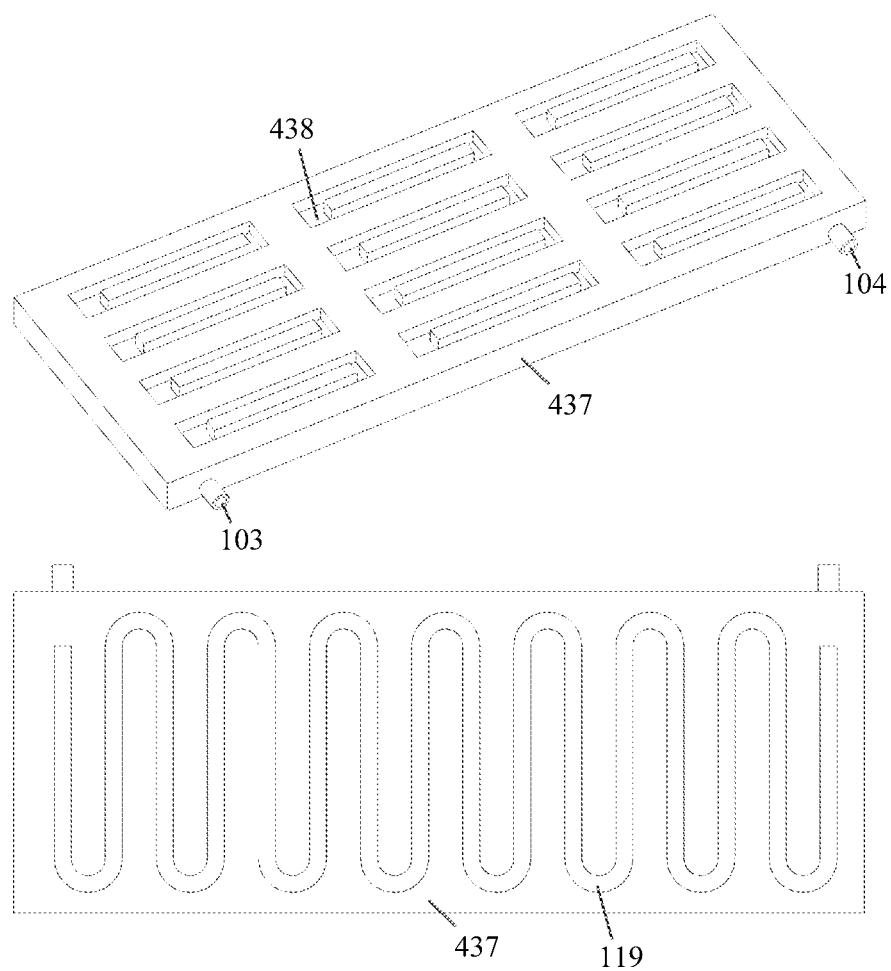
FIG. 192 illustrates a liquid-cooled radiator 437 in accordance with some embodiments.

FIG. 192 shows a perspective view of a liquid-cooled radiator 437 and a bottom view of the liquid-cooled radiator 437. As shown in FIG. 192, the rectangular portions of the FPCs 423 of the diode laser array modules 428, 429, 430, and 431 are placed in the corresponding grooves 438 to form a diode laser array module with the lead connectors residing above the top surface of the liquid-cooled radiator 437. The liquid-cooled radiator 433 includes a heat sink 437 and a water passage sealing plate 354. The water passage sealing plate 354 is embedded into the preformed water passage 119 in the bottom surface of the heat sink 437 and a sealed water passage is formed by bonding through adhesive or welding. The grooves 438 are used to accommodate the PCBs or FPCs set forth above.

The above-mentioned liquid-cooled radiators all can be manufactured by adopting different processes, and the former combination of the heat sink and the water passage sealing plate is optionally replaced with the upper and lower half parts, so as to reduce the difficulty in the manufacturing processes of the liquid-cooled radiators.

The liquid-cooled radiators described below are designed to replace the liquid-cooled radiator 404-2, as a demonstrative example.

Figure 193:
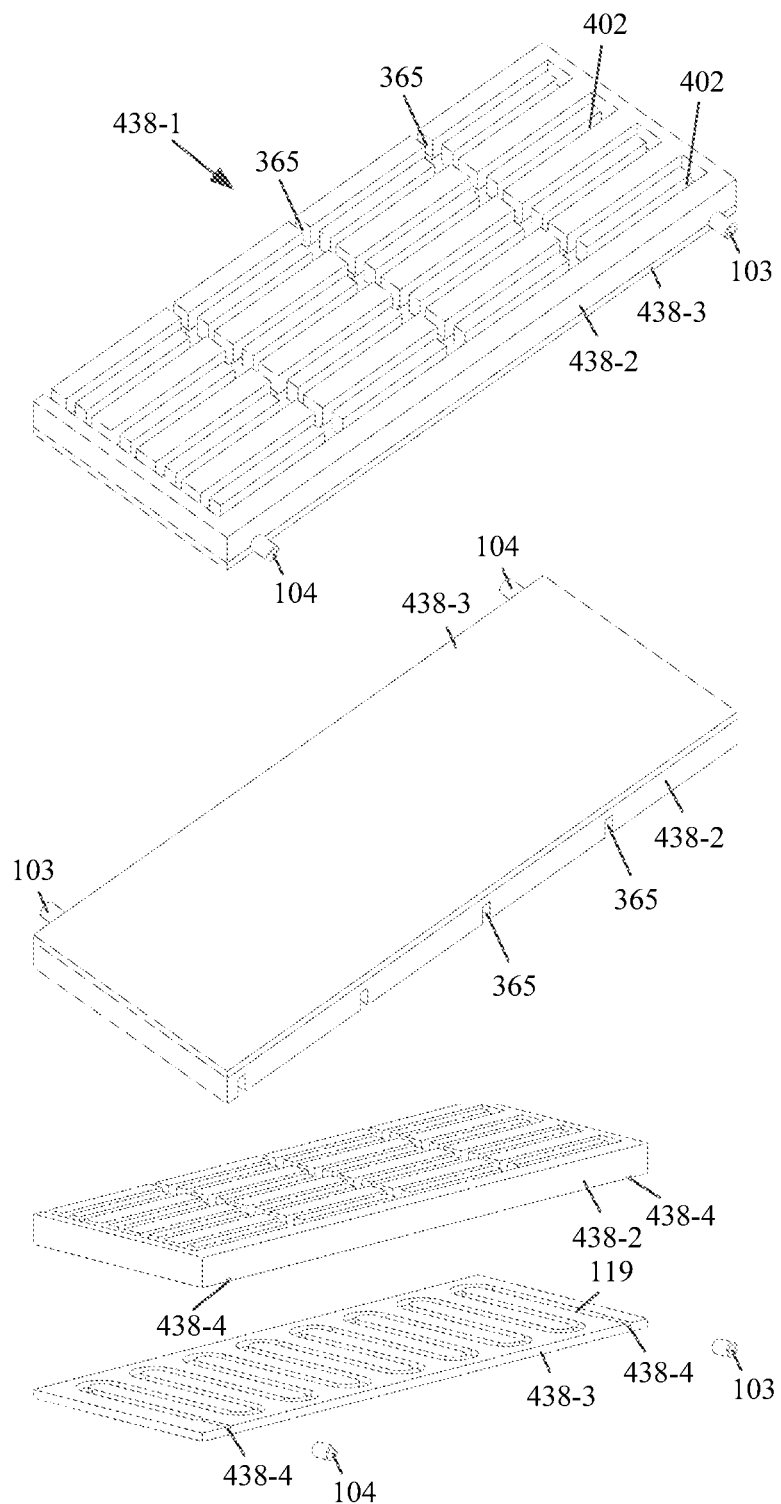
FIGS. 193-195 illustrate parts of the liquid-cooled radiator 438-1 in accordance with some embodiments.

FIG. 193 shows several views (perspective view from the top at an angle, perspective view from the bottom at an angle, exploded view) of a liquid-cooled radiator 438-1. The liquid-cooled radiator 438-1 includes an upper half part 438-2 and a lower half part 438-3. The top surface of the upper half part 438-2 for accommodating the diode laser module is totally the same as that of the heat sink 404, which will be not repetitively described any longer.

After the upper half part 438-2 and the lower half part 438-3 are aligned and tightly contacted and sealed, their respective water passages 119 form a complete water passage 119 communicated with the inlet 103 and the outlet 104, such that the coolant can flow inside without overflowing. The groove 438-4 is used to communicate the water passage 119 with the side surfaces of the upper half part 438-2 and the lower half part 438-3, and with the inlet 103 and the outlet 104.

Figure 194:
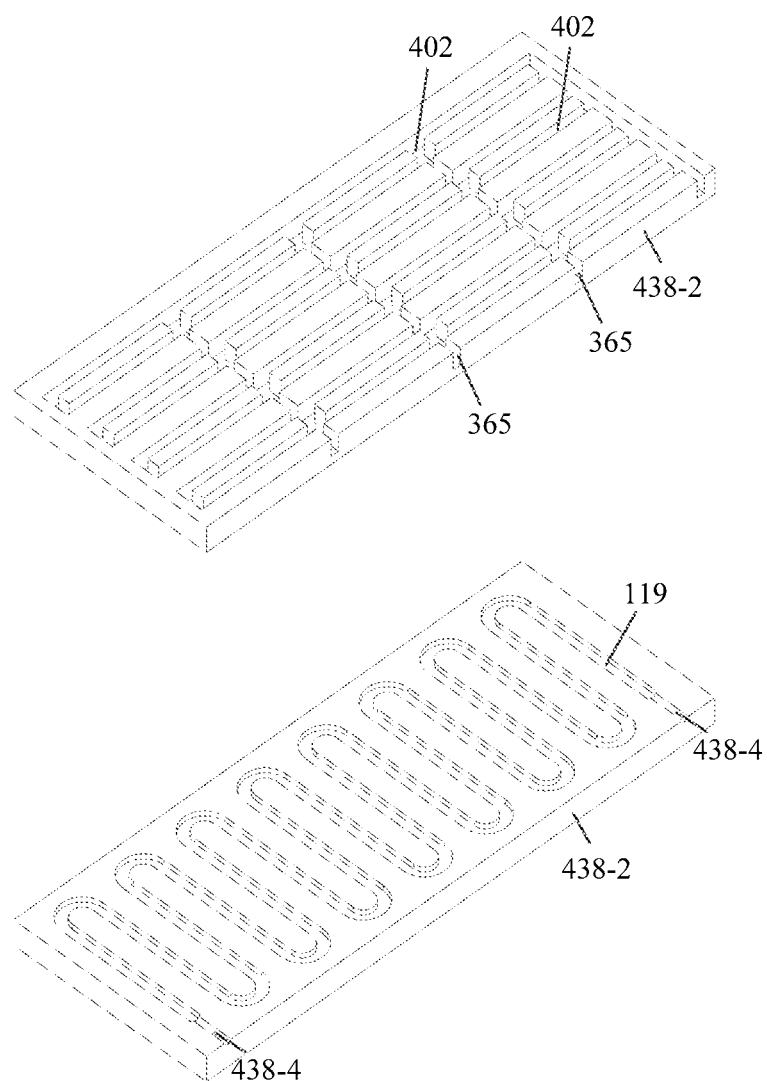
Figure 195:
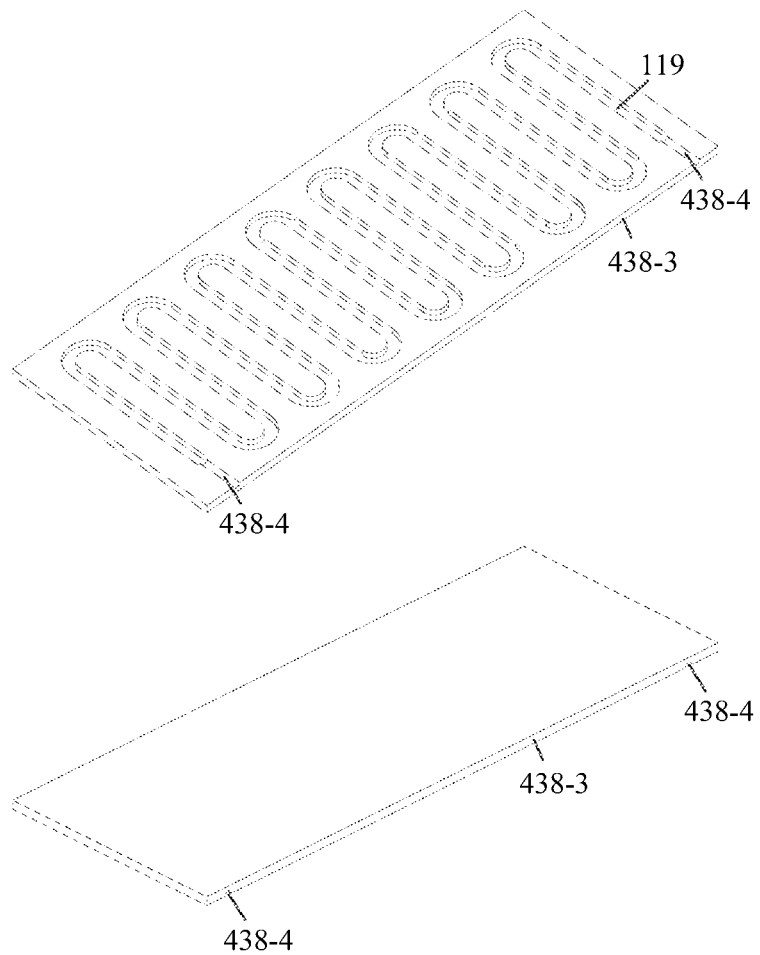

FIG. 194 shows two perspective views (view from the top at an angle, view from the bottom at an angle) of the top half part 438-2. FIG. 195 shows two perspective views (view from the top at an angle, view from the bottom at an angle) of the top half part 438-3. As shown in FIGS. 193-195, the liquid-cooled radiator 438-1 can replace the liquid-cooled radiator 404-2, and the above-mentioned other liquid-cooled radiators can be replaced with heat-pipe-cooled radiators based on the same principle, which will be not repetitively described any longer.

Figure 196:
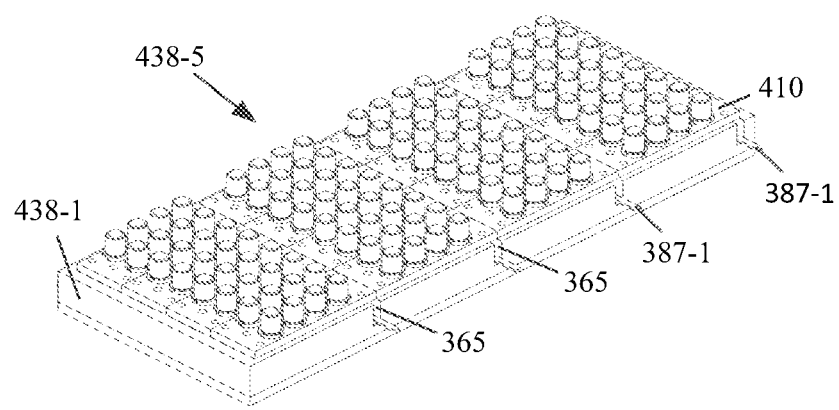
FIG. 196 is a schematic view of a diode laser array module 438-5 made with the liquid-cooled radiator 438-1 in accordance with some embodiments.

FIG. 196 shows a perspective view of a diode laser array module 438-5 in accordance with some embodiments. As shown in FIG. 196, the diode laser array module 438-5 includes a plurality of diode laser modules 410, and a liquid-cooled radiator 438-1. The bottom surfaces of the diode laser modules 53 are in close contact with the top surface of the upper half 438-2 of the liquid-cooled radiator 438-1, and heat conducting filling materials such as heat conducting paste are arranged on the contact surface. The heat produced during working of the diode laser modules 53 is transferred to the liquid-cooled radiator 438-1 for radiation. Coolant flows in from the inlet 103 and out from the outlet 104, which takes away the heat transferred to the liquid-cooled radiator 438-1. The coolant may be water, ethylene glycol, etc. The lead connector 387-1 for a row of diode laser modules is placed into the groove 365. The rectangular portions of the FPCs 387 are placed in the corresponding grooves 402 in the top surface of the top half part of the liquid-cooled radiator 438-1.

The diode laser array module 438-5 can replace the diode laser array module 410-1. Except that the cooled radiator is different, the other parts are totally the same, which will be not repetitively described any longer.

All the above-mentioned liquid-cooled radiators can be replaced with heat pipes and embedded liquid-filled pipes. The manufacturing process using heat pipes and embedded liquid-filled pipes is relatively simple and thus saving manufacturing cost.

The heat-pipe-cooled radiator and heat-pipe-cooled radiator described below are designed on the basis of replacing the liquid-cooled radiator 404-2 in a respective diode laser array module.

Figure 197:
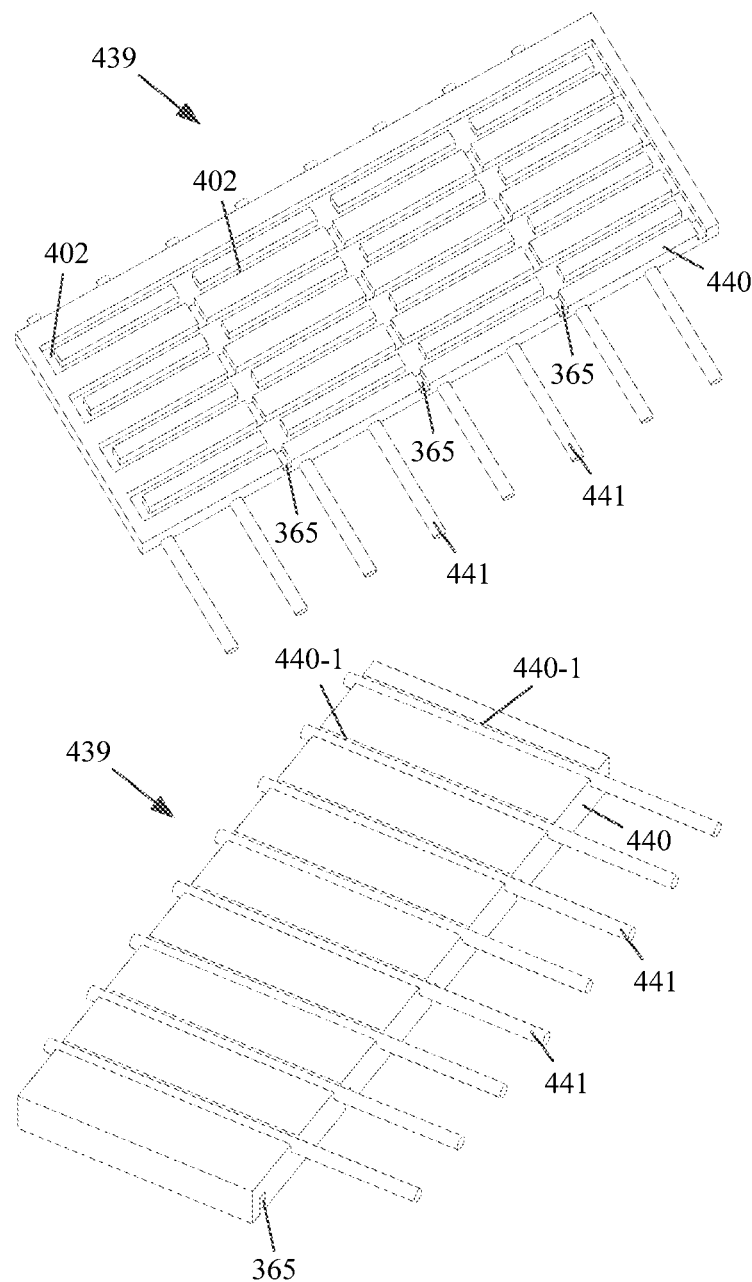
FIG. 197 illustrates a heat-pipe-cooled radiator 439 in accordance with some embodiments.

FIG. 197 shows two perspective views (view from top at an angle, and view from the bottom at an angle) of a cooled radiator 439 in accordance with some embodiments. As shown in FIG. 197, the heat-pipe-cooled radiator 439 includes a heat sink 440 and heat pipes 441. The heat pipes 441 are in close contact with the preformed grooves 440-1 on the bottom surface of the heat sink 440 to realize heat transfer from the heat sink 440 to the heat pipes 441, and the grooves 440-1 run through one or two side surfaces of the heat sink 440. The top surface of the heat sink 440 for placing the diode laser module is totally the same as that of the heat sink 404, which will be not repetitively described any longer.

The heat-pipe-cooled radiator 439 may replace the liquid-cooled radiator 404-2 in various embodiments of the diode laser array modules. The above-mentioned other liquid-cooled radiators may be replaced with the heat-pipe-cooled radiator based on the same principle, which will be not repetitively described any longer.

Figure 198:
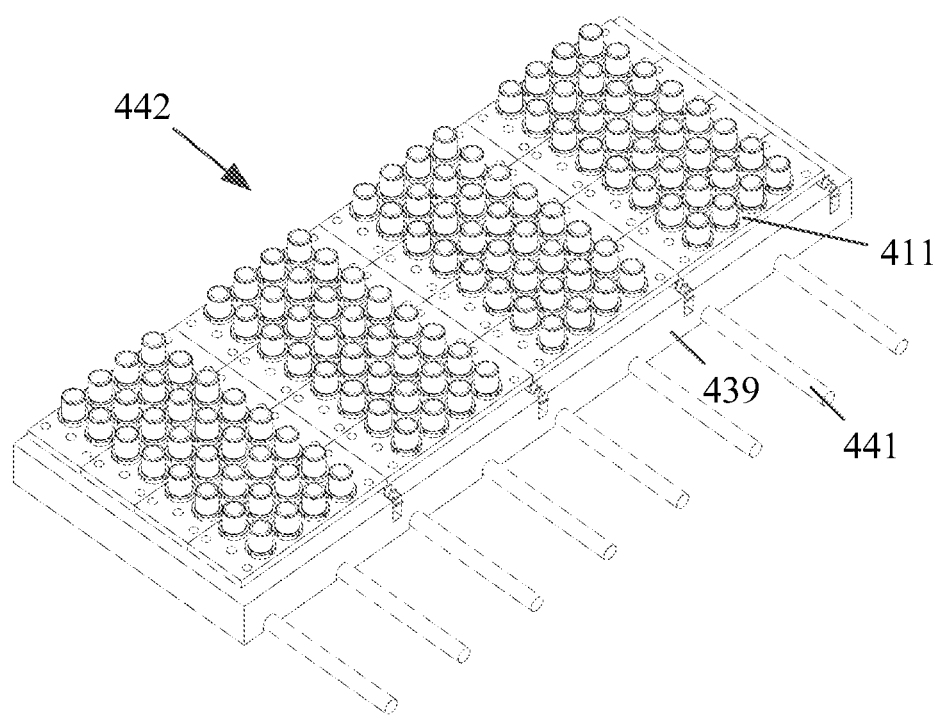
FIG. 198 illustrates a diode laser array module 442 made with the heat-pipe-cooled radiator 439 in accordance with some embodiments.

FIG. 198 shows a perspective view of a diode laser array module 442 that includes a heat-pipe-cooled radiator 439 in accordance with some embodiments. As shown in FIG. 198, the heat-pipe-cooled radiator 439 and the diode laser module 411 form the diode laser array module 442, which may replace the diode laser array module 412. Except for the cooled radiator, the other parts are totally the same, which will be not repetitively described any longer.

Figure 199:
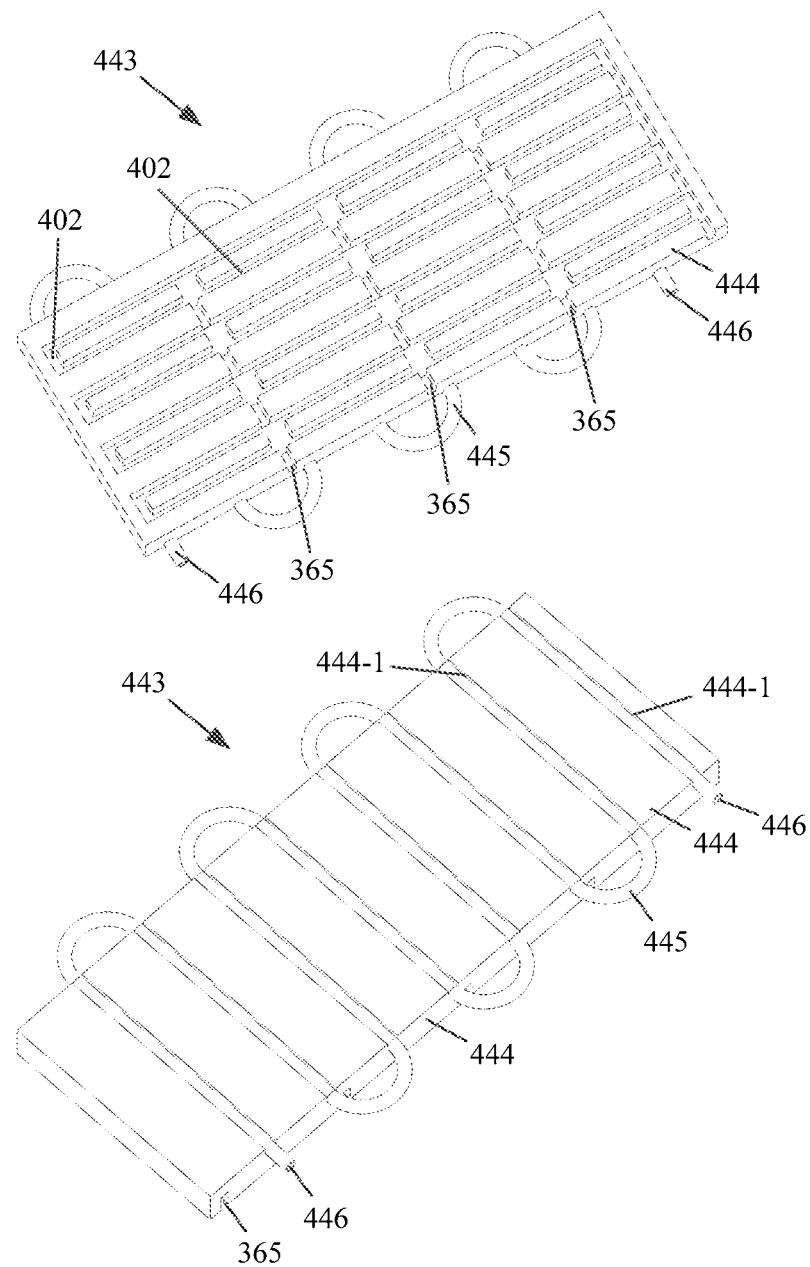
FIG. 199 illustrates an embedded-pipe-cooled radiator 443 in accordance with some embodiments.

FIG. 199 shows two perspective views (view from the top at an angle, view from the bottom at an angle) of liquid-cooled radiator 443. As shown in FIG. 199, the embedded-pipe-cooled radiator 443 includes a heat sink 444, liquid-filled pipes 445 and a liquid inlet and outlet 446. The pipes 445 are in close contact with the preformed grooves 444-1 in the bottom surface of the heat sink 444, to realize heat transfer from the heat sink 444 to the heat pipes 445, and the grooves 444-1 run through one or two side surfaces of the heat sink 444. The top surface of the heat sink 444 for placing the diode laser module is totally the same as that of the heat sink 404, which will be not repetitively described any longer. The embedded-pipe-cooled radiator 443 may replace the liquid-cooled radiator 404-2. The above-mentioned other liquid-cooled radiators may be replaced with the embedded-pipe-cooled radiators formed based on the same principle, which will be not repetitively described any longer.

Figure 200:
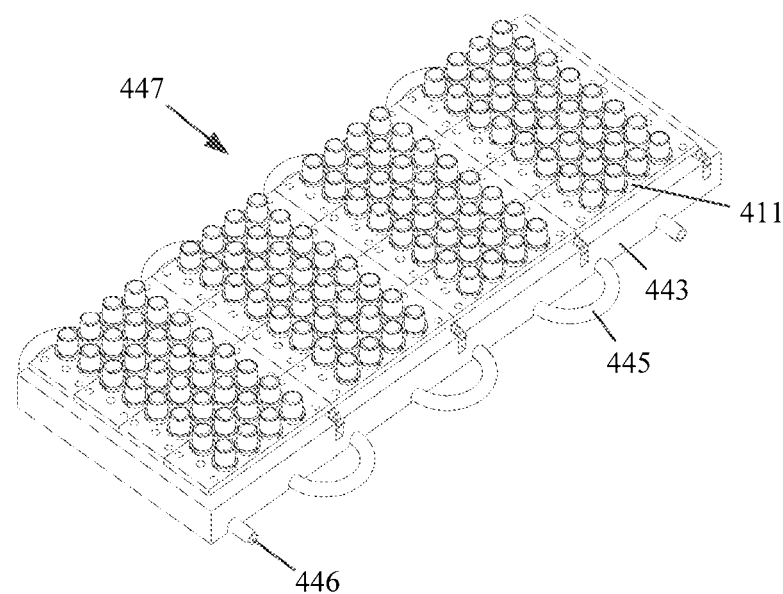
FIG. 200 illustrates a diode laser array module 447 made with the embedded-pipe-cooled radiator 443 in accordance with some embodiments.

FIG. 200 shows a perspective view of a diode laser array module 447 that includes a embedded-pipe-cooled radiator 443. As shown in FIG. 200, the embedded-pipe-cooled radiator 443 and the diode laser module 411 form a diode laser array module 447, which may replace the diode laser array module 412. Except for the cooled radiator, the other parts are totally the same, which will be not repetitively described any longer.

In all the above-mentioned solutions, any type of diode laser modules of the same type or different types may be combined in use and placed on both sides of the cooled radiator to form a double-sided cooling solution. The following is a demonstrative example. Using the same principle, the solution that diode laser modules are placed on both sides of any of the above-mentioned cooled radiators can be formed.

Figure 201:
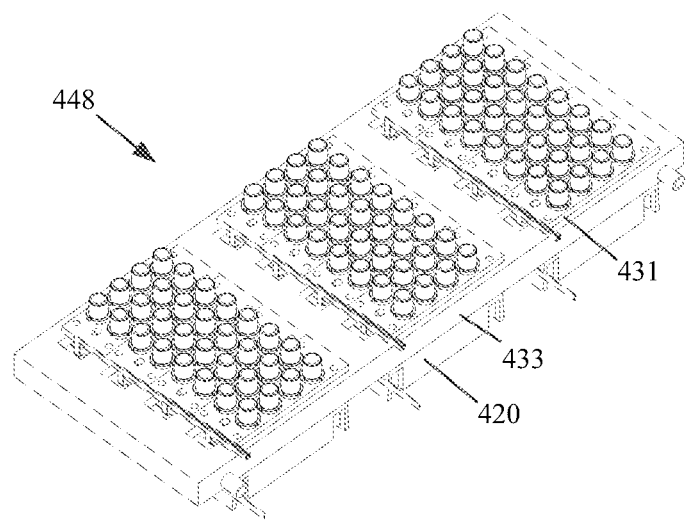
FIGS. 201-202 illustrate a plurality of double-sided diode laser array modules 448 in accordance with various embodiments.
Figure 201:
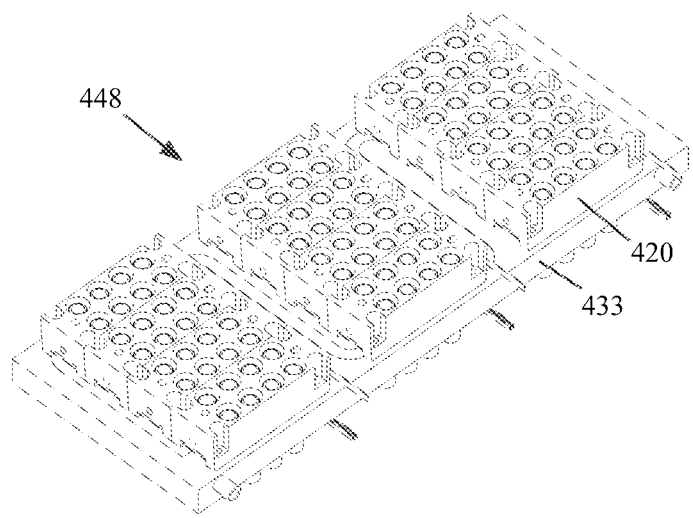

FIG. 201 shows two perspective views (view from the top at an angle, view from the bottom at an angle) of a double-sided diode laser array module 448. As shown in FIG. 201, the diode laser array module 448 includes a diode laser module 431, a diode laser module 420 and a liquid-cooled radiator 433. The diode laser module 431 and the diode laser module 420 are respectively placed on the top and bottom surfaces of the liquid-cooled radiator 433 and are in close contact therewith to radiate heat. Heat conducting filling materials, such as heat conducting paste, are arranged on the contact surfaces.

In addition to the solution that the diode laser modules are directly placed on the two surfaces of the cooled radiator, the double-sided cooling solution can also be realized by means of an auxiliary heat sink, which can reduce the difficulty in manufacturing the cooled radiator. The following is a demonstrative example. Using the same principle, the solution that diode laser modules are placed on both sides of any of the above-mentioned cooled radiators can be formed.

Figure 202:
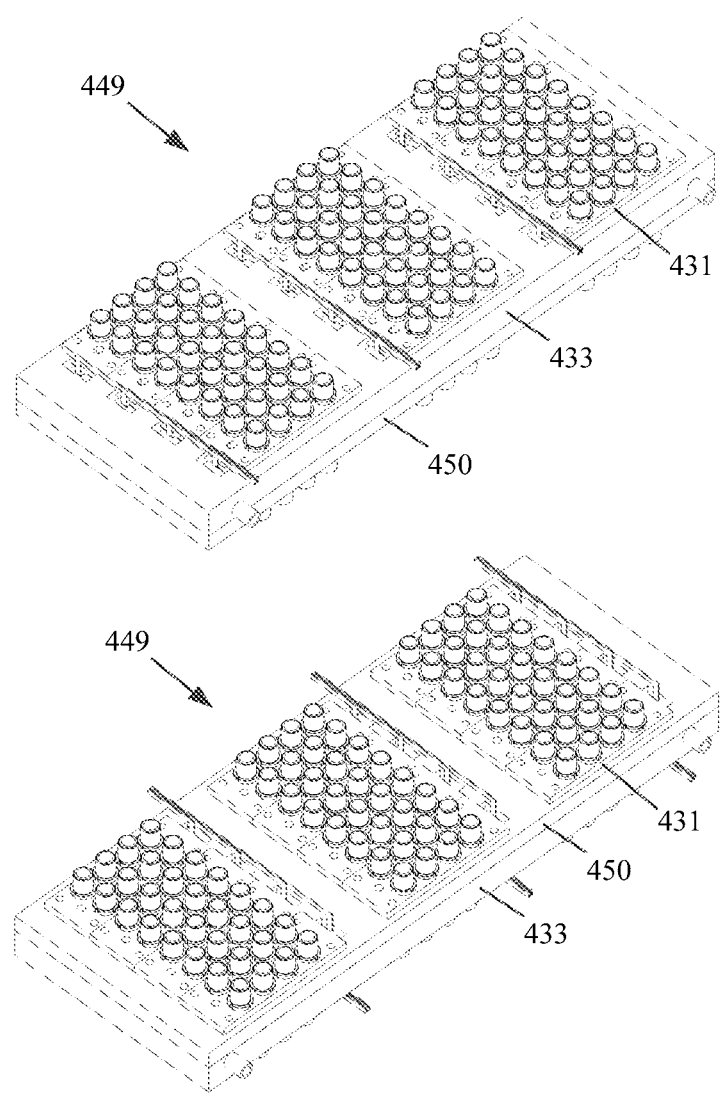

FIG. 202 shows two perspective views (view from the top at an angle, view from the bottom at an angle) of a double-sided diode laser array module 449 that includes a liquid-cooled radiator 443 and an auxiliary heat sink 450. As shown in FIG. 202, the diode laser array module 449 includes a diode laser module 431, a liquid-cooled radiator 433 and an auxiliary heat sink 450. One set of the diode laser modules 431 are placed on the top surface of the liquid-cooled radiator 433 and are in close contact with it. The bottom surface of the liquid-cooled radiator 433 is in close contact with the bottom surface of the auxiliary heat sink 450, and the other set of the diode laser modules 431 are placed on the top surface of the auxiliary heat sink 450 and are in close contact with it. All contact surfaces are filled with heat conducting filling materials such as heat conducting paste. The structure of the auxiliary heat sink 450 is very similar to that of the liquid-cooled radiator 433. The auxiliary heat sink 450 is equivalent to the heat sink 437 of the liquid-cooled radiator 433 without the water passage 119, the inlet 103 and the outlet 104. The method of placing diode laser modules 431 on the surface of the auxiliary heat sink 450 is totally the same as that of placing diode laser modules on the surface of the cooled radiator 433. FIG. 203 illustrates a plurality of views (view from the top of the auxiliary heat sink, and view from the bottom of the auxiliary heat sink) of the auxiliary heat sink 450.

In the above detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are only used to distinguish one element from another. For example, a first lens array could be termed a second lens array, and, similarly, a second lens array could be termed a first array, without departing from the scope of the various described embodiments. The first lens array and the second lens array are both lens arrays, but they are not the same lens arrays, unless the context clearly indicates otherwise.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The use of terminology such as "front," "back," "top," "bottom," "left," "right," "over," "above," and "below" throughout the specification and claims is for describing the relative positions of various components of the system(s) and relative positions of various parts of the various components described herein. Similarly, the use of any horizontal or vertical terms throughout the specification and claims is for describing the relative orientations of various components of the system(s) and the relative orientations of various parts of the various components described herein. Except where a relative orientation or position set forth below is explicitly stated in the description for a particular component, system, or device, the use of such terminology does not imply any particular positions or orientations of the system, device, component or part(s) thereof, relative to (1) the direction of the Earth's gravitational force, (2) the Earth ground surface or ground plane, (3) a direction that the system(s), device(s), or particular component(s) thereof may have in actual manufacturing, usage, or transportation; or (4) a surface that the system(s), device(s), or particular component(s) thereof may be disposed on during actual manufacturing, usage, or transportation.

A number of embodiments of the invention have been described. Nevertheless, it will be understood that various modifications may be made without departing from the spirit and scope of the inventions. For example, some processing steps may be carried out in a different order, modified, or omitted. The layout and configuration of the vibrating elements, electrodes, and electrical connections, may be varied.

The foregoing description has been provided with reference to specific embodiments. However, the illustrative discussions above are not intended to be exhaustive or to be limiting to the precise forms disclosed. Many modifications and variations are possible in view of the above teachings. The embodiments were chosen and described in order to best explain the principles disclosed and their practical applications, to thereby enable others to best utilize the disclosure and various embodiments with various modifications as are suited to the particular use contemplated.

What is claimed is:

1. A diode laser array module, comprising:
   a first diode laser array including a first plurality of diode lasers, wherein each diode laser of the first plurality of diode lasers has a respective diode laser body and a respective set of pins connected to the respective diode laser body; and
   a cooling module, wherein the cooling module includes a heat conducting body defined by a top surface, a bottom surface, and at least a first side surface and a second side surface of the cooling module, and includes a cooling structure that is at least partially embedded in the heat conducting body of the cooling module, wherein:
      the heat conducting body of the cooling module includes an array of first holes with corresponding first openings in the top surface of the cooling module to accommodate the first plurality of diode lasers, and
      the heat conducting body of the cooling module includes a plurality of first grooves, wherein each first groove is open in the bottom surface of the cooling module and connects a respective row of first holes in the array of first holes, and a plurality of pin connector modules, wherein:
each pin connector module includes a respective first conductive portion that is located within a respective first groove of the heat conducting body of the cooling module and electrically connects the respective row of diode lasers that are inserted into the respective row of the first holes connected by the respective first groove, and each pin connector module includes at least one respective second conductive portion that is disposed within a portion of the heat conducting body of the cooling module that is beyond the respective first groove, the respective second conductive portion of said each pin connector module forms an electrical contact with the respective first conductive portion of said each pin connector module within the heat conducting body of the cooling module, and is configured to form an electrical contact to a driving circuit module outside of the first side surface of the cooling module.

2. The diode laser array module of claim 1, including:
a first lens array module that includes a first plurality of lenses, wherein each lens of the first plurality of lenses is disposed above a respective diode laser of the first plurality of diode lasers and separated from a respective output window of the respective diode laser by an air gap.

3. The diode laser array module of claim 1, wherein:
each pin connector module of the plurality of pin connector modules includes a respective series of U-shaped pin connectors that are disposed within a respective first groove of the heat conducting body of the cooling module and electrically connecting a respective row of diode lasers of the first diode laser array that are inserted into the respective row of first holes connected by the respective first groove, and each pin connector module of the plurality of pin connector modules includes at least a respective L-shaped pin connector that is disposed within a portion of the heat conducting body of the cooling module that is beyond of the respective first groove, the respective L-shaped pin connector forming an electrical contact within the heat conducting body of the cooling module with one of the respective series of U-shaped pin connectors or a respective pin of a diode laser connected to the respective series of U-shaped pin connectors, and forming an electrical contact outside of the first side surface of the cooling module to the driving circuit module.

4. The diode laser array module of claim 1, wherein:
each pin connector module includes a respective PCB that is disposed within a respective first groove of the heat conducting body of the cooling module and electrically connecting a respective row of diode lasers of the first diode laser array that are inserted into the respective row of first holes connected by the respective first groove, and each pin connector module includes at least a respective L-shaped pin connector that is disposed within a portion of the heat conducting body of the cooling module that is beyond the respective first groove, and the respective L-shaped pin connector forming an electrical contact with the respective PCB of said each pin connector module within the heat conducting body of the cooling module, and forming an electrical contact to the driving circuit module outside of the first side surface of the cooling module.

5. The diode laser array module of claim 1, wherein the cooling module includes a plurality of third holes that run in a vertical direction defined by the top surface and the bottom surface of the cooling module, and wherein at least part of the respective second conductive portion of the respective pin connector module is disposed within a respective one of the third holes in the cooling module.

6. The diode laser array module of claim 1, wherein the cooling module includes a plurality of second grooves on the top surface of the cooling module, and wherein at least part of the respective second conductive portion of the respective pin connector module is disposed within a respective one of the second grooves on the top surface of the cooling module.

7. The diode laser array module of claim 1, wherein a vertical position of the driving circuit module on the first side surface of the cooling module is above a vertical position of the cooling structure in the cooling module.

8. The diode laser array module of claim 1, including:
a module pressing plate disposed above the top surface of the cooling module, wherein the module pressing plate includes a plurality of second holes at positions corresponding to the first plurality of diode lasers, and wherein the module pressing plate pushes the first plurality of diode lasers against the cooling module when the module pressing plate is affixed to the cooling module.

9. The diode laser array module of claim 1, wherein:
the cooling module includes a plurality of fourth holes that connects a first end surface of a respective first groove to the first side surface of the cooling module, and the second conductive portion of the respective pin connector module is disposed at least partially within the fourth holes of the cooling module.

10. The diode laser array module of claim 1, wherein:
the plurality of pin connector modules include a first pin connector module that is a PCB that includes a first conductive portion residing in the respective first groove and a second conductive portion that passes through a wall of the cooling module and connects to the driving circuit module at a location outside of the cooling module.

11. The diode laser array module of claim 1, wherein:
the cooling structure of the cooling module is a liquid-filled channel that is sealed by a cover plate disposed on the bottom surface of the cooling module.

12. The diode laser array module of claim 1, wherein:
the cooling structure of the cooling module is a liquid-filled channel that is sealed by a cover plate disposed on the top surface of the cooling module.

13. The diode laser array module of claim 1, wherein:
the cooling module is comprised of a upper part and lower part that are aligned and affixed to each other, wherein a top surface of the upper part serves as the top surface of the cooling module, a bottom surface of the lower part serves as the bottom surface of the cooling module, a first side surface of the upper part and a first side surface of the lower part together form the first side surface of the cooling module, and a second side surface of the upper part and a second side surface of the lower part form the second side surface of the cooling module, the upper part includes the array of first holes of the cooling module, and the lower part includes the plurality of first grooves of the cooling module.

14. The diode laser array module of claim 1, wherein:
the cooling structure of the cooling module includes a plurality of heat pipes that pass through the heat conducting body of the cooling module between adjacent rows of the array of first holes, and includes an external radiator that is connected to the heat conducting body of the cooling module via the plurality of heat pipes.

15. The diode laser array module of claim 1, wherein:
the cooling structure of the cooling module includes a preformed liquid passage pipe that is mounted into a plurality of preformed grooves in the top surface of the cooling module.

16. The diode laser array module of claim 1, wherein:
the diode laser array module is a double-sided diode laser array module,
the double-sided diode laser array module includes a second diode laser array including a second plurality of diode lasers, wherein the second diode laser array is facing a direction opposite to a direction faced by the first diode laser array in the diode laser array module, wherein each diode laser of the second plurality of diode lasers has a respective diode laser body and a respective plurality of pins connected to the respective diode laser body of the second plurality of diode lasers,
the double-sided diode laser array module includes an auxiliary heat sink module facing an opposite direction from a direction faced by the cooling module, wherein:
the auxiliary heat sink module includes a heat conducting body defined by a top surface, a bottom surface, and at least a first side surface and a second side surface of the auxiliary heat sink module, and does not include a corresponding cooling structure within the heat conducting body of the auxiliary heat sink module,
the heat conducting body of the auxiliary heat sink module is structured in accordance with any of the cooling module of the diode laser array module recited in claim 1, except for the inclusion of the cooling structure in the cooling module, to accommodate the second plurality of diode lasers and a corresponding second plurality of pin connector modules that connect the second plurality of diode lasers to the driving circuit module that is disposed away from the first side surface of the auxiliary heat sink module.

17. The diode laser array module of claim 1, wherein:
the diode laser array module is a double-sided diode laser array module,
the double-sided diode laser array module includes a second diode laser array including a second plurality of diode lasers, wherein the second diode laser array is facing a direction opposite to a direction faced by the first diode laser array in the diode laser array module, wherein each diode laser of the second plurality of diode lasers has a respective diode laser body and a respective plurality of pins connected to the respective diode laser body of the second plurality of diode lasers, and
the heat conducting body of the cooling module includes a second set of structural features corresponding to a first set of structural features of the cooling module recited in claim 1, wherein the second set of structural features are configured to accommodate the second plurality of diode lasers and a corresponding second plurality of pin connector modules, and wherein the second set of structural features and their corresponding structural features are disposed on two opposite sides of the heat conducting body of the cooling module and are offset from each other in a direction parallel to the top surface of the cooling module.

18. A diode laser array module, comprising:
a first plurality of diode laser modules, wherein:
each diode laser module of the first plurality of diode laser modules has a respective module body having a top surface, a bottom surface, a first side surface, and a second side surface,
the respective module body of said each diode laser module includes a respective plurality of first holes in the top surface of the respective module body, and
said each diode laser module includes a respective plurality of diode lasers mounted at least partially within the respective plurality of first holes of the respective module body of said each diode laser module, with respective pins of the respective plurality of diode lasers extending downward out of the respective plurality of first holes;
a first plurality of pin connector modules, wherein each respective pin connector module is configured to connect the respective pins of the respective plurality of diode lasers of at least one of the first plurality of diode laser modules to a driving circuit module that is disposed at a location separate from the bottom surface of the module body of said at least one diode laser module; and
a cooling module, wherein the cooling module includes a heat conducting body defined by a top surface, a bottom surface, and at least a first side surface and a second side surface of the cooling module, and includes a cooling structure that is at least partially embedded in the heat conducting body of the cooling module, wherein:
the top surface of the heat conducting body of the cooling module is in thermal contact with the bottom surfaces of the plurality of diode laser modules, and
at least one of the bottom surface of the module body of the respective diode laser module or the top surface of the heat conducting body of the cooling module includes one or more recessed areas at locations corresponding to the respective plurality of first holes of the respective module body of the respective diode laser module, such that one or more channels are formed by the one or more recessed areas when the top surface of the heat conducting body of the cooling module is in thermal contact with the bottom surfaces of the respective module bodies of the plurality of diode laser modules,
each pin connector module includes a respective first conductive portion that is located within the one or more channels formed between the top surface of the body of the cooling module and the bottom surfaces of the respective plurality of diode laser modules and electrically connects the respective plurality of diode lasers that are inserted into the respective plurality of first holes of a respective diode laser module, and
each pin connector module includes a respective second conductive portion that extends out of the channel formed between the top surface of the body of the cooling module and the bottom surfaces of the plurality of diode laser modules to a location where electrical connections to the driving circuit module are to be made.

19. A cooled radiator, comprising:

a heat conducting body defined by a top surface, a bottom surface, and at least a first side surface and a second side surface of the cooled radiator; and a cooling structure that is at least partially embedded in the heat conducting body of the cooled radiator, wherein:

the heat conducting body of the cooled radiator includes an array of first holes with corresponding first openings in the top surface of the cooled radiator to accommodate a first plurality of diode lasers, the heat conducting body of the cooled radiator includes a plurality of first grooves, wherein each first groove is open in the bottom surface of the cooled radiator and connects a respective row of first holes in the array of first holes, and the cooled radiator is configured to be fitted with a plurality of pin connector modules, a respective first groove of the heat conducting body of the cooled radiator is configured to accommodate a respective first conductive portion of each pin connector module that electrically connects a respective row of diode lasers that are inserted into the respective row of the first holes connected by the respective first groove, each pin connector module has at least one respective second conductive portion that is disposed within a portion of the heat conducting body of the cooled radiator that is beyond the respective first groove, the respective second conductive portion of said each pin connector module forms an electrical contact with the respective first conductive portion of said each pin connector module within the heat conducting body of the cooled radiator and is configured to form an electrical contact to a driving circuit module outside of the first side surface of the cooled radiator.

* * * * *